US009276611B2

(12) United States Patent
Murakami et al.

(10) Patent No.: US 9,276,611 B2
(45) Date of Patent: *Mar. 1, 2016

(54) ENCODING METHOD, ENCODER, AND DECODER

(71) Applicant: Panasonic Corporation, Osaka (JP)

(72) Inventors: Yutaka Murakami, Osaka (JP); Shutai Okamura, Osaka (JP); Masayuki Orihashi, Kanagawa (JP); Takaaki Kishigami, Tokyo (JP); Shozo Okasaka, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/255,651

(22) Filed: Apr. 17, 2014

(65) Prior Publication Data

US 2014/0325304 A1 Oct. 30, 2014

Related U.S. Application Data

(63) Continuation of application No. 12/679,740, filed as application No. PCT/JP2008/002701 on Sep. 26, 2008, now Pat. No. 8,745,471.

(30) Foreign Application Priority Data

| | | |
|---|---|---|
| Sep. 28, 2007 | (JP) | 2007-256567 |
| Dec. 28, 2007 | (JP) | 2007-340963 |
| Jan. 7, 2008 | (JP) | 2008-000844 |
| Jan. 7, 2008 | (JP) | 2008-000847 |
| Jan. 25, 2008 | (JP) | 2008-015670 |
| Feb. 26, 2008 | (JP) | 2008-045290 |
| Mar. 11, 2008 | (JP) | 2008-061749 |
| Jun. 6, 2008 | (JP) | 2008-149478 |

(51) Int. Cl.

| | |
|---|---|
| ***H03M 13/00*** | (2006.01) |
| ***H03M 13/11*** | (2006.01) |
| ***H03M 13/23*** | (2006.01) |

(52) U.S. Cl.
CPC ........ *H03M 13/1154* (2013.01); *H03M 13/118* (2013.01); *H03M 13/235* (2013.01); *H03M 13/6362* (2013.01)

(58) Field of Classification Search
CPC .......... H03M 13/2957; H03M 13/256; H03M 13/1525; H03M 13/23; H03M 13/3988; H03M 13/15; H03M 13/235; H03M 13/6362; H03M 13/116; H03M 13/1154; H03M 13/118; H04L 1/0059
USPC ......................................... 714/781, 786, 790
See application file for complete search history.

(56) References Cited

U.S. PATENT DOCUMENTS 6,134,696 A * 10/2000 Morelos-Zaragoza et al. ............................ 714/790

(Continued)

FOREIGN PATENT DOCUMENTS

CN 1759561 4/2006

(Continued)

OTHER PUBLICATIONS

Z. Chen, et al., "Efficient Encoding and Termination of Low-Density Parity-Check Convolutional Codes," IEEE Global Telecommunications Conference, Nov. 27-Dec. 1, 2006, 6 pages total.

(Continued)

*Primary Examiner* — James C Kerveros
(74) *Attorney, Agent, or Firm* — Dickinson Wright PLLC

(57) ABSTRACT

A low-density parity check convolution code (LDPC-CC) is made, and a signal sequence is sent after being subjected to an error-correcting encodement using the low-density parity check convolution code. In this case, a low-density parity check code of a time-variant period (3g) is created by linear operations of first to 3g-th (letter g designates a positive integer) parity check polynomials and input data.

6 Claims, 75 Drawing Sheets

$$
\mathbf{H}_{[0,n]}^{T}=\begin{pmatrix}
h_1^{(0)}(0) & h_1^{(1)}(1) & \cdots & h_1^{(M)}(M) & 0 & \cdots & 0 \\
h_2^{(0)}(0) & h_2^{(1)}(1) & \cdots & h_2^{(0)}(M) & 0 & & \\
0 & h_1^{(0)}(1) & \cdots & \vdots & h_1^{(M)}(M+1) & & \\
 & h_2^{(0)}(1) & \cdots & & h_2^{(M)}(M+1) & & \vdots \\
 & 0 & \ddots & & \vdots & & 0 \\
 & & \ddots & & & & h_1^{(M)}(n) \\
 & & & & & & h_2^{(M)}(n) \\
 & & & & & & \vdots \\
 & & & & & 0 & h_2^{(0)}(n)
\end{pmatrix}
$$

(56) References Cited

U.S. PATENT DOCUMENTS

| | | | | |
|---|---|---|---|---|
| 6,209,116 | B1 * | 3/2001 | Hammons et al. | 714/786 |
| 6,460,159 | B1 * | 10/2002 | Kim et al. | 714/790 |
| 6,665,833 | B1 * | 12/2003 | Tong et al. | 714/790 |
| 6,948,109 | B2 | 9/2005 | Coe | |
| 7,225,392 | B2 | 5/2007 | Huang | |
| 7,461,323 | B2 | 12/2008 | Matsumoto et al. | |
| 7,536,623 | B2 | 5/2009 | Kim | |
| 7,853,859 | B2 | 12/2010 | Ojard | |
| 8,069,390 | B2 | 11/2011 | Lin | |
| 8,078,933 | B2 | 12/2011 | Bates | |
| 8,095,859 | B1 | 1/2012 | Peterson | |
| 8,108,759 | B2 | 1/2012 | Moon | |
| 8,112,695 | B2 | 2/2012 | Costa | |
| 8,205,142 | B2 | 6/2012 | Kamiya | |
| 8,255,763 | B1 | 8/2012 | Yang | |
| 8,286,050 | B2 | 10/2012 | Murakami | |
| 2005/0050433 | A1 * | 3/2005 | Paul et al. | 714/784 |
| 2006/0262025 | A1 | 11/2006 | Sergi | |
| 2008/0201628 | A1 * | 8/2008 | Liou et al. | 714/786 |
| 2008/0301536 | A1 * | 12/2008 | Shin et al. | 714/786 |
| 2009/0290544 | A1 | 11/2009 | Yano | |

FOREIGN PATENT DOCUMENTS

| | | |
|---|---|---|
| CN | 101094000 | 12/2007 |
| WO | 2006/064659 | 6/2006 |
| WO | 2007/080727 | 7/2007 |

OTHER PUBLICATIONS

S. Bates, et al., "Termination Sequence Generation Circuits for Low-Density Parity-check Convolutional Codes," IEEE Transactions on Circuits and Systems I: Regular Papers, vol. 53, No. 9, Sep. 2006, pp. 1909-1917.

Z. Chen, et al., "Low-Density Parity-Check Convolutional Codes Applied to Packet Based Communication Systems," IEEE Global Telecommunications Conference, Nov. 28-Dec. 2, 2005, pp. 1250-1254.

E. Choi, et al., "Rate-Compatible Puncturing for Low-Density Parity-Check Codes with Dual-Diagonal Parity Structure," IEEE 16$^{th}$ International Symposium on Personal, Indoor and Mobile Radio Communications, Sep. 11-14, 2005, pp. 2642-2646.

D. Costello, Jr., et al., "A Comparison Between LDPC Block and Convolutional Codes," Proceedings of Information Theory and Application Workshop, Feb. 6-10, 2006, 5 pages total.

Supplementary European Search Report dated May 23, 2011.

S. Bates, et al., "Decoders for Low-Density Parity-Check Convolutional Codes with Large Memory," IEEE International Symposium on Circuits and Systems, May 2006, pp. 5103-5106.

O. Takeshita, "A New Construction for LDPC Codes using Permutation Polynomials over Integer Rings," Department of Electrical and Computer Engineering, The Ohio State University, Columbus, OH, Jun. 2005, pp. 1-12.

M. Tavares, et al., "LDPC Convolutional Codes Based on Permutation Polynomials over Integer Rings," XP-002635675, Proceedings of WMPC 2006, Vodafone Chair Mobile Communications Systems, Dresden University of Technology, Dresden, Germany, Sep. 2006, pp. 1-5.

International Search Report dated Nov. 25, 2008.

R.M. Tanner, et al., "LDPC Block and Convolutional Codes Based on Circulant Matrices," IEEE Transactions on Information Theory, vol. 50, No. 2, Dec. 2004, pp. 2966-2984.

J. Chen, et al., "Reduced-Complexity Decoding of LDPC Codes," IEEE Transactions on Communications, vol. 53, No. 8, Aug. 2005, pp. 1288-1299.

J. Fan, "Array Codes as Low-Density Parity-Check Codes," Proceedings of the Second International Symposium on Turbo Codes and Related Topics, Brest, France. Sep. 6-10, 2000, pp. 543-546.

A.J. Felstrom, et al., "Time-Varying Periodic Convolutional Codes with Low-Density Parity-Check Matrix," IEEE Transactions on Information Theory, vol. 45, No. 6, Sep. 1999, pp. 2181-2191.

M. Fossorier, et al., "Reduced Complexity Iterative Decoding of Low-Density Parity Check Codes Based on Belief Propagation," IEEE Transactions on Communications, vol. 47., No. 5, May 1999, pp. 673-680.

R. G. Gallager, "Low-Density Parity-Check Codes," IRE Transactions on Information Theory, 1962, Chapter 8, pp. 21-28.

R.G. Gallager, "Low-Density Parity-Check Codes," MIT Press, Cambridge, Massachusetts, Jul. 1963.

R. Johannesson, et al., "Fundamentals of Convolutional Coding," Wiley-IEEE Press, N.Y., Chapter 7, Section 7.5, "Low-Density Parity-Check Convolutional Codes," Mar. 1999, pp. 337-344.

Y. Kou, et al., "Low-Density Parity-Check Codes Based on Finite Geometries: A Rediscovery and New Results," IEEE Transactions on Information Theory, vol. 47, No. 7, Nov. 2001, pp. 2711-2736.

S. Lin, et al., "Error Control Coding: Fundamentals and Applications," Second Edition, Pearson-Prentice Hall, Chapter 12, Section 3, "Construction of Good Convolutional Codes," Upper Saddle River, N.J., 2004, pp. 538-544.

D. MacKay, "Good Error-Correcting Codes Based on Very Sparse Matrices," IEEE Transactions on Information Theory, vol. 45, No. 2, Mar. 1999, pp. 399-431.

A. Pusane, et al., "Construction of Irregular LDPC Convolutional Codes with Fast Encoding," Proceedings of the IEEE International Conference on Communications (ISIT 2006), Seattle, Washington, Jul. 6-12, pp. 1160-1165.

A. Pusane, et al., "On Deriving Good LDPC Convolutional Codes from QC LDPC Block Codes," Proceedings of the IEEE International Symposium on Information Theory (ISIT 2007), Nice, France, Jun. 24-29, 2007, pp. 1221-1225.

G. Richter, et al., "Irregular Low-Density Parity-Check Convolutional Codes Based on Protographs," Proceedings of the IEEE International Symposium on Information Theory (ISIT 2006), Seattle, Washington, Jul. 9-14, 2006, pp. 1633-1637.

T. Shohon, et al., "Sum-Product Decoding of Convolutional Codes," Proceedings of the Fourth International Workshop on Signal Design and Its Applicants in Communications (IWSDA '09), Fukuoka, Japan, Oct. 19-23, 2009, pp. 64-67.

A. Sridharan, et al., "Distance Bounds for an Ensemble of LDPC Convolutional Codes," IEEE Transactions on Information Theory, vol. 53, No. 12, Dec. 2007, pp. 4537-4555.

R. M. Tanner, et al., "LDPC Block and Convolutional Codes Based on Circulant Matrices," IEEE Transactions on Information Theory, vol. 50, No. 12, Dec. 2004, pp. 2966-2984.

T. Waydayama, "Low-Density Parity Check Codes and the Sum-Product Algorithm," Triceps, Jun. 2002, pp. 26-27.

H. Yashima, "Convolutional Coding and Vieterbi Decoding Method," Triceps, 2000, pp. 20-29.

First Examination Report dated Feb. 10, 2015.

Summons to Attend Oral Proceedings dated May 11, 2015.

J. Yedidia, et al., "Understanding Belief Propagation and its Generalizations," XP-002491761, Mitsubishi Electric Research Laboratories, TR-2001-22, Jan. 2002, 35 pages total.

Y. Murakami, et al. "LDPC Convolutional Codes Based on Parity Check Polynomials with a Time Period of 3," XP-001550838, IEICE Trans. Fundamentals, vol. E92-A, No. 10, Oct. 2009, pp. 2479-2483.

English Translation of Search Report which is an annex to Chinese Office Action dated Sep. 6, 2015.

* cited by examiner $$
\mathbf{H}_{[0,n]}^{T} = \begin{pmatrix}
h_1^{(0)}(0) & h_1^{(1)}(1) & \cdots & h_1^{(M)}(M) & 0 & \cdots & 0 \\
h_2^{(0)}(0) & h_2^{(1)}(1) & \cdots & h_2^{(0)}(M) & 0 & & \\
0 & h_1^{(0)}(1) & \cdots & \cdots & h_1^{(M)}(M+1) & & \\
 & h_2^{(0)}(1) & \cdots & & h_2^{(M)}(M+1) & & \cdots \\
 & 0 & \ddots & & \cdots & & 0 \\
 & & \ddots & & & & h_1^{(M)}(n) \\
 & & & & & & h_2^{(M)}(n) \\
 & & & & & & \cdots \\
 & & & & & 0 & h_2^{(0)}(n)
\end{pmatrix}
$$

FIG.1

GENERATING POLYNOMIAL $G = \left[ 1 \ (D^2+1)/(D^2+D+1) \right]$

PARITY CHECK POLYNOMIAL $\left(D^2+1\right)X(D)+\left(D^2+D+1\right)P(D)=0$

201

PARITY CHECK MATRIX $H$ =

```
11000000000000000000000000000000000000·
01110000000000000000000000000000000000·
11011100000000000000000000000000000000·
00110111000000000000000000000000000000·
00001101110000000000000000000000000000·
00000011011100000000000000000000000000·
00000000110111000000000000000000000000·
00000000001101110000000000000000000000·
00000000000011011100000000000000000000·
00000000000000110111000000000000000000·
..........................................
```

TRANSMISSION SEQUENCE wi =(xi,pi)

TRANSMISSION VECTOR w=(x1,p1,x2,p2,x3,p3,x4,p4,x5,p5,···,xi,pi,···)

```
110000000000000000000000000000000000000000000000000000000000000000000000000000000000…
011100000000000000000000000000000000000000000000000000000000000000000000000000000000…
000111000000000000000000000000000000000000000000000000000000000000000000000000000000…
010001110000000000000000000000000000000000000000000000000000000000000000000000000000…
000100011100000000000000000000000000000000000000000000000000000000000000000000000000…
100001000111000000000000000000000000000000000000000000000000000000000000000000000000…
101000010001110000000000000000000000000000000000000000000000000000000000000000000000…
001010000100011100000000000000000000000000000000000000000000000000000000000000000000…
010010100001000111000000000000000000000000000000000000000000000000000000000000000000…
110100101000010001110000000000000000000000000000000000000000000000000000000000000000…
001101001010000100011100000000000000000000000000000000000000000000000000000000000000…
000011010010100001000111000000000000000000000000000000000000000000000000000000000000…
000000110100101000010001110000000000000000000000000000000000000000000000000000000000…
000000001101001010000100011100000000000000000000000000000000000000000000000000000000…
000000000011010010100001000111000000000000000000000000000000000000000000000000000000…
000000000000110100101000010001110000000000000000000000000000000000000000000000000000…
000000000000001101001010000100011100000000000000000000000000000000000000000000000000…
000000000000000011010010100001000111000000000000000000000000000000000000000000000000…
000000000000000000110100101000010001110000000000000000000000000000000000000000000000…
000000000000000000001101001010000100011100000000000000000000000000000000000000000000…
000000000000000000000011010010100001000111000000000000000000000000000000000000000000…
000000000000000000000000110100101000010001110000000000000000000000000000000000000000…
000000000000000000000000001101001010000100011100000000000000000000000000000000000000…
000000000000000000000000000011010010100001000111000000000000000000000000000000000000…
000000000000000000000000000000110100101000010001110000000000000000000000000000000000…
000000000000000000000000000000001101001010000100011100000000000000000000000000000000…
000000000000000000000000000000000011010010100001000111000000000000000000000000000000…
000000000000000000000000000000000000110100101000010001110000000000000000000000000000…
⋮
```

$$\left(D^{\alpha 1}+\cdots+D^{\alpha e}+D^{14}+D^{10}+1\right)X(D)+\left(D^{5}+D^{4}+D^{3}+D^{1}+1\right)P(D)=0$$

$$\Downarrow$$

1403

$$\left(D^{\alpha 1}+\cdots+D^{\alpha e}+D^{z}+D^{14}+1\right)X(D)+\left(D^{5}+D^{4}+D^{3}+D^{1}+1\right)P(D)=0$$

1404

$$\left(D^{\alpha 1}+\cdots+D^{\alpha e}+D^{14}+1\right)X(D)+\left(D^{z}+D^{5}+D^{4}+D^{3}+D^{1}+1\right)P(D)=0$$

| | ENCODING SEQUENCE | $X_{i-1}$ | $P_{i-1}$ | $X_i$ | $P_i$ | $X_{i+1}$ | $P_{i+1}$ | $X_{i+2}$ | $P_{i+2}$ |
|---|---|---|---|---|---|---|---|---|---|
| | PUNCTURING PATTERN | × | × | ○ | ○ | × | × | × | × |
| | | | | 1 BLOCK | | | | | |
| ENCODING SEQUENCE STATE | #1 | $DX(D)$ | $DP(D)$ | $X(D)$ | $P(D)$ | | | | |
| | #2 | $D^2X(D)$ | $D^2P(D)$ | $DX(D)$ | $DP(D)$ | $X(D)$ | $P(D)$ | | |
| | #3 | $D^3X(D)$ | $D^3P(D)$ | $D^2X(D)$ | $D^2P(D)$ | $DX(D)$ | $DP(D)$ | $X(D)$ | $P(D)$ |

○: PUNCTURE BIT ×: TRANSMISSION BIT

FIG.20B

| CODE | NUMBER OF PARITY CHECK POLYNOMIALS THAT MUST BE CHECKED WHEN CODING RATE OF R=2/3 (L=4) | NUMBER OF PARITY CHECK POLYNOMIALS THAT MUST BE CHECKED WHEN CODING RATE OF R=3/4 (L=3) | NUMBER OF PARITY CHECK POLYNOMIALS THAT MUST BE CHECKED WHEN CODING RATE OF R=5/6 (L=5/2,j=k/2) |
|---|---|---|---|
| TIME-INVARIANT LDPC-CC | ${}_{4k}C_k$ | k: ODD NUMBER $\frac{1}{3k} \times {}_{3k}C_k$<br>k: EVEN NUMBER ${}_{3k}C_k$ | ${}_{5j}C_{2j}$ |
| LDPC-CC OF TIME- VARYING-PERIOD- OF m | $\frac{1}{2k} \times {}_{4k}C_k \times LCM\{2k,m\}$ | k: ODD NUMBER $\frac{1}{6k} \times {}_{3k}C_k \times LCM\{6k,m\}$<br>k: EVEN NUMBER $\frac{2}{3k} \times {}_{3k}C_k \times LCM\{\frac{3k}{2},m\}$ | k: ODD NUMBER $\frac{1}{10j} \times {}_{5j}C_{2j} \times LCM\{10j,m\}$<br>k: EVEN NUMBER $\frac{2}{5j} \times {}_{5j}C_{2j} \times LCM\{\frac{5j}{2},m\}$ |

FIG.20C $$H = \begin{pmatrix} H1 & & & 0 & & & & \\ 0 & H1 & & & 0 & & & \\ & 0 & H1 & & & 0 & & \\ & & 0 & H1 & & & 0 & \\ & & & 0 & H1 & & & 0 \\ & & & & & & & \\ & & & & & & & \end{pmatrix}$$

FIG.34

"CHECK EQUATION #1"

$$\left(D^{2}+D^{1}+1\right)X(D)+\left(D^{2}+D^{1}+1\right)P(D)=0$$

$H_1$ = 11 11 11

"CHECK EQUATION #2"

$$\left(D^{5}+D^{1}+1\right)X(D)+\left(D^{5}+D^{1}+1\right)P(D)=0$$

$H_2$ = 11 00 00 00 11 11

"CHECK EQUATION #3"

$$\left(D^{4}+D^{2}+1\right)X(D)+\left(D^{4}+D^{2}+1\right)P(D)=0$$

$H_3$ = 11 00 11 00 11

ENCODING METHOD, ENCODER, AND DECODER

CROSS REFERENCE TO RELATED APPLICATION

This is a continuation application of application Ser. No. 12/679,740 filed Mar. 24, 2010, now U.S. Pat. No. 8,745,471 issued Jun. 3, 2014, which is a 371 application of PCT/JP2008/002701 filed Sep. 26, 2008, which is based on Japanese Application No. 2007-256567 filed Sep. 28, 2007, Japanese Application No. 2007-340963 Dec. 28, 2007, Japanese Application No. 2008-000844 filed Jan. 7, 2008, Japanese Application No. 2008-000847 filed Jan. 7, 2008, Japanese Application No. 2008-015670 filed Jan. 25, 2008, Japanese Application No. 2008-045290 filed Feb. 26, 2008, Japanese Application No. 2008-061749 filed Mar. 11, 2008, and Japanese Application No. 2008-149478 filed Jun. 6, 2008, the entire contents of each of which are incorporated by reference herein.

TECHNICAL FIELD

The present invention relates to a Low-Density Parity-Check Convolutional Code (LDPC-CC) encoding method, encoder, and decoder.

BACKGROUND ART

In recent years, attention has been attracted to a Low-Density Parity-Check (LDPC) code as an error correction code that provides high error correction capability with a feasible computational complexity. Due to its high error correction capability and ease of implementation, an LDPC code has been adopted in an error correction encoding method for IEEE802.11n high-speed wireless LAN systems, digital broadcasting systems, and so forth.

An LDPC code is an error correction code defined by low-density parity check matrix H. An LDPC code is a block code having a block length equal to number of columns N of parity check matrix H. A random LDPC code, array LDPC code, and QC-LDPC code (QC: Quasi-Cyclic) are proposed in Non-Patent Document 1, Non-Patent Document 2, and Non-Patent Document 3, for example.

However, a characteristic of many current communication systems is that transmission information is transmitted collected together into variable-length packets and frames, as in the case of Ethernet (registered trademark). A problem with applying an LDPC code, which is a block code, to a system of this kind is, for example, how to make a fixed-length LDPC code block correspond to a variable-length Ethernet (registered trademark) frame. With IEEE802.11n, adjustment of the length of a transmission information sequence and an LDPC code block length is performed by executing padding processing or puncturing processing on a transmission information sequence, but it is difficult to avoid a change in the coding rate and redundant sequence transmission due to padding or puncturing.

In contrast to this kind of LDPC code of block code (hereinafter referred to as "LDPC-BC: Low-Density Parity-Check Block Code"), LDPC-CC (Low-Density Parity-Check Convolutional Code) allowing encoding and decoding of information sequences of arbitrary length have been investigated (see Non-Patent Document 1 and Non-Patent Document 1, for example).

An LDPC-CC is a convolutional code defined by a low-density parity-check matrix, and, as an example, parity check matrix $H^T[0,n]$ of an LDPC-CC for which coding rate of R=½ (=b/c) is shown in FIG. 1. Here, element $h_1^{(m)}(t)$ of $H^T[0,n]$ has a value of 0 or 1. All elements other than $h_1^{(m)}(t)$ are 0. M represents the LDPC-CC memory length, and n represents the length of an LDPC codeword. As shown in FIG. 1, a characteristic of an LDPC-CC parity check matrix is that it is a parallelogram-shaped matrix in which 1 is placed only in diagonal terms of the matrix and neighboring elements, and the bottom-left and top-right elements of the matrix are zero.

An LDPC encoder defined by parity check matrix $H^T[0,n]$ when $h_1^{(0)}(t)=1$ and $h_2^{(0)}(t)=1$ here is represented by FIG. 2. As shown in FIG. 2, an LDPC encoder is composed of M+1 shift registers of bit-length c and a modulo 2 adder. Consequently, a characteristic of an LDPC encoder is that it can be implemented with extremely simple circuitry in comparison with a circuit that performs generator matrix multiplication or an LDPC-BC encoder that performs computation based on backward (forward) substitution. Also, since the encoder in FIG. 2 is a convolutional code encoder, it is not necessary to divide an information sequence into fixed-length blocks when encoding, and an information sequence of any length can be encoded.

Non-Patent Document 1: R. G. Gallager, "Low-density parity check codes," IRE Trans. Inform. Theory, IT-8, pp-21-28, 1962.

Non-Patent Document 2: D. J. C. Mackay, "Good error-correcting codes based on very sparse matrices," IEEE Trans. Inform. Theory, vol. 45, no. 2, pp 399-431, March 1999.

Non-Patent Document 3: J. L. Fan, "Array codes as low-density parity-check codes," proc. of 2nd Int. Symp. on Turbo Codes, pp. 543-546, September 2000.

Non-Patent Document 4: Y. Kou, S. Lin, and M. P. C. Fossorier, "Low-density parity-check codes based on finite geometries: A rediscovery and new results," IEEE Trans. Inform. Theory, vol. 47, no. 7, pp 2711-2736, November 2001.

Non-Patent Document 5: A. J. Felstorom, and K. Sh. Zigangirov, "Time-Varying Periodic Convolutional Codes With Low-Density Parity-Check Matrix," IEEE Transactions on Information Theory, Vol. 45, No. 6, pp 2181-2191, September 1999.

Non-Patent Document 6: R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.

Non-Patent Document 7: G. Richter, M. Kaupper, and K. Sh. Zigangirov, "Irregular low-density parity-Check convolutional codes based on protographs," Proceeding of IEEE ISIT 2006, pp 1633-1637.

Non-Patent Document 8: R. D. Gallager, "Low-Density Parity-Check Codes," Cambridge, Mass.: MIT Press, 1963.

Non-Patent Document 9: M. P. C. Fossorier, M. Mihaljevic, and H. Imai, "Reduced complexity iterative decoding of low-density parity-check codes based on belief propagation," IEEE Trans. Commun., vol. 47., no. 5, pp. 673-680, May 1999.

Non-Patent Document 10: J. Chen, A. Dholakia, E. Eleftheriou, M. P. C. Fossorier, and X.-Yu Hu, "Reduced-complexity decoding of LDPC codes," IEEE Trans. Commun., vol. 53., no. 8, pp. 1288-1299, August 2005.

Non-Patent Document 11: Y. Ogawa, "Sum-product decoding of turbo codes," M. D. Thesis, Dept. Elec. Eng., Nagaoka Univ. of Technology, February 2007.

Non-Patent Document 12: S. Lin, D. J. Jr., Costello, "Error control coding Fundamentals and applications," Prentice-Hall. 12.3 章 pp. 538-544, 13.4 章 pp. 640-645

Non-Patent Document 13: Tadashi Wadayama, "Low-Density Parity-Check Code and the decoding method", Triceps., p. 26-27.

Non-Patent Document 14: A. Pusane, R. Smarandache, P. Vontobel, and D. J. Costello Jr., "On deriving good LDPC convolutional codes from QC LDPC block codes," Proc. of IEEE ISIT 2007, pp. 1221-1225, June 2007.

Non-Patent Document 15: A. Sridharan, D. Truhachev, M. Lentmaier, D. J. Costello, Jr., K. Sh. Zigangirov, "Distance Bounds for an Ensemble of LDPC Convolutional Codes," IEEE Transactions on Information Theory, vol. 53, no. 12, December 2007.

Non-Patent Document 16: A. Pusane, K. S. Zigangirov, and D. J. Costello Jr., "Construction of irregular LDPC convolutional codes with fast encoding," Proc. of IEEE ICC 2006, pp. 1160-1165, June 2006.

Non-Patent Document 17: Hiroyuki Yashima, "Convolutional code and Viterbi decoding method", Triceps., p. 20-29.

Non-Patent Document 18: R. Johannesson, and K. S. Zigangirov, "Fundamentals of convolutional coding," IEEE Press. pp. 337-344

DISCLOSURE OF INVENTION

Problems to be Solved by the Invention

Here, in the case of a block code, if the number of bits of transmission data is not an integral multiple of the code block length, it is necessary to transmit redundant bits. Therefore, when an LDPC-BC with a large block size or an LDPC-CC with a large protograph size is used, the number of redundant bits transmitted is large. In particular, when a packet for which the number of transmission data bits is small is transmitted in packet communication, there is a problem of data transmission efficiency decreasing significantly due to the transmission of redundant bits. However, it is difficult to solve this problem with the LDPC codes disclosed in Non-Patent Document 1 through Non-Patent Document 7. Solving this problem requires an LDPC-CC to be designed that can be configured using a smaller protograph size than in Non-Patent Document 1 through Non-Patent Document 7.

In this regard, if an LDPC-CC is created from a convolutional code, the protograph size can be made smaller than in Non-Patent Document 1 through Non-Patent Document 7.

Thus, a technique is required for improving received quality when an LDPC-CC is created from a convolutional code and an information sequence is transmitted after undergoing error correction encoding using the LDPC-CC.

The present invention has been implemented taking into account the problems described above, and it is an object of the present invention to provide an LDPC-CC encoding method, encoder, and decoder that enable good received quality to be obtained when an LDPC-CC is created from a convolutional code and an information sequence is transmitted after undergoing error correction encoding using the LDPC-CC.

Means for Solving the Problem

One aspect of an encoding method according to the present invention is an encoding method that creates a Low-Density Parity-Check Convolutional Code (LDPC-CC) of a time varying period of 3g (where g is a positive integer), and has: a step of supplying the first through 3g'th parity check polynomials, in an LDPC-CC defined based on, in a parity check polynomial represented by Equation 168-1, a first parity check polynomial, $(a_{\#1,1,1}\%3, a_{\#1,1,2}\%3, a_{\#1,1,3}\%3)$, $(a_{\#1,2,1}\%3, a_{\#1,2,2}\%3, a_{\#1,2,3}\%3), \ldots, (a\#_{1,n-1,1}\%3, a\#_{1,n-1,2}\%3, a\#_{1,n-1,3}\%3)$ are any of (0, 1, 2), (0, 2, 1), (1, 0, 2), (1, 2, 0), (2, 0, 1), or (2, 1, 0), and $(b_{\#1,1}\%3, b_{\#1,2}\%3, b_{\#1,3}\%3)$ is any of (0, 1, 2), (0, 2, 1), (1, 0, 2), (1, 2, 0), (2, 0, 1), or (2, 1, 0), and a second parity check polynomial in which, in a parity check polynomial represented by Equation 168-2, $(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a\#_{2,n-1,1}\%3, a\#_{2,n-1,2}\%3, a\#_{2,n-1,3}\%3)$ are any of (0, 1, 2), (0, 2, 1), (1, 0, 2), (1, 2, 0), (2, 0, 1), or (2, 1, 0), and $(b_{\#2,1}\%3, b_{\#2,2}\%3, b_{\#2,3}\%3)$ is any of (0, 1, 2), (0, 2, 1), (1, 0, 2), (1, 2, 0), (2, 0, 1), or (2, 1, 0), and a kk'th parity check polynomial in which, in a parity check polynomial represented by Equation 168-kk (where kk=3, 4, . . . , 3g−1), $(a_{\#kk,1,1}\%3, a_{\#kk,1,2}\%3, a_{\#kk,1,3}\%3), (a_{\#kk,2,1}\%3, a_{\#kk,2,2}\%3, a_{\#kk,2,3}\%3), \ldots, (a_{\#kk,n-1,1}\%3, a_{\#kk,n-1,2}\%3, a_{\#kk,n-1,3}\%3)$ are any of (0, 1, 2), (0, 2, 1), (1, 0, 2), (1, 2, 0), (2, 0, 1), or (2, 1, 0), and $(b_{\#kk,1}\%3, b_{\#kk,2}\%3, b_{\#kk,3}\%3)$ is any of (0, 1, 2), (0, 2, 1), (1, 0, 2), (1, 2, 0), (2, 0, 1), or (2, 1, 0), and a 3g'th parity check polynomial in which, in a parity check polynomial represented by Equation 168-3g, $(a_{\#3g,1,1}\%3, a_{\#3g,1,2}\%3, a_{\#3g,1,3}\%3), (a_{\#3g,2,1}\%3, a_{\#3g,2,2}\%3, a_{\#3g,2,3}\%3), \ldots, (a_{\#3g,n-1,1}\%3, a_{\#3g,n-1,2}\%3, a_{\#3g,n-1,3}\%3)$ are any of (0, 1, 2), (0, 2, 1), (1, 0, 2), (1, 2, 0), (2, 0, 1), or (2, 1, 0), and $(b_{\#3g,1}\%3, b_{\#3g,2}\%3, b_{\#3g,3}\%3)$ is any of (0, 1, 2), (0, 2, 1), (1, 0, 2), (1, 2, 0), (2, 0, 1), or (2, 1, 0), supplying the first through 3g'th parity check polynomials; and a step of acquiring an LDPC-CC codeword by linear computation using the first through 3g'th parity check polynomials and input data.

One aspect of an encoder according to the present invention is an encoder that creates a Low-Density Parity-Check Convolutional Code (LDPC-CC) from a convolutional code, and employs a configuration having a parity calculation section that finds a parity sequence by means of the above-described encoding method.

One aspect of a decoder according to the present invention is a decoder that decodes a Low-Density Parity-Check Convolutional Code (LDPC-CC) using Belief Propagation (BP), and employs a configuration having: a row processing computation section that performs row processing computation using a parity check matrix corresponding to a parity check polynomial used by the above-described encoder; a column processing computation section that performs column processing computation using the parity check matrix; and a determination section that estimates a codeword using computation results of the row processing computation section and the column processing computation section.

Advantageous Effects of Invention

According to the present invention, by focusing on a convolutional code for a small-size protograph, and making a parity check polynomial of a convolutional code a protograph, received quality can be improved and the number of redundant bits transmitted can be reduced in an LDPC-CC design method. Furthermore, by adding "1" to a predetermined position of an approximate lower triangular matrix or upper trapezoidal matrix of parity check matrix H, and increasing the order of a parity check polynomial of a convolutional code at this time, good received quality can be obtained in a receiving apparatus by performing BP decoding or approximated BP decoding using the created LDPC-CC parity check matrix. Brief Description of Drawings FIG. 1 shows an LDPC-CC parity check matrix;

FIG. 4 shows a parity check matrix of a (7, 5) convolutional code;

FIG. 8 shows a parity check matrix of a (7, 5) convolutional code;

FIG. 9 shows an example of the configuration of an LDPC-CC parity check matrix according to Embodiment 1;

FIG. 16 illustrates a method of creating an LDPC-CC from a convolutional code;

FIG. 17 shows an example of the configuration of an LDPC-CC parity check matrix according to Embodiment 7;

FIG. 20B shows the relationship between an encoding sequence and a puncturing pattern;

FIG. 20C shows the number of parity check polynomials that must be checked in order to select a puncturing pattern;

FIG. 34 shows the configuration of an LDPC-CC parity check matrix according to another Embodiment 7;

Figures 60A, 60B, 60C:
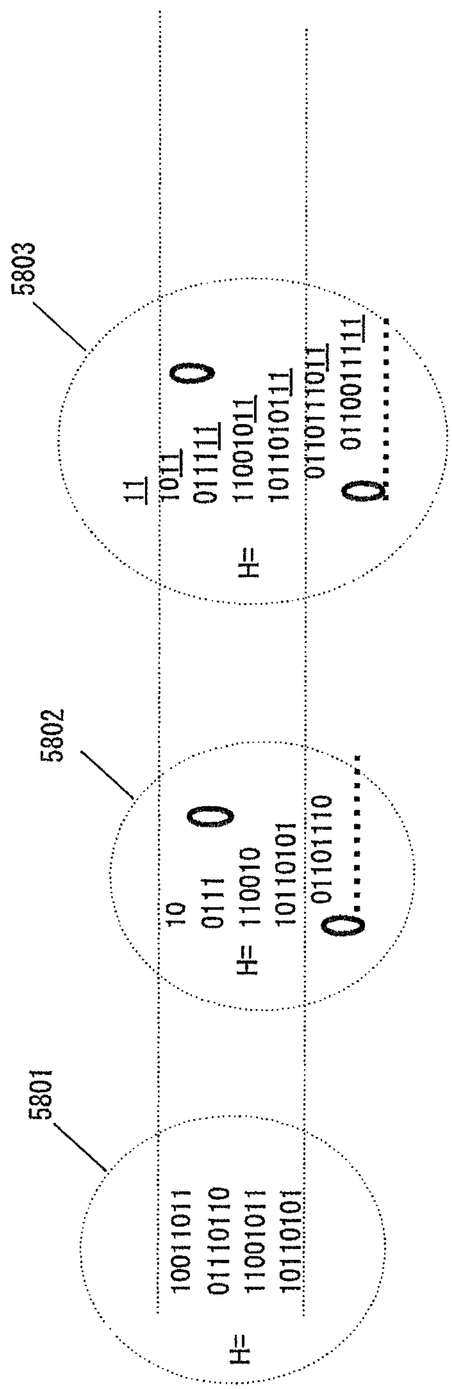
Figure 61:
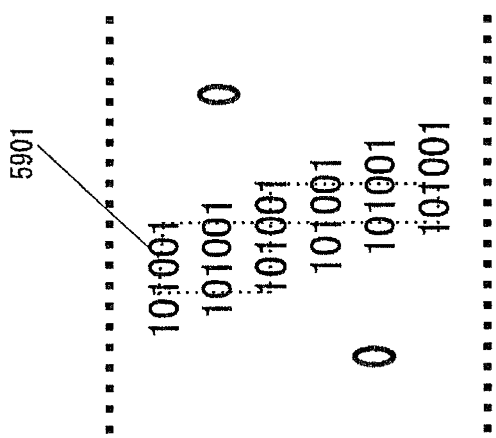
Figure 62:
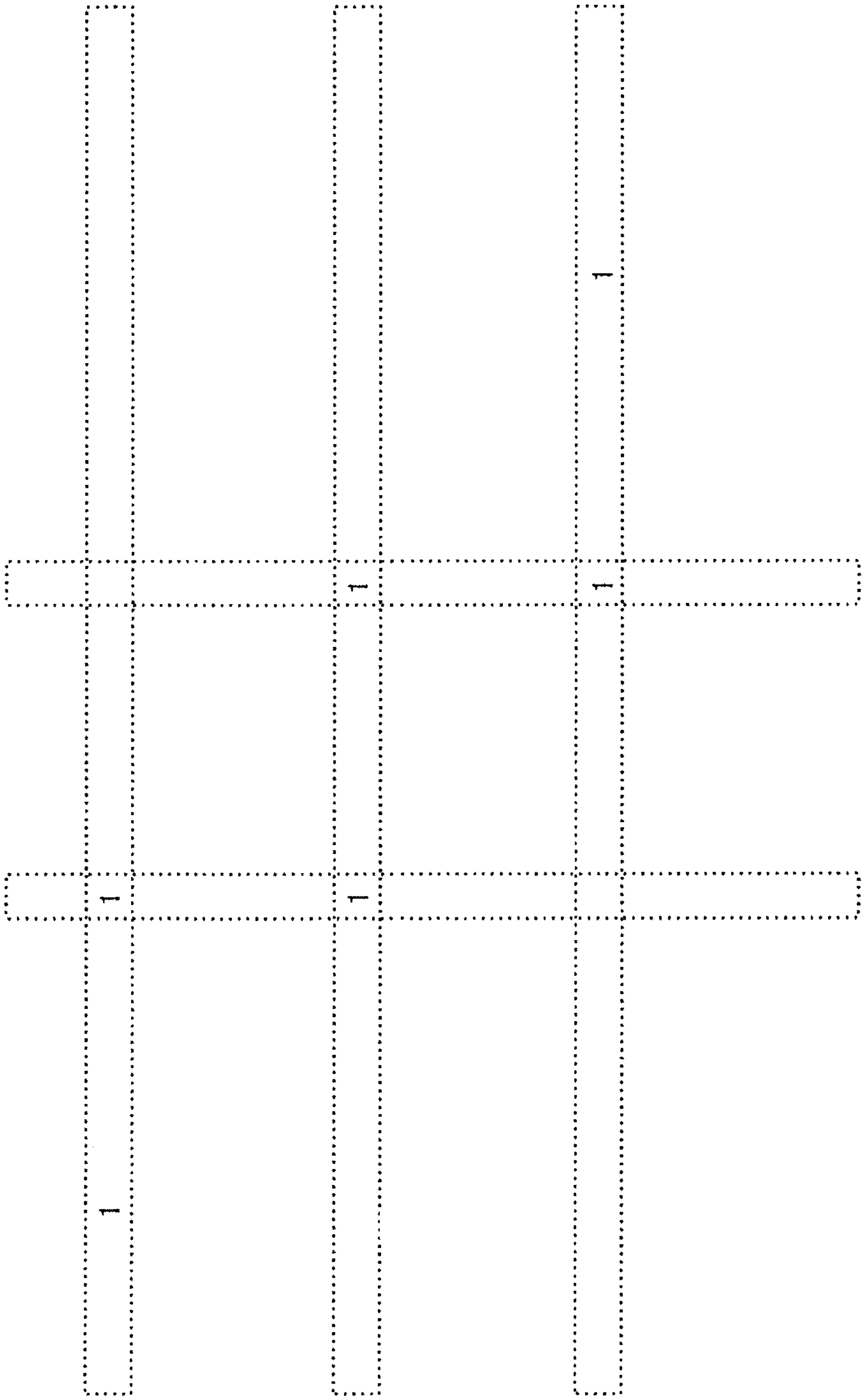
Figure 63:
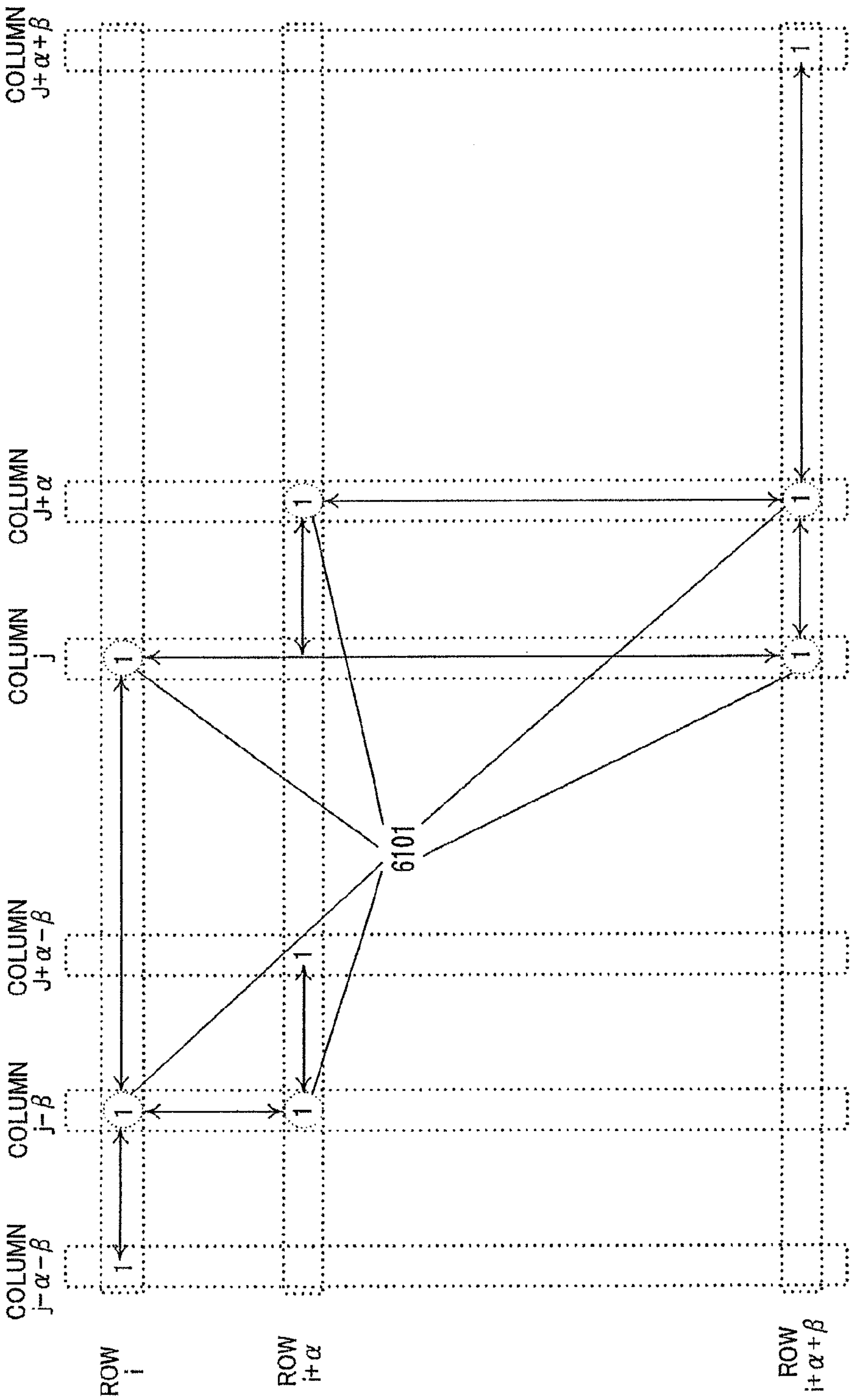
Figure 64:
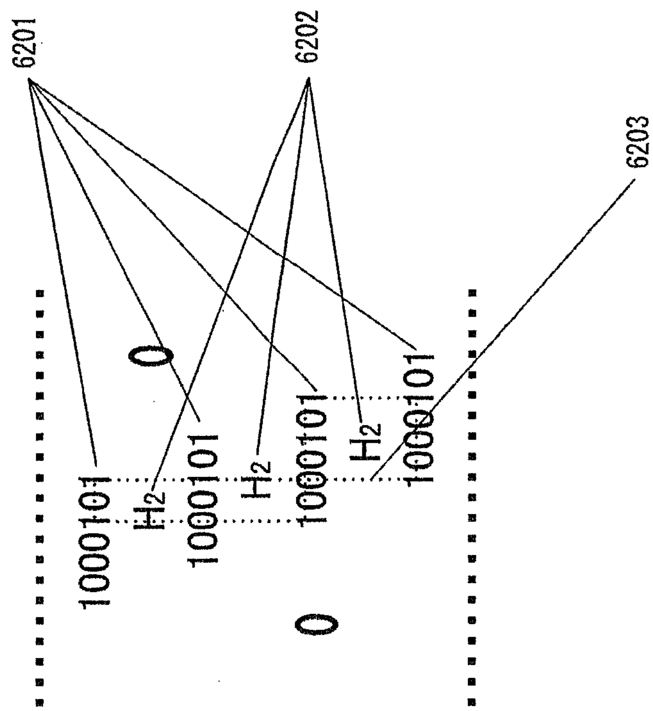
Figure 65:
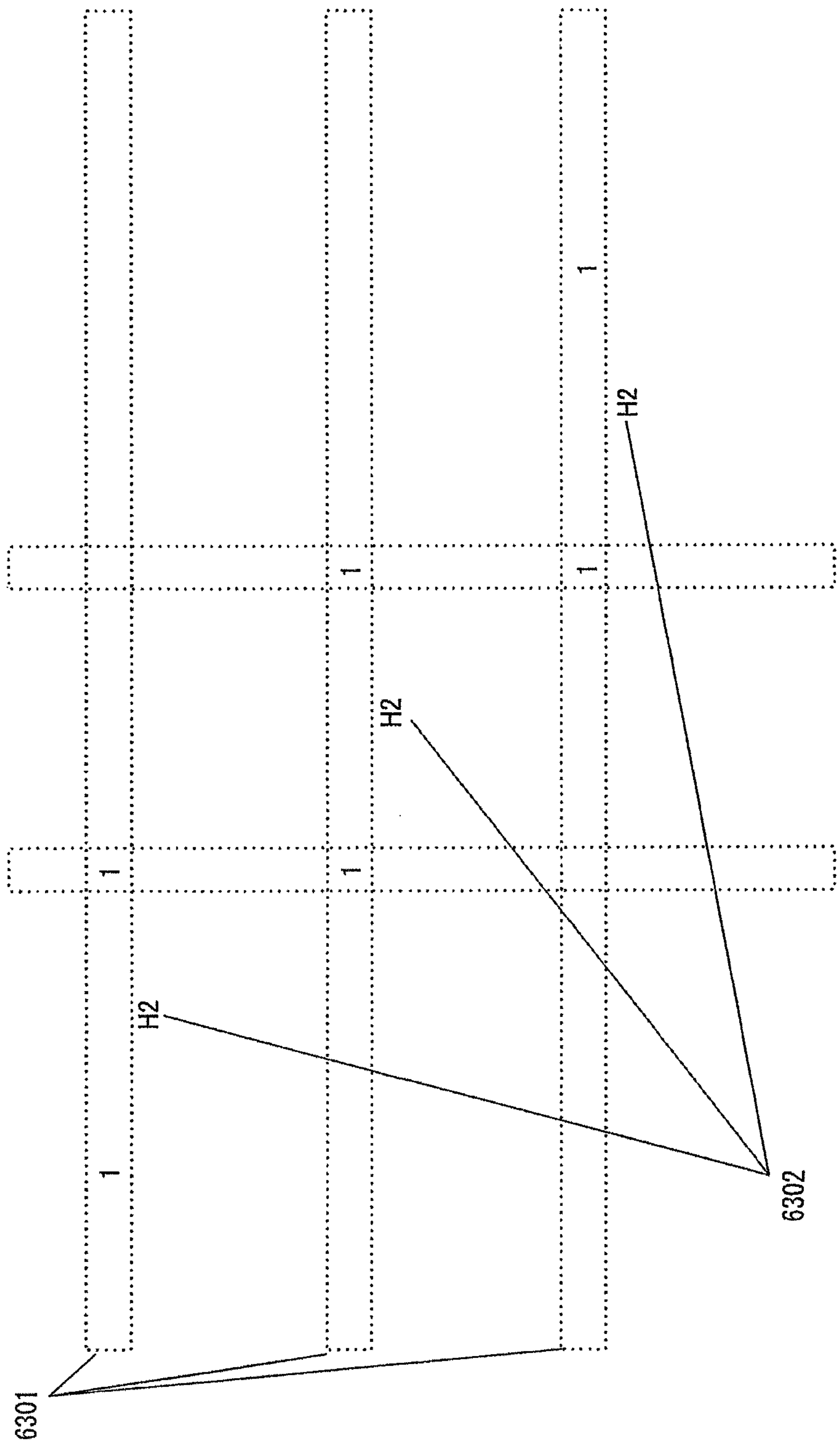
Figure 66:
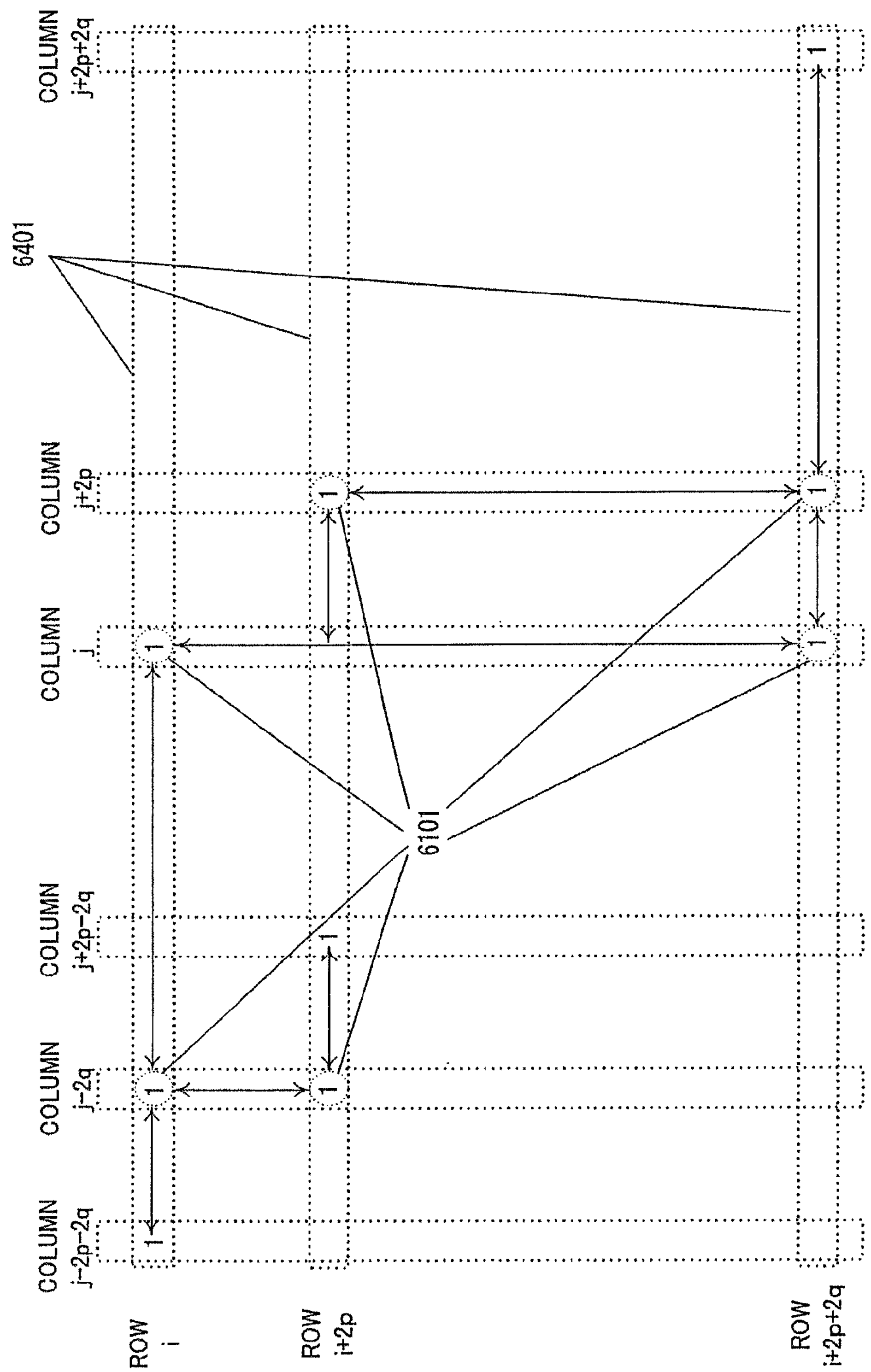
Figure 67A:
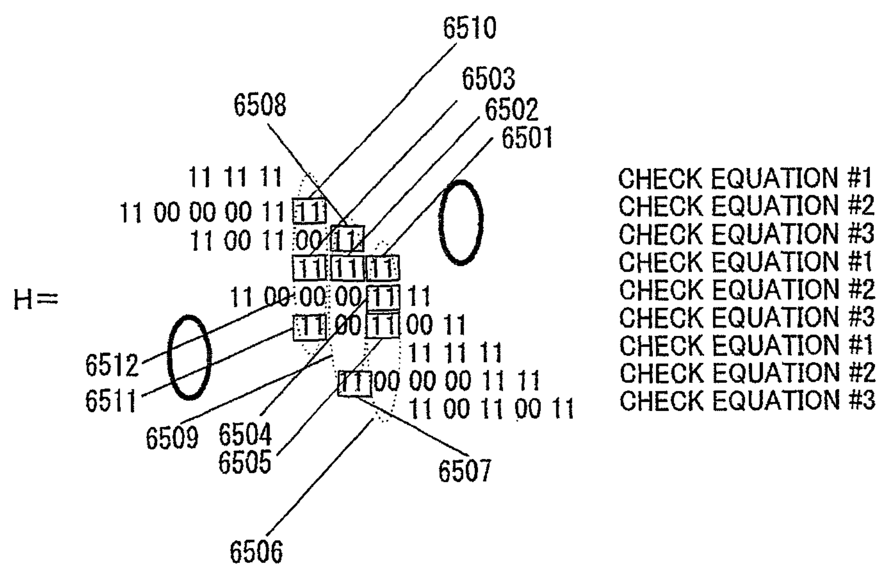
Figure 67B:
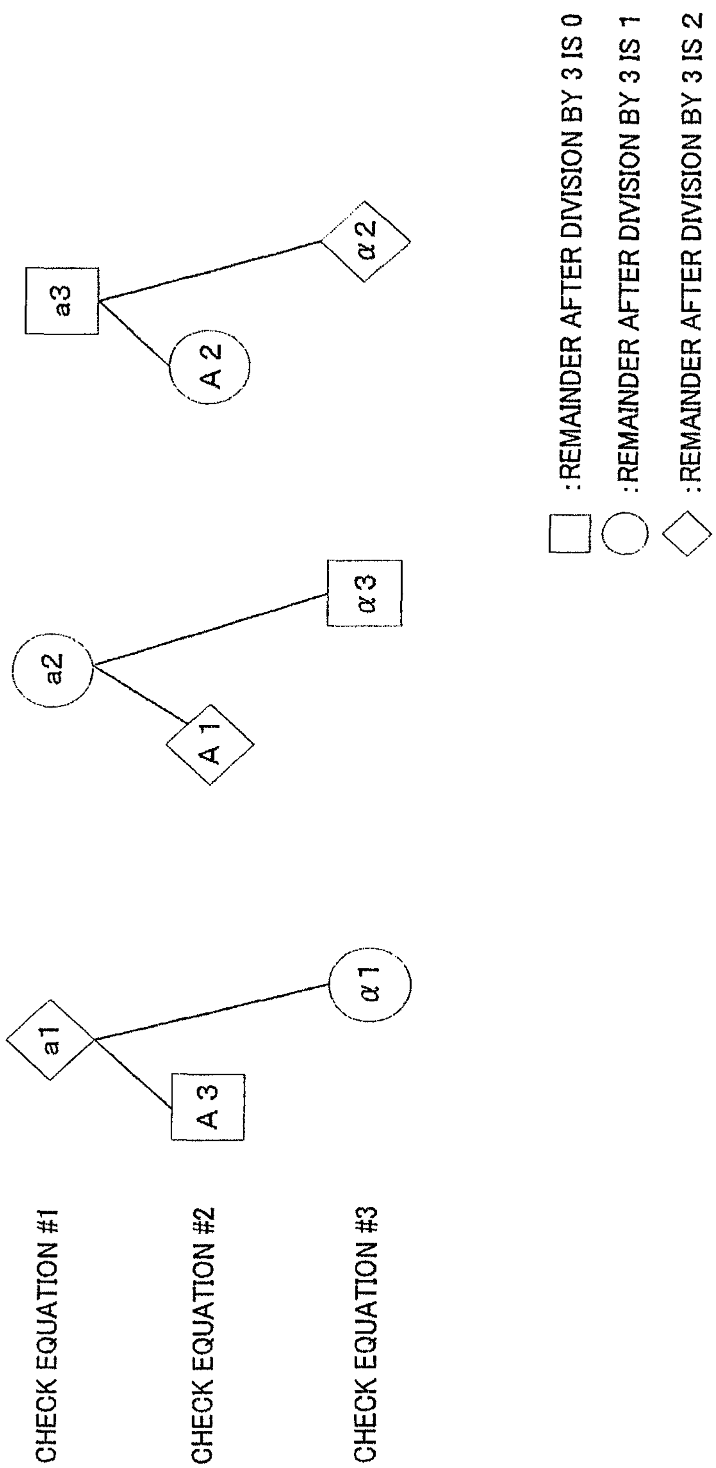
Figure 67C:
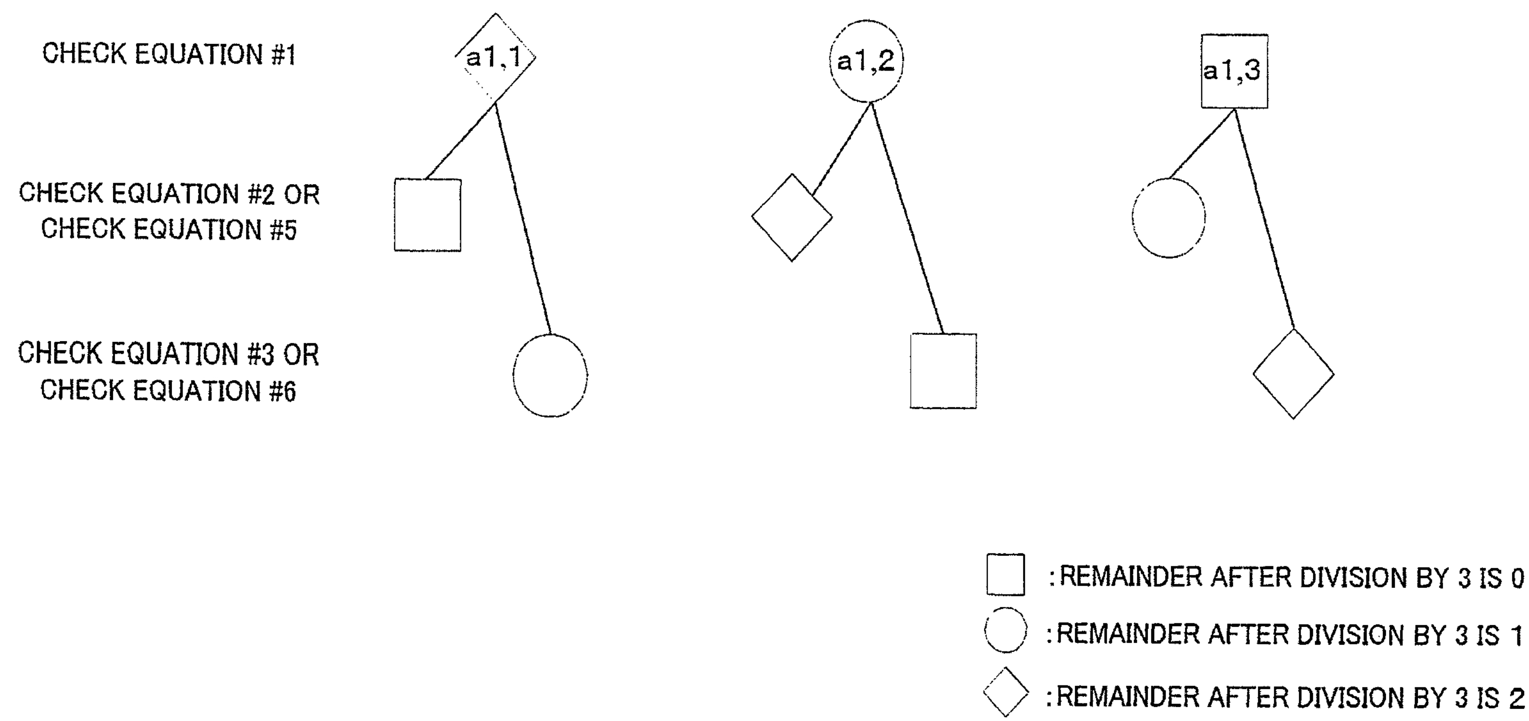
Figure 68:
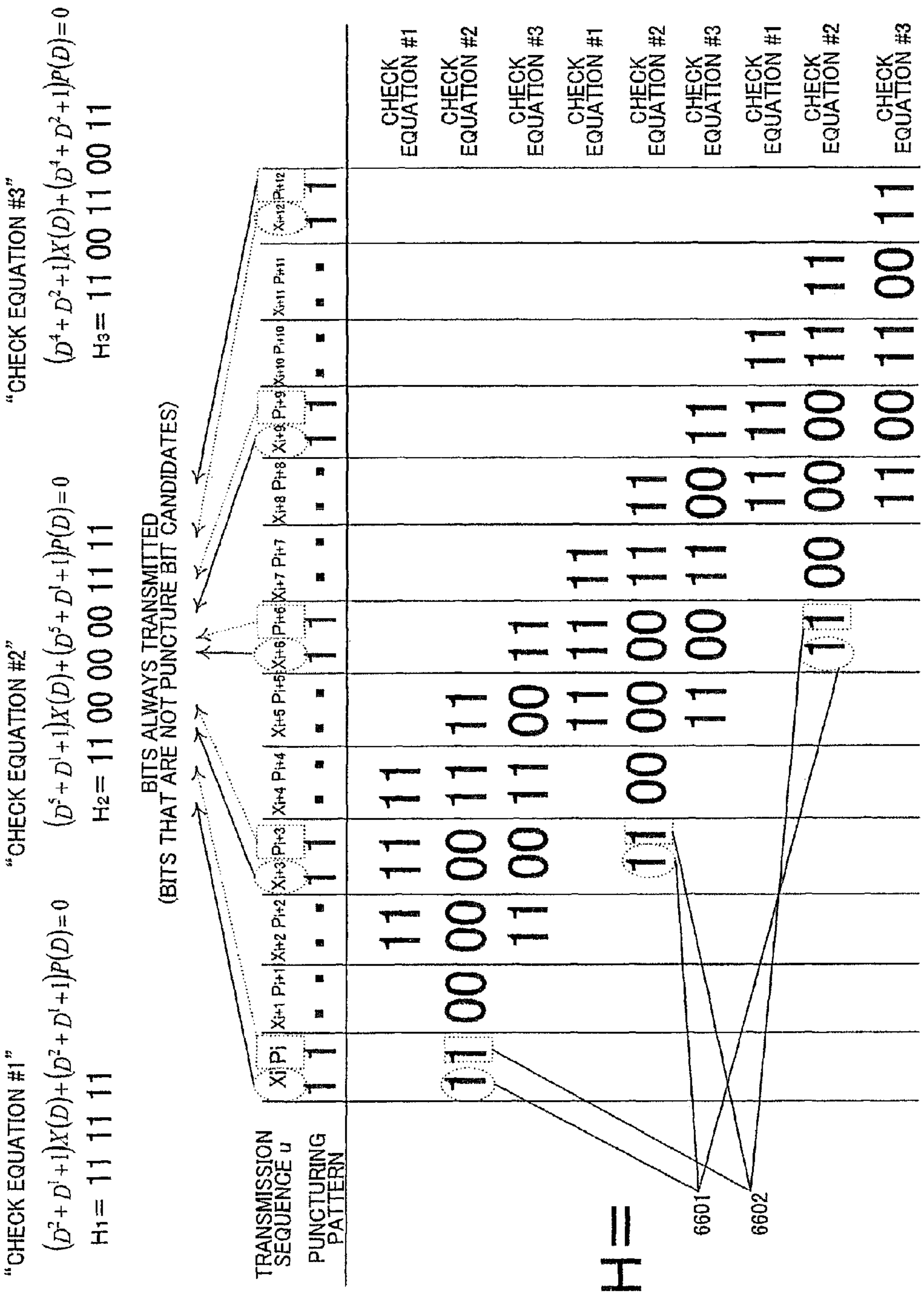
Figure 69:
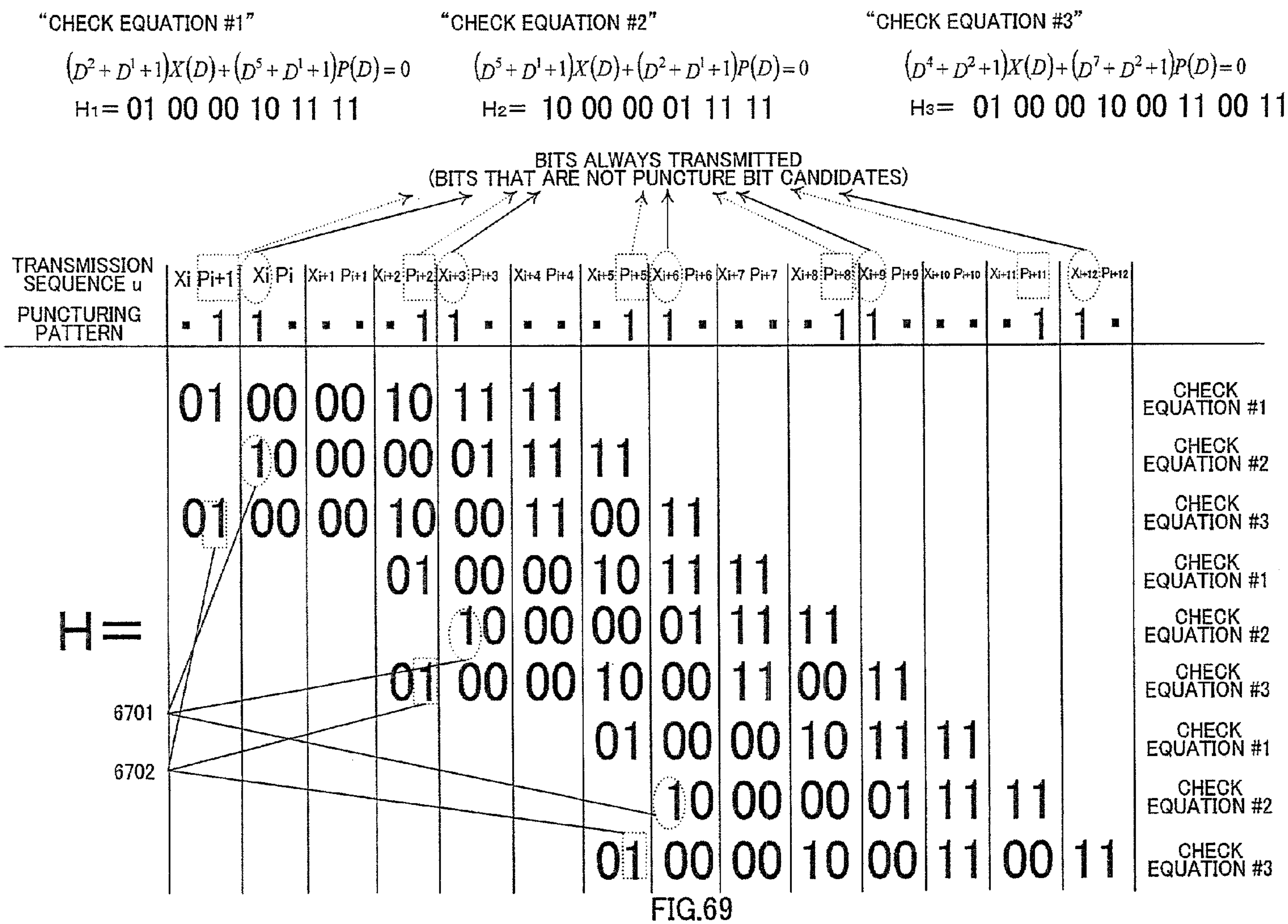

FIG. 60A, FIG. 60B, and FIG. 60C are drawings provided to explain the design method described in Non-Patent Document 16;

FIG. 61 shows a sub-matrix provided to explain Theorem 1;

FIG. 62 shows a sub-matrix provided to explain Theorem 1;

FIG. 63 shows a sub-matrix provided to explain Theorem 1;

FIG. 64 shows a sub-matrix provided to explain Theorem 2;

FIG. 65 shows a sub-matrix provided to explain Theorem 2;

FIG. 66 shows a sub-matrix provided to explain Theorem 2;

FIG. 67A shows parity check polynomials and a parity check matrix H configuration of an LDPC-CC of a time varying period of 3;

FIG. 67B shows the belief propagation relationship of terms relating to X(D) of "check equation #1" through "check equation #3" in FIG. 67A;

FIG. 67C shows the belief propagation relationship of terms relating to X(D) of "check equation #1" through "check equation #6";

FIG. 68 shows a correspondence relationship of parity check matrix H of an LDPC-CC of a time varying period of 3, transmission sequence u, and parity patterns in accordance with [Condition #1] and [Condition #2]; and FIG. 69 shows another correspondence relationship of LDPC-CC parity check matrix H of a time varying period of 3, transmission sequence u, and parity patterns in accordance with [Condition #1] and [Condition #2].

BEST MODE FOR CARRYING OUT THE INVENTION

Now, embodiments of the present invention will be described in detail with reference to the accompanying drawings.

Embodiment 1

In Embodiment 1, a method of designing a new LDPC-CC from a (7, 5) convolutional code will be described in detail.

Figure 2:
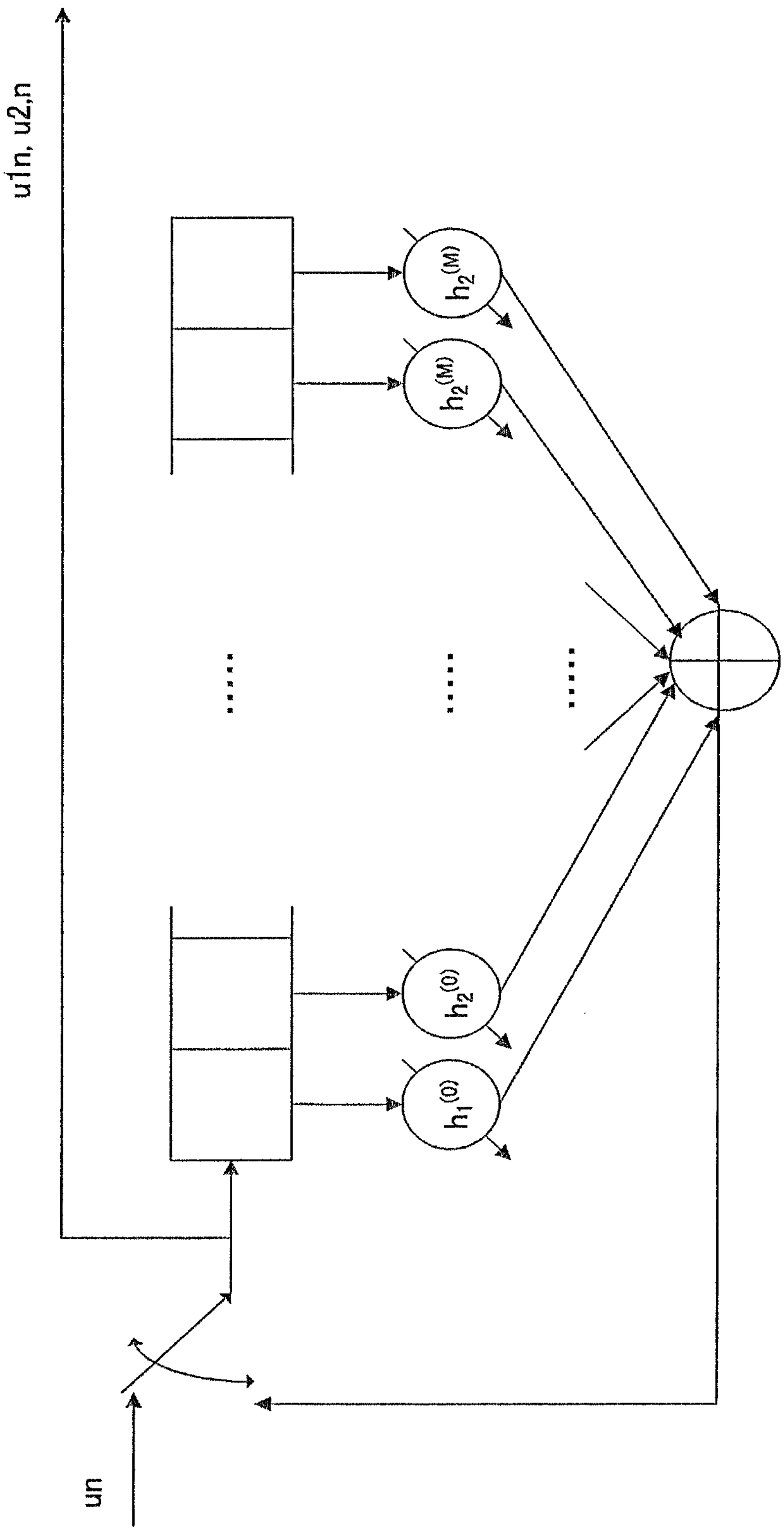
FIG. 2 shows a configuration of an LDPC-CC encoder.
Figure 3:
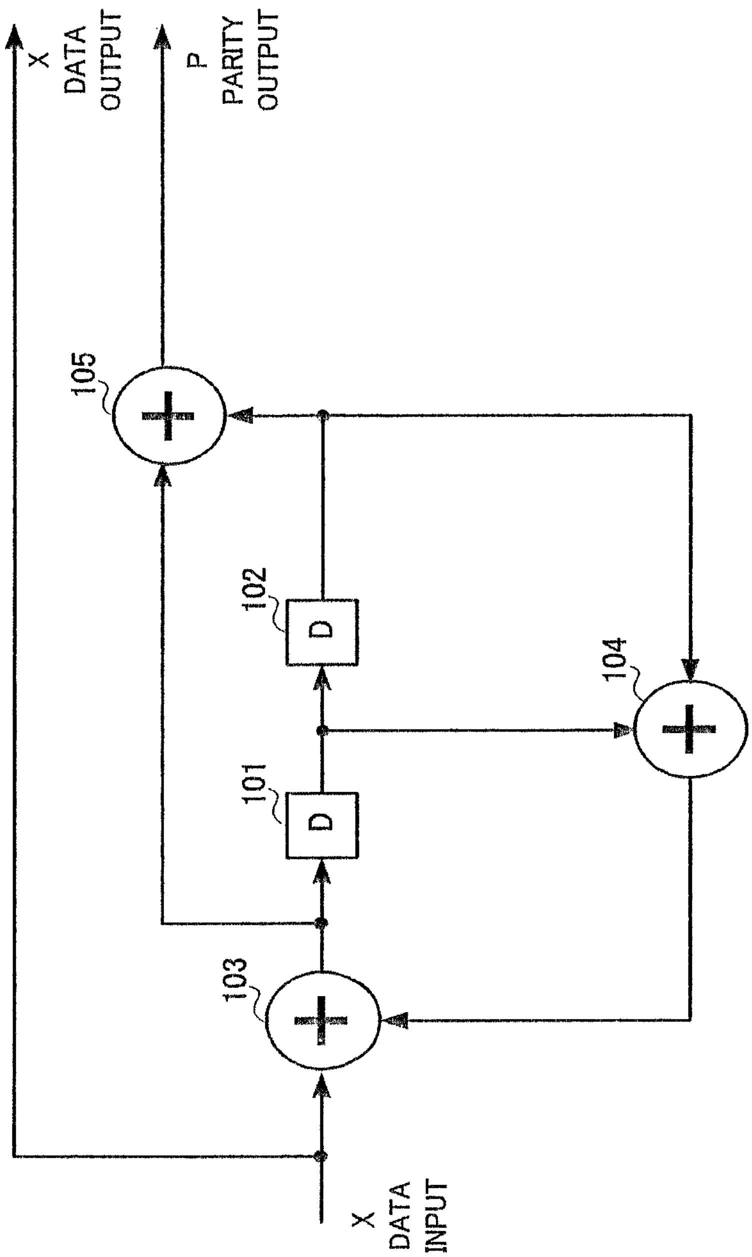
FIG. 3 shows an encoder with a (7, 5) convolutional code.

FIG. 3 shows a configuration of an encoder with a (7, 5) convolutional code. The encoder shown in FIG. 3 has shift registers 101 and 102, and exclusive OR circuits 103, 104, and 105. The encoder shown in FIG. 3 outputs output x and parity p for input x. This code is a systematic code.

In the present invention, the fact that a convolutional code, which is a systematic code, is used is important. This point will be explained in detail in Embodiment 2.

A convolutional code of a coding rate of ½ and generating polynomial $G=[1\ G_1(D)/G_0(D)]$ will be considered as an example. At this time, $G_1$ represents a feed-forward polynomial and $G_0$ represents a feedback polynomial. If polynomial representation of an information sequence (data) is X(D), and a parity sequence polynomial representation is P(D), a parity check polynomial is represented as shown in Equation 1 below.

$$G_1(D)X(D)+G_0(D)P(D)=0 \qquad \text{(Equation 1)}$$

Here, D is a delay operator.

FIG. 4 shows information relating to a (7, 5) convolutional code. A (7, 5) convolutional code generating polynomial is represented as $G=[1\ (D^2+1)/(D^2+D+1)]$. Therefore, a parity check polynomial is as shown in Equation 2 below.

$$(D^2+1)X(D)+(D^2+D+1)P(D)=0 \qquad \text{(Equation 2)}$$

Here, data at point in time i is represented by $X_i$, and parity by $P_i$, and transmission sequence Wi is represented as $W_i=(X_i, P_i)$. Then transmission vector w is represented as $w=(X_1, P_1, X_2, P_2, \ldots, X_i, P_i)^T$. Thus, from Equation 2, parity check matrix H can be represented as shown in FIG. 4. At this time, the relational equation in Equation 3 below holds true.

$$Hw=0 \qquad \text{(Equation 3)}$$

Therefore, in a receiving apparatus, parity check matrix H is used, and decoding can be performed using Belief Propagation (BP) decoding, min-sum decoding similar to BP decoding, offset BP decoding, Normalized BP decoding, shuffled BP decoding, or suchlike belief propagation, as shown in Non-Patent Document 8 through Non-Patent Document 10.

Here, in the parity check matrix in FIG. 4, the part to the lower-left of row number=column number "1"s (the part to the lower-left of 201 in FIG. 4) is defined as an approximate lower triangular matrix. The part to the upper-right of row number=column number "1"s is defined as an upper trapezoidal matrix.

Next, a design method for an LDPC-CC according to the present invention will be described in detail.

In order to implement an encoder with a simple configuration, a method is adopted whereby "1" is added to an approximate lower triangular matrix of parity check matrix H for a (7, 5) convolutional code shown in FIG. 4.

<Encoding Method>

Here, it will be assumed as an example that "1"s added to the parity check matrix in FIG. 4 comprise one data "1" and one parity "1." When "1" is added to data and parity to the approximate lower triangular matrix of parity check matrix H in FIG. 4, a check polynomial is represented as shown in Equation 4 below. In Equation 4, $\alpha\geq3$ and $\beta\geq3$.

$$(D^\alpha+D^2+1)X(D)+(D^\beta+D^2+D+1)P(D)=0 \qquad \text{(Equation 4)}$$

Therefore, parity P(D) is represented as shown in Equation 5 below.

$$P(D)=(D^{+}+D^2+1)X(D)+(D^\beta+D^2+D)P(D) \qquad \text{(Equation 5)}$$

When "1" is added to an approximate lower triangular matrix of a parity check matrix, since $D^\beta P(D)$, $D^2P(D)$, and DP(D) are past data and are known values, parity P(D) can easily be found.

<Positions at Which "1" is Added>

Figure 5:
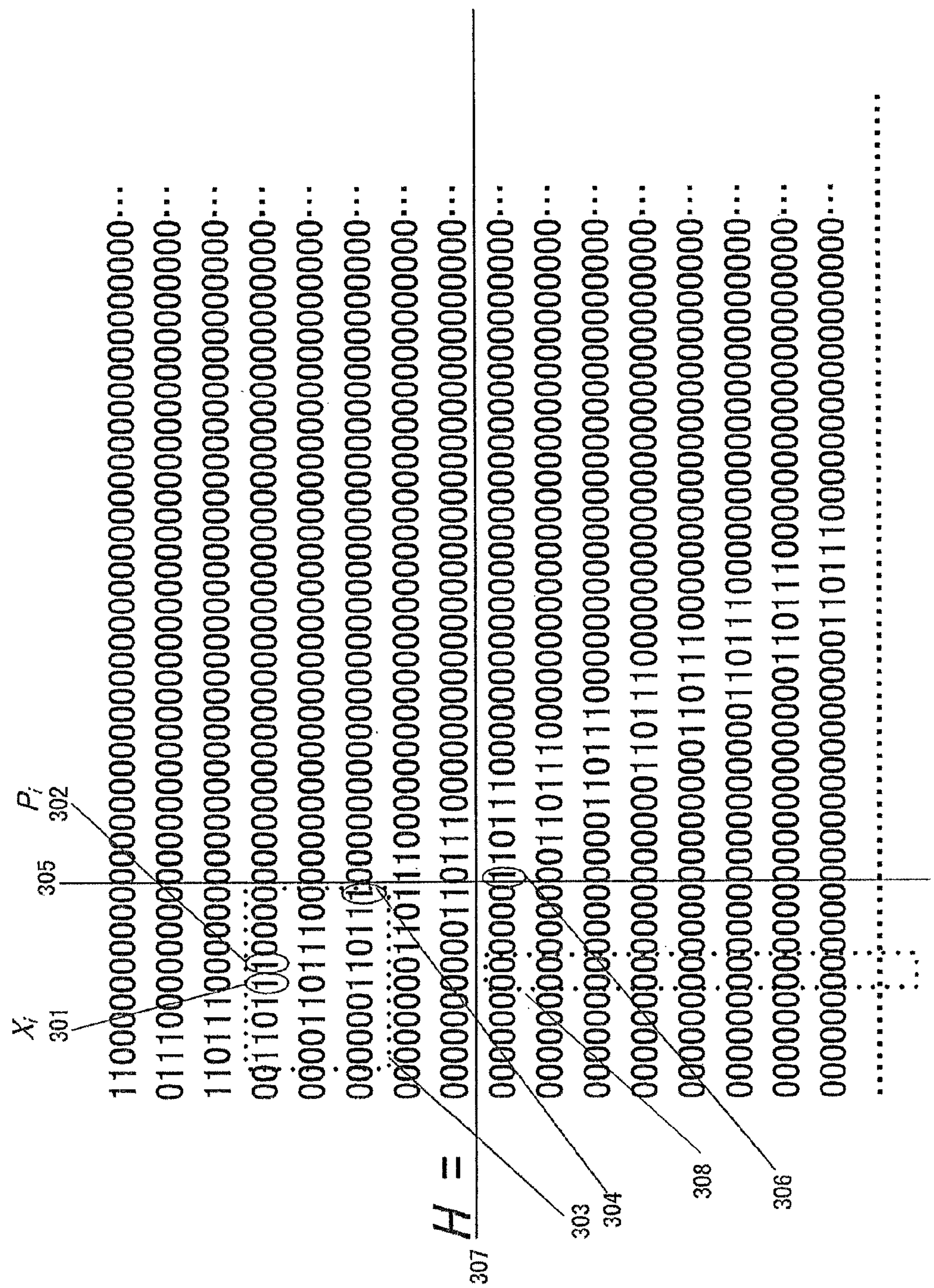
FIG. 5 shows a parity check matrix of a (7, 5) convolutional code.

Next, positions of added "1"s will be described in detail using FIG. 5. In FIG. 5, reference code 301 indicates a "1" relating to decoding of data $X_i$ of point in time i, and reference code 302 indicates a "1" relating to decoding of parity Pi of point in time i. Dotted line 303 is a protograph involved in propagation of external information for data Xi and parity $P_i$ of point in time i when one BP decoding operation is performed. That is to say, belief from point in time i−2 to point in time i+2 is involved in propagation.

Boundary line 305 is drawn vertically for the rightmost "1" (304) of protograph 303. Then boundary line 307 is drawn for the leftmost "1" (306) adjacent to boundary line 305. Then "1" is added somewhere in area 308 so that belief from boundary line 305 onward is propagated to data $X_i$ and parity Pi of point in time i. By this means, a probability that could not be obtained before adding "1," that is, belief other than from point in time i−2 to point in time i+2, can be propagated. In order to propagate a new probability, it is necessary to add to area 308 in FIG. 5.

Here, the width from the rightmost "1" to the leftmost "1" in each row of parity check matrix H in FIG. 5 is designated L. Thus far, a position at which "1" is added has been described in the column direction. Considering this in the row direction, in the parity check matrix in FIG. 4, "1" is added at a position L-2 or more to the left of the leftmost "1." Also, when described in terms of a check polynomial, $\alpha$ should be set to 5 or above and $\beta$ to 5 or above in Equation 4.

This will be considered represented by a general expression. A general expression for a parity check polynomial of a convolutional code is represented as shown in Equation 6 below.

$$(D^K+\ldots+1)X(D)+(D^K+\ldots+1)P(D)=0 \quad \text{(Equation 6)}$$

When "1" are added as data and parity to the approximate lower triangular matrix of parity check matrix H, a check polynomial is represented as shown in Equation 7 below.

$$(D^\alpha+D^K+\ldots+1)X(D)+(D^\beta+D^K+\ldots+1)P(D)=0 \quad \text{(Equation 7)}$$

In this case, $\alpha$ should be set to 2K+1 or above and $\beta$ to 2K+1 or above, where $K\geq2$.

Figure 6:
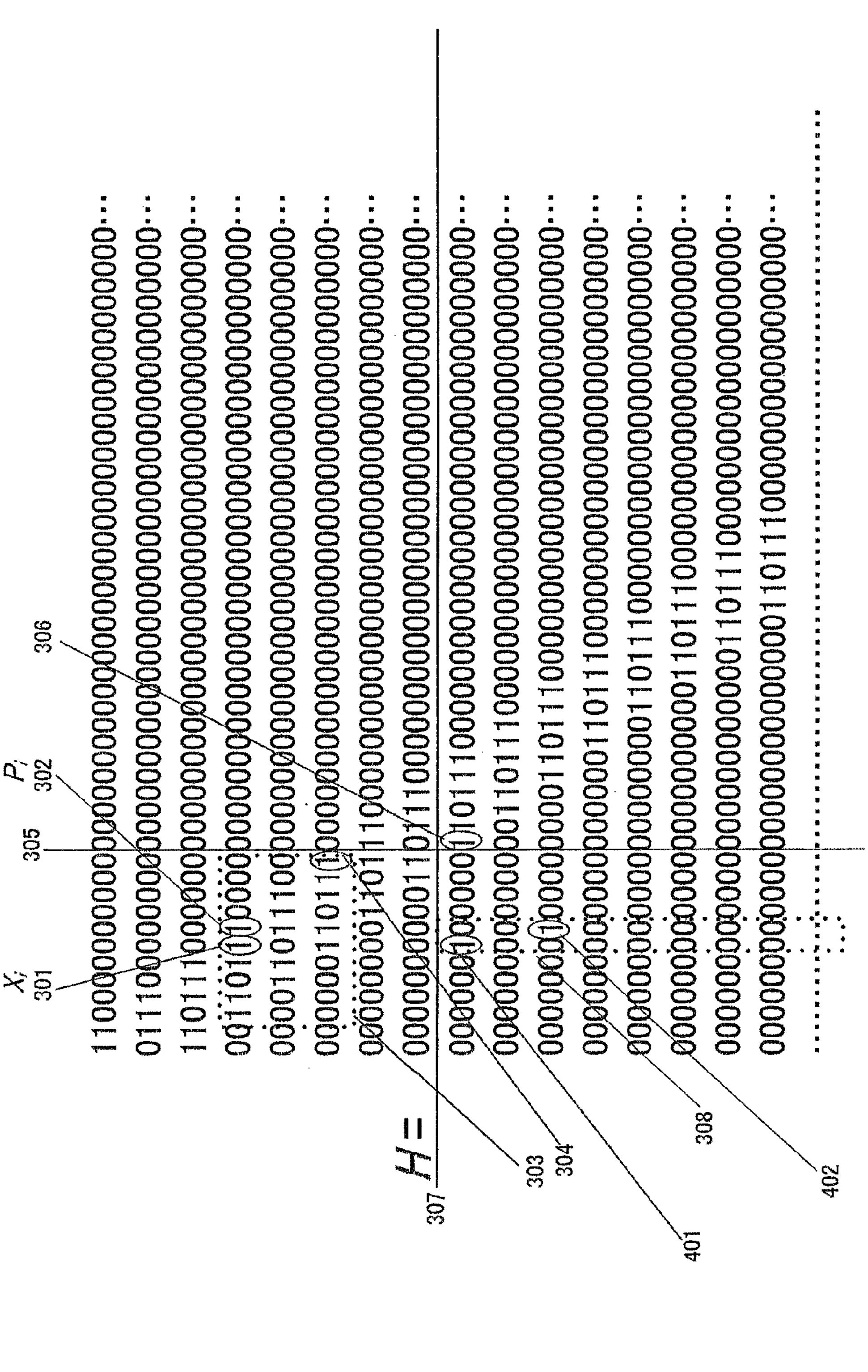
FIG. 6 shows an example of a case in which "1" is added to an approximate lower triangular matrix of the parity check matrix in FIG. 5.
Figure 7:
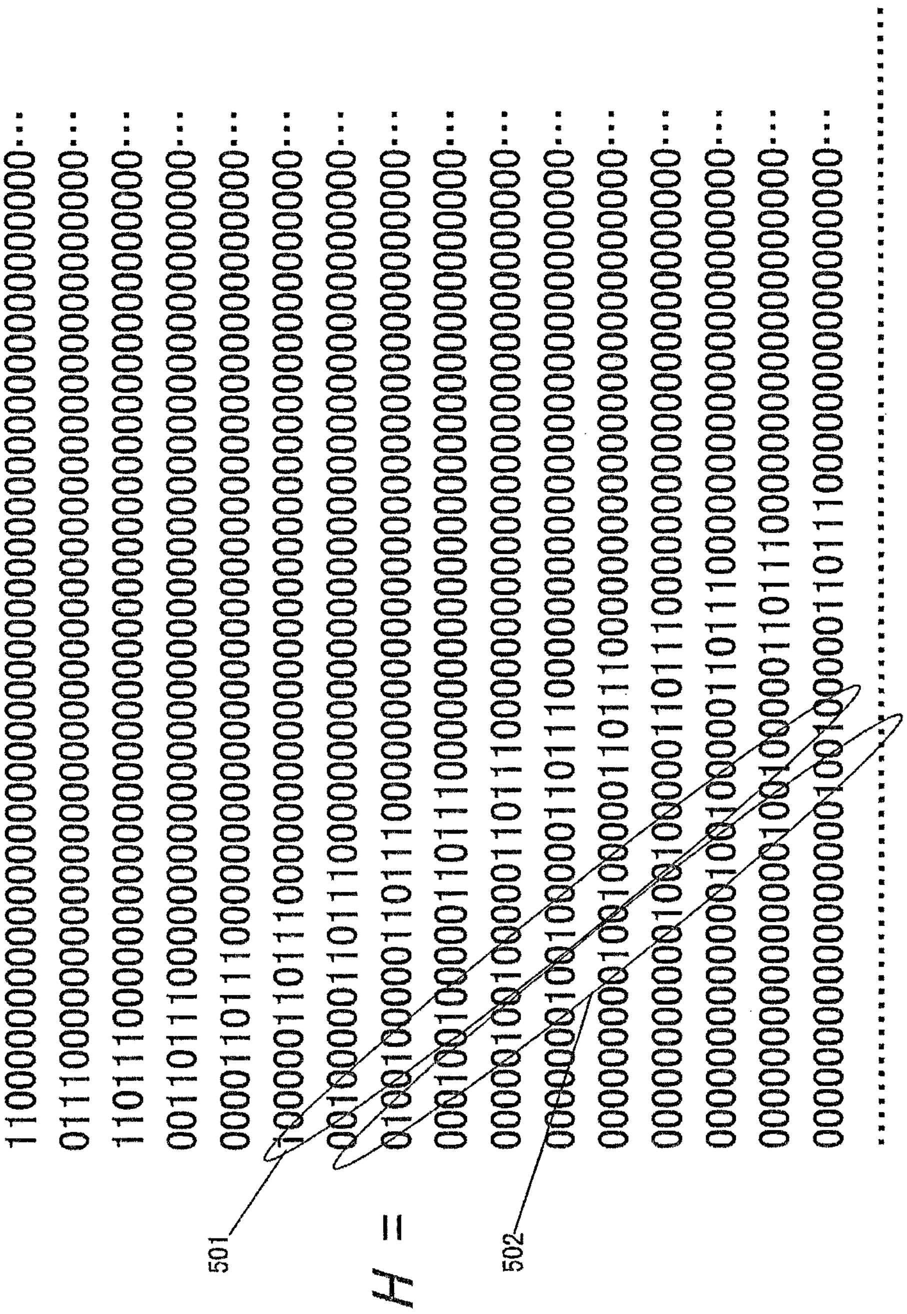
FIG. 7 shows an example of the configuration of an LDPC-CC parity check matrix according to Embodiment 1.

FIG. 6 shows an example of a case in which "1" is added to the approximate lower triangular matrix of the parity check matrix in FIG. 5. When "1" is added for data and parity of all points in time, the parity check matrix is represented as shown in FIG. 7. FIG. 7 shows an example of the configuration of an LDPC-CC parity check matrix according to this embodiment. In FIG. 7, "1"s inside areas 501 and 502 are added "1"s, and a code having parity check matrix H is an LDPC-CC according to this embodiment. At this time, a check polynomial is represented as shown in Equation 8 below.

$$(D^5+D^2+1)X(D)+(D^7+D^2+D+1)P(D)=0 \quad \text{(Equation 8)}$$

Creating an LDPC-CC from a convolutional code by adding "1"s to an approximate lower triangular matrix of parity check matrix H in a transmitting apparatus as described above enables a receiving apparatus to obtain good received quality by performing BP decoding or approximated BP decoding using a parity check matrix of the created LDPC-CC.

In this embodiment, a case has been described in which one "1" is added for data and for parity respectively, but the present invention is not limited to this, and a method may also be used, for example, whereby "1" is added for either data or parity. As an example, consider a case in which there is no $D^\beta$ in Equation 7 above. At this time, a receiving apparatus can obtain good received quality if $\alpha$ is set to 2K+1 or above. Conversely, to consider a case in which there is no $D^\alpha$ in Equation 7, at this time the receiving apparatus can obtain good received quality if $\beta$ is set to 2K+1 or above.

Received quality is also greatly improved by a code in which a plurality of "1"s are added for both data and parity. For instance, as an example of a case in which a plurality of "1"s are inserted, a parity check polynomial of a certain convolutional code is assumed to be represented by Equation 9. In Equation 9, K>2.

$$(D^K+\ldots+1)X(D)+(D^K+\ldots+1)P(D)=0 \quad \text{(Equation 9)}$$

When a plurality of "1"s are added as data and parity in an approximate lower triangular matrix of parity check matrix H, a check polynomial is represented as shown in Equation 10 below.

$$(D^{\alpha1}+\ldots+D^{\alpha n}+D^K+\ldots+1)X(D)+(D^{\beta1}+\ldots+D^{\beta m}+D^K+\ldots+1)P(D)=0 \quad \text{(Equation 10)}$$

In this case, good received quality can be obtained by a receiving apparatus if $\alpha_1, \ldots, \alpha_n$ are set to 2K+1 or above and $\beta_1, \ldots, \beta_m$ are set to 2K+1 or above. This point is important in this embodiment.

However, good received quality can still be obtained by the receiving apparatus if at least one of $\alpha_1, \ldots, \alpha_n$ is 2K+1 or above. Also, good received quality can still be obtained by the receiving apparatus if at least one of $\beta_1, \ldots, \beta_m$ is 2K+1 or above.

Also, when a check polynomial of an LDPC-CC is represented as shown in Equation 11 below, good received quality can be obtained by a receiving apparatus if $\alpha_1, \ldots, \alpha_n$ are set to 2K+1 or above and $\beta_1, \ldots, \beta_m$ are set to 2K+1 or above. This point is important in this embodiment.

$$(D^{\alpha1}+\ldots+D^{\alpha n}+D^K+\ldots+1)X(D)+(D^K+\ldots+1)P(D)=0 \quad \text{(Equation 11)}$$

However, good received quality can still be obtained by the receiving apparatus if at least one of $\alpha_1, \ldots, \alpha_n$ is 2K+1 or above.

Also, when a check polynomial of an LDPC-CC is represented as shown in Equation 12 below, good received quality can be obtained by a receiving apparatus if $\beta_1, \ldots, \beta_m$ are set to 2K+1 or above. This point is important in this embodiment.

$$(D^K+\ldots+1)X(D)+(D^{\beta1}+\ldots+D^{\beta m}+D^K+\ldots+1)P(D)=0 \quad \text{(Equation 12)}$$

However, good received quality can still be obtained by the receiving apparatus if at least one of $\beta_1, \ldots, \beta_n$ is 2K+1 or above.

Next, a method of designing an LDPC-CC from a parity check polynomial different from Equation 2 of a (7, 5) convolutional code will be described in detail. Here, as an example, a case will be described in which two "1"s are added for data and two "1"s are added for parity.

Parity check polynomials different from Equation 2 of a (7, 5) convolutional code are shown in Non-Patent Document 11. One example is represented as shown in Equation 13 below.

$$(D^9+D^6+D^5+1)X(D)+(D^9+D^8+D^3+D+1)P(D)=0 \quad \text{(Equation 13)}$$

In this case, parity check matrix H can be represented as shown in FIG. 8.

<Encoding Method>

Here, a case will be described in which two "1"s are added to both data and parity for the parity check matrix in FIG. 8. When two "1"s are added to both data and parity in the approximate lower triangular matrix of parity check matrix H in FIG. 8, a check polynomial is represented as shown in Equation 14 below.

$$(D^{\alpha1}+D^{\alpha2}+D^9+D^6+D^5+1)X(D)+(D^{\beta1}+D^{\beta2}+D^9+D^8+D^3+D+1)P(D)=0 \quad \text{(Equation 14)}$$

Therefore, parity P(D) can be represented as shown in Equation 15 below.

$$P(D)=(D^{\alpha1}+D^{\alpha2}+D^9+D^6+D^5+1)X(D)+(D^{\beta1}+D^{\beta2}+D^9+D^8+D^3D)P(D) \quad \text{(Equation 15)}$$

Thus, when "1" is added to an approximate lower triangular matrix of a parity check matrix, since $D^{\beta1}P(D)$, $D^{\beta2}P(D)$, $D^9P(D)$, $D^8P(D)$, $D^3P(D)$ and DP(D) are past data and are known values, parity P(D) can easily be found.

<Positions at Which "1" is Added>

Good received quality can be obtained by a receiving apparatus if $\alpha_1$, $\alpha_2$ are set to 19 or above and $\beta_1$, $\beta_2$ are set to 19 or above in order to obtain the same kind of effect as described above. As an example, it will be assumed that settings $\alpha_1=26$, $\alpha_2=19$, $\beta_1=30$, and $\beta_2=24$ are made for the parity check matrix in FIG. 9. By this means, for the same reason as given above, good received quality can be obtained by the receiving apparatus.

From the above example, a method of creating an LDPC-CC from a convolutional code comprises the kind of procedure described below. The following procedure is an example of a case in which the convolutional code has a coding rate of 12.

<1> Select a convolutional code that gives good characteristics.

<2> Generate a check polynomial for the selected convolutional code (for example, Equation 6). It is important to use the selected convolutional code as a systematic code. A check polynomial is not limited to one as described above. It is necessary to select a check polynomial that gives good received quality. At this time, it is preferable to use an equivalent check polynomial of a higher order than a check polynomial generated from a generating polynomial (see Non-Patent Document 11).

<3> Create parity check matrix H for the selected convolutional code.

<4> Consider probability propagation for data or (and) parity, and add "1"s to the parity check matrix. Positions at which "1" is added are as explained above.

In this embodiment, a method of creating an LDPC-CC from a (7, 5) convolutional code has been described, but the present invention is not limited to a (7, 5) convolutional code, and can be similarly implemented using another convolutional code. Details of generating polynomial G of a convolutional code that gives good received quality at this time are given in Non-Patent Document 12.

As described above, according to this embodiment, by having a transmitting apparatus set $\alpha_1, \ldots, \alpha_n$ to 2K+1 or above and set $\beta_1, \beta_m$ to 2K+1 or above in Equation 10 and create an LDPC-CC from a convolutional code, a receiving apparatus can obtain good received quality by performing BP decoding or approximated BP decoding using a parity check matrix of the created LDPC-CC. Also, when an LDPC-CC is created from a convolutional code, the size of a protograph, that is, a check polynomial, is much smaller than that of a protograph shown in Non-Patent Document 6 or Non-Patent Document 7, and therefore the number of redundant bits generated when transmitting a packet for which the number of transmission data bits is small can be reduced, and the problem of a decrease in data transmission efficiency can be suppressed.

Embodiment 2

In Embodiment 2, a method of designing a new LDPC-CC from a (7, 5) convolutional code will be described in detail. Especially, a method of adding "1"s to an upper trapezoidal matrix of a parity check matrix will be described in detail.

Details of a parity check polynomial and parity check matrix H configuration of a (7, 5) convolutional code are as described in Embodiment 1.

A design method for an LDPC-CC according to the present invention will be described in detail.

Figure 10:
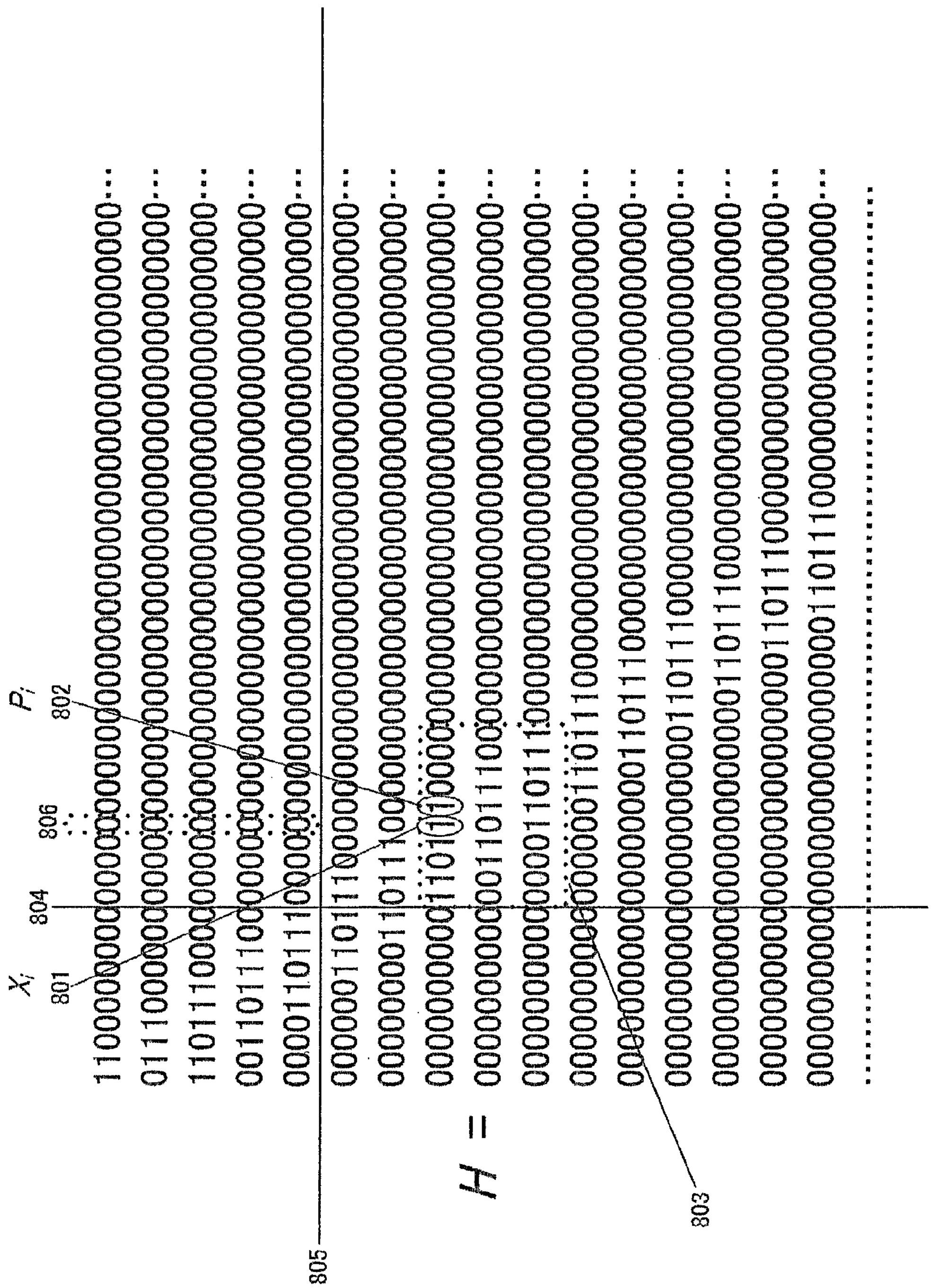
FIG. 10 shows a parity check matrix of a (7, 5) convolutional code.

In order to implement an encoder with a simple configuration, in the invention of this embodiment a method is adopted whereby "1" is added to an upper trapezoidal matrix of parity check matrix H for a (7, 5) convolutional code shown in FIG. 10.

<Encoding Method>

Here, it will be assumed as an example that "1"s added to the parity check matrix in FIG. 10 are added to data and parity. In this case, a check polynomial is represented as shown in Equation 16 below. In Equation 16, $\alpha_1, \ldots, \alpha_n \leq -1$, and $\beta_1, \ldots, \beta_m \leq -1$.

$$(D^2+1+D^{\alpha 1}+\ldots+D^{\alpha n})x(D)+(D^2+D+1+D^{\beta 1}+\ldots+D^{\beta m})P(D)+0 \quad \text{(Equation 16)}$$

Therefore, parity P(D) is represented as shown in Equation 17 below.

$$P(D)=(D^2+1+D^{\alpha 1}+\ldots+D^{\alpha n})X(D)+(D^2+D+D^{\beta 1}+\ldots+D^{\beta m})P(D) \quad \text{(Equation 17)}$$

Here, $D^{\alpha 1}X(D), \ldots, D^{\alpha n}X(D)$ are known since they are input data, but $D^{\beta 1}P(D), \ldots, D^{\beta m}P(D)$ are unknown values. Therefore, it is possible to insert "1" for a data related item in the upper trapezoidal matrix of parity check matrix H, but it is difficult to find a parity bit even if "1" is inserted for a parity related item. Thus, "1" is inserted for a data related item in the upper trapezoidal matrix of parity check matrix H. That is to say, when a check polynomial is represented by Equation 18, parity P(D) can be represented as shown in Equation 19 below, and parity P(D) can be found.

$$(D^2+1+D^{\alpha 1}+\ldots+D^{\alpha n})X(D)+(D^2+D+1)P(D)=0 \quad \text{(Equation 18)}$$

$$(\alpha_1, \ldots, \alpha_n \leq -1)$$

$$P(D)=(D^2+1+D^{\alpha 1}+\ldots+D^{\alpha n})X(D)+(D^2+D)P(D) \quad \text{(Equation 19)}$$

Here, in the case of a non-systematic code, only parity bits are present in a check polynomial, and therefore, as explained above, it is difficult to find a parity bit if "1" is added to the upper trapezoidal matrix of parity check matrix H. Thus, it can be seen that, in the present invention, it is important to use a convolutional code of systematic code.

<Positions at Which "1" is Added>

Next, positions of added "1"s will be described in detail using FIG. 10. In FIG. 10, reference code 801 indicates a "1" relating to decoding of data $X_i$ of point in time i, and reference code 802 indicates a "1" relating to decoding of parity Pi of point in time i. Dotted line 803 is a protograph involved in propagation of external information for data $X_i$ and parity $P_i$ of point in time i when one BP decoding operation is performed. That is to say, belief from point in time i−2 to point in time i+2 is involved in propagation.

Then boundary lines 804 and 805 are drawn in the same way as in Embodiment 1. Then "1" is added somewhere in area 806 so that belief before boundary line 804 is propagated to data Xi of point in time i. By this means, a probability that could not be obtained before adding "1," that is, probability other than from point in time i−2 to point in time i+2, can be propagated. In order to propagate a new probability, it is necessary to add to area 806 in FIG. 10.

Here, the width from the rightmost "1" to the leftmost "1" in each row of parity check matrix H in FIG. 10 is designated L. Thus far, a position at which "1" is added has been described in the column direction. Considering this in the row direction, in the parity check matrix in FIG. 4, "1" is added at a position L-2 or more to the right of the rightmost "1." Also, when described in terms of a check polynomial, $\alpha_1, \ldots, \alpha_n$ should be set to −2 or below in Equation 18.

This will be considered represented by a general expression. A general expression for a parity check polynomial of a convolutional code is represented as shown in Equation 6.

When "1" is added as data to the upper trapezoidal matrix of parity check matrix H, a check polynomial is represented as shown in Equation 20 below.

$$(D^{\alpha}+D^{K}+\ldots+1+D^{\alpha 1}+\ldots+D^{\alpha n})X(D)+(D^{K}+\ldots+1)P(D)=0 \quad \text{(Equation 20)}$$

In this case, good received quality can be obtained by setting $\alpha_1, \ldots, \alpha_n$ to −K−1 or below. However, good received quality can still be obtained if the condition that at least one of $\alpha_1, \ldots, \alpha_n$ is "−K−1 or below" is satisfied.

Figure 11:
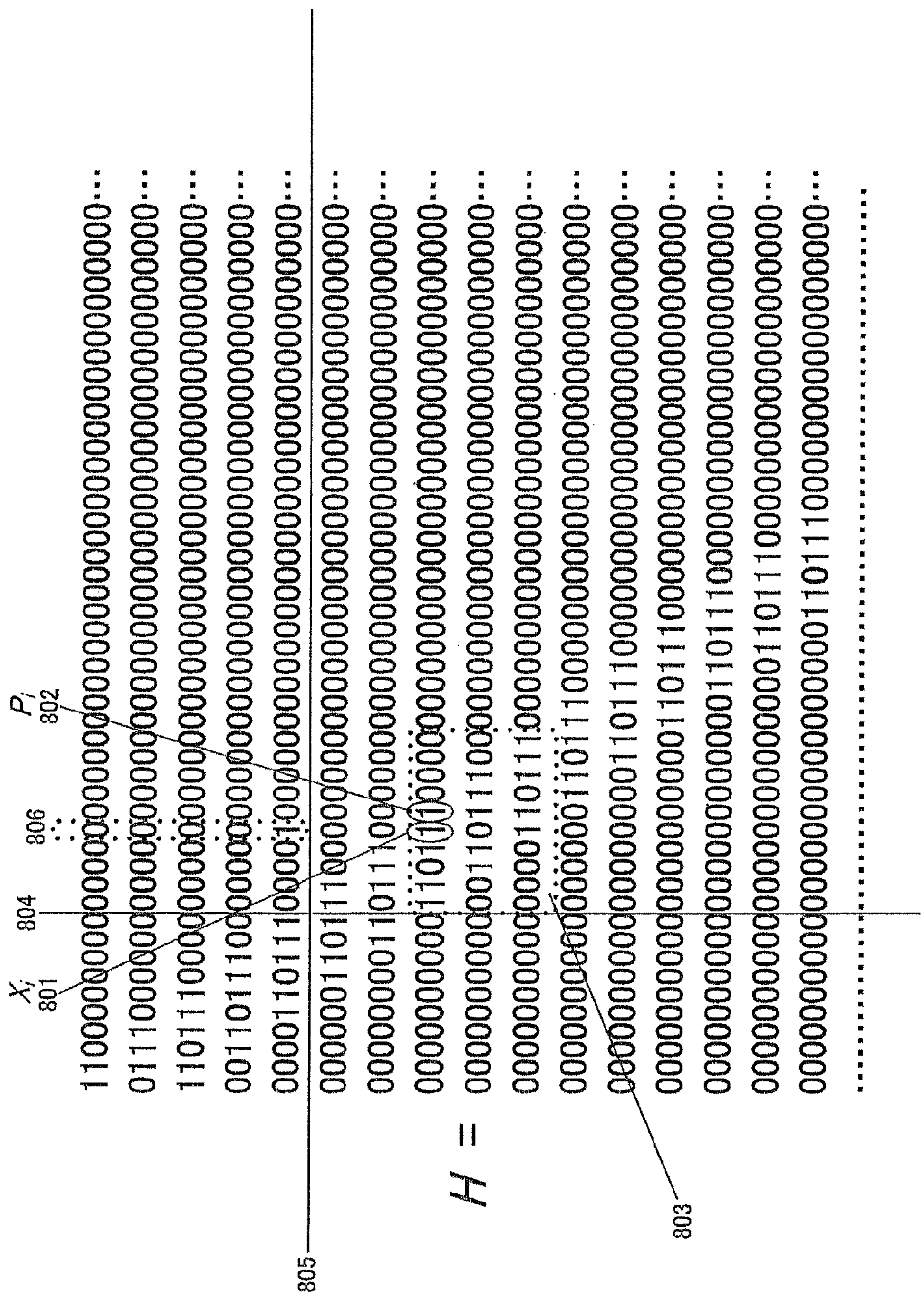
FIG. 11 shows an example of a case in which "1" is added to an upper trapezoidal matrix of the parity check matrix in FIG. 5.
Figure 12:
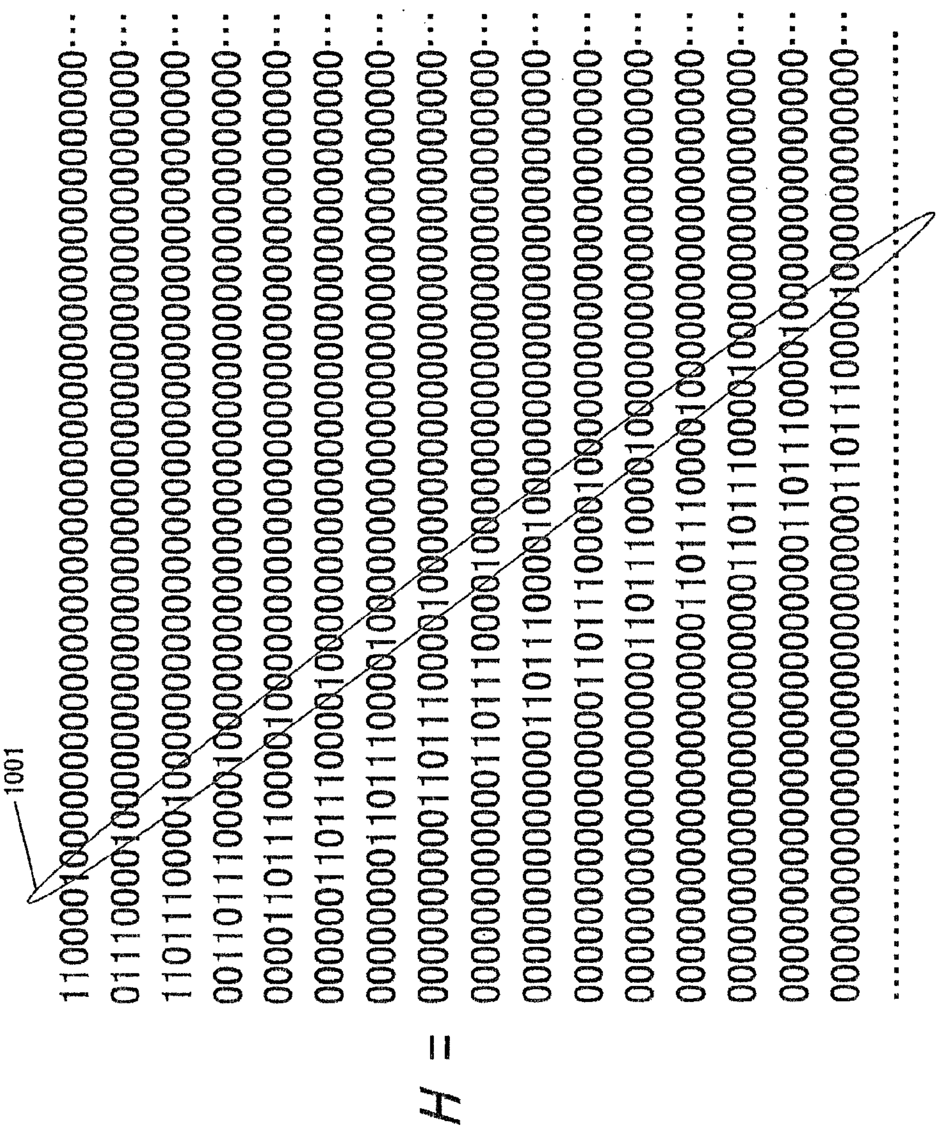
FIG. 12 shows an example of the configuration of an LDPC-CC parity check matrix according to Embodiment 2.

FIG. 11 shows an example of a case in which "1" is added to the upper trapezoidal matrix of the parity check matrix in FIG. 5. FIG. 11 shows an example in which "1" is added to area 806. Then, when "1" is added for data of all points in time of the upper trapezoidal matrix of parity check matrix H, the parity check matrix is represented as shown in FIG. 12. FIG. 12 shows an example of the configuration of an LDPC-CC parity check matrix according to this embodiment. In FIG. 12, "1"s inside area 1001 are added "1"s, and a code for which parity check matrix H shown in FIG. 12 is taken as a parity check matrix is an LDPC-CC according to this embodiment. At this time, a check polynomial is represented as shown in Equation 21 below.

$$(D^2+1+D^{-3})X(D)+(D^2+D+1)P(D)=0 \quad \text{(Equation 21)}$$

As described above, according to this embodiment, by having a transmitting apparatus set $\alpha_1, \ldots, \alpha_n$ to −K−1 or below in Equation 20 and create an LDPC-CC from a convolutional code, a receiving apparatus can obtain good received quality by performing BP decoding or approximated BP decoding using a parity check matrix of the created LDPC-CC. In this embodiment, an example has been described in which "1"s are added to an upper trapezoidal matrix of a parity check matrix for data, but the present invention is not limited to this, and, in combination with Embodiment 1, "1"s may also be added to an approximate lower triangular matrix of a parity check matrix rather than being added only to an upper trapezoidal matrix of a parity check matrix. At this time, better received quality can be achieved if the conditions described in Embodiment 1 are satisfied.

When "1"s are added to an upper trapezoidal matrix of a parity check matrix, there is an advantage of contributing to an improvement in convergence speed in termination of Embodiment 3 described later herein. This point will be explained in detail in Embodiment 3.

Also, according to this embodiment, an LDPC-CC can be designed from a parity check polynomial different from Equation 2 of a (7, 5) convolutional code, in the same way as in Embodiment 1.

In this embodiment, a method of creating an LDPC-CC from a (7, 5) convolutional code has been described, but the present invention is not limited to a (7, 5) convolutional code, and can be similarly implemented using another convolutional code. Details of generating polynomial G of a convolutional code that gives good received quality at this time are given in Non-Patent Document 12.

Also, when an LDPC-CC is created from a convolutional code, the size of a protograph, that is, a check polynomial, is much smaller than that of a protograph shown in Non-Patent Document 6 or Non-Patent Document 7, and therefore the number of redundant bits generated when transmitting a packet for which the number of transmission data bits is small can be reduced, and the problem of a decrease in data transmission efficiency can be suppressed.

Embodiment 3

In Embodiment 3, a description will be given of the problem of termination in a case in which "1"s are added to an approximate lower triangular matrix of a parity check matrix when generating an LDPC-CC from a convolutional code, as described in Embodiment 1, and of a method of solving this problem.

Figure 13:
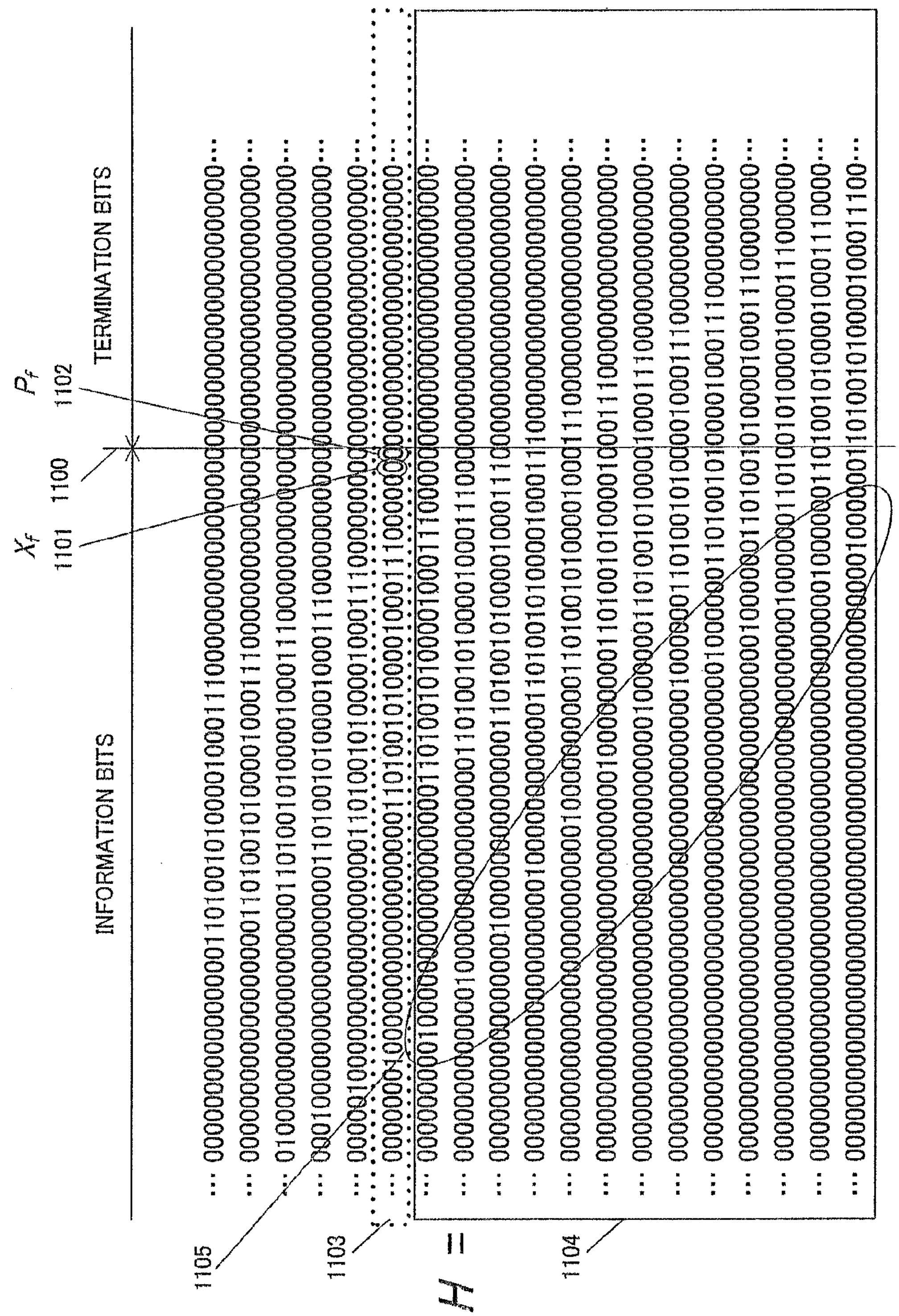
FIG. 13 shows an example of the configuration of a parity check matrix upon termination according to Embodiment 3.

FIG. 13 shows an example of a parity check matrix at the time of termination. In FIG. 13, reference code 1100 indicates a boundary between information bits and termination bits. "Information bits" are bits relating to information that a transmitting apparatus wishes to transmit to a receiving apparatus. On the other hand, "termination bits" are redundant bits for conveying information bits correctly, and termination bits themselves do not belong to information deemed necessary by a receiving apparatus, but are bits that are necessary for receiving information bits accurately.

Here, in information bits, a final bit of data bits is designated $X_f$, a final bit of parity bits is designated $P_f$, and that point in time is designated f. In area 1103 in FIG. 13, reference code 1101 corresponds to "1" relating to data of point in time f, and reference code 1102 corresponds to "1" relating to parity of point in time f.

A check polynomial corresponding to the protograph in FIG. 13 is represented as shown in Equation 22 below.

$$(D^9+D^6+D^5+1)X(D)+(D^{19}+D^9+D^8+D^3D+1)P(D)=0 \quad \text{(Equation 22)}$$

In FIG. 13, reference code 1104 indicates a parity check matrix for termination bits. A data bit transmitted as a termination bit is made "0." However, making a data bit transmitted as a termination bit "0" is only an example, and as long as the information is known by the transmitter and receiver, data bits transmitted as termination bits can be termination bits whatever the kind of sequence.

In FIG. 13, a check polynomial for point in time f+1, that is, the start of termination bits, is represented as shown in Equation 23 below.

$$(D^9+D^6+D^5+1)X(D)+(D^{18}+D^9+D^8+D^3+D+1)P(D)=0 \quad \text{(Equation 23)}$$

Also, a check polynomial for a termination bit at point in time f+2 is represented as shown in Equation 24 below.

$$(D^9+D^6+D^5+1X(D)+(D^{17}+D^9+D^8+D^3+D+1)P(D)=0 \quad \text{(Equation 24)}$$

Thus, a characteristic of this embodiment is that with termination bits, as shown in FIG. 13, a position of an added "1" is shifted with time, and the order of a check polynomial is decreased with time. In FIG. 13, reference code 1105 indicates an example of the configuration of "1"s relating to termination bit addition. In FIG. 13, added "1"s are present in parity.

Then, since a termination bit sequence transmitted from a transmitting apparatus is known, a receiving apparatus can set termination bit likelihood to a known value when performing BP decoding.

As described above, according to this embodiment, the speed at which a trellis diagram stabilizes (converges) is improved by decreasing the order of a check polynomial with time. Therefore, the number of bits transmitted for termination can be reduced, and data transmission efficiency can be improved.

Figure 14:
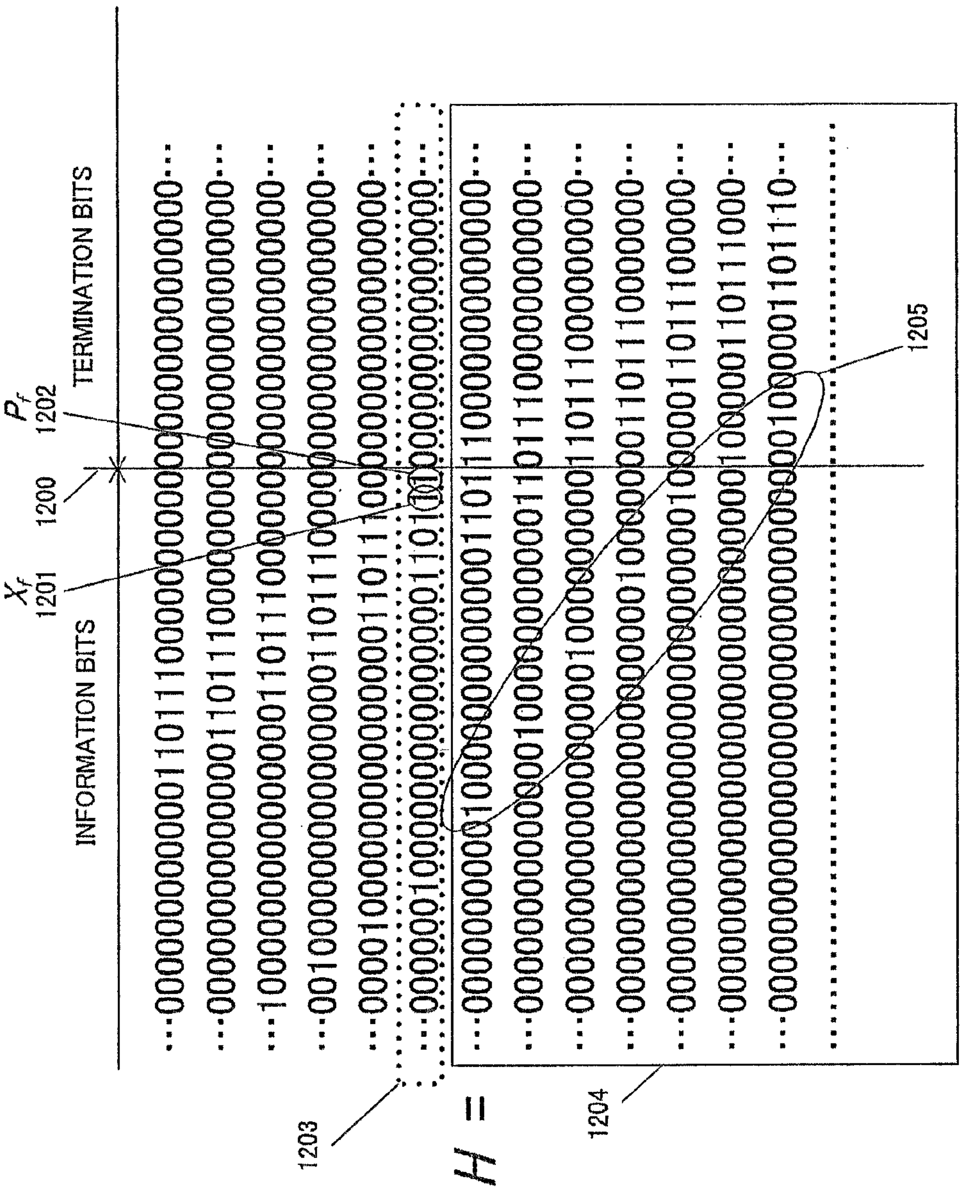
FIG. 14 shows an example of the configuration of a parity check matrix upon termination according to Embodiment 3.

FIG. 14 shows an example of the configuration of a parity check matrix relating to "information bits" and "termination bits" different from FIG. 13. In FIG. 14, reference code 1200 indicates a boundary between information bits and termination bits.

Here, in information bits, a final bit of data bits is designated $X_f$, a final bit of parity bits is designated $P_f$, and that point in time is designated f. In area 1203 in FIG. 14, reference code 1201 corresponds to "1" relating to data of point in time f, and reference code 1202 corresponds to "1" relating to parity of point in time f.

A check polynomial corresponding to the protograph in FIG. 14 is represented as shown in Equation 25 below.

$$(D^{10}+D^2+1)X(D)+(D^2+D+1)P(D)=0 \quad \text{(Equation 25)}$$

In FIG. 14, reference code 1204 indicates a parity check matrix for termination bits. A data bit transmitted as a termination bit is made "0." Making a data bit transmitted as a termination bit "0" is only an example, and as long as the information is known by the transmitter and receiver, data bits transmitted as termination bits can be any kind of sequence.

In FIG. 14, a check polynomial for point in time f+1, that is, the start of termination bits, is represented as shown in Equation 26 below.

$$(D^9+D^2+1)X(D)+(D^2+D+1)P(D)=0 \quad \text{(Equation 26)}$$

Also, a check polynomial for a termination bit at point in time f+2 is represented as shown in Equation 27 below.

$$(D^8+D^2+1)X(D)+(D^2+D+1)P(D)=0 \quad \text{(Equation 27)}$$

Thus, a characteristic of this embodiment is that with termination bits, as shown in FIG. 14, a position of an added "1" is shifted with time, and the order of a check polynomial is decreased with time. In FIG. 14, reference code 1205 indicates an example of the configuration of "1"s relating to termination bit addition. In FIG. 14, added "1"s are present in data.

Also, in order to prevent degradation of received quality of information bits, the order of a check polynomial is decreased so as to satisfy the condition of "2K+1 or above" as described in Embodiment 1. Therefore, a check polynomial of a final termination bit is represented as shown in Equation 28 below, for example.

$$(D^5+D^2+1)X(D)+(D^2+D+1)P(D)=0 \quad \text{(Equation 28)}$$

Then, since a termination bit sequence transmitted from a transmitting apparatus is known, a receiving apparatus can set termination bit likelihood to a known value when performing BP decoding.

As described above, according to this embodiment, with termination bits the speed at which a trellis diagram stabilizes (converges) can be improved by decreasing the order of a check polynomial with time. Therefore, the number of bits transmitted for termination can be reduced, and data transmission efficiency can be improved.

Figure 15:
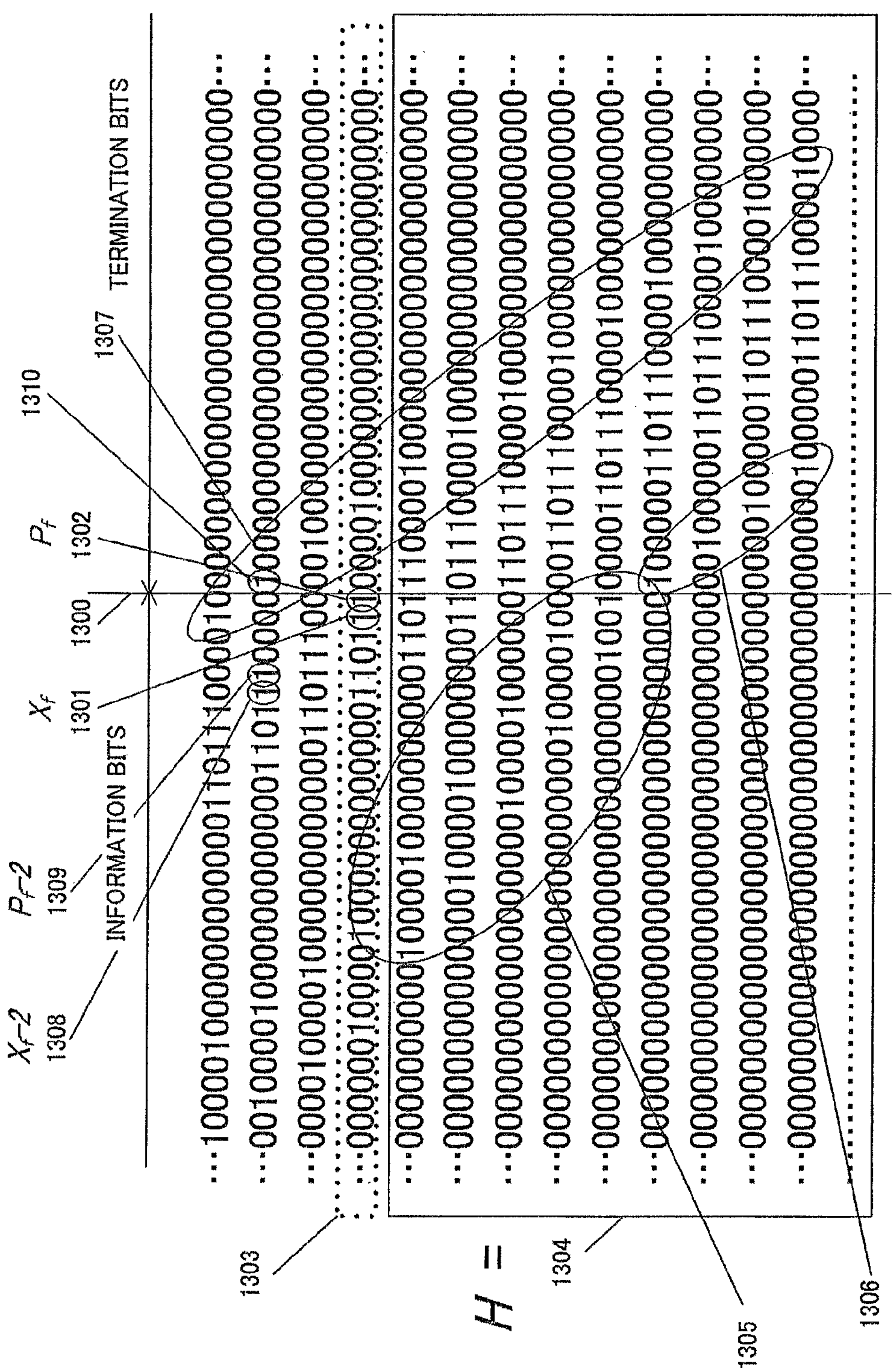
FIG. 15 shows an example of the configuration of a parity check matrix upon termination according to Embodiment 3.

Next, an example will be given of a termination method when the method of adding "1"s to an upper trapezoidal matrix of a parity check matrix described in Embodiment 2 is used. FIG. 15 shows an example of the configuration of a parity check matrix relating to "information bits" and "termination bits" different from FIG. 13 and FIG. 14. In FIG. 15, reference code 1300 indicates a boundary between information bits and termination bits.

Here, in information bits, a final bit of data bits is designated $X_f$, a final bit of parity bits is designated $P_f$, and that point in time is designated f. In area 1303 in FIG. 15, reference code 1301 corresponds to "1" relating to data of point in time f, and reference code 1302 corresponds to "1" relating to parity of point in time f.

A check polynomial corresponding to the protograph in FIG. 15 is represented as shown in Equation 29 below.

$$(D^{11}+D^2+1+D^{-3})X(D)+(D^9+D^2+D+1)P(D)=0 \quad \text{(Equation 29)}$$

In FIG. 15, reference code 1304 indicates a parity check matrix for termination bits. A data bit transmitted as a termination bit is made "0." Making a data bit transmitted as a termination bit "0" is only an example, and as long as the information is known by the transmittingreceiving apparatus, data bits transmitted as termination bits can be any kind of sequence.

In FIG. 15, a check polynomial for point in time f+1, that is, the start of termination bits, is represented as shown in Equation 30 below.

$$(D^{10}+D^2+1+D^{-3})X(D)+(D^8+D^2+D+1)P(D)=0 \quad \text{(Equation 30)}$$

Also, a check polynomial for a termination bit at point in time f+2 is represented as shown in Equation 31 below.

$$(D^9+D^2+1+D^{-3})X(D)+(D^7+D^2+D+1)P(D)=0 \quad \text{(Equation 31)}$$

Thus, a characteristic is that with termination bits, as shown in FIG. 15, a position of an added "1" is shifted with time, and the order of a check polynomial is decreased with time (corresponding to reference code 1305 in FIG. 15). In FIG. 15, reference code 1304 indicates an example of the configuration of a termination bit protograph. In FIG. 15, added "1"s are present in data and parity.

Also, in order to prevent degradation of received quality of information bits, the order of a check polynomial is decreased so as to satisfy the condition of "2K+1 or above" as described in Embodiment 1.

Another characteristic of termination bits in FIG. 15 is that, as the change from reference code 1305 to reference code 1306 shows in FIG. 15, the number of "1"s additionally inserted in the parity check matrix is changed from two to one. By this means, the speed at which a trellis diagram stabilizes (converges) is improved.

In this embodiment, an example has been described in which the number of "1"s added to a parity check matrix is two at the time of information bit transmission, and is then reduced to one at the time of termination bit transmission, but the present invention is not limited to this, and the same kind of effect can also be obtained, for example, by making the number of "1"s added to a parity check matrix M at the time of information bit transmission, and then reducing this number to N (where M>N) at the time of termination bit transmission.

An advantage when "1"s are added to an upper trapezoidal matrix of a parity check matrix ("1"s indicated by reference code 1307 in FIG. 15) will now be explained. For example, with data $X_{f-2}$ (1308) and parity $P_{f-2}$ (1309) of point in time f−2 in FIG. 15, the influence of termination bit 1310 is experienced. As a result, the received quality of data $X_{f-2}$ (1308) of point in time f−2 is improved in the receiving apparatus. The same kind of effect can also be obtained in a similar way for data after point in time f−2. Thus, when "1"s are added to an upper trapezoidal matrix of a parity check matrix, the speed at which a trellis diagram stabilizes (converges) can be improved due to the above-described effect.

In this embodiment, the order of a check polynomial is decreased in a regular manner (the order is decreased each time the number of rows increases by one), but the present invention can obtain the same kind of effect even if this decrease is not performed in a regular manner, and, for example, can obtain the same kind of effect if the order is decreased at intervals of several rows.

Embodiment 4

In Embodiment 1 and Embodiment 2, methods of designing an LDPC-CC from a (7, 5) convolutional code, that is, a feedback-type convolutional code, were described. In this embodiment, a case will be described in which the LDPC-CC design methods described in Embodiment 1 and Embodiment 2 are applied to a feed-forward-type convolutional code. Advantages of using a feed-forward-type convolutional code are that, for the same constraint length, a row weight and column weight are smaller and there are fewer loops of the length of 4 when drawing a Tanner graph in the case of a feed-forward-type convolutional code parity check matrix than in the case of a feedback-type convolutional code parity check matrix. A loop is a circular path that starts at a certain node and ends at that node, and if there are a large number of loops of the length of 4, received quality degrades (see Non-Patent Document 13). Consequently, when a feed-forward-type convolutional code is used, the possibility of received quality improving is high when BP decoding is performed. Thus, a characteristic of an LDPC-CC designed from a feed-forward-type convolutional code is having better performance than an LDPC-CC designed from a feedback-type convolutional code.

In Non-Patent Document 12, a convolutional code that is of feed-forward type and a systematic code is described. Below, a case in which a (1, 1547) convolutional code is used will be described as an example. A check polynomial of a (1, 1547) convolutional code is represented as shown in the following equation.

$$(D^9+D^8+D^6+D^5+D^2+D^1+1)X(D)+P(D)=0 \quad \text{(Equation 32)}$$

Also, the following equation is used as an example of a parity check polynomial different from Equation 32 of a (1, 1547) convolutional code.

$$(D^{14}+D^{10}+1)X(D)+(D^5+D^4+D^3+D^1+1)P(D)=0 \quad \text{(Equation 33)}$$

Furthermore, P(D) given by the following equations will be considered as LDPC-CC check polynomials.

$$(D^{\alpha 1}+\ldots+D^{\alpha e}+D^{14}+D^{10}+1)X(D)+(D^5+D^4+D^3+D^1+1)P(D)=0 \quad \text{(Equation 34)}$$

$$(D^{\alpha 1}+\ldots+D^{\alpha e}+D^{14}+D^{10}+1)X(D)+(D^{\beta 1}+\ldots+D^{\beta f}+D^5+D^4+D^3+D^1+1)P(D)=0 \quad \text{(Equation 35)}$$

$$(D^{\alpha 1}+\ldots+D^{\alpha e}+D^{14}+D^{10}+1+D^{\gamma 1}+\ldots+D^{\gamma g})X(D)+(D^5+D^4+D^3+D^1+1)P(D)=0 \quad \text{(Equation 36)}$$

$$(D^{\alpha 1}+\ldots+D^{\alpha e}+D^{14}+D^{10}+1+D^{\gamma 1}+\ldots+D^{\gamma g})X(D)+(D^{\beta 1}+\ldots+D^{\beta f}+D^5+D^4+D^3+D^1+1)P(D)=0 \quad \text{(Equation 37)}$$

$$(D^{14}+D^{10}+1X(D)+(D^{\beta 1}+\ldots+D^{\beta f}+D^5+D^4+D^3+D^1+1)P(D)=0 \quad \text{(Equation 38)}$$

$$(D^{14}+D^{10}+1+D^{\gamma 1}+\ldots+D^{\gamma g})X(D)+(D^{\beta 1}+\ldots+D^{\beta f}+D^5+D^4+D^3+D^1+1)P(D)=0 \quad \text{(Equation 39)}$$

$$(D^{14}+D^{10}+1+D^{\gamma 1}+\ldots+D^{\gamma g})X(D)+(D^5+D^4+D^3+D^1+1)P(D)=0 \quad \text{(Equation 40)}$$

At this time, it is assumed that $\alpha_1, \ldots, \alpha_e$ are integers of 15 or above, $\beta_1, \ldots, \beta_f$ are integers of 15 or above, and $\gamma_1, \ldots, \gamma_g$ are integers of −1 or below. At this time, as described in Embodiment 1 and Embodiment 2, at least one of $\alpha_1, \ldots, \alpha_e$ is set to an integer of 29 or above, at least one of $\beta_1, \ldots, \beta_f$ is set to an integer of 29 or above, and at least one of $\gamma_1, \ldots, \gamma_g$ is set to an integer of −15 or below. However, it is more effective if $\alpha_1, \ldots, \alpha_e$ are all set to integers of 29 or above, $\beta_1, \ldots, \beta_f$ are all set to integers of 29 or above, and $\gamma_1, \ldots, \gamma_g$ are all set to −15 or below. Making such settings enables received quality (decoding performance) to be greatly improved.

For example, received quality (decoding performance) is greatly improved if settings of $\gamma_1=-25$, $\gamma_2=-55$, and $\gamma_3=-95$ are made in Equation 40, settings of $\gamma_1=-25$ and $\gamma_2=-65$ are made in Equation 40, and settings of $\beta_1=35$, $\gamma_1=-40$, and $\gamma_2=-90$ are made in Equation 39.

Received quality (decoding performance) can also be greatly improved if, in Equation 36, Equation 37, and Equation 39, at least one of $\alpha_1, \ldots, \alpha_e$ is set to an integer of 29 or above, or at least one of $\beta_1, \ldots, \beta_f$ is set to an integer of 29 or above, or at least one of $\gamma_1, \ldots, \gamma_g$ is set to −15 or below.

Embodiment 5

In this embodiment, a detailed description will be given of a method of creating an LDPC-CC of a coding rate of ⅓ from an LDPC-CC of a coding rate of ½. This will be described using a convolutional code that is of feed-forward type and a systematic code shown in Non-Patent Document 12, and a (1, 1547) convolutional code. A (1, 1547) convolutional code parity check equation is represented as shown in the following equation.

$$(D^9+D^8+D^6+D^5+D^2+D^1+1)X(D)+P(D)=0 \quad \text{(Equation 41)}$$

Also, the following equation is used as an example of a parity check polynomial different from Equation 41 of a (1, 1547) convolutional code.

$$(D^{14}+D^{10}+1)X(D)+(D^5+D^4+D^3+D^1+1)P(D)=0 \quad \text{(Equation 42)}$$

Here, P(D) given by the following equations will be considered as polynomials of new parity sequence.

$$(D^{\alpha 1}+D^{\alpha 2}+\ldots+D^{\alpha v})X(D)+(D^{b1}+D^{b2}+\ldots+D^{bw})P(D)(D^{c1}+D^{c2}+\ldots+D^{cy})P_n(D)=0 \quad \text{(Equation 43)}$$

$$(D^{\alpha 1}+D^{\alpha 2}+\ldots+D^{\alpha v})X(D)+(D^{c1}+D^{c2}+\ldots+D^{cy})P_n(D)=0 \quad \text{(Equation 44)}$$

$$(D^{b1}+D^{b2}+\ldots+D^{bw})P(D)+(D^{c1}+D^{c2}+\ldots+D^{cy})P_n(D)=0 \quad \text{(Equation 45)}$$

If data at point in time i is designated $X_i$, parity relating to P(D) of Equation 42 at point in time i is designated $P_i$, and parity relating to Pn(D) of Equation 43 or Equation 44 or Equation 45 at point in time i is designated $Pn_i$, transmission sequence $W_i$ can be represented by $W_i=(X_i, P_i, Pn_i)$.

Also, the following equations will be considered as check polynomials relating to LDPC-CC X(D) and P(D) in the same way as in Embodiment 4.

$$(D^{\alpha 1}+\ldots+D^{\alpha e}+D^{14}+D^{10}+1)X(D)+(D^5+D^4+D^3+D^1+1)P(D)=0 \quad \text{(Equation 46)}$$

$$(D^{\alpha 1}+\ldots+D^{\alpha e}+D^{14}+D^{10}+1)X(D)+(D^{\beta 1}+\ldots+D^{\beta f}+D^5+D^4+D^3+D^1+1)P(D)=0 \quad \text{(Equation 47)}$$

$$(D^{\alpha 1}+\ldots+D^{\alpha e}+D^{14}+D^{10}+1+D^{\gamma 1}+\ldots+D^{\gamma 2})X(D)+(D^5+D^4+D^3+D^1+1)P(D)=0 \quad \text{(Equation 48)}$$

$$(D^{\alpha 1}+\ldots+D^{\alpha e}+D^{14}+D^{10}+1+D^{\gamma 1}+\ldots+D^{\gamma 2})X(D)+(D^5+D^4+D^3+D^1+1)P(D)=0 \quad \text{(Equation 49)}$$

$$(D^{14}+D^{10}+1)X(D)+(D^{\beta f}+D^5+D^4+D^3+D^1+1)P(D)=0 \quad \text{(Equation 50)}$$

$$(D^{14}+D^{10}+1+D^{\gamma 1}+\ldots+D^{\gamma 2})X(D)+(D^{\beta 1}+\ldots+D^{\beta f}+D^5+D^4+D^3+D^1+1)P(D)=0 \quad \text{(Equation 51)}$$

$$(D^{14}+D^{10}+1+D^{\gamma 1}+\ldots+D^{\gamma 2})X(D)+(D^5+D^4+D^3+D^1+1)P(D)=0 \quad \text{(Equation 52)}$$

At this time, it is assumed that $\alpha_1, \ldots, \alpha_e$ are integers of 15 or above, $\beta_1, \ldots, \beta_f$ are integers of 15 or above, and $\gamma_1, \ldots, \gamma_g$ are integers of −1 or below. At this time, as described in Embodiment 1 and Embodiment 2, at least one of $\alpha_1, \ldots, \alpha_e$, is set to an integer of 29 or above, at least one of $\beta_1, \ldots, \beta_f$ is set to an integer of 29 or above, and at least one of $\gamma_1, \ldots, \gamma_g$ is set to −15 or below. However, it is more effective if $\alpha_1, \ldots, \alpha_e$ are all set to integers of 29 or above, $\beta_1, \ldots, \beta_f$ are all set to integers of 29 or above, and $\gamma_1, \ldots, \gamma_g$ are all set to −15 or below. Making such settings enables received quality (decoding performance) to be greatly improved.

Then, a check polynomial relating to new parity sequence Pn(D) for LDPC-CC use is made one of Equation 43 through Equation 45. At this time, at least one of $a_1, \ldots, a_v$ is made an integer of 29 or above, or at least one of $a_1, \ldots, a_v$ is set to an integer of −15 or below. Also, at least one of $b_1, \ldots, b_w$ is set to an integer of 29 or above. However, received quality (decoding performance) is greatly improved if $a_1, \ldots, a_v$ are all set to integers of 29 or above or are all set to integers of −15 or below. Also, received quality (decoding performance) is greatly improved if $b_1, \ldots, b_w$ are all set to integers of 29 or above. Here, no restrictions are imposed on $c_1, \ldots, c_y$, but it is effective if at least one of $c_1, \ldots, c_y$ is made an integer of 29 or above, and, in general, one of $c_1, \ldots, c_y$ is "0."

A method of generating an LDPC-CC of a convolutional code of a coding rate of ⅓ from a convolutional code of a coding rate of ½ is summarized below.

A convolutional code of a coding rate of ½ check polynomial is represented by the following equation, and the maximum value of $+K_x$ (the maximum order of a data X(D) term) and $K_1$ (the maximum order of a parity P(D) term) is designated $K_{max}$.

$$(D^{K_Y}+\ldots+1)X(D)+(D^{K1}+\ldots+1)P(D)=0 \quad \text{(Equation 53)}$$

Then X(D) and P(D) LDPC-CC check polynomials are created as in Embodiments 1 through 4 and another Embodiment 1. Following this, Pn(D) obtained from Equation 54 through Equation 56 is considered as a polynomial of a new parity sequence.

$$(D^{\alpha1}+D^{\alpha2}+\ldots+D^{\alpha v})X(D)+(D^{b1}+D^{b2}+\ldots+D^{bw})P(D)+(D^{c1}+D^{c2}+\ldots+D^{cy})P_n(D)=0 \quad \text{(Equation 54)}$$

$$(D^{\alpha1}+D^{\alpha2}+\ldots+D^{\alpha v})X(D)+(D^{c1}+D^{c2}+\ldots+D^{cy})P_n(D)=0 \quad \text{(Equation 55)}$$

$$(D^{b1}+D^{b2}+\ldots+D^{bw})P(D)+(D^{c1}+D^{c2}+\ldots+D^{cy})P_n(D)=0 \quad \text{(Equation 56)}$$

At this time, at least one of $a_{11}, \ldots, a_v$ is made an integer of $2K_{max}+1$ or above, or at least one of $a_1, \ldots, a_v$ is set to an integer of $-K_{max}-1$ or below. Also, at least one of $b_1, \ldots, b_w$ is set to an integer of $2K_{max}+1$ or above. However, received quality (decoding performance) is greatly improved if $a_1, \ldots, a_v$ are all set to integers of $2K_{max}+1$ or above or are all set to integers of $-K_{max}-1$ or below. Also, received quality (decoding performance) is greatly improved if $b_1, \ldots, b_w$ are all set to integers of $2K_{max}+1$ or above. Here, no restrictions are imposed on $c_1, \ldots, c_y$, but it is effective if at least one of $c_1, \ldots, c_y$ is made an integer of $2K_{max}+1$ or above, and, in general, one of $c_1, \ldots, c_y$ is "0."

As described above, according to this embodiment, provision is made for an LDPC-CC of a coding rate of ⅓ to be generated from a convolutional code of a coding rate of ½, using polynomial Pn(D) obtained from Equation 54 through Equation 56 as a new parity sequence for the coding rate of ⅓. In this case, by imposing restrictions such as described above on $a_1, \ldots, a_v$ and $b_1, \ldots, b_w$, the range in which belief is propagated can be extended without making changes to check polynomial P(D) of a coding rate of ½, and received quality (decoding performance) can be greatly improved.

A description has been given above of a method of generating an LDPC-CC of a coding rate of ⅓ from a convolutional code of a coding rate of ½. With regard to generation of an LDPC-CC of a coding rate of ¼ or below, an LDPC-CC of a coding rate of ¼ or below can be generated if a new parity check polynomial is generated under the same kind of conditions as when generating an LDPC-CC of a coding rate of ⅓.

Embodiment 6

A sample variant of the method of generating an LDPC-CC from a convolutional code described in Embodiment 4 will be described in detail here.

One of the following polynomials will be considered as a polynomial of an LDPC-CC check described in Embodiment 4.

$$(D^{\alpha1}+\ldots+D^{\alpha e}+D^{14}+D^{10}+1)X(D)+(D^5+D^4+D^3+D^1+1)P(D)=0 \quad \text{(Equation 57)}$$

$$(D^{\alpha1}+\ldots+D^{\alpha e}+D^{14}+D^{10}+1)X(D)+(D^{\beta1}+\ldots+D^{\beta f}+D^5+D^4+D^3+D^1+1)P(D)=0 \quad \text{(Equation 58)}$$

$$(D^{\alpha1}+\ldots+D^{\alpha e}+D^{14}+D^{10}+1+D^{\gamma1}+\ldots+D^{\gamma g})X(D)+(D^5+D^4+D^3+D^1+1)P(D)=0 \quad \text{(Equation 59)}$$

$$(D^{\alpha1}+\ldots+D^{\alpha e}+D^{14}+D^{10}+1+D^{\gamma1}+\ldots+D^{\gamma g})X(D)+(D^{\beta1}+\ldots+D^{\beta f}+D^5+D^4+D^3+D^1+1)P(D)=0 \quad \text{(Equation 60)}$$

$$(D^{14}+D^{10}+1)X(D)+(D^{\beta1}+\ldots+D^{\beta f}+D^5+D^4+D^3+D^1+1)P(D)=0 \quad \text{(Equation 61)}$$

$$(D^{14}+D^{10}+1+D^{\gamma1}+\ldots+D^{\gamma g})X(D)+(D^{\beta1}+\ldots+D^{\beta f}+D^5+D^4+D^3+D^1+1)P(D)=0 \quad \text{(Equation 62)}$$

$$(D^{14}+D^{10}+1+D^{\gamma1}+\ldots+D^{\gamma g})X(D)+(D^5+D^4+D^3+D^1+1)P(D)=0 \quad \text{(Equation 63)}$$

At this time, it is assumed that $\alpha_1, \ldots, \alpha_e$ are integers of 15 or above, $\beta_1, \ldots, \beta_f$ are integers of 15 or above, and $\gamma_1, \ldots, \gamma_g$ are integers of −1 or below. At this time, as described in Embodiment 1 and Embodiment 2, at least one of $\alpha_1, \ldots, \alpha_e$ is set to an integer of 29 or above, at least one of $\beta_1, \ldots, \beta_f$ is set to an integer of 29 or above, and at least one of $\gamma_1, \ldots, \gamma_g$ is set to an integer of −15 or below. However, it is more effective if $\alpha_1, \ldots, \alpha_e$ are all set to integers of 29 or above, $\beta_1, \ldots, \beta_f$ are all set to integers of 29 or above, and $\gamma_1, \ldots, \gamma_g$ are all set to −15 or below.

Then a number of terms are selected from among terms excluding "1" and maximum order "$D^{14}$" of the source convolutional code, that is, from among term 1401 ($D^{10}$) and terms 1402 ($D^5$, $D^4$, $D^3$, $D^1$) in FIG. 16. For example, term 1401 ($D^{10}$) is selected as shown in FIG. 16. Then the selected term is eliminated, and polynomials such as polynomial 1403 and polynomial 1404 in FIG. 16 are considered. In the case of polynomial 1403 in FIG. 16, $D^{10}$ is deleted, and a $D^z$ term is added for X(D). In the case of polynomial 1404 in FIG. 16, $D^{10}$ is deleted, and a $D^z$ term is added for P(D). At this time, in the same way as described in Embodiment 4, received quality is improved by making z an integer of $2K_{max}+1$ or above for maximum order $K_{max}$ (=14). Also, in the case of polynomial 1403 in FIG. 16, received quality is also improved if z is made an integer of $-K_{max}-1$ or below.

A case has been described in which, in FIG. 16, term 1401 ($D^{10}$) is selected and a $D^z$ term is added, but the present invention is not limited to this, and a check polynomial of an LDPC-CC may also be created by selecting a plurality of terms from term 1401 and terms 1402, eliminating those terms, and adding a plurality of $D^z$ terms.

Thus, in this embodiment, at least one term excluding maximum order "$D^K$" of a source convolutional code is deleted, and at least one $D^z$ term satisfying the condition $z \geq 2K_{max}+1$ is added for X(D) or P(D). Provision has been made for an LDPC-CC to be configured using a parity check polynomial with an above-described configuration. Provision may also be made for a $D^z$ term to be added to X(D) and P(D).

Also, Equation 57 has been described as an example, but the present invention is not limited to this, and can also be implemented in a similar way with any of Equation 58 through Equation 63. By performing this kind of operation, a length-4 loop or a short loop (for example, a length-6 loop) in a Tanner graph described in Non-Patent Document 13 can be eliminated, enabling received quality to be greatly improved.

Embodiment 7

In this embodiment, a configuration of a time varying LDPC-CC is described that allows puncturing to be performed easily and that has a simple encoder configuration. In particular, in this embodiment an LDPC-CC is described that enables data to be punctured periodically. With regard to LDPC codes, sufficient investigation has not so far been carried out into a puncturing method that punctures data periodically, and in particular, there has not been sufficient discussion of a method of performing puncturing easily. With an LDPC-CC according to this embodiment, data is not punctured randomly, but can be punctured periodically and in a regular manner, and degradation of received quality can be suppressed. Below, a method is described for configuring a time varying LDPC-CC for which the coding rate is R=½ capable of implementing the above.

With a coding rate of ½, if a polynomial representation of an information sequence (data) is X(D), and a parity sequence polynomial representation is P(D), a parity check polynomial is represented as shown below.

$$(D^{\alpha 1}+\ldots+D^{+e}+1)X(D)+(D^{b1}+\ldots+D^{bw}+1)P(D)=0 \quad \text{(Equation 64)}$$

In Equation 64, it is assumed that a1, a2, . . . , an are integers of 1 or above (where a1≠a2≠ . . . ≠an, and a1 through an are all mutually different). Use of the notation "X≠Y≠ . . . ≠Z" is assumed to express the fact that X, Y, . . . , Z are all mutually different. Also, it is assumed that b1, b2, . . . , bm are integers of 1 or above (where b1≠b2≠ . . . ≠bm). Here, in order to make it possible to perform encoding easily, it is assumed that terms $D^0X(D)$ and $D^0P(D)$ (where $D^0=1$) are present. Therefore, P(D) is represented as shown below.

$$P(D)=(D^{\alpha 1}+\ldots+D^{\alpha n}+1)X(D)+(D^{b1}+\ldots+D^{bm})P(D) \quad \text{(Equation 65)}$$

As can be seen from Equation 65, since $D^0=1$ is present and terms of past parity, that is, b1, b2, . . . , bm, are integers of 1 or above, parity P can be found sequentially.

Next, a parity check polynomial of a coding rate of ½ different from Equation 64 is represented as shown below.

$$(D^{A1}+\ldots+D^{AN}+1)X(D)+(D^{B1}+\ldots+D^{BM})P(D) \quad \text{(Equation 66)}$$

In Equation 66, it is assumed that A1, A2, . . . , AN are integers of 1 or above (where A1≠A2≠ . . . ≠AN). Also, it is assumed that B1, B2, . . . , BM are integers of 1 or above (where B1≠B2≠ . . . ≠BM). Here, in order to make it possible to perform encoding easily, it is assumed that terms $D^0X(D)$ and $D^0P(D)$ (where $D^0=1$) are present. Therefore, P(D) is represented as shown in Equation 67.

$$P(D)=(D^{A1}+\ldots+D^{AN}+1)X(D)+(D^{B1}+\ldots+D^{BM})P(D) \quad \text{(Equation 67)}$$

Below, data X and parity P of point in time 2i are represented by $X_{2i}$ and $P_{2i}$ respectively, and data X and parity P of point in time 2i+1 are represented by $X_{2i+1}$ and $P_{2i+1}$ respectively (where i is an integer).

In this embodiment, an LDPC-CC of a time varying period of 2 is proposed whereby parity $P_{2i}$ of point in time 2i is calculated (encoded) using Equation 65 and parity $P_{2i+1}$ of point in time 2i+1 is calculated (encoded) using Equation 67. In the same way as in the above embodiments, an advantage is that parity can easily be found sequentially.

Below, a description will be given using Equation 68 and Equation 69 as examples of Equation 64 and Equation 66.

$$(D^{396}+D^{237}+D^{114}+D^{97}+1)X(D)+(D^{390}+D^{383}+D^{334}+D^{276}+1)P(D)=0 \quad \text{(Equation 68)}$$

$$(D^{170}+D^{166}+D^{153}+D^{135}+1)X(D)+(D^{363}+D^{279}+D^{273}+D^{63}+1)P(D)=0 \quad \text{(Equation 69)}$$

At this time, parity check matrix H can be represented as shown in FIG. 17. In FIG. 17, (Ha, 11) is a part corresponding to Equation 68, and (Hc, 11) is a part corresponding to Equation 69. Below, (Ha, 11) and (Hc, 11) are defined as sub-matrices.

Thus, LDPC-CC parity check matrix H of a time varying period of 2 of this proposal can be defined by a first sub-matrix representing an a parity check polynomial of Equation 64, and a second sub-matrix representing an a parity check polynomial of Equation 66. Specifically, in parity check matrix H, a first sub-matrix and second sub-matrix are arranged alternately in the row direction. When the coding rate is 12, a configuration is used in which a sub-matrix is shifted two columns to the right between an i'th row and i+1'th row (see FIG. 17).

In the case of a time varying LDPC-CC of a time varying period of 2, an i'th row sub-matrix and an i+1'th row sub-matrix are different sub-matrices. That is to say, either sub-matrix (Ha, 11) or sub-matrix (Hc, 11) is a first sub-matrix, and the other is a second sub-matrix. If transmission vector u is represented as $u=(X_0, P_0, X_1, P_1, \ldots, X_k, P_k, \ldots)^T$, the relationship Hu=0 holds true. This point is as explained in Embodiment 1 (see Equation 3).

When BP decoding was performed using the parity check matrix in FIG. 17, that is, a parity check matrix of a time varying period of 2, it was confirmed that data received quality improved greatly as compared with LDPC-CCs described in Embodiment 1 through Embodiment 6.

A case has been described above in which the time varying period is 2, but the time varying period is not limited to 2. However, if the time varying period is too large, it is difficult to perform puncturing periodically, and it may be necessary to perform puncturing randomly, for example, with a resulting possibility of degradation of received quality. Below, the advantage of received quality being improved by decreasing the time varying period is explained.

Figure 18:
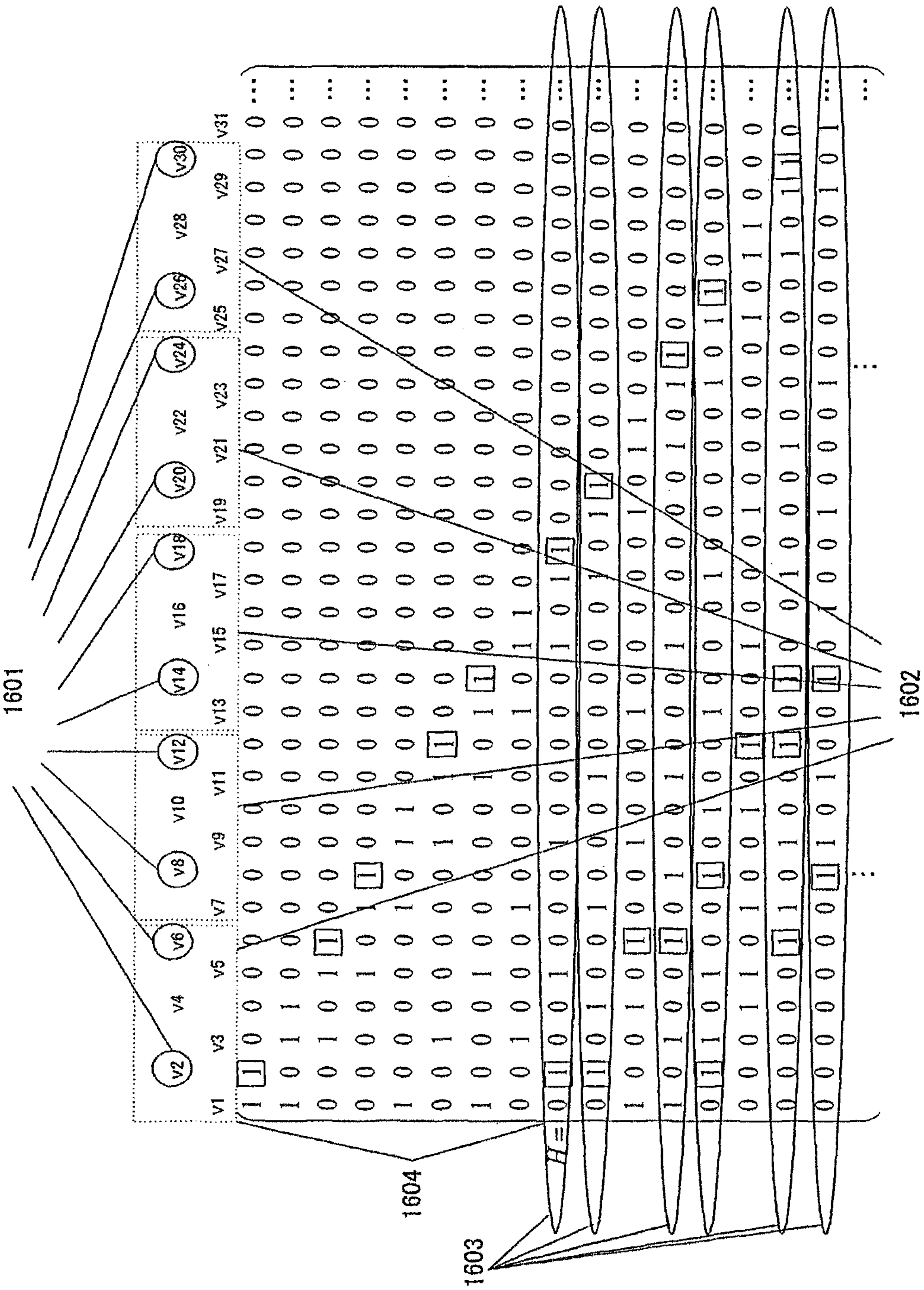
FIG. 18 shows an example of the configuration of an LDPC-CC parity check matrix of a time varying period of 1 according to Embodiment 7.

FIG. 18 shows an example of a puncturing method in case of a time varying period of 1. In FIG. 18, H is an LDPC-CC parity check matrix, and if a transmission sequence vector is designated v, the relationship in Equation 70 holds true.

$$Hv=0 \quad \text{(Equation 70)}$$

Here, transmission sequence vector v=(v1, v2, v3, v4, v5, v6, . . . , v2i, v2i+1, . . . )T.

FIG. 18 shows an example of a case in which a transmission sequence for which the coding rate of R=½ is punctured, giving the coding rate of R=¾. When puncturing is performed periodically, a block period for selecting puncture bits is first set. FIG. 18 shows an example in which the block period is made 6, and blocks are set as shown by the dotted lines (1602). Then two bits of the six bits forming one block are selected as puncture bits, and the selected two bits are set as non-transmitted bits. In FIG. 18, circled bits 1601 are non-transmitted bits. In this way, a coding rate of ¾ can be implemented. Therefore, the transmission data sequence becomes v1, v3, v4, v5, v7, v9, v10, v11, v13, v15, v16, v17, v19, v21, v22, v23, v25, . . . .

A "1" inside a square in FIG. 18 has no initial log likelihood ratio at the time of reception due to puncturing, and therefore its log likelihood ratio is set to 0.

In BP decoding, row computation and column computation are performed iteratively. Therefore, if two or more bits for which there is no initial log likelihood ratio (bits with a 0 log likelihood ratio) (lost bits) are included in the same row, log likelihood ratio updating is not performed by row computation in isolation for that row until the log likelihood ratio of a bit for which there is no initial log likelihood ratio (a bit with a 0 log likelihood ratio) is updated by column computation. That is to say, belief is not propagated by row computation in isolation, and iteration of row computation and column computation is necessary in order to propagate belief. Therefore, if there are many such rows, belief is not propagated in a case such as when there is a limit on the number of iteration processes in BP decoding, causing degradation of received quality. In the example shown in FIG. 18, a bit corresponding to a 1 inside a square indicates an lost bit, and rows 1603 are rows for which belief is not propagated by row computation in isolation, that is, rows that cause degradation of received quality.

Therefore, as a puncture bit (non-transmitted bit) decision method, that is, a puncturing pattern decision method, it is necessary to find a method whereby rows for which belief is not propagated in isolation due to puncturing are made as few as possible. Finding a puncture bit selection method is described below.

Figure 20A:
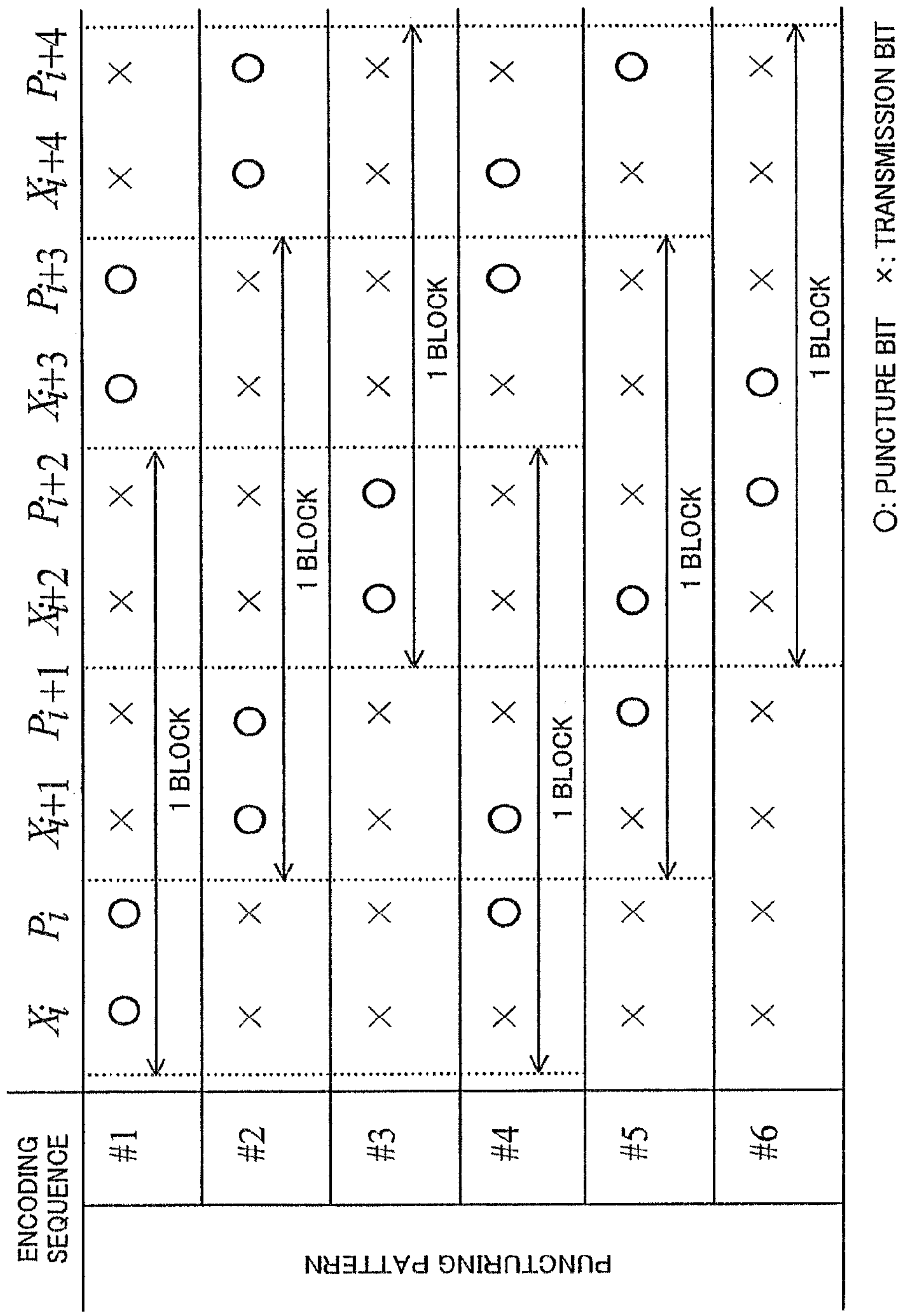
FIG. 20A is a drawing for explaining a number puncturing patterns.

When two bits of the six bits forming one block are selected as puncture bits, there are $3\times2C_2$ 2-bit selection methods. Of these, selection methods whereby cyclic shifting is performed within six bits of a block period can be regarded as identical. A supplementary explanation is given below using FIG. 20A. As an example, FIG. 20A shows six puncturing patterns when two of six bits are punctured consecutively. As shown in FIG. 20A, puncturing patterns #1 through #3 become identical puncturing patterns by changing the block delimiter. Similarly, puncturing patterns #4 through #6 becomes identical puncturing patterns by changing the block delimiter. Thus, selection methods whereby cyclic shifting is performed within six bits of a block period can be regarded as identical. Therefore, there are $3\times2C_2\times2(3\times2)=5$ puncture bit selection methods.

When one block is composed of L×k bits, and k bits of the L×k bits are punctured, the number of puncturing patterns found by means of Equation 71 exist.

$$\frac{2}{L\times k}\times_{L\times k}C_k \quad \text{(Equation 71)}$$

The relationship between an encoding sequence and a puncturing pattern when focusing on one puncturing pattern is shown in FIG. 20B. Although not shown, there are also puncture bits at Xi+3 and Pi+3. Consequently, as can be seen from FIG. 20B, when two bits of six bits forming one block are punctured, existing check equation patterns for one puncturing pattern are (3×2)×½. Similarly, when one block is composed of L×k bits, and k bits of the L×k bits are punctured, the numbers of puncturing patterns found by means of Equation 72 exist for one puncturing pattern.

$$L\times k\times\frac{1}{2} \quad \text{(Equation 72)}$$

Therefore, in a puncturing pattern selection method, it is necessary to check whether or not belief is propagated in isolation for the number of check equations (rows) found from Equation 73.

$$\frac{2}{3\times2}\times_{3\times2}C_2\times3\times2\times\frac{1}{2}=15 \quad \text{(Equation 73)}$$

From the above relationship, when making a coding rate of ¾ from a code of a coding rate of ½, if k bits of an L×k-bit block are punctured it is necessary to check whether or not belief is propagated in isolation for the number of check equations (rows) found from Equation 74.

$$\frac{2}{L\times k}\times_{L\times k}C_k\times L\times k\times\frac{1}{2} \quad \text{(Equation 74)}$$

Then, if a good puncturing pattern cannot be found, it is necessary to increment L and k.

Next, a case in which the time varying period is m will be considered. In this case, also, in the same way as when the time varying period is 1, m different check equations represented by Equation 64 are provided. Below, m check equations are designated "check equation #1, check equation #2, . . . , check equation #m."

Figure 19:
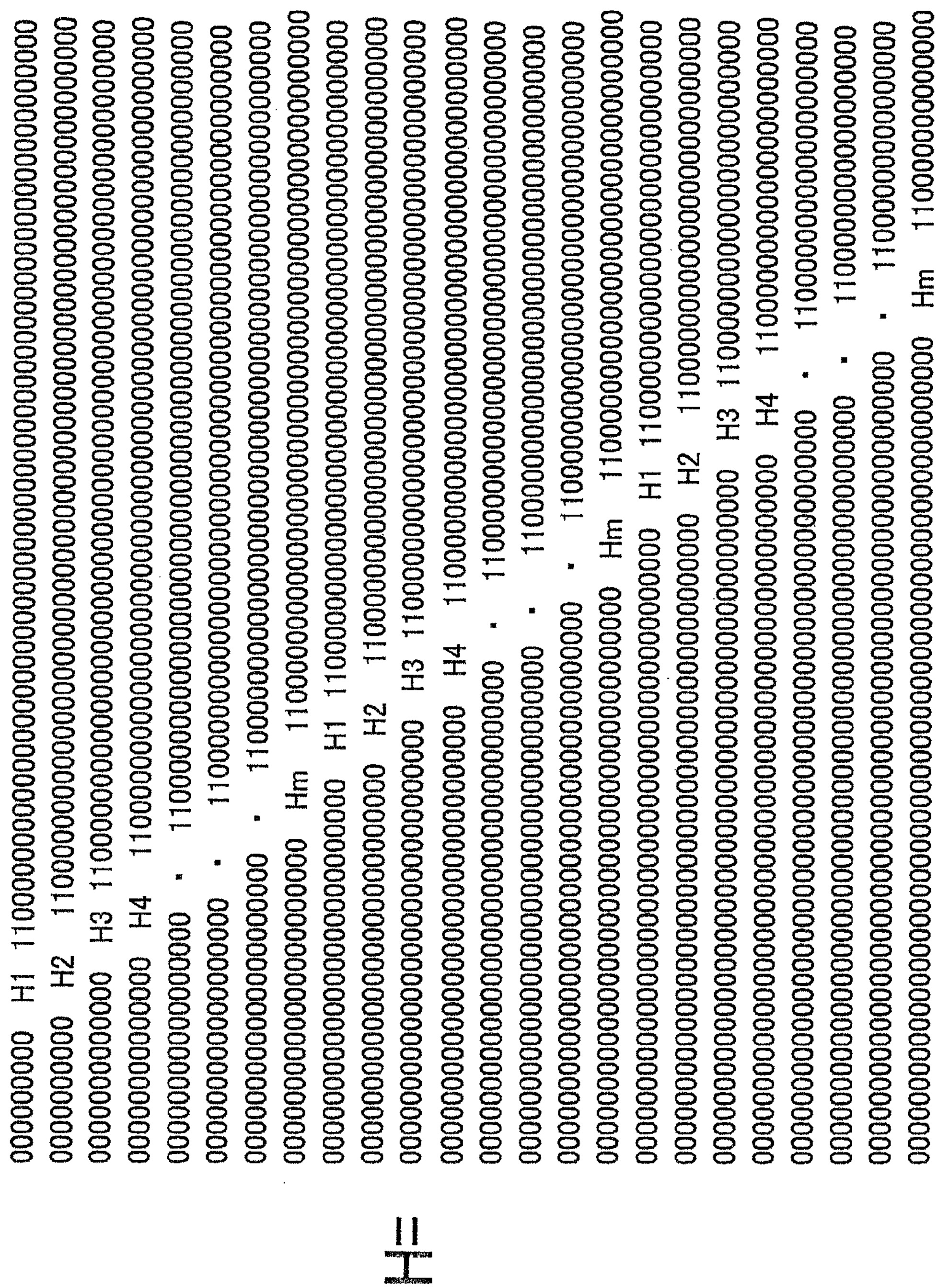
FIG. 19 shows an example of the configuration of an LDPC-CC parity check matrix of a time varying period of m according to Embodiment 7.

Consider an LDPC-CC for which parity $P_{mi+1}$ of point in time mi+1 is found using "check equation #1," parity $P_{mi+2}$ of point in time mi+2 is found using "check equation #2," . . . , and parity $P_{mi+m}$ of point in time mi+m is found using "check equation #m." At this time, following the same line of thought as in the case of FIG. 17, a parity check matrix is as shown in FIG. 19. Thus, when making a coding rate of ¾ from a code of a coding rate of ½, for a case in which two bits of a 6-bit block are punctured, for example, following the same line of thought as in the case of Equation 73, it is necessary to check whether or not belief is propagated in isolation for the number of check equations (rows) found from Equation 75.

$$\frac{2}{3\times2}\times_{3\times2}C_2\times LCM\{3,m\}=5\times LCM\{3,m\} \quad \text{(Equation 75)}$$

In Equation 75, LCM{α,β} represents the least common multiple of natural number α and natural number β.

As can be seen from Equation 75, as m increases, check equations that must be checked increase. Consequently, a puncturing method of periodically performing puncturing is not suitable, and, for example, a method of randomly puncturing is used, with a resultant possibility of received quality degrading.

FIG. 20C shows the number of parity check polynomials that must be checked when generating encoding sequences for which coding rates are R=⅔, ¾, and ⅚ by puncturing k bits of the L×k bits by means of puncturing.

Realistically, a time varying period enabling an optimal puncturing pattern to be found is between 2 and 10 or so. In particular, taking a time varying period enabling an optimal puncturing pattern to be found and an improvement in received quality into consideration, a time varying period of 2 is suitable. There is also an advantage of being able to configure an encoder/decoder extremely easily if the kind of check equations shown in Equation 64 and Equation 66 are repeated periodically with a time varying period of 2.

In the case of time varying periods of 3, 4, 5, . . . , 10, although an encoder/decoder configuration is slightly larger than when the time varying period is 2, as in the case of a time varying period of 2a simple configuration can be employed when periodically repeating a plurality of parity check equations based on Equation 64 and Equation 66.

When a time varying period is semi-infinite (an extremely long period), or an LDPC-CC is created from an LDPC-BC, the time varying period is generally extremely long, and therefore it is difficult to employ a method of periodically selecting puncture bits and to find an optimal puncturing pattern. Employing a method of randomly selecting puncture bits could be considered, for example, but there is a possibility of received quality degrading greatly when puncturing is performed.

In Equations 64, 66, 68, and 69, a check polynomial can also be represented by multiplying both sides by $D^n$. In this embodiment, it has been assumed that terms $D^0X(D)$ and $D^0P(D)$ (where $D^0=1$) are present in Equations 64, 66, 68, and 69.

In this way, parity can be computed sequentially, with the result that the configuration of encoder becomes simple, and furthermore, in the case of a systematic code, if belief propagation to data of point in time i is considered, belief propagation to data can easily be understood if a $D^0$ term is present in both data and parity, enabling code design to be carried out easily. If simplicity of code design is not taken into consideration, it is not necessary for a $D^0X(D)$ term to be present in Equations 64, 66, 68, and 69.

Figure 21A:
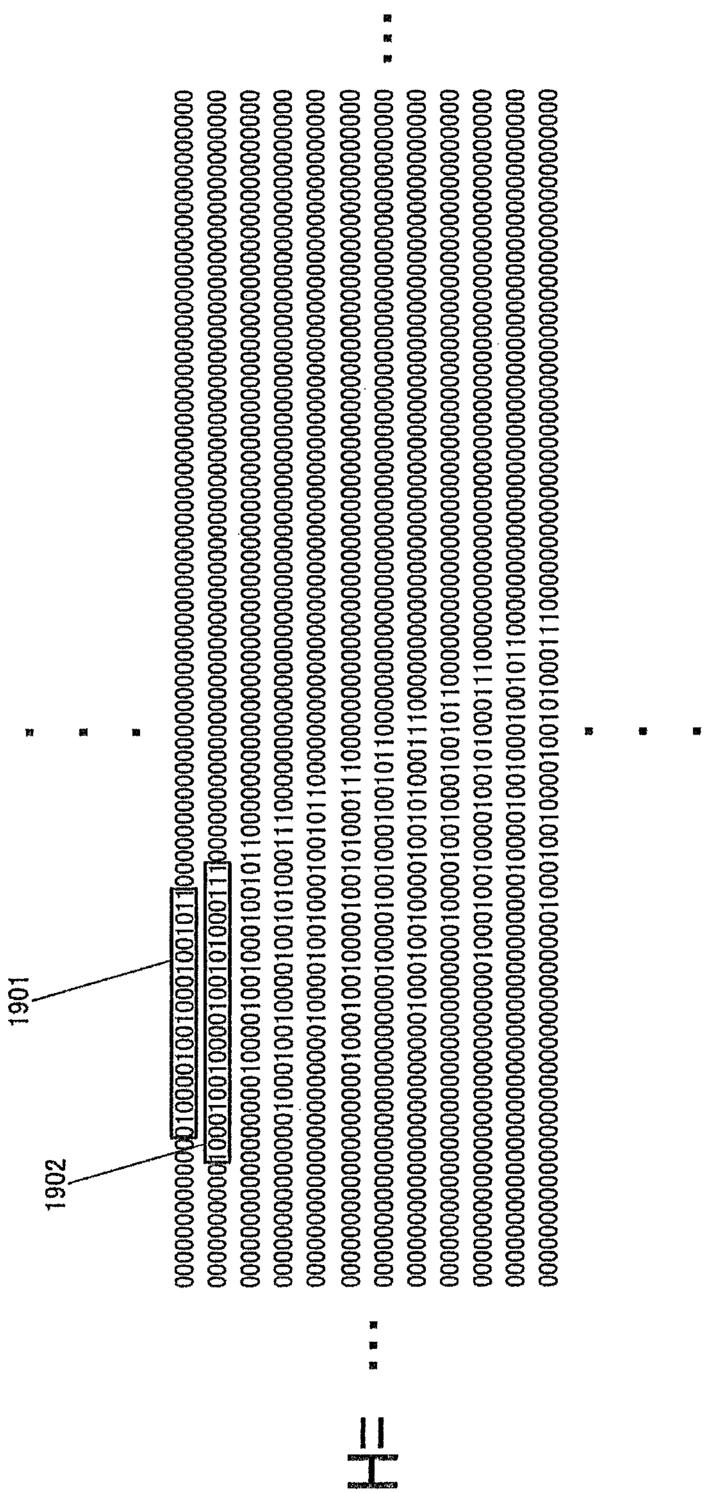
FIG. 21A shows an example of the configuration of an LDPC-CC parity check matrix of a time varying period of 2.

FIG. 21A shows an example of an LDPC-CC parity check matrix of a time varying period of 2. As shown in FIG. 21A, in the case of a time varying period of 2, two parity check equations, parity check equation 1901 and parity check equation 1902, are used alternately.

Figure 21B:
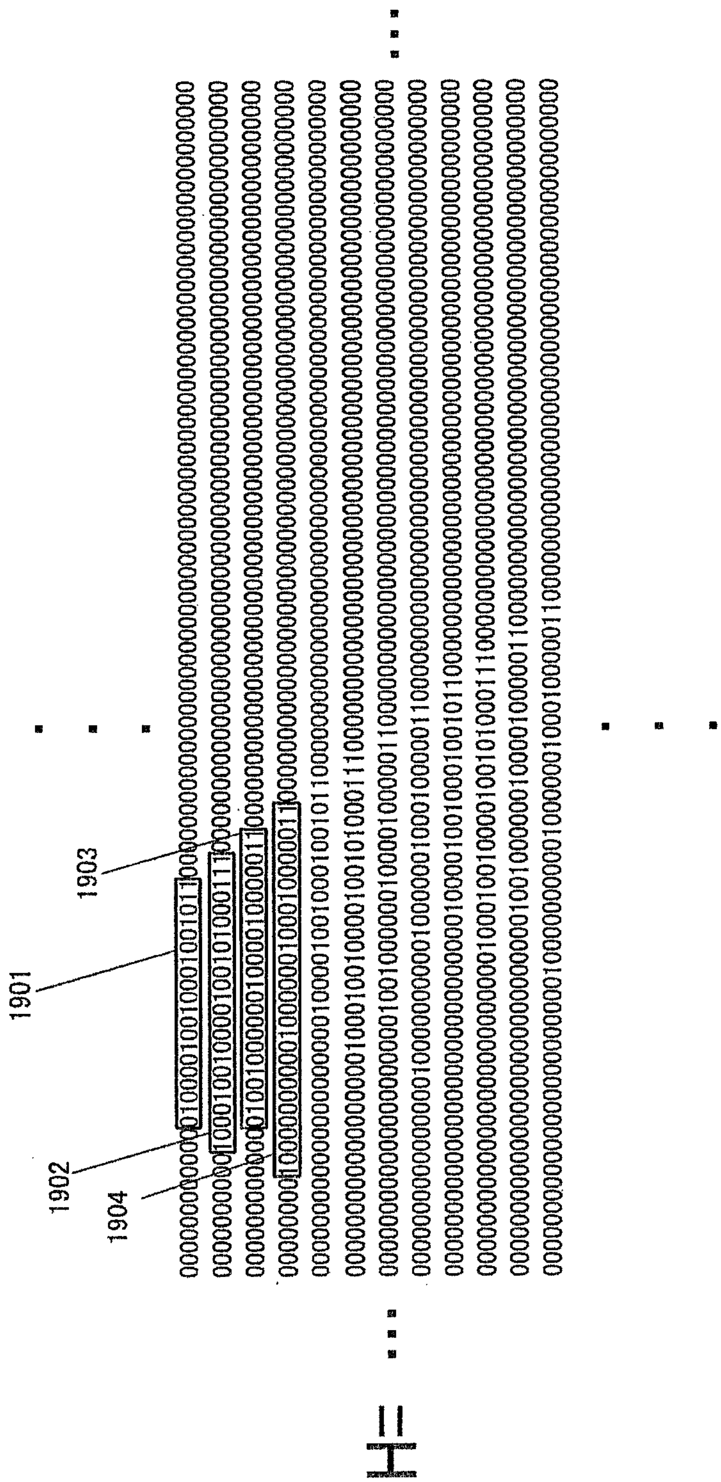
FIG. 21B shows an example of the configuration of an LDPC-CC parity check matrix of a time varying period of 4.

FIG. 21B shows an example of an LDPC-CC parity check matrix of a time varying period of 4. As shown in FIG. 21B, in the case of a time varying period of 4, four parity check equations, parity check equation 1901, parity check equation 1902, parity check equation 1903, and parity check equation 1904, are used alternately.

As described above, according to this embodiment, provision is made for a parity sequence to be found by means of a parity check matrix of a time varying period of 2 formed with parity check polynomial (64) and parity check polynomial (66) different from Equation 64. The time varying period is not limited to 2, and, for example, provision may also be made for a parity sequence to be found using a parity check matrix of a time varying period of 4 such as shown in FIG. 21B. However, if a time varying period of m is too large, it is difficult to perform puncturing periodically, and it may be necessary to perform puncturing randomly, for example, resulting in degradation of received quality. Realistically, a time varying period enabling an optimal puncturing pattern to be found is between 2 and 10 or so. In this case, received quality can be improved and puncturing can be performed periodically, enabling an LDPC-CC encoder to be configured easily.

It has been confirmed that good received quality is obtained if the row weight in parity check matrix H, that is, the number of 1 elements among row elements of the parity check matrix, is between 7 and 12. Considering a code for which the minimum distance is excellent in a convolutional code, as described in Non-Patent Document 12, if the fact that row weight increases as constraint length increases—with, for example, the row weight being 14 in the case of a feedback convolutional code with a constraint length of 11—is taken into consideration, the row weight between 7 and 12 can be considered to be a unique value of an LDPC-CC of this proposal. Also, if code design merit is taken into consideration, design is simplified if the same row weight is used for each row of an LDPC-CC parity check matrix.

In the above description, a case in which the coding rate is ½ has been described, but the present invention is not limited to this, and a parity sequence can also be found using a parity check matrix of a time varying period of m and a coding rate other than ½, and the same kind of effect can also be obtained with a time varying period between 2 and 10 or so.

In particular, if coding rates are R=⅚, ⅞, or above, a puncturing pattern is selected so as to avoid a configuration comprising only rows including two or more lost bits in a LDPC-CC of a time varying period of 2 or a time varying period of m described in this embodiment. That is to say, selecting a puncturing pattern such that there is a row for which the number of lost bits is zero or one is important in obtaining good received quality when the coding rate is high, such as when the coding rates are R=⅚, ⅞, or above.

Embodiment 8

In this embodiment, a time varying LDPC-CC is described that uses a check equation such that "1"s are present in the upper trapezoidal matrix of the parity check matrix described in Embodiment 2, and that enables an encoder to be configured easily. A method is described below for configuring the above with the coding rate of R=½.

With a coding rate of ½, if polynomial representation of an information sequence (data) is X(D), and a parity sequence polynomial representation is P(D), a parity check polynomial is represented as shown below.

$$(D^{a1}+\ldots+D^{an}+1+D^{c1}+\ldots+D^{cq})X(D)+(D^{b1}+\ldots+D^{bm}1)P(D)=0 \quad \text{(Equation 76)}$$

In Equation 76, it is assumed that a1, a2, . . . , an are integers of 1 or above (where a1≠a2≠ . . . ≠an). Also, it is assumed that b1, b2, . . . , bm are integers of 1 or above (where b1≠b2≠ . . . ≠bm). Also, it is assumed that c1, c2, . . . , eq are integers of −1 or below (where c1≠c2≠ . . . ≠cq). Therefore, P(D) is represented as shown below.

$$P(D)=(D^{a1}+\ldots+D^{an}+1+D^{c1}+\ldots+D^{cq})X(D)+(D^{b1}+\ldots+D^{bm})P(D) \quad \text{(Equation 77)}$$

Parity P can be found sequentially in the same way as in Embodiment 2.

Equation 78 and Equation 79 will be considered as parity check polynomials of a coding rate of ½ different from Equation 76.

$$(D^{A1}+\ldots+D^{AN}+1)X(D)+(D^{B1}+\ldots+D^{BM})P(D)=0 \quad \text{(Equation 77)}$$

$$(D^{A1}+\ldots+D^{AN}+1+D^{C1}+\ldots+D^{DQ})X(D)+(D^{B1}+\ldots+D^{BM})P(D)=0 \quad \text{(Equation 79)}$$

In Equations 78 and 79, it is assumed that A1, A2, . . . , AN are integers of 1 or above (where A1≠A2≠ . . . ≠AN). Also, it is assumed that B1, B2, . . . , BM are integers of 1 or above (where B1≠B2≠ . . . ≠BM). Also, it is assumed that C1, C2, . . . , CQ are integers of −1 or below (where c1≠c2≠ . . . ≠cq). Therefore, P(D) is represented as shown below.

$$P(D)=(D^{A1}+\ldots+D^{AN}+1)X(D)+(D^{B1}+\ldots+D^{BM})P(D) \quad \text{(Equation 80)}$$

$$P(D)=(D^{A1}+\ldots+D^{AN}+1+D^{C1}+\ldots+D^{CQ})X(D)+(D^{B1}+\ldots+D^{BM})P(D) \quad \text{(Equation 81)}$$

Below, data X and parity P of point in time 2i are represented by $X_{2i}$ and $P_{2i}$ respectively, and data X and parity P of point in time 2i+1 are represented by $X_{2i+1}$ and $P_{2i+1}$ respectively (where i is an integer).

At this time, an LDPC-CC of a time varying period of 2 for which parity $P_{2i}$ of point in time 2i is found using Equation 77 and parity $P_{2i+1}$ of point in time 2i+1 is found using Equation 80, or an LDPC-CC of a time varying period of 2 for which parity $P_{2i}$ of point in time 2i is found using Equation 77 and parity $_{P2i+1}$ of point in time 2i+1 is found using Equation 81, is considered.

An LDPC-CC of this kind provides the following advantages:

An encoder can be configured easily, and parity can be found sequentially.

Puncture bits can be set periodically.

Termination bit reduction and received quality improvement in puncturing upon termination can be expected.

Next, an LDPC-CC for which the time varying period is m is considered. In the same way as when the time varying period is 2, "check equation #1" represented by Equation 78 is provided, and "check equation #2" through "check equation #m" represented by either Equation 78 or Equation 79 are provided. Data X and parity P of point in time mi+1 are represented by $X_{mi+1}$ and $P_{mi+1}$ respectively, data X and parity P of point in time mi+2 are represented by $X_{mi+2}$ and $P_{mi+2}$ respectively, . . . , and data X and parity P of point in time mi+m are represented by $X_{mi+m}$ and $P_{mi+m}$ respectively (where i is an integer).

Consider an LDPC-CC for which parity $P_{mi+1}$ of point in time mi+1 is found using "check equation #1," parity $P_{mi+2}$ of point in time mi+2 is found using "check equation #2," . . . , and parity $P_{mi+m}$ of point in time mi+m is found using "check equation #m." An LDPC-CC code of this kind provides the following advantages:

An encoder can be configured easily, and parity can be found sequentially.

Termination bit reduction and received quality improvement in puncturing upon termination can be expected As described above, according to this embodiment, provision is made for a parity sequence to be found by means of a parity check matrix of a time varying period of 2 formed with parity check polynomial (76) and parity check polynomial (78) different from Equation 76.

Thus, when a check equation is used for which "1"s are present in an upper trapezoidal matrix of a parity check matrix, a time varying LDPC-CC encoder can be configured easily. The time variation period is not limited to 2. However, in the same way as in Embodiment 7, when a method is employed whereby puncturing is performed periodically, a time, varying period enabling an optimal puncturing pattern to be found is realistically between 2 and 10 or so.

In the case of time varying periods of 3, 4, 5, . . . , 10, although an encoder/decoder configuration is slightly larger than when the time varying period is 2, as in the case of a time varying period of 2a simple configuration can be employed when periodically repeating Equation 78 and Equation 79 check equations.

In Equations 76, 78, and 79, a check polynomial can also be represented by multiplying both sides by $D^n$. In this embodiment, it has been assumed that terms $D^0X(D)$ and $D^0P(D)$ (where $D^0=1$) are present in Equations 76, 78, and 79.

In this way, parity can be computed sequentially, with the result that the configuration of the encoder becomes simple, and furthermore, in the case of a systematic code, if belief propagation to data of point in time i is considered, if a $D^0$ term is present in both data and parity, enabling code design to be carried out easily. If simplicity of code design is not taken into consideration, it is not necessary for a $D^0X(D)$ term to be present in Equations 76, 78, and 79.

It has been confirmed that good received quality is obtained if the row weight in parity check matrix H, that is, the number of 1 elements among row elements of the parity check matrix, is between 7 and 12. Considering a code for which the minimum distance is excellent in a convolutional code, as described in Non-Patent Document 12, if the fact that row weight increases as the constraint length increases, with, for example, the row weight being 14 in the case of a feedback convolutional code with a constraint length of 11, is taken into consideration, making the row weight between 7 and 12 can be considered to be a unique feature of an LDPC-CC of this proposal. Also, if code design merit is taken into consideration, design is simplified if the same row weight is used for each row of an LDPC-CC parity check matrix.

Embodiment 9

In this embodiment, a detailed description will be given of a method of creating an LDPC-CC of a coding rate of ⅓ from an LDPC-CC of a coding rate of ½ (and a time varying period of in) described in Embodiment 7 and Embodiment 8. An LDPC-CC of a time varying period of 2 will be described as an example.

Data X and parity P of point in time 2i are represented by $X_{2i}$ and $P_{2i}$ respectively, and data X and parity P of point in time 2i+1 are represented by $X_{2i+1}$ and $P_{2i+1}$ respectively (where i is an integer). An LDPC-CC of a time varying period of 2 will be considered for which parity $P_{2i}$ of point in time 2i is found using Equation 64 and parity $P_{2i+1}$ of point in time 2i+1 is found using Equation 66.

Here, a polynomial of a new parity sequence is designated Pn(D), and one of Equation 82 through Equation 84 will be considered.

$$(D^{a1}+D^{a2}+\ldots+D^{ay})X(D)+(D^{b1}+D^{b2}+\ldots+D^{bm})P(D)+(D^{c1}+D^{c2}+\ldots+D^{cy})P_n(D)=0 \quad \text{(Equation 82)}$$

$$(D^{a1}+D^{a2}+\ldots+D^{ay})X(D)+(D^{c1}+D^{c2}+\ldots+D^{cy})P_n(D)=0 \quad \text{(Equation 83)}$$

$$(D^{b1}+D^{b2}+\ldots+D^{bm})P(D)+(D^{c1}+D^{c2}+\ldots+D^{cy})P_n(D)=0 \quad \text{(Equation 84)}$$

It is assumed that a1, a2, . . . , ay are integers of 1 or above (where a1≠a2≠ . . . ≠ay). Also, it is assumed that b1, b2, . . . , bw are integers of 1 or above (where b1≠b2≠ . . . ≠bw). Also, it is assumed that c1, c2, . . . , cy are integers of 1 or above (where c1≠c2≠ . . . ≠cy).

Then different check polynomials "cheek equation #1" and "check equation #2" configured by means of one of Equation 82 through Equation 84 are provided.

Data $X_{2i}$ at point in time 2i and parity $P_{2i}$ at point in time 2i are found using Equation 64, and parity $Pn_{,2i}$ at point in time 2i (parity for a coding rate of ⅓) is found using "check equation #1." At this time, a transmission sequence can be represented as $W_{2i}=(X_{2i}, P_{2i}, Pn_{2i})$.

Similarly, data $X_{2i+1}$ at point in time 2i+1 and parity $P_{2i+1}$ at point in time 2i+1 are found using Equation 66, and parity $Pn_{,2i+1}$ at point in time 2i+1 (parity for a coding rate of ⅓) is found using "check equation #2." At this time, a transmission sequence can be represented as $W_{2i+1}=(X_{2i+1}, P_{2i+1}, Pn_{2i+1})$. In general, one of c1, . . . , cy is "0."

Terms corresponding respectively to X(D), P(D), and Pn(D) in Equations 82, 83 and 84 will be considered. A parity check matrix of a coding rate of ½ is configured from Equations 64 and 66. At this time, a plurality of terms (there are a plurality of "1"s in a parity check matrix) are present in each of X(D) and P(D). Then, if the coding rate is made ⅓, a check equation configured by means of one of Equations 82, 83 and 84 is added.

A column weight at this time will be considered. According to a check equation in the case of a coding rate of ½, there is a certain level of column weight in data X and parity P, for example, a weight of around 5. In this state, a data X and parity P column weight increases when a check equation configured by means of one of Equations 82, 83, and 84 is added in order to set a coding rate of ⅓, but an improvement in received quality cannot be expected when BP decoding is performed unless column weight is suppressed to a certain degree. Therefore, if a check equation configured by means of one of Equations 82, 83, and 84 is added when setting a coding rate of ⅓, the increase in data X and parity P column weight must be kept down to 1 or 2. Therefore, Equation 82 becomes one of Equations 85 through 88.

$$(D^{a1}+D^{a2})X(D)+(D^{b1}+D^{b2})P(D)+(D^{c1}+D^{c2}+\dots+D^{c\gamma})P_n(D)=0 \quad \text{(Equation 85)}$$

$$(D^{a1})X(D)+(D^{b1}+D^{b2})P(D)+(D^{c1}+D^{c2}+\dots+D^{c\gamma})P_n(D)=0 \quad \text{(Equation 86)}$$

$$(D^{a1}+D^{a2})X(D)+(D^{b1})P(D)+(D^{c1}+D^{c2}+\dots+D^{c\gamma})P_n(D)=0 \quad \text{(Equation 87)}$$

$$(D^{a1})X(D)+(D^{b1})P(D)+(D^{c1}+D^{c2}+\dots+D^{c\gamma})P_n(D)=0 \quad \text{(Equation 88)}$$

Also, Equation 83 becomes one of Equations 89 and 90.

$$(D^{a1}+D^{a2})X(D)+(D^{c1}+D^{c2}+\dots+D^{c\gamma})P_n(D)=0 \quad \text{(Equation 89)}$$

$$(D^{a1})X(D)+(D^{c1}+D^{c2}+\dots+D^{c\gamma})P_n(D)=0 \quad \text{(Equation 90)}$$

Also, Equation 84 becomes one of Equations 91 and 92.

$$(D^{b1}+D^{b2})P(D)+(D^{c1}+D^{c2}+\dots+D^{c\gamma})P_n(D)=0 \quad \text{(Equation 91)}$$

$$(D^{b1})P(D)+(D^{c1}+D^{c2}+\dots+D^{c\gamma})P_n(D)=0 \quad \text{(Equation 92)}$$

The relationship between the number of terms of a parity check polynomial of a coding rate of ½ and the number of terms of a parity check polynomial added in order to obtain a coding rate of ⅓ is explained below. Below, a case is described by way of example in which an LDPC-CC of a coding rate of ½ is created using a parity check polynomial represented by Equation 64 and Equation 66, and an LDPC-CC of a coding rate of ⅓ is created by adding a parity check polynomial represented by Equation 82 through Equation 92.

Due to the presence of $D^{a1}$ through $D^{an}$ and $D^0$, the number of terms of X(D) in Equation 64 is n+1. Also, due to the presence of $D^{b1}$ through $D^{bm}$ and $D^0$, the number of terms of P(D) in Equation 64 is m+1.

Also, due to the presence of $D^{A1}$ through $D^{AN}$ and $D^0$, the number of terms of data X(D) in Equation 66 is N+1. Also, due to the presence of $D^{B1}$ through $D^{BM}$ and $D^0$, the number of terms of parity P(D) in Equation 66 is M+1.

Also, due to the presence of $D^{c1}$ through $D^{c\gamma}$ and $D^0$, the number of terms of parity Pn(D) in Equations 82 through 92 is γ+1.

Here, the minimum value of the number of terms in Equation 64 and Equation 66, n+l, m+1, N+1, M+1, is designated Z. It has been confirmed that good received quality can be obtained if the relationship γ+1<Z holds true for number of terms γ+1 of parity Pn(D) in Equation 82 through Equation 92 at this time.

In the case of a time varying period of 2, two different parity check polynomials are added in order to create an LDPC-CC of a coding rate of ⅓, and therefore it is necessary for the relationship γ+1<Z to hold true for these two parity check polynomials.

The reason why good received quality is obtained by this means is that, with a parity check matrix of a coding rate of ½, "1"s are inserted so that reception performance is good in the case of a coding rate of ½, and therefore the effect on received quality is kept small by preventing the number of "1"s to be inserted from becoming too large.

As described above, in this embodiment a parity check matrix of a time varying period of 2 configured from parity check polynomials (82) through (84) is added to a parity check matrix of a time varying period of 2 composed of parity check polynomial (64) and parity check polynomial (66) different from Equation 64, and a parity sequence is found using the added parity check matrix.

By this means, LDPC-CC of a time varying period of 2 and a coding rate of ⅓ can be generated from a convolutional code of a time varying period of 2 and a coding rate of ½. When generating an LDPC-CC of a coding rate of ¼ or below, also, generation can be performed in the same way as when generating an LDPC-CC of a coding rate of ⅓.

The time varying period is not limited to 2, and implementation is also possible in a similar way in the case of a time varying period of m described in Embodiment 7 and Embodiment 8. Implementation is of course also possible in a similar way in the case of a time varying period of 2 of Embodiment 8. Also, in the above description, a case has been described in which a parity check polynomial of a time varying period of 2 configured by means of one of Equations 82 through 84 is used as a new parity check equation in order to obtain a coding rate of 13, but implementation is also possible in a similar way using a parity check polynomial of a time varying period of n. In Equations 82 through 84, a1, a2, . . . , ay may also be −1 or below in the same way as in Embodiment 8.

For a time varying period of n and a time varying period of m, it has been confirmed that good received quality can be obtained if the relationship n=Km or m=Kn (where K is a natural number) holds true.

Also, good received quality can be obtained if the relationship γ+1<Z holds true between minimum number of terms Z of terms X(D) and P(D) among m parity check polynomials of a coding rate of ½ (and a time varying period of m) and number of terms γ+1 of Pn(D) of n parity check polynomials added in order to obtain a coding rate of ⅓ (a time varying period of n) in all n parity check polynomials.

Another Embodiment 1

In the above description, a convolutional code of a coding rate of ½ has been described as an example, but in this embodiment a method of configuring an LDPC-CC when the coding rate is 1/n will be described.

When the coding rate is 1/n, if polynomial representation of an information sequence (data) is X(D), polynomial representation of a parity 1 sequence is $P_i(D)$, polynomial representation of a parity 2 sequence is $P_2(D)$, . . . , and polynomial representation of a parity n−1 sequence is $P_{n-1}(D)$, a parity check polynomial is represented as shown in Equation 93 below.

$$(D^{Kx}+\dots+1)X(D)+(D^{K1}+\dots 1)P_1(D)+(D^{K2}+\dots+1)P_2(D)+\dots+(D^{Kn-1}+\dots+1)P_{n-1}(D)=0 \quad \text{(Equation 93)}$$

At this time, it is assumed that $K_x, K_1, K_2, \dots, K_{n-1}$ are integers of 0 or above, and the maximum value of $K_x, K_1, K_2, K_{n-1}$ is $K_{max}$.

Here, data at point in time i is represented by $X_i$, parity 1 by $P_i$, parity 2 by $P_{2,i}, \dots$, and parity n−1 by $P_{n-1,i}$. Then transmission vector w is represented as $w=(X_1, P_{1,1}, P_{2,1}, \dots, P_{n-1,1}, X_2, P_{1,2}, P_{2,2}, \dots, P_{n-1,2}, \dots, X_i, P_{1,i}, P_{2,i}, \dots, P_{n-1,i}, \dots)$. In this case, if a parity check matrix is designated H, above Equation 3 holds true.

Figure 22:
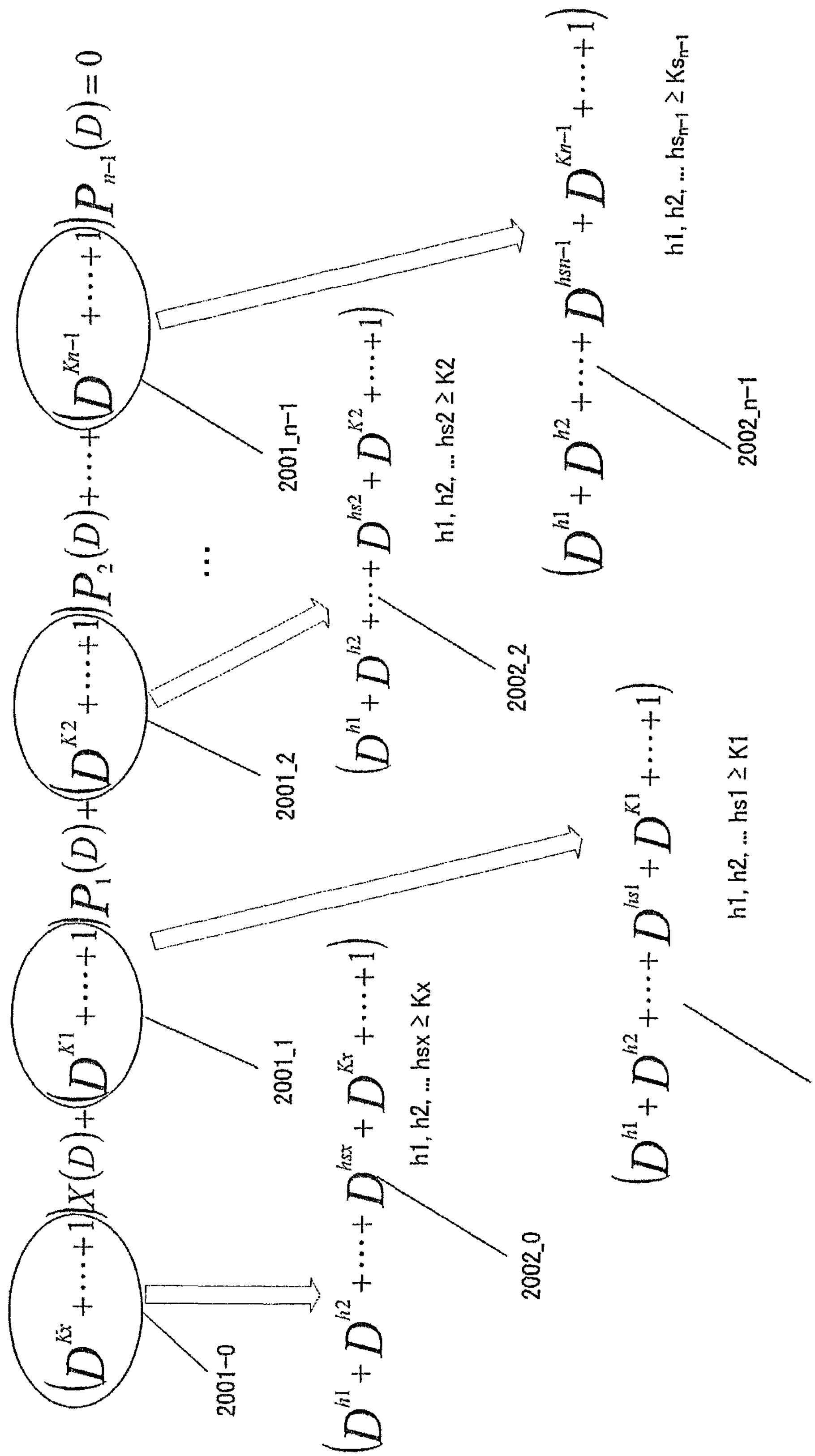
FIG. 22 illustrates a method of creating an LDPC-CC from a convolutional code of a coding rate of 1/n.

Here, in the same way as in Embodiment 1, probability propagation for data or (and) parity is taken into consideration, and "1"s are added to the parity check matrix. At this time, one or more of terms 2001_0, 2001_1, 2001__2, . . . , 2001_*n*−1 in FIG. 22 are selected, and changed to terms 2002_0, 2002_1, 2002_2, . . . , 2002_*n*−1. For example, if 2001_0 in FIG. 22 is selected, 2001_0 is changed to 2002_0, and the other terms are not changed. Also, if 2001_0 and 2001_*n*−1 in FIG. 22 are selected, 2001_0 is changed to 2002_0, 2001_*n*−1 is changed to 2002_*n*−1, and the other terms are not changed. Of course, terms 2001_0, 2001_1, 2001_2, . . . , 2001_$n-1$ in FIG. 22 may all be changed. That is to say, the check polynomial becomes as shown in Equation 94 below.

$$(D^{h1}+D^{h2}+\ldots+D^{hsx}+D^{Kx}+\ldots+1)X(D)+(D^{h1}+D^{h2}+\ldots+D^{hs1}+D^{K1}+\ldots+1)P_1(D)=$$

$$(D^{h1}+D^{h2}+\ldots+D^{hs2}+D^{K2}+\ldots+1)P_2(D)+\ldots+(D^{h1}+D^{h2}+\ldots+D^{hsn-1}+D^{Kn-1}+\ldots+1)P_{n-1}(D)=0 \quad \text{(Equation 94)}$$

At this time, in FIG. 22 and Equation 94, $s_x$, $s_1$, $s_2$, $s_{n-1}$ are 1 or above, and h1, h2, . . . , $hs_k \geq 2K_{max}+1$ is set (where k=x, 1, 2, . . . , n−1). By this means, good received quality can be obtained. Good received quality can also be obtained if at least one of h1, h2, . . . , hsk is 2 Kmax+1 or above.

Next, a method of adding the coding rate is made 1/n and "1"s to an upper trapezoidal matrix of a parity check matrix will be described in detail.

When the coding rate is 1/n, if polynomial representation of an information sequence (data) is X(D), polynomial representation of a parity 1 sequence is $P_1(D)$, polynomial representation of a parity 2 sequence is $P_2(D)$, . . . , and polynomial representation of a parity n−1 sequence is $P_{n-1}(D)$, a parity check polynomial is represented as shown in Equation 32 below.

Here, data at point in time i is represented by $X_i$, parity 1 by $P_{1,i}$, parity 2 by $P_{2,i}$, . . . , and parity n−1 by $P_{n-1,i}$. Then transmission vector w is represented as $w=(X_1, P_{1,1}, P_{2,1}, \ldots, P_{n-1,1}, X_2, P_{1,2}, P_{2,2}, \ldots, P_{n-1,2}, \ldots, X_i, P_{1,i}, P_{2,i}, \ldots, P_{n-1,i}, \ldots)$. In this case, if a parity check matrix is designated H, above Equation 3 holds true.

Figure 23:
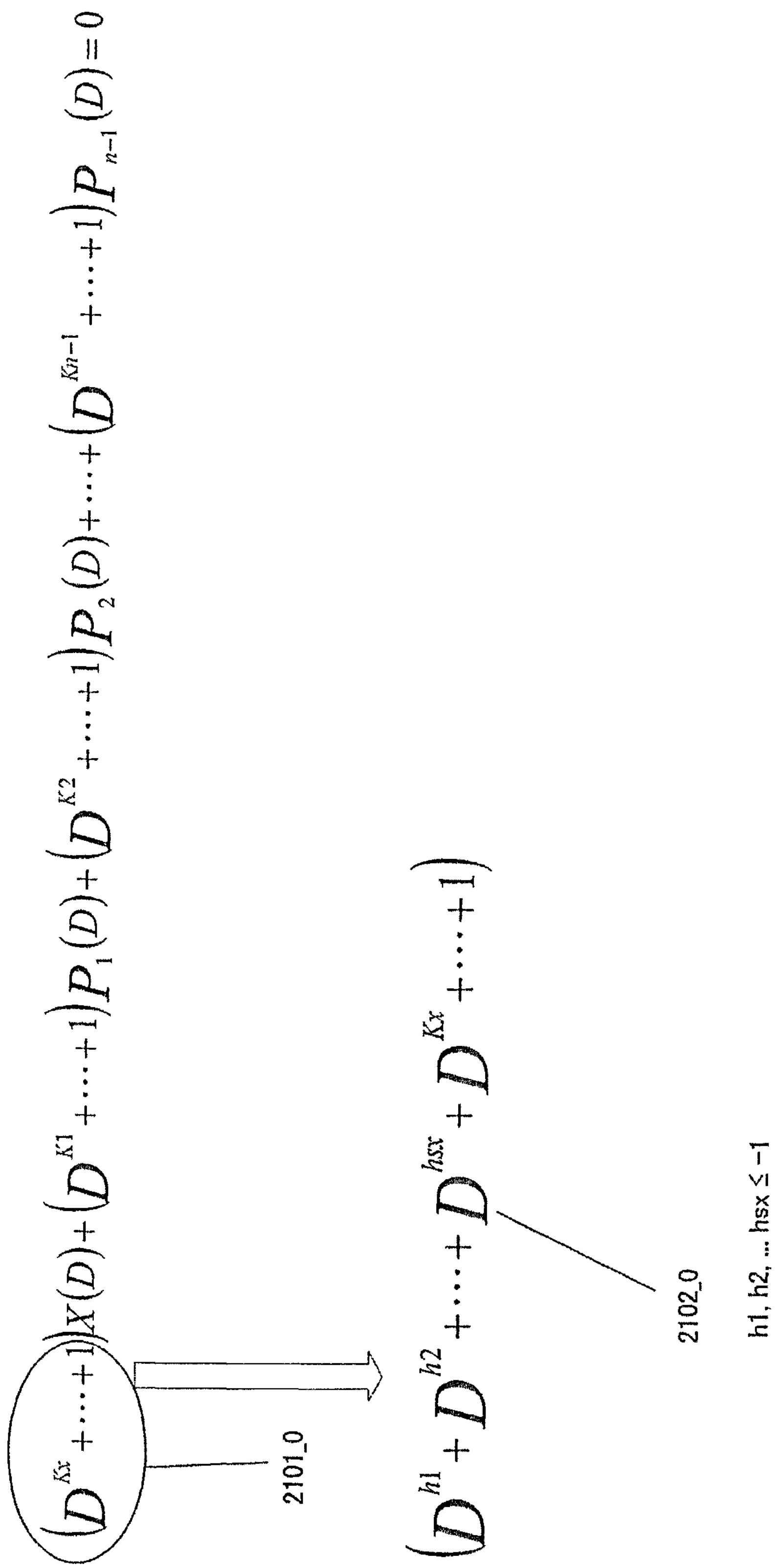
FIG. 23 illustrates a method of creating an LDPC-CC from a convolutional code of coding rate of 1/n.

Here, in the same way as in Embodiment 2, probability propagation for data or (and) parity is taken into consideration, and "1"s are added to the parity check matrix. At this time, term 2101_0 in FIG. 23 is changed to terms 2102_0. That is to say, the check polynomial becomes as shown in Equation 95 below.

$$(D^{h1}+D^{h2}+\ldots+D^{hsx}+\ldots+1)X(D)+(D^{K1}+\ldots+1)P_1(D)=$$

$$(D^{K2}+\ldots+1)P_2(D)+\ldots+(D^{Kn-1}+\ldots+1)P_{n-1}(D)=0 \quad \text{(Equation 95)}$$

At this time, s, in FIG. 23 is 1 or above, and h1, h2, . . . , $hs_x \leq -K_{max}-1$ is set. By this means, good received quality can be obtained. Good received quality can also be obtained if at least one of h1, h2, . . . , $hs_x$ is −Kmax−1 or below.

As described above, a method described in Embodiment 1 and Embodiment 2 can be extended to a method of generating an LDPC-CC from a convolutional code of a coding rate of 1/n as described in this embodiment. Also, when an LDPC-CC is generated from a convolutional code of a coding rate other than the above, an LDPC-CC can be created in a similar way if a method described thus far is extended.

In this embodiment, data can be obtained by performing BP decoding in a receiving apparatus even if transmission is performed after performing puncturing as described in Non-Patent Document 12 when transmitting data. At this time, since an LDPC-CC described in the embodiments is represented by a simple parity check matrix, data can be punctured more easily than in the case of an LDPC-BC.

In this embodiment, an example has been described in which "1"s are added to an upper trapezoidal matrix of a parity check matrix for data, as shown in FIG. 23, but the present invention is not limited to this, and, in combination with the case shown in FIG. 22, "1"s may also be added to an approximate lower triangular matrix of a parity check matrix in addition to being added to an upper trapezoidal matrix of a parity check matrix. By this means, a further improvement in received quality can be expected. The check polynomial in this case is Equation 96 below.

$$(D^{h1}+D^{h2}+\ldots+D^{hsx}+D^{Kx}+\ldots+1+D^{H1}+D^{H2}+\ldots+D^{Htx}X(D)+(D^{h1}+D^{h2}+\ldots+D^{hs1}+D^{K1}+\ldots+1)P_1(D)=$$

$$(D^{h1}+D^{h2}+\ldots+D^{hs2}+D^{K2}+\ldots+1)P_2(D)+\ldots+(D^{h1}+D^{h2}+\ldots+D^{hsn-1}+K^{Kn-1}+\ldots+1)P_{n-1}(D)=0 \quad \text{(Equation 96)}$$

The termination method when the coding rate is ½ described in Embodiment 3 can also be implemented in a similar way when the coding rate is 1/n as in this embodiment.

Another Embodiment 2

Figure 24:
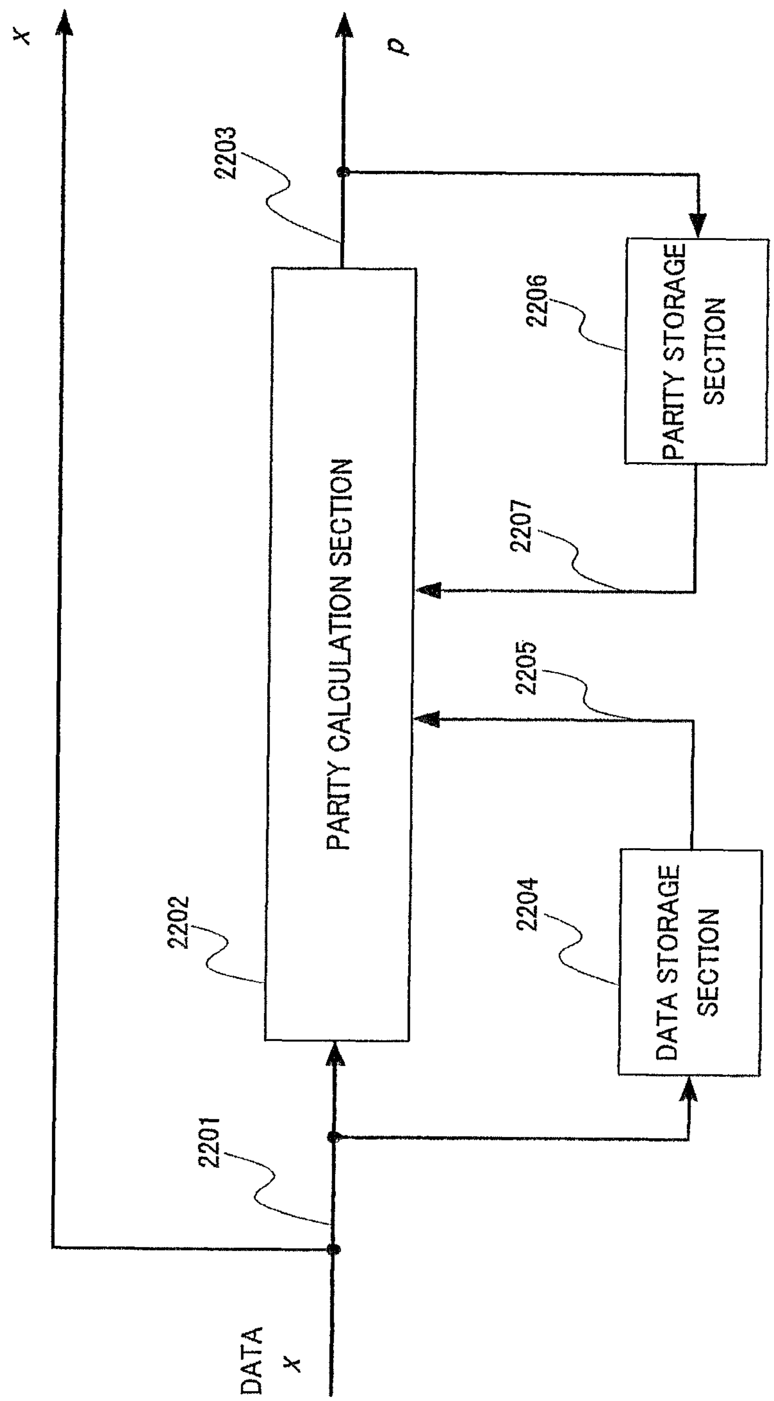
FIG. 24 shows an example of the configuration of an encoder.

Here, a configuration of an encoder of the present invention will be described. FIG. 24 shows an example of the configuration of Equation 15 encoder.

In FIG. 24, parity calculation section 2202 has data x (2201) (that is, X(D) of Equation 15), stored data 2205 (that is, $D^{\alpha1}X(D)$, $D^{\alpha2}X(D)$, $D^9X(D)$, $D^6X(D)$, $D^5X(D)$ of Equation 15), and stored parity 2207 (that is, $D^{\beta1}P(D)$, $D^{\beta2}P(D)$, $D^9P(D)$, $D^8P(D)$, $D^3P(D)$, DP(D) of Equation 15) as input, performs Equation 15 computation, and outputs parity 2203 (that is, P(D) of Equation 15).

Data storage section 2204 has data x (2201) as input, and stores its value. Similarly, parity storage section 2206 has parity 2203 as input, and stores its value.

Figure 25:
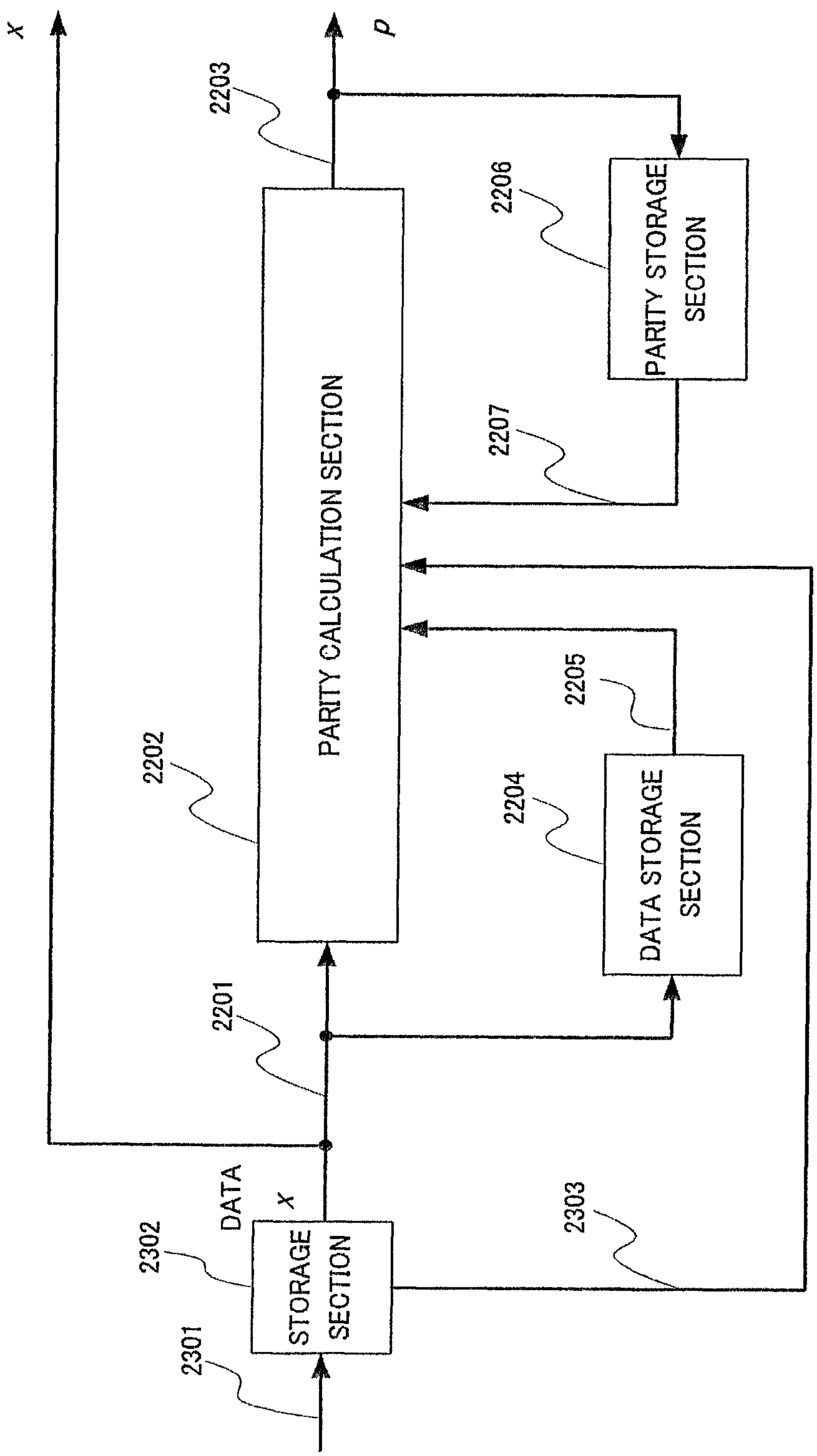
FIG. 25 shows an example of the configuration of an encoder.

FIG. 25 shows an example of the configuration of a encoder of Equation 19. Parts in FIG. 25 that operate in the same way as in FIG. 24 are assigned the same reference codes as in FIG. 24. Storage section 2302 stores data 2301, and outputs stored data 2303 (that is, $D^{\alpha1}X(D)$, . . . , $D^{\alpha n}X(D)$ of Equation 19).

Data storage section 2204 outputs stored data 2205 (that is, $D^2X(D)$ of Equation 19).

Parity storage section 2206 outputs stored parity 2207 (that is, $D^2P(D)$, DP(D) of Equation 19).

Parity calculation section 2202 has various signals as input, and calculates and outputs Equation 19 parity.

As described above, an encoder can basically be configured by means of a shift register and exclusive OR.

Next, sum-product decoding will be described as an example of a decoder algorithm. A sum-product decoding algorithm is as described below.

Sum-Product Decoding

Two-dimensional M×N matrix $H=\{H_{mn}\}$ is assumed to be a parity check matrix of an LDPC code that is a decoding object. Subsets A(m), B(n) of set [1, N]={1, 2, . . . , N} are defined as shown in Equations 97 and 98 below.

$$A(m) \equiv \{n : H_{mn}=1\} \quad \text{(Equation 97)}$$

$$B(n) \equiv \{m : H_{nm}=1\} \quad \text{(Equation 98)}$$

A(m) means a set of "1" column indexes in the m'th row of parity check matrix H, and B(n) is a set of "1" column indexes in the n'th row of parity check matrix H.

Step A•1 (Initialization)

Log likelihood ratio $\beta^{(i)}_{mn}=\lambda_n$ is set for all pairs (m,n) satisfying the equation $H_{mn}=1$. Loop variable (number of iterations) $1_{sum}$ is set to 1, and the maximum number of loops is set as $1_{sum,mux}$.

Step A•2 (Row Processing)

Log likelihood ratio $\alpha^{(i)}_{mn}$ is updated using update equations 99, 100, and 101 below for all pairs (m,n) satisfying the equation $H_{mn}=1$ in the order m=1, 2, . . . , M. Here, i represents the number of iterations, and f is a Gallager function.

$$\alpha_{mn}^{(i)} = \left(\prod_{n' \in A(m)\backslash n} \text{sign}(\beta_{mn'}^{(i-1)})\right) \times f\left(\sum_{n' \in A(m)\backslash n} f(|\beta_{mn'}^{(i-1)}|)\right) \quad \text{(Equation 99)}$$

$$\text{sign}(x) \equiv \begin{cases} 1 & x \geq 0 \\ -1 & x < 0 \end{cases} \quad \text{(Equation 100)}$$

$$f(x) \equiv \ln\frac{\exp(x)+1}{\exp(x)-1} \quad \text{(Equation 101)}$$

Step A•3 (Column Processing)

Log likelihood ratio $\beta^{(i)}_{mn}$ is updated using update equation 102 below for all pairs (m,n) satisfying the equation $H_{mn}=1$ in the order n=1, 2, . . . , N.

$$\beta_{mn}^{(i)} = \lambda_n + \sum_{m' \in B(n)\backslash m} \alpha_{m'n}^{(i)} \quad \text{(Equation 102)}$$

Step A•4 (Log Likelihood Ratio Calculation)

Log likelihood ratio $L^{(i)}_n$ is found by means of Equation 103 below for $n\in[1,N]$.

$$L_n^{(i)} = \lambda_n + \sum_{m' \in B(n)} \alpha_{m'n}^{(i)} \quad \text{(Equation 103)}$$

Step A•5 (Number-of-Iterations Count)

If $1_{sum}<1_{sum,mux}$, $1_{sum}$ is incremented and the procedure returns to step A•2. On the other hand, if $1_{sum}=1_{sum,mux}$, codeword w is estimated as shown in Equation 104 below, and sum-product decoding is terminated.

$$w \equiv \begin{cases} 0 & L_n^{(i)} \geq 0 \\ 1 & L_n^{(i)} < 0 \end{cases} \quad \text{(Equation 104)}$$

If a transmission sequence (post-encoding data) is designated $n_1, n_2, n_3, n_4, \ldots, u=(n_1, n_2, n_3, n_4, \ldots)$, and a generator matrix is designated G, the relational equation in Equation 105 below holds true.

$$HG^T=0 \quad \text{(Equation 105)}$$

Then, if information sequence vector $i=(i_1, i_2, \ldots)$, the relational equation in Equation 106 below holds true.

$$u=iG \quad \text{(Equation 106)}$$

A transmission sequence is found by employing Equations 105 and 106.

Figure 26:
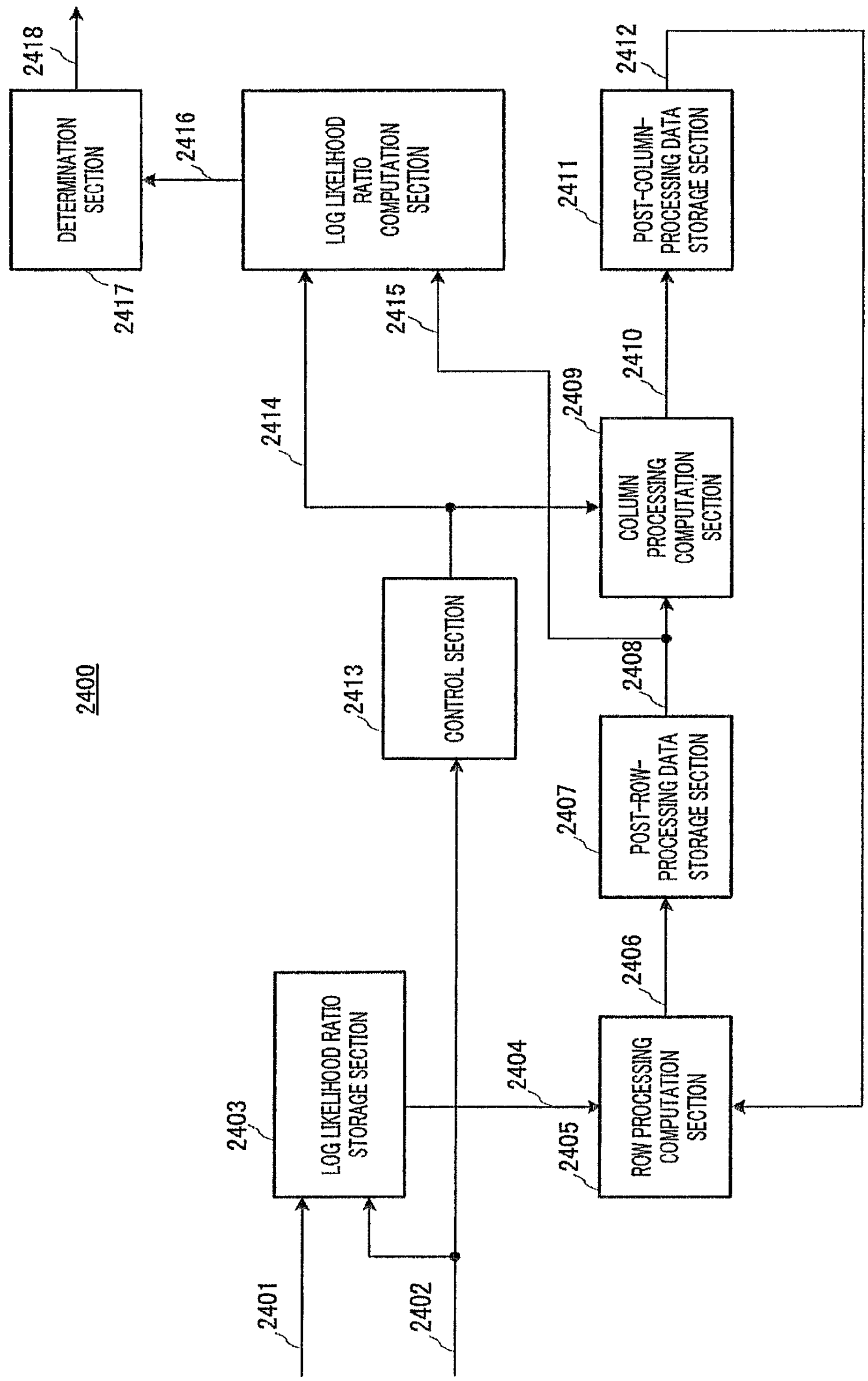
FIG. 26 shows a configuration of a decoder using a sum-product decoding algorithm.

FIG. 26 shows an example of a configuration when sum-product decoding is used in a decoder. Decoder 2400 in FIG. 26 comprises log likelihood ratio storage section 2403, row processing computation section 2405, post-row-processing data storage section 2407, column processing computation section 2409, post-column-processing data storage section 2411, control section 2413, log likelihood ratio computation section 2415, and determination section 2417.

Log likelihood ratio storage section 2403 has log likelihood ratio signal 2401 and timing signal 2402 as input, and stores a log likelihood ratio of a data interval based on timing signal 2402. Then log likelihood ratio storage section 2403 outputs a stored log likelihood ratio to row processing computation section 2405 as signal 2404.

Row processing computation section 2405 has log likelihood ratio signal 2404 and post-column-processing signal 2412 as input, and performs the above-described Step A•2 (Row processing) computation at a position at which a "1" is present in parity check matrix H. As the decoder performs iterative decoding, row processing computation section 2405 performs row processing using log likelihood ratio signal 2404 (corresponding to above-described Step A•1 processing) in the first decoding, and performs processing using post-column-processing signal 2412 in the second decoding. Then row processing computation section 2405 outputs post-row-processing signal 2406 to post-row-processing data storage section 2407.

Post-row-processing data storage section 2407 has post-row-processing signal 2406 as input, and stores all post-row-processing values (signals). Then post-row-processing data storage section 2407 outputs post-row-processing signal 2408 to column processing computation section 2409 and log likelihood ratio computation section 2415.

Column processing computation section 2409 has post-row-processing signal 2408 and control signal 2414 as input, confirms that this is not the final iterative computation from control signal 2414, and performs the above-described Step A•3 (Column processing) computation at a position at which a "1" is present in parity check matrix H. Then column processing computation section 2409 outputs post-column-processing signal 2410 to post-column-processing data storage section 2411.

Post-column-processing data storage section 2411 has post-column-processing signal 2410 as input, and stores all post-column-processing values (signals). Then post-column-processing data storage section 2411 outputs post-column-processing signal 2412 to row processing computation section 2405.

Control section 2413 has timing signal 2402 as input, counts the number of iterations, and outputs the number of iterations to column processing computation section 2409 and log likelihood ratio computation section 2415 as control signal 2414.

Log likelihood ratio computation section 2415 has post-row-processing signal 2408 and control signal 2414 as input, and if it determines that this is the final iterative computation based on control signal 2414, executes Step A•4 (Log likelihood ratio calculation) computation for a position at which a "1" is present in parity check matrix H, and obtains log likelihood ratio signal 2416. Then log likelihood ratio computation section 2415 outputs log likelihood ratio signal 2416 to determination section 2417.

Determination section 2417 has log likelihood ratio signal 2416 as input, estimates a codeword, and outputs estimation bit 2418.

Here, for BP decoding, decoding can also be performed using min-sum decoding similar to BP decoding, offset BP decoding, Normalized. BP decoding, shuffled BP decoding, or the like, as mentioned with regard to sum-product decoding.

Another Embodiment 3

With LDPC-CCs described in the preceding embodiments, a problem arises of whether data or parity should be punctured (subjected to selection of non-transmitted bits) preferentially when puncturing is performed.

When a row of a parity check matrix is considered, that is, when a parity check polynomial is considered, if the number of positions at which 1 is present corresponding to data in a row of a parity check matrix is designated Nx, and the number of positions corresponding to parity at which 1 is present is designated Np, bits that are punctured (selected as non-transmitted bits) preferentially may be selected as shown in 1) and 2) below according to the result of comparing Np and Nx.

1) If Np<Nx: Data is punctured preferentially

2) If Nx<Np: Parity is punctured preferentially

In this way, degradation of received quality when puncturing is performed can be suppressed.

Another Embodiment 4

In this embodiment, a transmitting apparatus and receiving apparatus that implement a puncturing method described in the preceding embodiments are described. A transmitting apparatus and receiving apparatus according to this embodiment can handle a plurality of coding rates.

Figure 27:
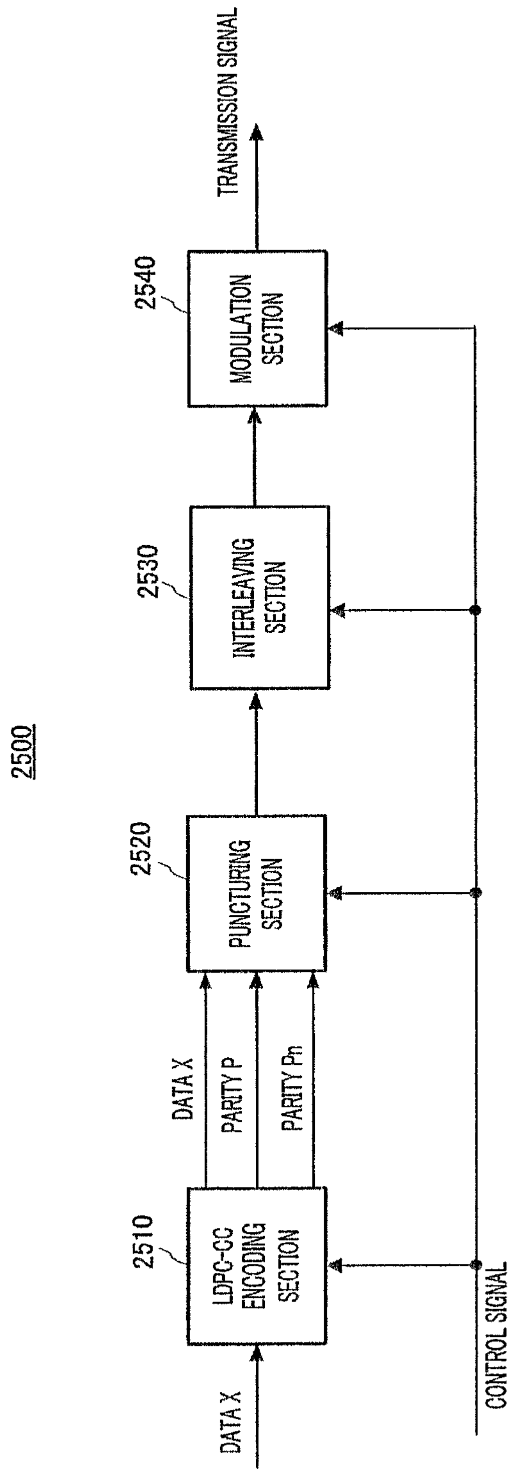
FIG. 27 shows an example of the configuration of a transmitting apparatus.

FIG. 27 shows a configuration of a transmitting apparatus according to this embodiment. Transmitting apparatus 2500 in FIG. 27 comprises LDPC-CC encoding section (LDPC-CC encoder) 2510, puncturing section 2520, interleaving section 2530, and modulation section 2540.

LDPC-CC encoding section 2510 executes encoding on data X using an LDPC-CC parity check matrix of a coding rate specified by a control signal. For example, if the control signal specifies a coding rate of ½ or above, LDPC-CC encoding section 2510 performs encoding on data X using an LDPC-CC of a coding rate of ½ parity check matrix, and outputs data X and parity P to puncturing section 2520. And if the control signal specifies a coding rate of ⅓, LDPC-CC encoding section 2510 performs encoding on data X using an LDPC-CC of a coding rate of ⅓ parity check matrix, and outputs data X, parity P, and parity Pn to puncturing section 2520.

Puncturing section 2520 executes puncturing on data X, parity P, or parity Pn output from LDPC-CC encoding section 2510 according to the coding rate specified by the control signal. In this embodiment, puncturing section 2520 does not perform puncturing randomly, but punctures bits periodically and in a regular manner. Puncturing section 2520 outputs a post-puncturing transmission sequence to interleaving section 2530.

Specifically, if the coding rate specified by the control signal exceeds ½, puncturing section 2520 punctures parity P periodically and uses a predetermined coding rate.

On the other hand, if the coding rate specified by the control signal is ½ or ⅓, puncturing section 2520 outputs a transmission sequence to interleaving section 2530 without performing puncturing.

Interleaving section 2530 rearranges the order of a transmission sequence and outputs a post-rearrangement transmission sequence to modulation section 2540.

Modulation section 2540 modulates a post-interleaving transmission sequence using a modulation method specified by a control signal.

Figure 28:
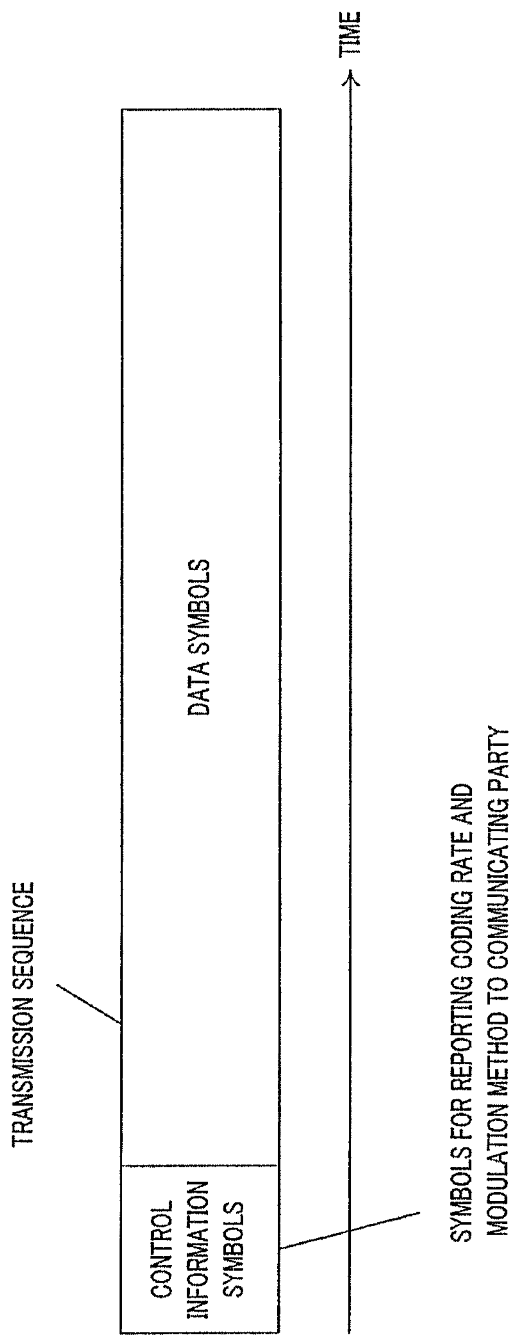
FIG. 28 shows an example of a transmission format.

FIG. 28 shows an example of a transmission sequence transmission format. A transmission sequence is composed of control information symbols and data symbols. Control information symbols are symbols for reporting a coding rate and modulation method to a communicating party.

Figure 29:
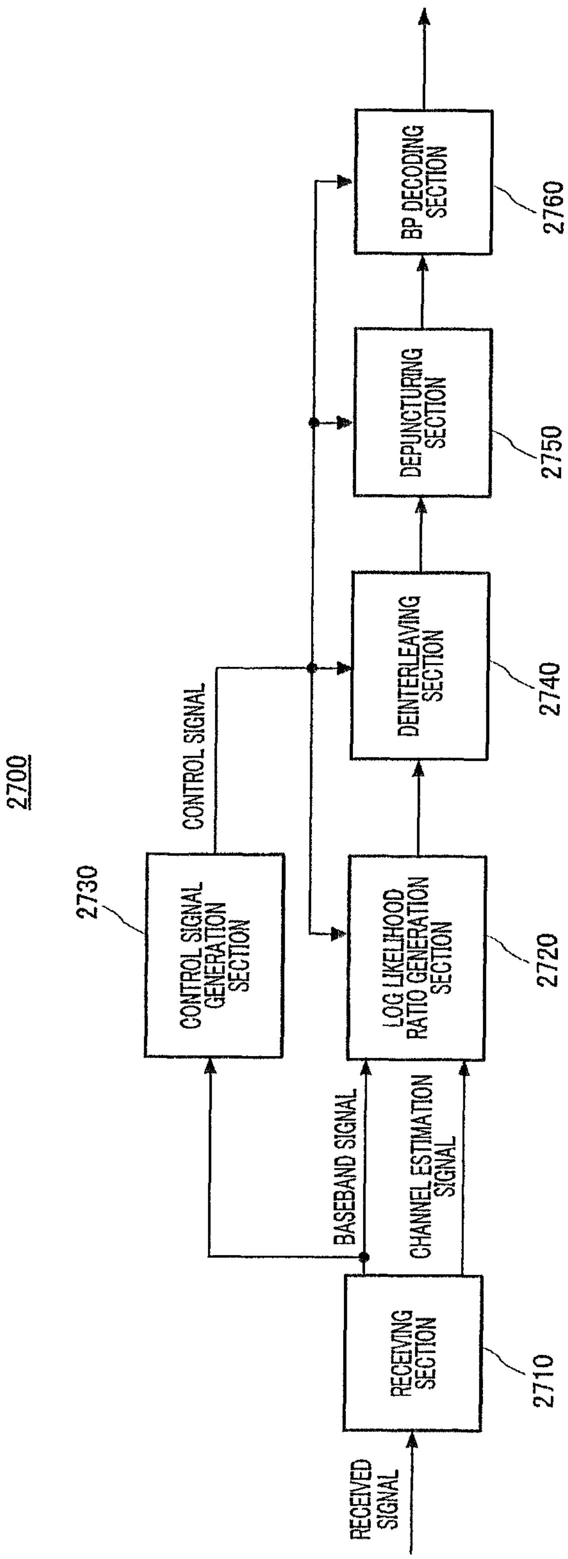
FIG. 29 shows an example of the configuration of a receiving apparatus.

FIG. 29 shows a configuration of a receiving apparatus according to this embodiment. Receiving apparatus 2700 in FIG. 29 comprises receiving section 2710, log likelihood ratio generation section 2720, control signal generation section 2730, deinterleaving section 2740, depuncturing section 2750, and BP decoding section 2760.

Receiving section 2710 receives a received signal transmitted from transmitting apparatus 2500, performs radio demodulation processing such as RF (Radio Frequency) filtering processing, frequency conversion, A/D (Analog to Digital) conversion, and quadrature demodulation, and outputs a baseband signal after radio demodulation processing to log likelihood ratio generation section 2720. Also, receiving section 2710 estimates channel fluctuation in a radio channel between transmitting apparatus 2500 and receiving apparatus 2700 using a known signal included in the baseband signal, and outputs an estimated channel estimation signal to log likelihood ratio generation section 2720.

Log likelihood ratio generation section 2720 finds a log likelihood ratio of each transmission sequence, and outputs an obtained log likelihood ratio to deinterleaving section 2740.

Control signal generation section 2730 extracts control information from control information symbols included in a broadband signal. Coding rate and modulation method information is included in the control information symbols. Control signal generation section 2730 outputs the extracted control information to log likelihood ratio generation section 2720, deinterleaving section 2740, depuncturing section 2750, and BP decoding section 2760 as a control signal.

Using processing that is the reverse of the rearrangement processing performed by interleaving section 2530 of transmitting apparatus 2500, deinterleaving section 2740 rearranges a log likelihood ratio sequence into its original order, and sends a post-rearrangement log likelihood ratio to depuncturing section 2750.

Using processing that is the reverse of the puncturing performed by puncturing section 2520, depuncturing section 2750 performs depuncturing on a log likelihood ratio output from deinterleaving section 2740. That is to say, if the coding rate exceeds ½, parity P is punctured periodically by transmitting apparatus 2500, and therefore in this case deinterleaving section 2740 inserts 0 as the log likelihood ratio of a bit punctured by puncturing section 2520. On the other hand, if the coding rate is ½ or ⅓, puncturing is not performed by puncturing section 2520, and therefore a log likelihood ratio is output to BP decoding section 2760 without the above depuncturing processing being performed.

BP decoding section 2760 switches an LDPC-CC parity check matrix according to the coding rate indicated by a control signal, and performs BP decoding. Specifically, BP decoding section 2760 is provided with LDPC-CC check matrices corresponding to a coding rate of ½ and a coding rate of ⅓, and performs BP decoding using the parity check matrix of a coding rate of ⅓ if the control signal indicates a coding rate of ⅓, or performs BP decoding using the parity check matrix of a coding rate of ½ if the control signal indicates a coding rate other than ⅓.

Figure 30:
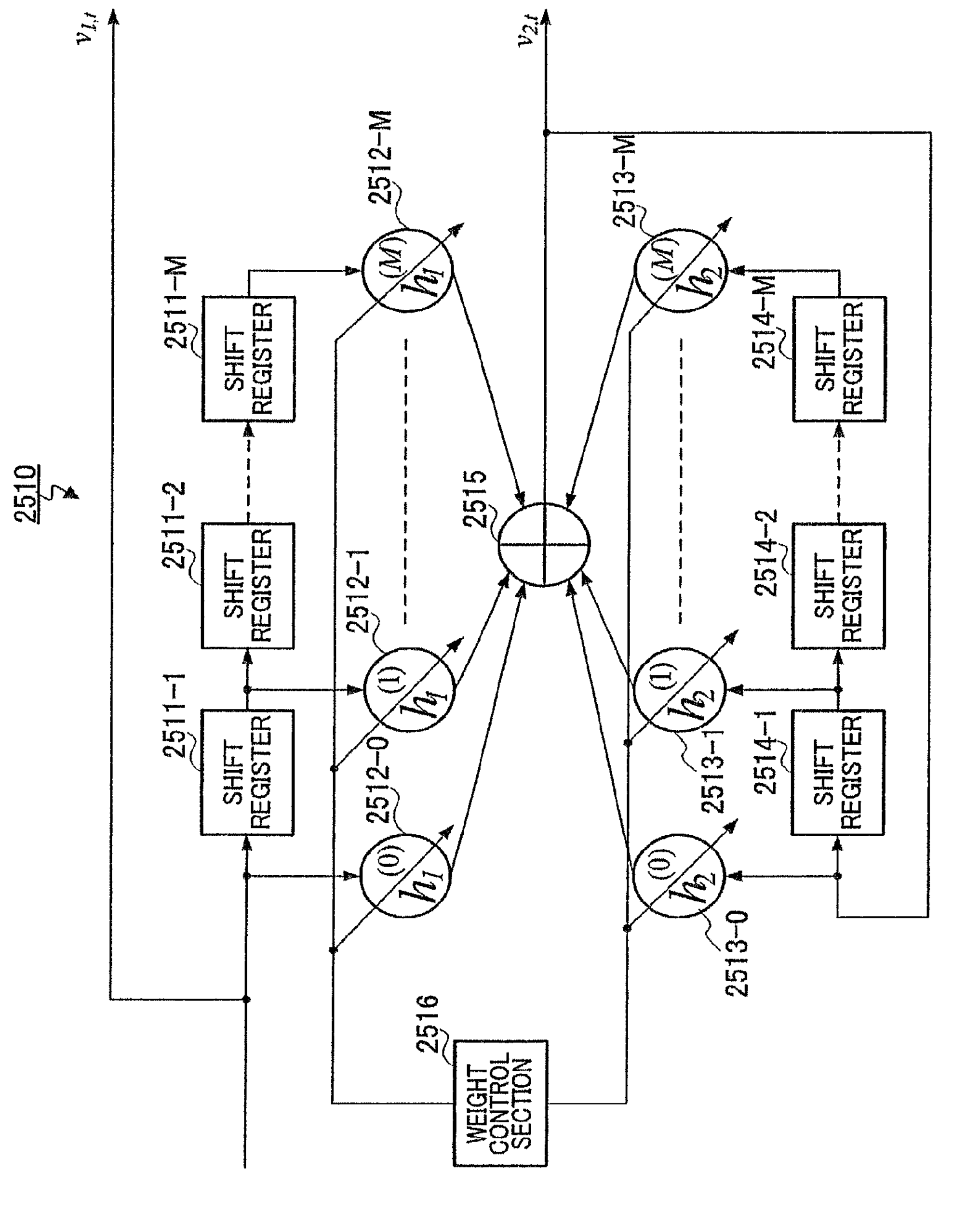
FIG. 30 shows an example of the configuration of an encoding section.

FIG. 30 shows an example of the configuration of LDPC-CC encoding section 2510 when the coding rate is R=½. As shown in FIG. 30, LDPC-CC encoding section 2510 comprises shift registers 2511-1 through 2511-M and 2514-1 through 2514-M, weight multipliers 2512-0 through 2512-M and 2513-0 through 2513-M, weight control section 2516, and modulo 2 adder 2515.

Shift registers 2511-1 through 2511-M and 2514-1 through 2514-M are registers storing $v_{1,t-i}$ and $v_{2,t-i}$ (where i=0, . . . , M) respectively, and at a timing at which the next input comes in, send a stored value to the adjacent shift register to the right, and store a new value sent from the adjacent shift register to the left. The initial state of the shift registers is all-zeros.

Weight multipliers 2512-0 through 2512-M and 2513-0 through 2513-M switch values of $h_1^{(m)}$ and $h_2^{(m)}$ to 0 or 1 in accordance with a control signal output from weight control section 2516. Based on a parity check matrix stored internally, weight control section 2516 outputs values of $h_1^{(m)}$ and $h_2^{(m)}$ at that timing, and supplies them to weight multipliers 2512-0 through 2512-M and 2513-0 through 2513-M.

Modulo 2 adder 2515 performs modulo 2 addition on the outputs of weight multipliers 2512-0 through 2512-M and 2513-0 through 2513-M, and calculates $v_{2,t}$.

By employing this kind of configuration, LDPC-CC encoding section (LDPC-CC encoder) 2510 can perform LDPC-CC encoding in accordance with a parity check matrix.

If the arrangement of rows of a parity check matrix stored by weight control section 2516 differs on a row-by-row basis, LDPC-CC encoding section 2510 is a time varying convolutional encoder.

Figure 31:
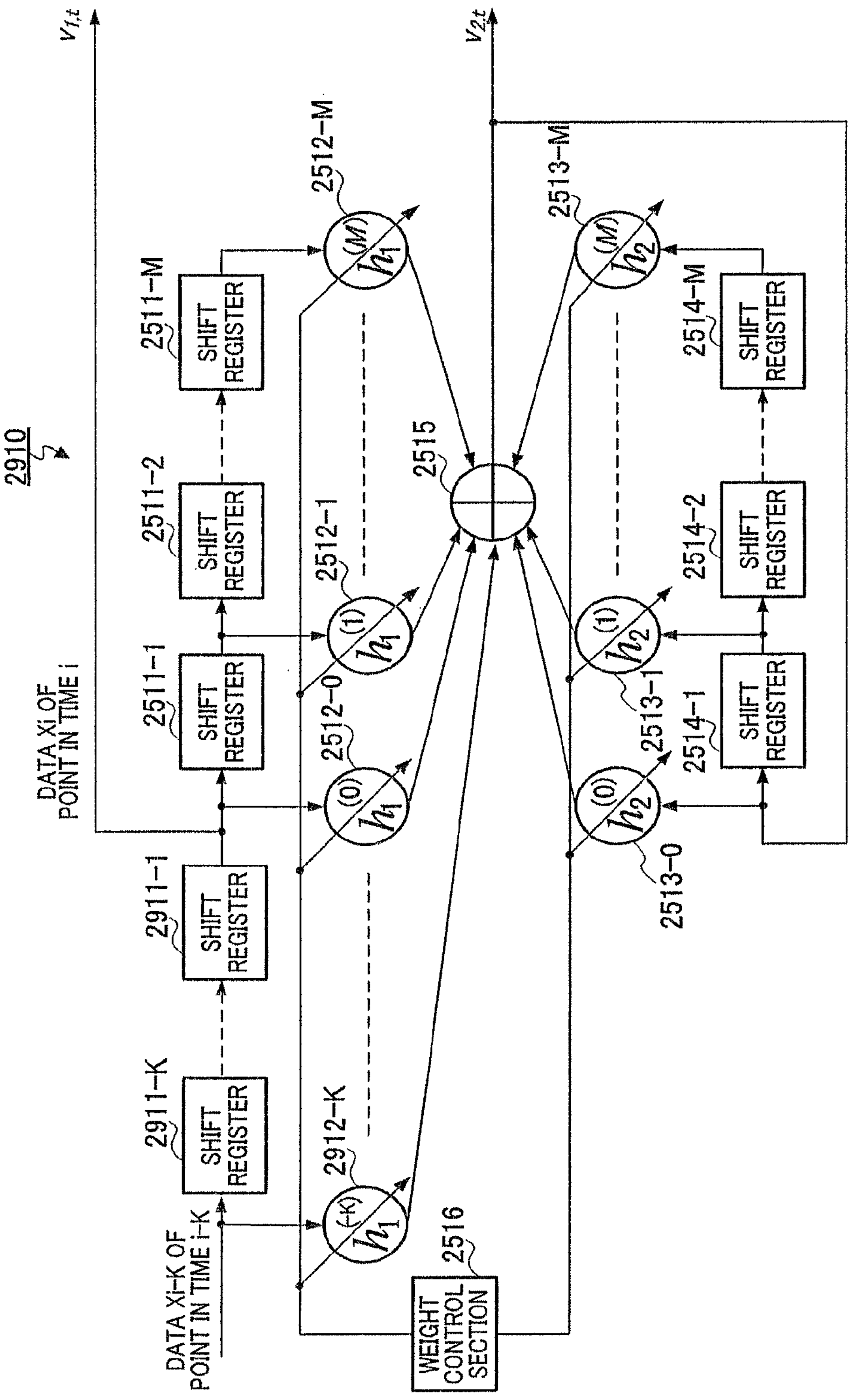
FIG. 31 shows an example of the configuration of an LDPC-CC encoding section using a parity check matrix in which "1" is added to an upper trapezoidal matrix of the parity check matrix.

FIG. 31 shows an example of the configuration of an LDPC-CC encoding section (LDPC-CC encoder) when $D^{-K}$ (X) (where K is a positive integer) is included in a parity check polynomial, that is, when the coding rate is R=½ and a parity check matrix is used in which "1" is added to an upper trapezoidal matrix of the parity check matrix. LDPC-CC encoding section 2910 in FIG. 31 employs a configuration in which shift registers 2911-1 through 2911-K and weight multipliers 2912-1 through 2912-K have been added to LDPC-CC encoding section (LDPC-CC encoder) 2510 in FIG. 30.

Shift registers 2911-1 through 2911-K are registers storing $v_{1,t-i}$, (where i=0, . . . M) respectively, and at a timing at which the next input comes in, send a stored value to the adjacent shift register to the right, and store a new value sent from the adjacent shift register to the left. The initial state of the shift registers is all-zeros.

Weight multipliers 2912-1 through 2912-K switch values of $h_1^{(-k)}$ and $h_2^{(-k)}$ to 0 or 1 in accordance with a control signal output from weight control section 2316.

Based on a parity check matrix stored internally, weight control section 2516 outputs values of $h_1^{(m)}$ and $h_2^{(m)}$ at that timing, and supplies them to weight multipliers 2512-0 through 2512-M and 2513-0 through 2513-M. Based on a parity check matrix stored internally, weight control section 2516 outputs values of $h_1^{(-k)}$ and $h_2^{(-k)}$ at that timing, and supplies them to weight multipliers 2912-1 through 2912-K.

Modulo 2 adder 2515 performs modulo 2 addition on the outputs of weight multipliers 2512-0 through 2512-M and 2513-0 through 2513-M, and 2912-0 through 2912-K, and calculates $v_{2,t}$.

By using the kind of configuration shown in FIG. 31, LDPC-CC encoding section (LDPC-CC encoder) 2910 can handle a case in which $D^{-K}$(X) (where K is a positive integer) is included in a parity check polynomial.

By means of the same kind of configurations as in FIG. 30 and FIG. 31, an LDPC-CC encoding section (LDPC-CC encoder) that handles a coding rate of R of less than ½ can be configured. For example, if the coding rate is R=⅓, it is only necessary for a shift register, weight multiplier, and modulo 2 adder for generating parity sequence Pn to be added to FIG. 30 and FIG. 31.

In the above description, a case in which LDPC-CC encoding section 2510 switches the encoding sequence creation method according to a case in which the coding rate is R=½ or above or a case in which the coding rate is R=⅓ has been described, but provision may also be made for LDPC-CC encoding section 2510 to generate all transmission sequences (including parity Pn) irrespective of the coding rate, and not to output the relevant parity Pn when the coding rate is R=½. By this means, an LDPC-CC encoding section (LDPC-CC encoder) can be made to handle cases in which the coding rate is R=½ and the coding rate is R=⅓.

In the above description, a case in which BP decoding section 2760 switches the decoding method according to a case in which the coding rate is R=½ or above or a case in which the coding rate is R=⅓ has been described, but provision may also be made for BP decoding section 2760 to perform BP decoding using a parity check matrix of a coding rate of ⅓ irrespective of the coding rate, and to replace a log likelihood ratio corresponding to obtained parity Pn with 0 if the coding rate indicated by a control signal is other than ⅓. By so doing, the BP decoding section can be shared.

Another Embodiment 5

In this embodiment, a sample variant of Embodiment 8 will be described in detail. A method of configuring a time varying LDPC-CC when the coding rate is R=½ is described below.

With a coding rate of ½, if polynomial representation of an information sequence (data) is X(D), and a parity sequence polynomial representation is P(D), a parity check polynomial is represented as shown below.

$$(D^{a1}+\ldots+D^{am}+D^{c1}+\ldots+D^{cq})X(D)+(D^{b1}+\ldots+D^{bm}+1)P(D)=0 \quad \text{(Equation 107)}$$

In Equation 107, it is assumed that a1, a2, . . . , an are integers of 0 or above (where a1≠a2≠ . . . ≠an). Also, it is assumed that b1, b2, . . . , bm are integers of 1 or above (where b1≠b2≠ . . . ≠bm). Furthermore, it is assumed that c1, c2, . . . , cq are integers of −1 or below (where c1≠c2≠ . . . ≠cq). At this time, P(D) is represented as shown below.

$$P(D)=(D^{a1}+\ldots+D^{an}+D^{c1}+\ldots+D^{cq})X(D)+(D^{b1}+\ldots+D^{bm})P(D) \quad \text{(Equation 108)}$$

Thus, parity P can be found sequentially (See Embodiment 2 and Embodiment 8).

Equation 109 and Equation 110 will be considered as parity check polynomials of a coding rate of ½ different from Equation 107.

$$(D^{A1}+\ldots+D^{AN})X(D)+(D^{B1}+\ldots+D^{BM}+1)P(D)=0 \quad \text{(Equation 109)}$$

$$(D^{A1}+\ldots+D^{AN}+D^{C1}+\ldots+D^{CQ})X(D)+(D^{B1}+\ldots+D^{BM}+1)P(D)=0 \quad \text{(Equation 110)}$$

In Equation 109 and Equation 110, it is assumed that A1, A2, . . . , AN are integers of 0 or above (where A1≠A2≠ . . . ≠AN). Also, it is assumed that B1, B2, . . . , BM are integers of 1 or above (where B1≠B2≠ . . . ≠Bm). Furthermore, it is assumed that C1, C2, . . . , CQ are integers of −1 or below (where C1≠C2≠ . . . ≠CQ). At this time, P(D) is represented as shown below.

Data X and parity P of point in time 2i are represented by $X_{2i}$ and $P_{2i}$ respectively, and data X and parity P of point in time 2i+1 are represented by $X_{2i+1}$ and $P_{2i+}1$ respectively (where i is an integer).

At this time, an LDPC-CC of a time varying period of 2 for which parity $P_{2i}$ of point in time 2i is found using Equation 108 and parity $P_{2i+1}$ of point in time 2i+1 is found using Equation 111, or an LDPC-CC of a time varying period of 2 for which parity $P_2$i of point in time 2i is found using Equation 108 and parity $P_2$i+1 of point in time 2i+1 is found using Equation 112, is considered.

$$P(D)=(D^{A1}+\ldots+D^{AN})X(D)+(D^{B1}+\ldots+D^{BM})P(D) \quad \text{(Equation 111)}$$

$$P(D)=(D^{A1}+\ldots+D^{AN}+D^{C1}+\ldots+D^{CQ})X(D)+(D^{B1}+\ldots+D^{BM})P(D) \quad \text{(Equation 112)}$$

An LDPC-CC of this kind provides the following advantages:

An encoder can be configured easily, and parity can be found sequentially.

Puncture bits can be set periodically.

Termination bit reduction and received quality improvement in puncturing upon termination can be expected.

Next, an LDPC-CC for which the time varying period is m is considered. In the same way as when the time varying period is 2, "check equation #1" represented by either Equation 109 or Equation 110 is provided, and "check equation #2," "check equation #3," . . . "check equation #m" represented by either Equation 109 or Equation 110 are provided. Data X and parity P of point in time mi+1 are represented by and $P_{mi+1}$ respectively, data X and parity P of point in time mi+2 are represented by $X_{mi+2}$ and $P_{mi+2}$ respectively, . . . , and data X and parity P of point in time mi+m are represented by $X_{mi+m}$ and $P_{mi+m}$ respectively (where i is an integer).

Consider an LDPC-CC for which parity $P_{mi+1}$ of point in time mi+1 is found using "check equation #1," parity $P_{mi+2}$ of point in time mi+2 is found using "check equation #2," . . . , and parity $P_{mi+m}$ of point in time mi+m is found using "check equation #m." An LDPC-CC of this kind provides the following advantages:

An encoder can be configured easily, and parity can be found sequentially.

Termination bit reduction and received quality improvement in puncturing upon termination can be expected.

An example of the configuration of a parity check matrix according to this embodiment is shown below.

Figure 32:
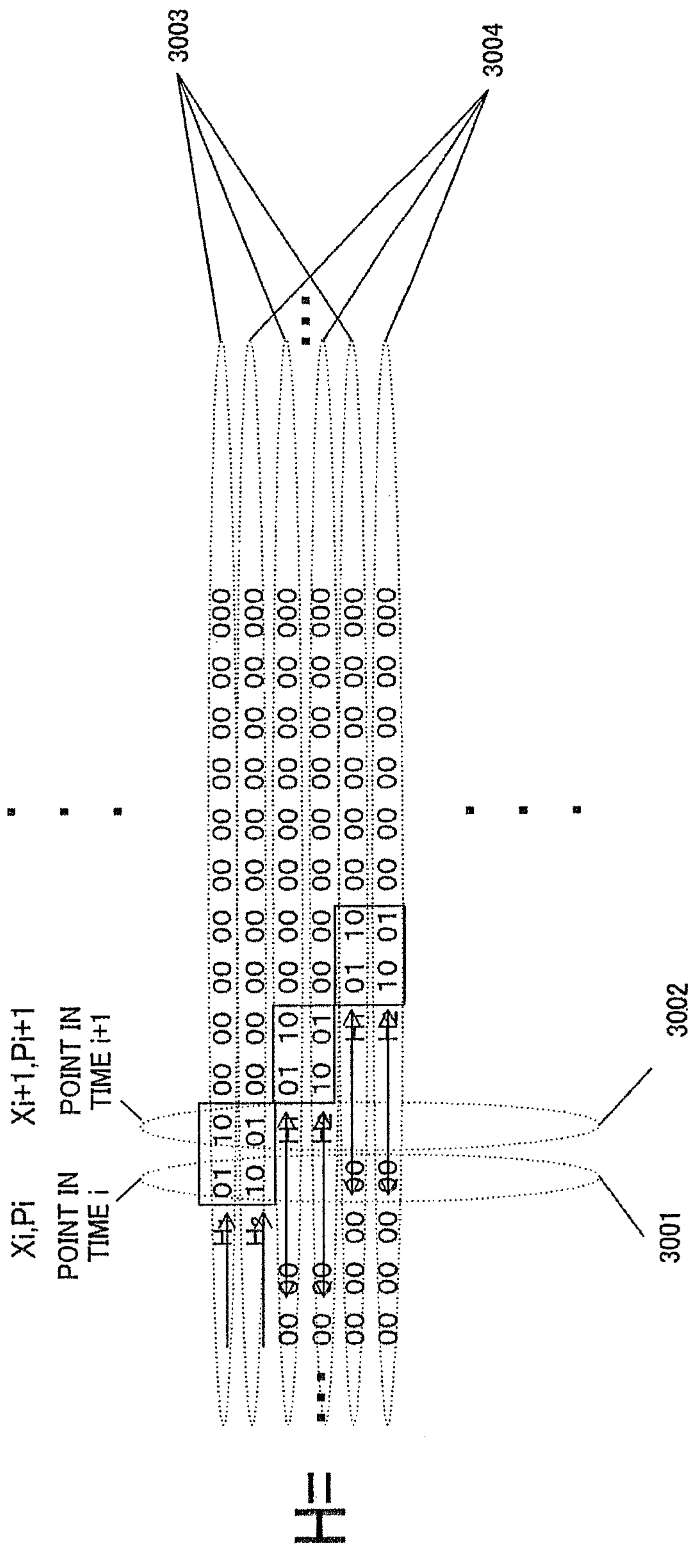
FIG. 32 shows an example of the configuration of an LDPC-CC parity check matrix of a time varying period of 2.

FIG. 32 shows an example of the configuration of an LDPC-CC parity check matrix of a time varying period of 2. In FIG. 32, reference code 3001 indicates a part corresponding to data Xi and parity Pi of point in time i. Similarly, reference code 3002 indicates a part corresponding to data $X_{i+1}$ and parity $P_{i+1}$ of point in time i+1.

A parity check polynomial corresponding to reference code 3003 in FIG. 32 (for example, a parity check polynomial at point in time i) can be represented as shown below.

$$(D^{a1}+\dots+D^{an}+D^{-1})X(D)+(D^{b1}+\dots+D^{bm}+1)P(D)=0 \quad \text{(Equation 113)}$$

In Equation 113, it is assumed that a1, a2, . . . , an are integers other than −1 or 0 (where a1≠a2≠ . . . ≠an). Also, it is assumed that b1, b2, . . . bm are integers of 1 or above (where b1≠b2≠ . . . ≠bm). In FIG. 32, it is assumed that a1, a2, . . . , an are positive integers. At this time, P(D) can be found sequentially.

A parity check polynomial corresponding to reference code 3004 in FIG. 32 (for example, a parity check polynomial at point in time i+1) can be represented as shown below.

$$(D^{A1}+\dots+D^{AN}+D^{1})X(D)+(D^{B1}+\dots+D^{BM}+1)P(D)=0 \quad \text{(Equation 114)}$$

In Equation 114, it is assumed that A1, A2, . . . , AN are integers of 0 or above (where A1≠A2≠ . . . ≠AN). Also, it is assumed that B1, B2, . . . , BM are integers of 1 or above (where B1≠B2≠ . . . ≠BM). At this time, P(D) is represented as shown below.

That is to say, in the case of point in time 2j, parity P is found based on Equation 113, and in the case of point in time 2j+1, parity P is found based on Equation 114 (where j is an integer). In the case of time varying LDPC-CC of a time varying period of 2 employing the configuration shown in FIG. 32, the belief of parity $P_i$ at point in time i is propagated to data $X_{i+1}$ at point in time i+1, and as a result, data $X_{i+1}$ at point in time i+1 is decoded. Then the belief of parity $P_{i+1}$ at point in time i+1 is propagated to data $X_i$ at point in time i, and as a result, data $X_i$ at point in time i is decoded.

Whereas in Embodiment 7 data and parity of an identical point in time have relevancy and data is decoded, in this embodiment there is a parity check polynomial such that data and parity of different points in time have relevancy. Then, to consider a positional relationship between data and parity having relevancy, excluding a case of an identical point in time, since data Xi+1 and parity Pi at point in time i and point in time i+1 have relevancy in the example shown in FIG. 32, they are in a temporally closest positional relationship in a time varying LDPC-CC of a time varying period of 2. There is thus an advantage of the necessity of considering the temporal positional relationship between related data and parity when performing decoding being low. Thus, provision is made for an LDPC-CC for which the time varying period is 2 to be configured so that data Xi+1 and parity Pi at point in time i and point in time i+1 have relevancy, and are associated within a time varying period of 2.

A time varying LDPC-CC of a time varying period other than 2 can also be given the same kind of characteristic. That is to say, an LDPC-CC can be configured so that data and parity have relevancy within a time varying period of m. A case in which the time varying period is 7 is described below using FIG. 33.

Figure 33:
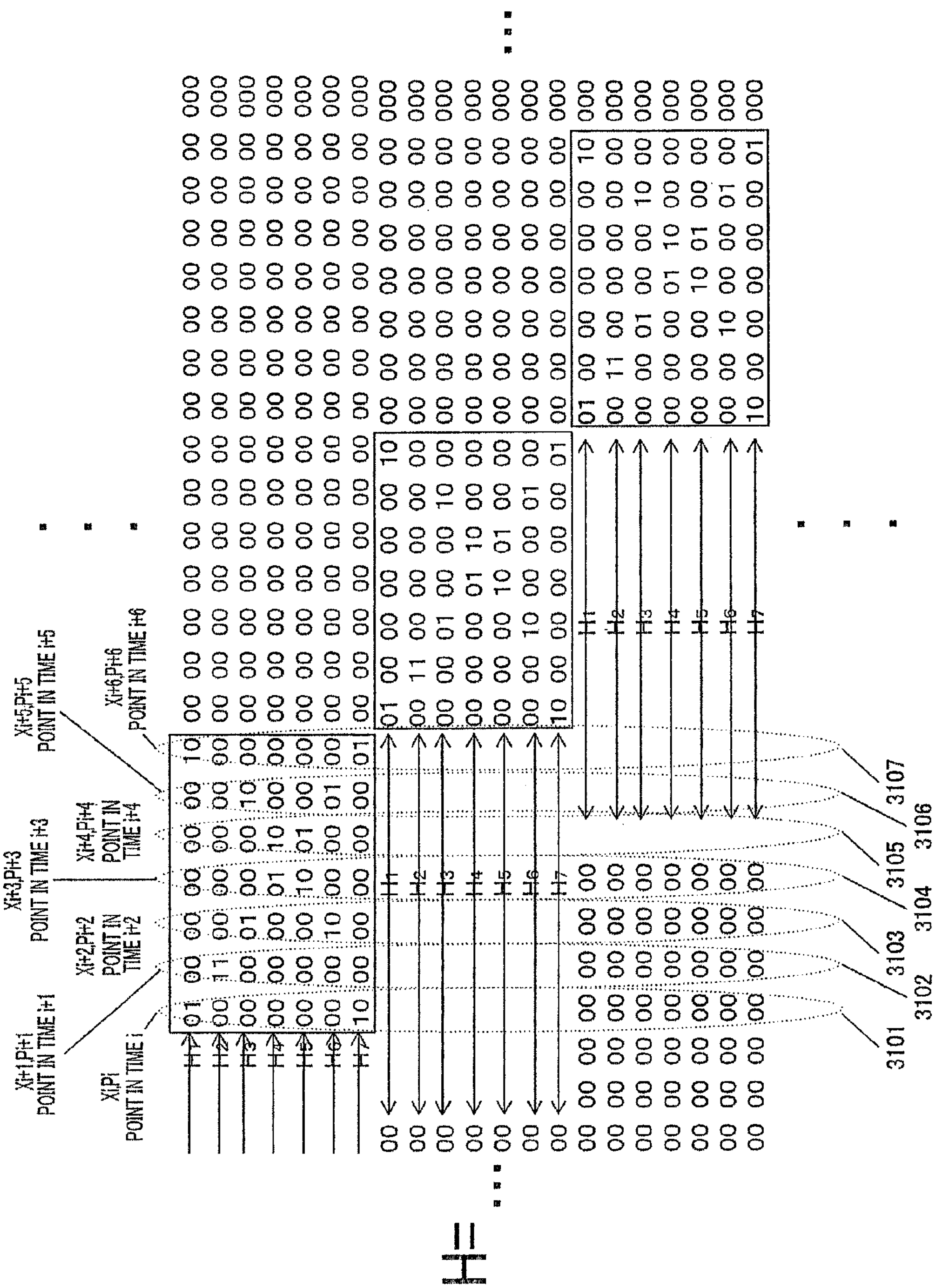
FIG. 33 shows an example of the configuration of an LDPC-CC parity check matrix of a time varying period of 7.

FIG. 33 shows an example of the configuration of an LDPC-CC parity check matrix of a time varying period of 7. In FIG. 33, reference code 3101 indicates a part corresponding to data Xi and parity $P_i$ of point in time i. Similarly, reference code 3102 indicates a part corresponding to data $X_{i+1}$ and parity $P_{i+1}$ of point in time i+1. Similarly, reference code 3103 indicates a part corresponding to data $X_{i+2}$ and parity $P_{i+2}$ of point in time i+2. Similarly, reference code 3104 indicates a part corresponding to data $X_{i+3}$ and parity $P_{i+3}$ of point in time i+3. Similarly, reference code 3105 indicates a part corresponding to data $X_{i+4}$ and parity $P_{i+4}$ of point in time i+4. Similarly, reference code 3106 indicates a part corresponding to data $X_{i+5}$ and parity $P_{i+5}$ of point in time i+5. Similarly, reference code 3107 indicates a part corresponding to data $X_{i+6}$ and parity $P_{i+6}$ of point in time i+6.

In the case of a time varying LDPC-CC of a time varying period of 7 employing the configuration shown in FIG. 33, the belief (placement of "1") of parity Pi at point in time i is propagated ("1" is placed in the same row as parity Pi) to data $X_{i+6}$ at point in time i+6, and as a result, data $X_{i+6}$ at point in time i+6 is decoded.

The belief of parity $P_{i+1}$ at point in time i+1 is propagated to data $X_{i+1}$ at point in time i+1, and as a result, data $X_{i+1}$ at point in time i+1 is decoded.

The belief of parity $P_{i+2}$ at point in time i+2 is propagated to data $X_{i+5}$ at point in time i+5, and as a result, data $X_{i+5}$ at point in time i+5 is decoded.

The belief of parity $P_{i+3}$ at point in time i+3 is propagated to data $X_{i+4}$ at point in time i+4, and as a result, data $X_{i+4}$ at point in time i+4 is decoded.

The belief of parity $P_{i+4}$ at point in time i+4 is propagated to data $X_{i+3}$ at point in time i+3, and as a result, data $X_{i+3}$ at point in time i+3 is decoded.

The belief of parity $P_{i+5}$ at point in time i+5 is propagated to data $X_{i+2}$ at point in time i+2, and as a result, data $X_{i+2}$ at point in time i+2 is decoded.

The belief of parity $P_{i+6}$ at point in time i+6 is propagated to data Xi at point in time i, and as a result, data $X_i$ at point in time i is decoded.

As shown in FIG. 33, provision is made for an LDPC-CC for which the time varying period is 7 to be configured so that data and parity at point in time i through point in time i+6 have relevancy, and are associated within a time varying period of 2.

Thus, configuring an LDPC-CC so that data and parity are associated within a time varying period produces an advantage of the necessity of considering the temporal positional relationship between data and parity when performing decoding being low.

Another Embodiment 6

In this embodiment, a method will be described whereby the method of creating a time varying LDPC-CC of a coding rate of ½ described in Embodiment 7 is extended, and a time varying LDPC-CC of a coding rate of ⅓ is created.

Data X, parity P, and parity Pn of point in time 2i are represented by $X_{2i}$, $P_{2i}$, and $Pn_{2i}$ respectively, and data X and parity P of point in time 2i+1 are represented by $X_{2i+1}$, $P_{2i+1}$, and $Pn_{2i+1}$ respectively (where i is an integer). Here, a data X polynomial is designated X(D), a polynomial of parity P is designated P(D), and a parity Pn polynomial is designated Pn(D), and the parity check polynomial below is considered.

$$(D^{a1}+\ldots+D^{an}+1)X(D)+(D^{b1}+\ldots+D^{bm}+1)P(D)+(D^{c1}+\ldots+D^{cq})P_n(D)=0 \qquad \text{(Equation 115)}$$

In Equation 115, it is assumed that a1, a2, . . . , an are integers other than 0 (where a1≠a2≠ . . . ≠an). Also, it is assumed that b1, b2, . . . , bm are integers of 1 or above (where b1≠b2≠ . . . ≠bm). Furthermore, it is assumed that c1, c2, . . . , cq are integers of 1 or above (where c1≠c2≠ . . . ≠cq). Then P(D) of point in time 2i is found using the relational equation in Equation 115. At this time, P(D) can be found sequentially.

Next, Equation 116 is considered as a parity check polynomial.

$$(D^{A1}+\ldots+D^{AN}+1)X(D)+(D^{B1}+\ldots+D^{BM})P(D)+(D^{C1}+\ldots+D^{CQ}+1)P_n(D)=0 \qquad \text{(Equation 116)}$$

In Equation 116, it is assumed that A1, A2, . . . , AN are integers other than 0 (where A1≠A2≠ . . . ≠AN). Also, it is assumed that B1, B2, . . . , BM are integers of 1 or above (where B1≠B2≠ . . . ≠BM). Furthermore, it is assumed that C1, C2, . . . , CQ are integers of 1 or above (where C1≠C2≠ . . . ≠CQ). Then Pn(D) of point in time 2i is found using the relational equation in Equation 116. At this time, Pn(D) can be found sequentially.

Next, Equation 117 is considered as a parity check polynomial.

$$(D^{\alpha1}+\ldots+D^{\alpha\omega}+1)X(D)+(D^{\beta1}+\ldots+D^{\beta\xi}+1)P(D)+(D^{\gamma1}+\ldots+D^{\gamma\lambda}+1)P_n(D)=0 \qquad \text{(Equation 117)}$$

In Equation 117, it is assumed that α1, α2, . . . αω are integers other than 0 (where α1≠α2≠ . . . ≠αω). Also, it is assumed that β1, β2, . . . , βξ are integers of 1 or above (where β1≠β2≠ . . . ≠βξ). Furthermore, it is assumed that γ1, γ2, . . . , γλ are integers of 1 or above (where γ1≠γ2≠ . . . ≠γλ). Then P(D) of point in time 2i+1 is found using the relational equation in Equation 117. At this time, P(D) can be found sequentially.

Next, Equation 118 is considered as a parity check polynomial.

$$(D^{E1}+\ldots+D^{E\Omega}+1)X(D)+(D^{F1}+\ldots+D^{FZ})P(D)+(D^{G1}+\ldots+D^{GA}+1)P_n(D)=0 \qquad \text{(Equation 118)}$$

In Equation 118, it is assumed that E1, E2, . . . , EΩ are integers other than 0 (where E1≠E2≠ . . . ≠EΩ). Also, it is assumed that F1, F2, . . . , FZ are integers of 1 or above (where F1≠F2≠ . . . ≠FZ). Furthermore, it is assumed that G1, G2, . . . , GA are integers of 1 or above (where G1≠G2≠ . . . ≠GA). Then Pn(D) of point in time 2i+1 is found using the relational equation in Equation 118. At this time, Pn(D) can be found sequentially.

Creating an LDPC-CC of a time varying period of 2 as described above provides an advantage of enabling an optimal puncturing pattern to be selected easily when a method of periodically selecting puncture bits is employed, in the same way as in Embodiment 7.

If the time varying period is within 10, it is easy to employ a method of performing puncturing periodically and find an optimal puncturing pattern.

Next, an LDPC-CC for which the time varying period is m is considered.

In the case of a time varying period of m, m different check equations represented by Equation 115 are provided, and those m check equations are designated "check equation A#1, check equation A#2, . . . , check equation A#m." Also, m different check equations represented by Equation 116 are provided, and those m check equations are designated "check equation B#1, check equation B#2, . . . , check equation B#m."

Data X, parity P and parity Pn of point in time mi+1 are represented by $X_{mi+1}$, $P_{mi+1}$ and $Pn_{mi+1}$ respectively, data X, parity P and parity Pn of point in time mi+2 are represented by $X_{mi+2}$, $P_{mi+2}$ and $Pn_{mi+2}$ respectively, . . . , and data X, parity P and parity Pn of point in time mi+m are represented by $X_{mi+m}$, $P_{mi+m}$ and $Pn_{mi+n}$, respectively (where i is an integer).

Consider an LDPC-CC of a time varying period of in for which parity $P_{mi+1}$ of point in time mi+1 is found using "check equation A#1" and parity $Pn_{mi+i}$ is found using "check equation B#1," parity $P_{mi+2}$ of point in time mi+2 is found using "check equation A#2" and parity $Pn_{mi+2}$ is found using "check equation B#2," . . . , and parity $P_{mi+m}$ of point in time mi+m is found using "check equation A#m" and parity $Pn_{mi+}$, is found using "check equation B#m" at this time. This kind of LDPC-CC code provides an advantage of enabling parity to be found sequentially, in addition to being a code offering good received quality.

The coding rate is not limited to 13, and an LDPC-CC code of a coding rate of ⅓ or below can also be created in a similar way.

Another Embodiment 7

In this embodiment, a description will be given of a transmitting apparatus that executes puncturing suitable for a transmission codeword sequence obtained by LDPC-CC encoding, and such a puncturing method.

FIG. 34 shows a configuration of a time-invariant LDPC-CC parity check matrix used in this embodiment. Unlike FIG. 1, FIG. 34 shows the configuration of parity check matrix H, not parity check matrix $H^T$. If a transmission codeword vector is denoted by v, the relational equation Hv=0 holds true.

In the description of a puncturing method according to this embodiment, a problem when a general puncturing method is applied to above transmission codeword sequence v will first be explained. A general puncturing method is described in Non-Patent Document 12, for example. Below, a case in which an LDPC-CC is configured using a (177, 131) convolutional code with a coding rate of R=½ is described as an example.

Figure 35:
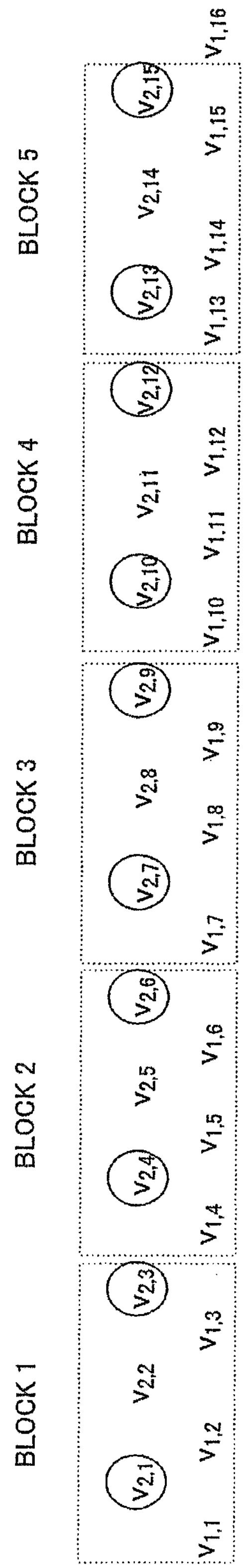
FIG. 35 is a drawing for explaining a general puncturing method.

FIG. 35 is a drawing for explaining a general puncturing method. In FIG. 35, $v_{1,t}$ and $v_{2,t}$ (where t=1, 2, . . . ) indicate transmission codeword sequence v. With a general puncturing method, transmission codeword sequence v is divided into a plurality of blocks, and transmission codeword bits are punctured by using the same puncturing on each block.

FIG. 35 shows how transmission codeword sequence v is divided into blocks at 6-bit intervals, and transmission codeword bits are punctured in a fixed proportion using the same puncturing pattern on all blocks. In FIG. 35, circled bits indicate bits that are punctured (bits that are not transmitted), and $v_{2,1}$, $v_{2,3}$, $v_{2,4}$, $v_{2,6}$, $v_{2,7}$, $v_{2,9}$, $v_{2,10}$, $v_{2,12}$, $v_{2,13}$, and $v_{2,15}$ are selected and punctured (made non-transmitted bits) so that the post-puncturing coding rate becomes 34 for all of blocks 1 through 5.

Figure 36:
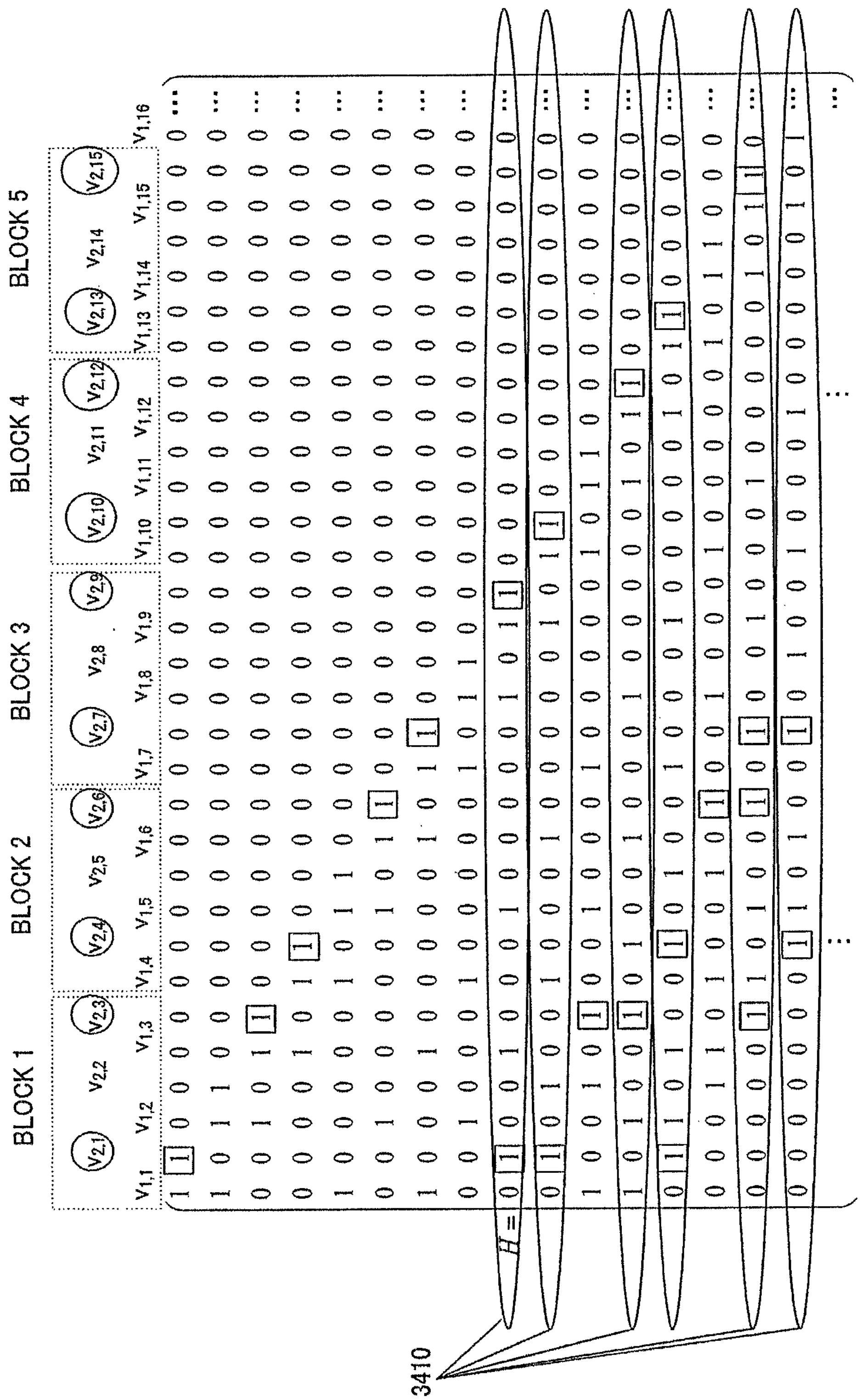
FIG. 36 shows the correspondence between transmission codeword sequence v and LDPC-CC parity check matrix H according to a general puncturing method.

Next, the effect on the receiving side (decoding side) will be considered when the kind of general puncturing shown in FIG. 35 is executed on a transmission codeword sequence obtained by encoding using an LDPC-CC. Below, a case in which BP decoding is used on the receiving side (decoding side) will be considered. In BP decoding, decoding processing is performed based on an LDPC-CC parity check matrix. FIG. 36 shows the correspondence between transmission codeword sequence v and LDPC-CC parity check matrix H. In FIG. 36, circled bits are transmission codeword bits that are punctured by puncturing. As a result, bits corresponding to a 1 inside a square in parity check matrix H cease to be included in a transmission codeword sequence. As a result, when BP decoding is performed there is no initial log likelihood ratio for a bit corresponding to a 1 inside a square, and therefore the log likelihood ratio is set to 0.

In BP decoding, row computation and column computation are performed iteratively. Therefore, if two or more bits for which there is no initial log likelihood ratio (bits with a 0 log likelihood ratio) (that is, bits corresponding to a 1 inside a square in FIG. 36) are included in the same row, log likelihood ratio updating is not performed by row computation in isolation for that row until the log likelihood ratio of a bit for which there is no initial log likelihood ratio (a bit with a 0 log likelihood ratio) is updated by column computation. That is to say, belief is not propagated by row computation in isolation, and iteration of row computation and column computation is necessary in order to propagate belief. Therefore, if there are many such rows, belief is not propagated in a case such as when there is a limit on the number of iteration processes in BP decoding, causing degradation of received quality. In the example shown in FIG. 36, rows 3410 are rows for which belief is not propagated by row computation in isolation, that is, rows that cause degradation of received quality.

On the other hand, when a puncturing method according to this embodiment is used, the number of rows for which belief is not propagated by row computation in isolation can be reduced. In this embodiment, transmission codeword bit puncturing is performed, using a first puncturing pattern and a second puncturing pattern whereby more bits are punctured than with the first puncturing pattern, for each transmission codeword bit processing unit on the receiving side (decoding side). This will now be explained using FIG. 37 and FIG. 38.

Figure 37:
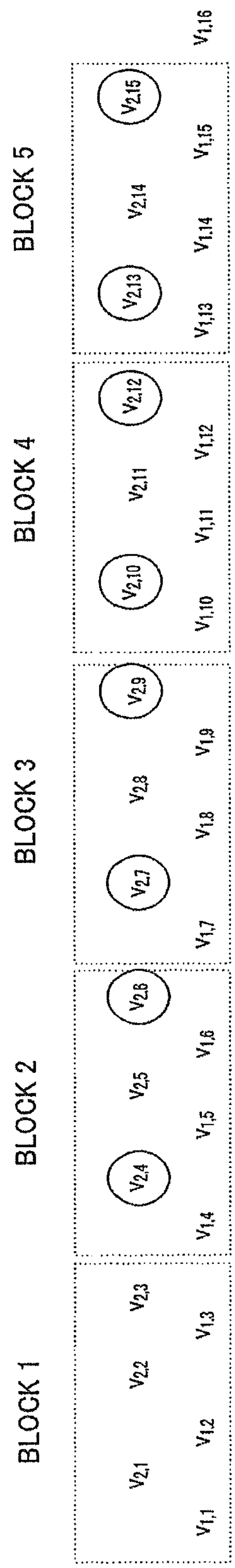
FIG. 37 is a drawing for explaining puncturing method according to another Embodiment 7.

FIG. 37 is a drawing for explaining a puncturing method according to this embodiment. As in FIG. 35, $v_{1,t}$ and $v_{2,t}$ (where t=1, 2, . . . ) indicate transmission codeword sequence v, and a case is described below in which one block is composed of 6 bits in the same way as in FIG. 35. Also, it is assumed that a transmission codeword bit processing unit on the receiving side (decoding side) comprises block 1 through block 5. The example shown in FIG. 37 shows the way in which $v_{2,1}$, $vV_{2,3}$, $v_{2,4}$, $v_{2,6}$, $v_{2,7}$, $v_{2,9}$, $v_{2,10}$, $v_{2,12}$, $v_{2,13}$, and $v_{2,15}$ are punctured as a result of using a first puncturing pattern whereby puncturing is not performed for the first block, block 1, and using a second puncturing pattern whereby puncturing is performed for block 2 through block 5. Thus, in this embodiment, puncturing patterns having different coding rates are used, and a range in which few bits are punctured is provided within a transmission codeword bit processing unit.

Figure 38:
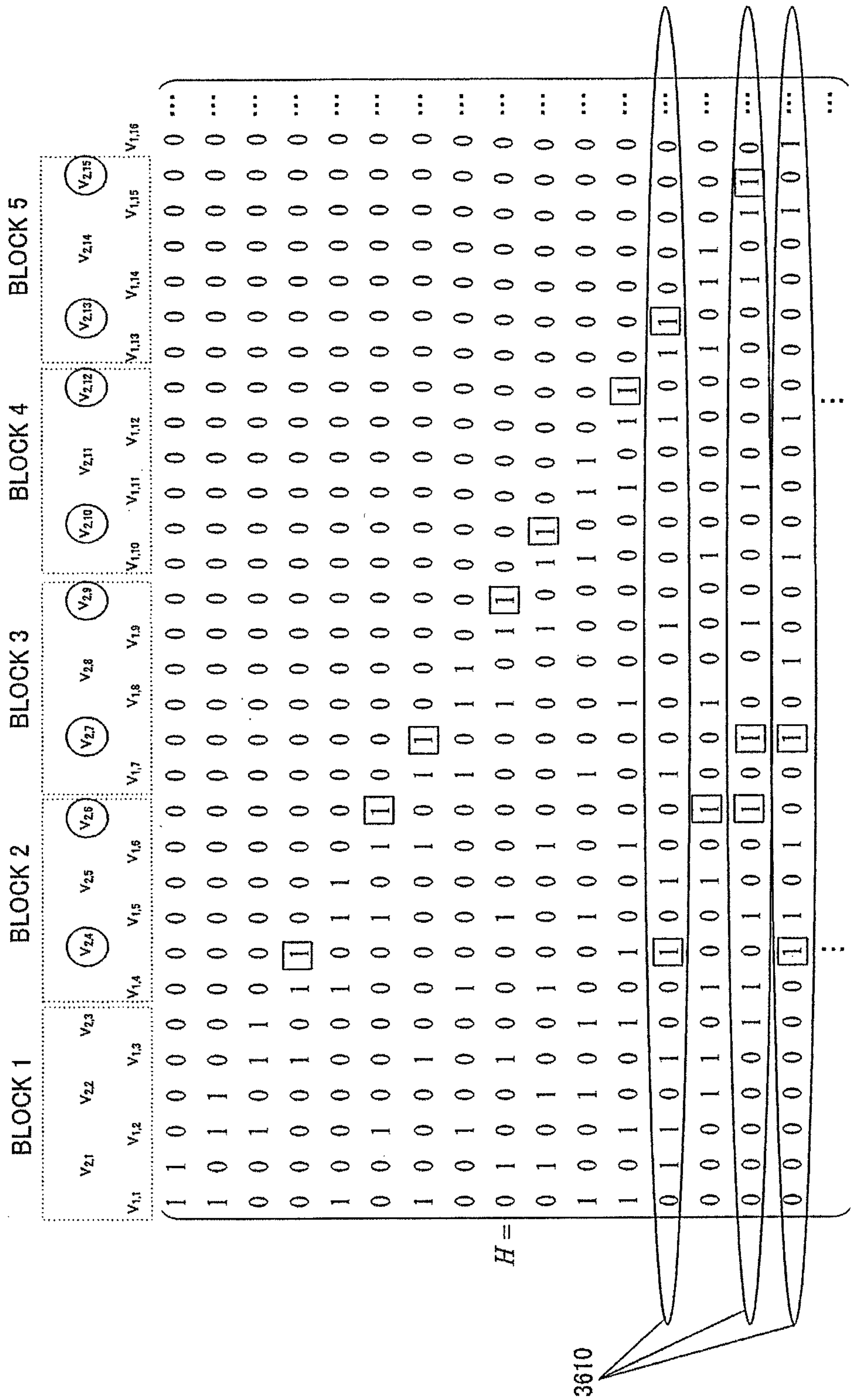
FIG. 38 shows the correspondence between transmission codeword sequence v and LDPC-CC parity check matrix H according to another Embodiment 7.

FIG. 38 shows the correspondence between transmission codeword sequence v and LDPC-CC parity check matrix H in this case. In FIG. 38, although three rows occur that include two or more 1 s inside a square in the same row, the number of such rows has been reduced compared with the case shown in FIG. 36. This is due to the fact that puncturing is not executed on block 1.

Thus, by providing a block on which puncturing is not performed, the number of rows causing degradation of received quality when BP decoding is performed can be reduced. As a result, in rows up to rows 3610 there is a log likelihood initially, belief is dependably propagated in BP decoding, and post-updating belief is propagated to rows 3610, enabling degradation of received quality to be suppressed. Thus, due to the characteristics of the structure of a convolutional code (LDPC-CC) parity check matrix, row reliabilities obtained by row computations in isolation are propagated sequentially by performing iterative decoding a plurality of times, enabling degradation of received quality due to puncturing to be suppressed. Also, since the number of rows for which belief is not propagated by row computation in isolation is reduced, the number of iterations necessary for belief propagation can be reduced.

In the example shown in FIG. 37, transmitted transmission codeword bits increase and transmission speed decreases due to the provision of a block that is not punctured. However, as long as provision is made for the relationship N<<M to hold true between number of bits N for which the first puncturing pattern is used and number of bits M for which the second puncturing pattern is used, received quality can be improved while suppressing a decrease in transmission speed. In the example shown in FIG. 37, N=6 and M=24, and although the number of additional transmission codeword bits is only two, the number of rows for which log likelihood propagation is not performed by row computation in isolation can be reduced from six to three.

Figure 39:
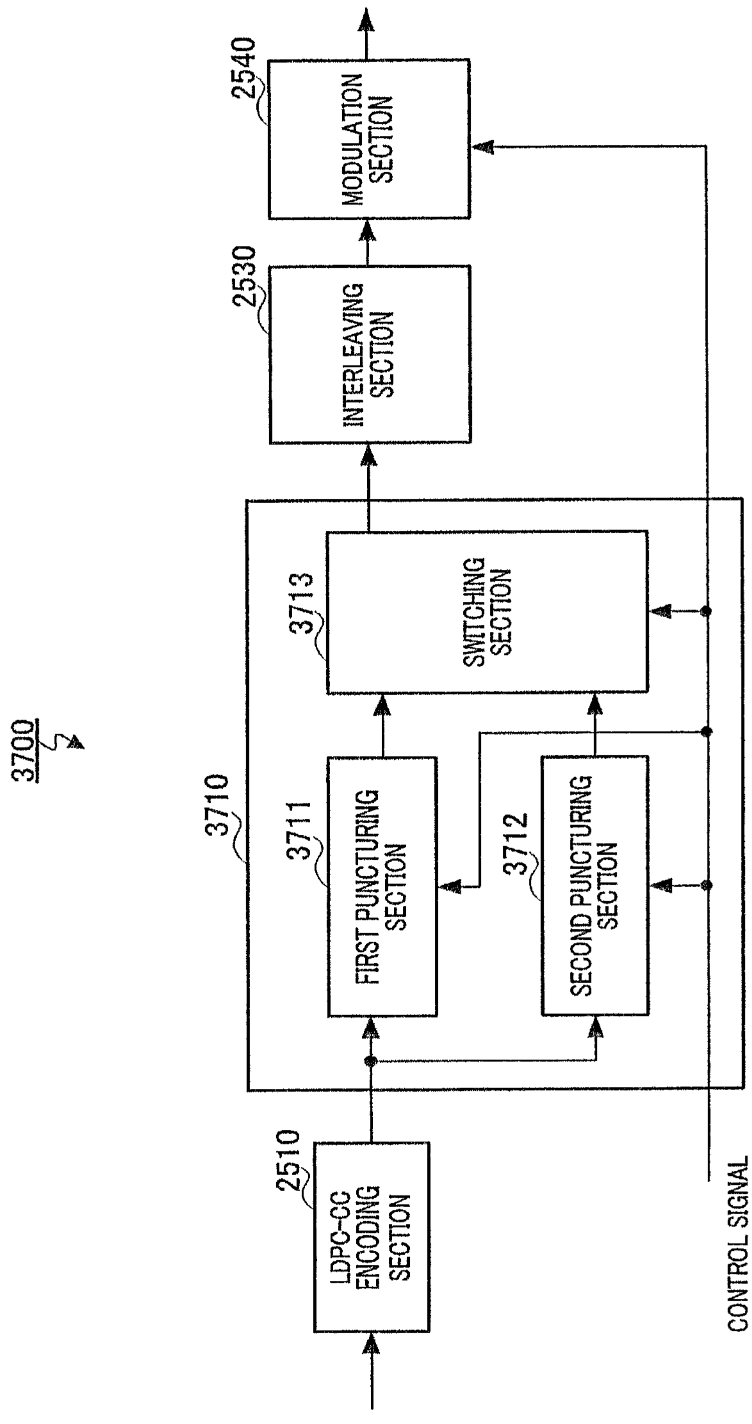
FIG. 39 is a block diagram showing another main configuration of a transmitting apparatus according to another Embodiment 7.

A configuration of a transmitting apparatus according to this embodiment will now be described. FIG. 39 is a block diagram showing a main configuration of a transmitting apparatus according to this embodiment. In the description of this embodiment, configuration parts identical to those in FIG. 27 are assigned the same reference codes as in FIG. 27, and descriptions thereof are omitted. As compared with transmitting apparatus 2500 in FIG. 27, transmitting apparatus 3700 in FIG. 39 is equipped with puncturing section 3710 instead of puncturing section 2520. Puncturing section 3710 is equipped with first puncturing section 3711, second puncturing section 3712, and switching section 3713.

Puncturing section 3710 performs puncturing on a transmission codeword sequence comprising a transmission information sequence and a termination sequence, and outputs a post-puncturing transmission codeword sequence to interleaving section 2530.

Figure 40:
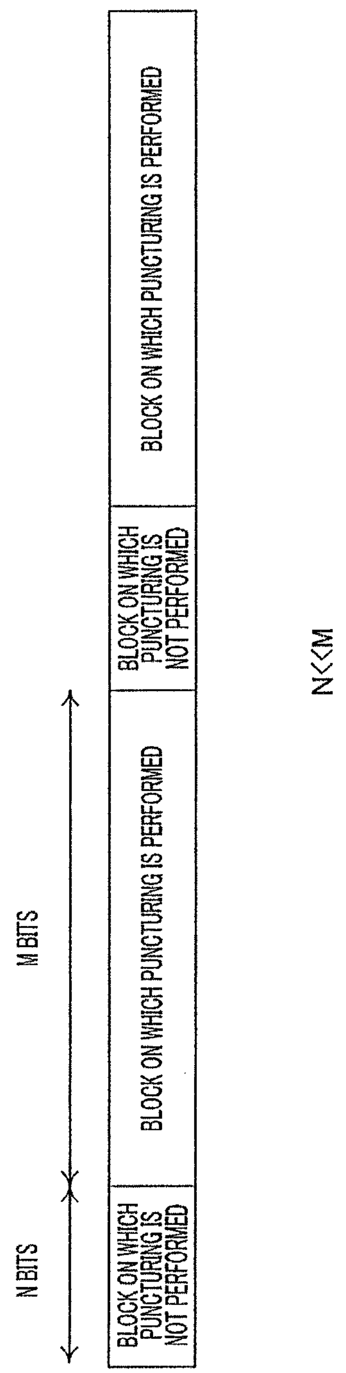
FIG. 40 shows an example of a puncturing pattern according to another Embodiment 7.

Specifically, puncturing section 3710 punctures a transmission codeword sequence using a first puncturing pattern and a second puncturing pattern whereby more bits are punctured than with the first puncturing pattern. The first puncturing pattern and second puncturing pattern have different proportions of bits that are punctured. Puncturing section 3710 punctures a transmission codeword sequence using a puncturing pattern such as shown in FIG. 40, for example. In FIG. 40, (N+M) bits comprise a receiving-side (decoding-side) processing unit.

First puncturing section 3711 performs puncturing on a transmission codeword sequence using a first puncturing pattern. Second puncturing section 3712 performs puncturing on a transmission codeword sequence using a second puncturing pattern.

When the puncturing pattern shown in FIG. 40 is used, first puncturing section 3711 does not perform puncturing on an N-bit transmission codeword sequence from the start of a receiving-side (decoding-side) processing unit, and outputs a transmission codeword sequence input to first puncturing section 3711 to switching section 3713. Second puncturing section 3712 performs puncturing on a bit (N+1) through (N+M) transmission codeword sequence, and outputs a post-puncturing transmission codeword sequence to switching section 3713.

Provision may also be made for first puncturing section 3711 and second puncturing section 3712 to determine whether or not to execute puncturing on a transmission codeword sequence based on a control signal from control information generation section 2730. According to a control signal from the control information generation section (not shown), switching section 3713 outputs either a transmission codeword sequence output from first puncturing section 3711, or a transmission codeword sequence output from second puncturing section 3712, to interleaving section 2530.

The operation of transmitting apparatus 3700 configured as described above will now be explained, focusing mainly on puncturing processing by puncturing section 3710. Below, a case in which LDPC-CC encoding section 2510 executes LDPC-CC encoding using a (177, 131) convolutional code with a coding rate of R=½ is described as an example.

In LDPC-CC encoding section 2510, LDPC-CC encoding processing is executed on transmission information sequence ut (where t=1, . . . , n), and $v=(v_{1,t}, v_{2,t})$ is acquired. In the case of a systematic code, $v_{1,t}$ is transmission information sequence $u_t$ and $v_{2,t}$ is parity. Parity $v_{2,t}$ is found based on transmission information sequence $v_{1,t}$ and a check equation of each row in FIG. 38.

Puncturing processing is executed on transmission codeword sequence v of the coding rate of R=½ by puncturing section 3710. For example, when the puncturing shown in FIG. 37 is used, puncturing is not performed on block 1 by puncturing section 3710, but bits are punctured in a regular manner at predetermined intervals for block 2 through block 5. That is to say, bits $v_{2,4}$ and $v_{2,6}$ are punctured in block 2, bits $v_{2,7}$ and $v_{2,9}$ are punctured in block 3, bits $v_{2,10}$ and $v_{2,12}$ are punctured in block 4, and bits $v_{2,13}$ and $v_{2,15}$ are punctured in block 5. In this way, a transmission codeword sequence with the coding rate of R=34 is acquired for block 2 through block 5.

A post-puncturing transmission codeword sequence is transmitted to the receiving side (decoding side) via interleaving section 2530 and modulation section 2540. At this time, when the puncturing pattern shown in FIG. 37 is used, $v_{2,4}$, $V_{2,6}$, $V_{2,7}$, $V_{2,9}$, $V_{2,10}$, $v_{2,12}$, $v_{2,13}$, and $V_{2,15}$ are not transmitted.

Thus, when the puncturing pattern shown in FIG. 37 is used, blocks for which puncturing is not performed occur at predetermined intervals. As shown in FIG. 37, as a result of puncturing not being performed on block 1, $v_{2,1}$ and $v_{2,3}$, which were not transmitted when the general puncturing method in FIG. 35 was used, are transmitted. Consequently, rows for which belief is not propagated by row computation in isolation when using BP decoding are the three rows shown as rows 3610 in FIG. 38. As can be seen by comparing FIG. 35 and FIG. 37, adding two transmission bits decreases the number of rows for which belief is not propagated by row computation in isolation from six to three. As a result, the number of rows for which there is a log likelihood initially increases, and initial belief is updated dependably by BP decoding, and furthermore that belief is propagated to rows 3610 in FIG. 38.

Subsequently, due to the characteristics of the structure of a convolutional code (LDPC-CC) parity check matrix, reliabilities present in large numbers at the start of the parity check matrix are propagated sequentially by performing iterative decoding a plurality of times, enabling degradation of received quality due to puncturing to be suppressed.

Figure 45:
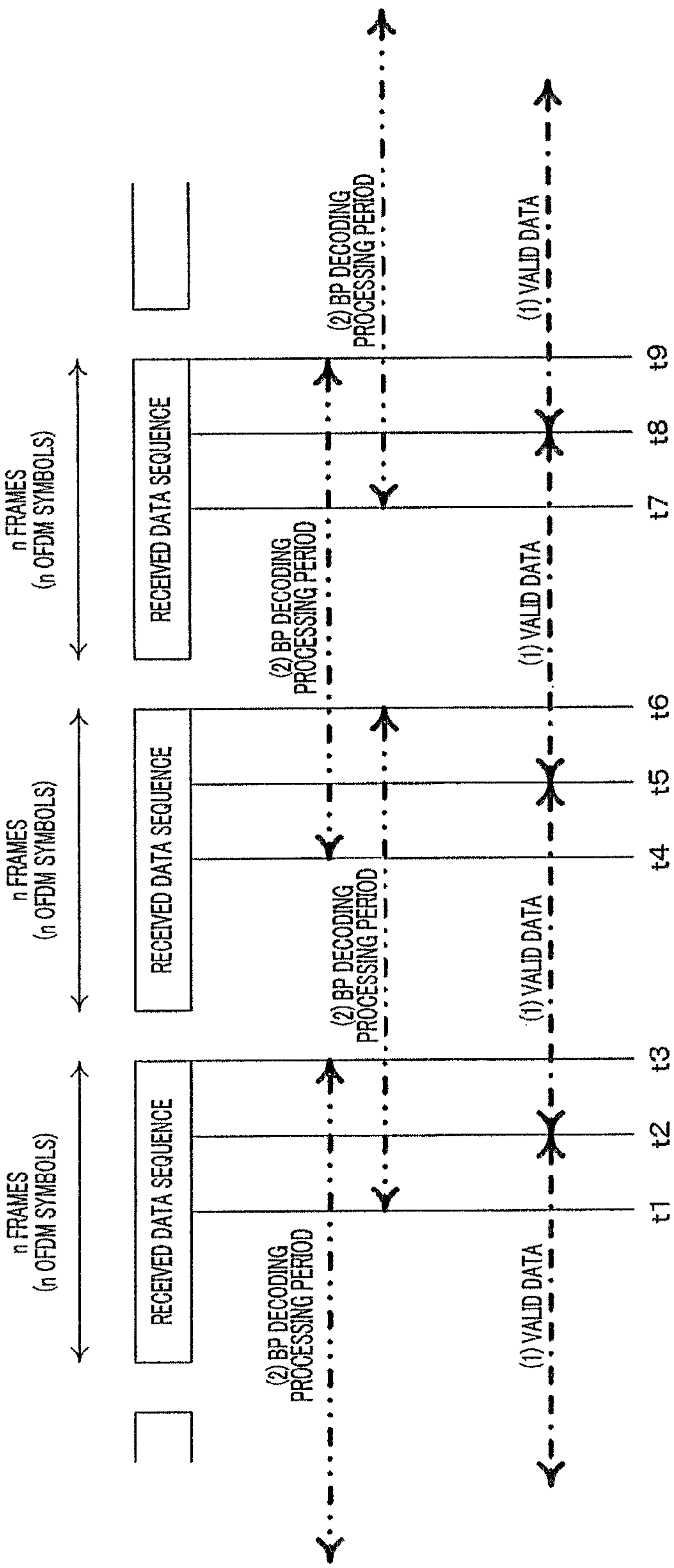
FIG. 45 is a drawing for explaining decoding processing timing.

In the example shown in FIG. 37, the additional number of bits that come to be transmitted is only two, and therefore a decrease in transmission speed is small and degradation of received quality can be suppressed. The achievement of this effect is due to the characteristic of an LDPC-CC adopting a form in which places where a 1 is present are concentrated in a parallelogram-shaped range in a parity check matrix, as shown in FIG. 45. Therefore, there is little possibility of being able to obtain the same kind of effect by application to the case of an LDPC-BC.

Thus, by providing a block that is not punctured, the number of rows that exert an adverse effect when BP decoding is performed can be reduced. To consider transmission efficiency at this time, it is important that the relationship N<<M should hold true between M bits forming a block that is not punctured and N bits forming a block subject to puncturing. By making N<<M, degradation of received quality can be suppressed while suppressing degradation of transmission efficiency.

Provision may also be made for puncturing section 3710 to puncture block 2 through block 5, to which the second puncturing pattern is applied, in accordance with a predetermined rule instead of randomly. Puncture computation processing is simpler when puncturing is performed in accordance with a predetermined rule than when puncturing is performed randomly.

(Other Puncturing Patterns)

Figure 41:
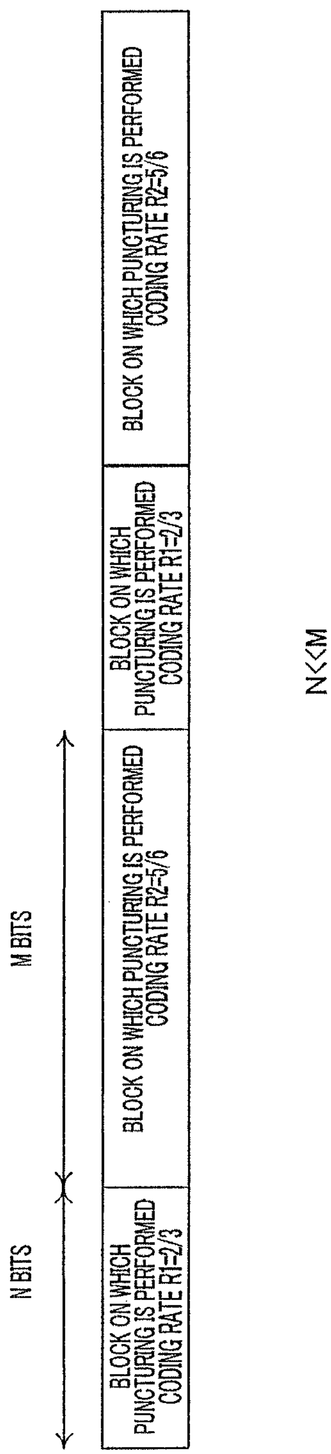
FIG. 41 shows another puncturing pattern according to another Embodiment 7.

The puncturing pattern used by puncturing section 3710 is not limited to that in FIG. 40. For example, provision may also be made for puncturing section 3710 to use a puncturing pattern with the coding rate of R1=⅔ as a first puncturing pattern, and to use a puncturing pattern with the coding rate of R2=⅚ as a second puncturing pattern, as shown in FIG. 41.

Figure 42A:
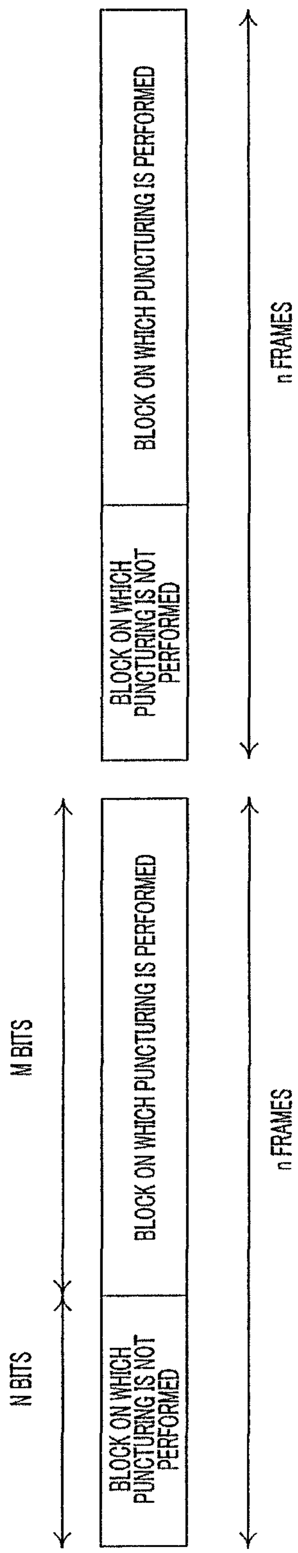
FIG. 42A and FIG. 42B show puncturing patterns according to another Embodiment 7.
Figure 42B:
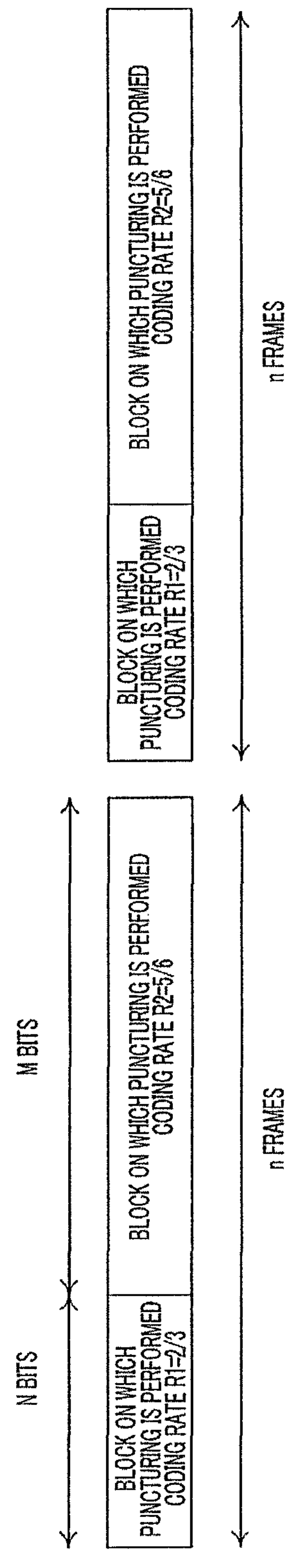

Furthermore, puncturing may also be executed with n frames as a processing unit on the receiving side (decoding side), as shown in FIG. 42A and FIG. 42B. As shown in FIG. 42A, provision may be made for a first puncturing pattern whereby puncturing is not performed to be used for N bits from the start of n frames (where n is an integer greater than or equal to 1), and for a second puncturing pattern whereby puncturing is performed to be used for bits (N+1) through (N+M).

Alternatively, as shown in FIG. 42B, provision may be made for a first puncturing pattern with the coding rate of R1=⅔ to be used for N bits from the start of n frames, and for a second puncturing pattern with the coding rate of R2=⅚ to be used for bits (N+1) through (N+M). By this means, the number of bits punctured in N bits from the start of n frames can be reduced.

Figure 43A:
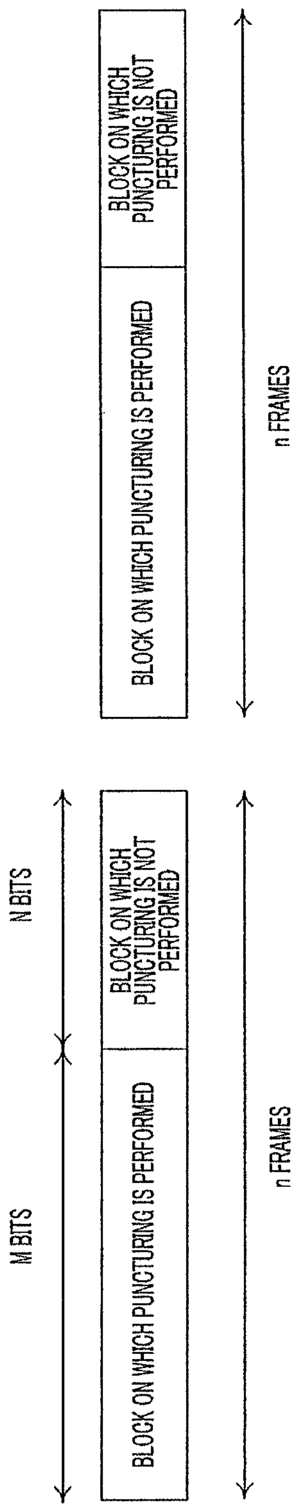
FIG. 43A and FIG. 43B show puncturing patterns according to another Embodiment 7.
Figure 43B:
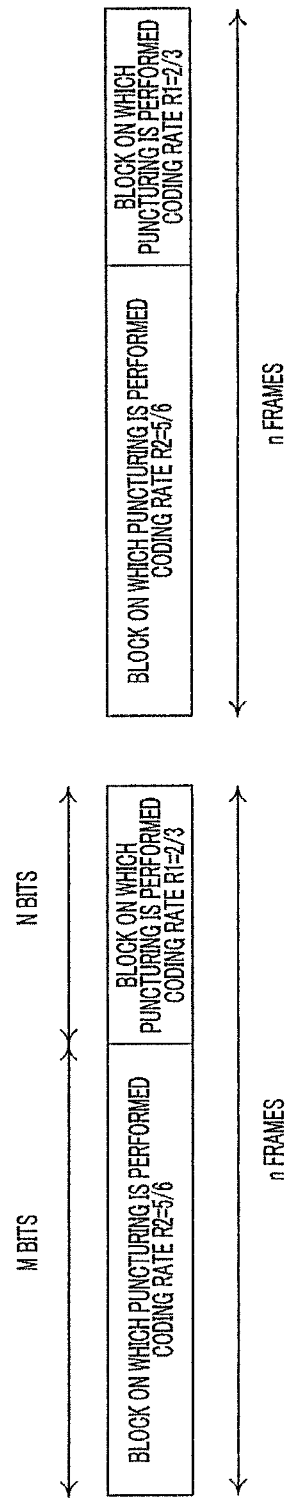

Also, a pattern may be used whereby fewer bits are punctured by puncturing toward the rear of a processing unit on the receiving side (decoding side), as shown in FIG. 43A and FIG. 43B. Providing for fewer bits to be punctured by puncturing toward the rear of a processing unit on the receiving side (decoding side) improves received quality in BP decoding.

This is because, when decoding processing timing is taken into consideration, if provision is made for puncturing such that the number of bits punctured by puncturing becomes smaller in the rear part of a received data sequence composed of n frames, for example, rows for which belief is propagated are included both forward and rearward in a BP decoding processing period, and therefore belief can be propagated efficiently.

As in the case shown in FIG. 40, as long as provision is made for the relationship N<<M to hold true between number of bits N for which the first puncturing pattern is used and number of bits M for which the second puncturing pattern is used, received quality can be improved while suppressing a decrease in transmission speed.

Figure 44A:
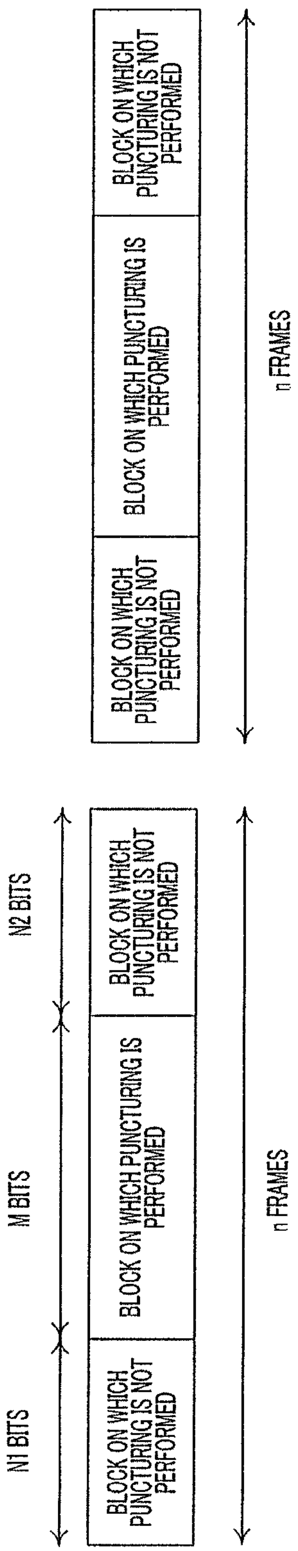
FIG. 44A and FIG. 44B show puncturing patterns according to another Embodiment 7.

Also, as shown in FIG. 44A, provision may be made for a first puncturing pattern whereby puncturing is not performed to be used for N1 bits from the start of n frames (where n is an integer greater than or equal to 1) comprising a processing unit on the receiving side (decoding side), for a second puncturing pattern whereby puncturing is performed to be used for bits (N1+1) through (N1+M), and for the first puncturing pattern whereby puncturing is not performed to be used for bits (N1+M+1) through (N1+M+N2).

Figure 44B:
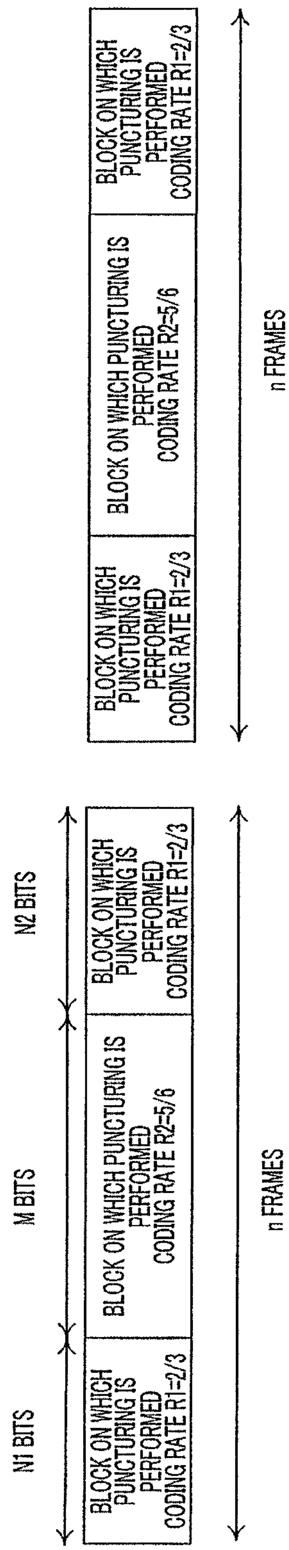

Moreover, as shown in FIG. 44B, provision may be made for a first puncturing pattern with the coding rate of R1=⅔ to be used for N1 bits from the start of n frames (where n is an integer greater than or equal to 1) comprising a processing unit on the receiving side (decoding side), for a second puncturing pattern with the coding rate of R2=⅚ to be used for bits (N1+1) through (N1+M), and for the first puncturing pattern with the coding rate of R1=⅔ to be used for bits (N1+M+1) through (N1+M+N2).

Check rows for which belief is high increase when a first puncturing pattern whereby few bits are punctured by puncturing is used in two places in a processing unit on the receiving side (decoding side) (see FIG. 44A and FIG. 44B) as compared with a case in which such a first puncturing pattern is used in one place (see FIG. 42A and FIG. 42B and FIG. 43A and FIG. 43B), and therefore the convergence rate is high when BP decoding is performed, and decoded results can be obtained with a small number of iterations.

The number of places at which a first puncturing pattern whereby few bits are punctured by puncturing is used in an above processing unit is not limited to two, and may be three or more.

When the number of places at which a first puncturing pattern whereby few bits are punctured by puncturing is used in an above processing unit is two or more, also, as long as provision is made for the relationship N<<M to hold true between total number of bits N for which the first puncturing pattern is used and total number of bits M for which the second puncturing pattern is used, received quality can be improved while suppressing a decrease in transmission speed.

In FIG. 42A and FIG. 42B, FIG. 43A and FIG. 43B, and FIG. 44A and FIG. 44B, cases have been described in which a first puncturing pattern and second puncturing pattern are used for n frames, but n need only be an integer greater than or equal to 1, and application is also possible in the case of one frame.

Below, puncturing patterns suitable for a transmission codeword sequence obtained by LDPC-CC encoding will be considered, taking the relationship to decoding processing timing into consideration.

FIG. 45 is a drawing for explaining decoding processing timing. In FIG. 45, received data sequences are each composed of n frames (for example, n OFDM (Orthogonal Frequency Division Multiplexing) symbols: an OFDM symbol being a symbol composed of all carriers (32 subcarriers) when an OFDM method comprises subcarriers and composes a modulation signal on a subcarrier-by-subcarrier basis). This received data sequence length is a processing unit on the receiving side (decoding side), and the relevant n frames (or n OFDM symbols) are passed to an upper layer as one entity. Generally, there is a time lag until the upper layer fetches data of the next frame, and therefore timings t3, t6, and t9 in FIG. 45, that is, timings at which the final part of n frames is received, are actually taken to be the ends of periods in which BP decoding is performed.

As an LDPC-CC has properties of a convolutional code, in order for data estimated by BP decoding from timing t2 to be made valid data (data with a high possibility of being correct), it is necessary for BP decoding to be started before timing t2. For example, in the example shown in FIG. 45, in order for estimated data obtained by BP decoding between t2 and t5 to be made valid data, it is necessary for BP decoding to be performed between t1 and t6. Similarly, in order for estimated data obtained by BP decoding between t5 and t8 to be made valid data, it is necessary for BP decoding to be performed between t4 and t9.

When such decoding processing timing is taken into consideration, if provision is made for puncturing such that the number of bits punctured by puncturing becomes smaller in the rear part of a received data sequence composed of n frames, for example, rows for which belief is propagated are included both forward and rearward in a BP decoding processing period, and therefore belief can be propagated efficiently.

As described above, according to this embodiment provision is made for puncturing section 3710 to perform transmission codeword bit puncturing using a first puncturing pattern, and a second puncturing pattern whereby more bits are punctured than with the first puncturing pattern, for each transmission codeword bit processing unit.

By using first and second puncturing patterns with different post-puncturing coding rates for a transmission codeword sequence instead of executing puncturing in a fixed proportion, degradation of decoding characteristics due to BP decoding can be suppressed.

Although rows that cause degradation of received quality inevitably occur when puncturing is performed, a method of suppressing degradation of received quality while suppressing a decrease in transmission speed, such as a puncturing method according to this embodiment, is extremely important in constructing a system offering good performance.

First and second puncturing patterns may each be composed of an identical plurality of sub-patterns. That is to say, provision may be made for identical sub-puncturing patterns to be used for each of blocks 2 through 5, and for transmission codeword bits to be punctured in a regular manner, as shown in FIG. 37. This enables puncture computation processing to be simplified.

Also, a first puncturing pattern with a small coding rate need not necessarily be positioned at the end of n frames, but, as can be seen from FIG. 45, may also be provided between t1 and t3, t4 and t6, and t7 and t9. Furthermore, since periods t1 to t3, t4 to t6, and t7 to t9 are determined by the relationship between a BP decoding processing period and a period in which valid data is obtained, a suitable position for placing a first puncturing pattern also varies.

In the above description, a puncturing method for a case in which BP decoding is performed on a convolutional code has been described as an example, but this is not a limitation, and a puncturing method of the present invention can also be implemented in a similar way in the case of a time-invariant LDPC-CC or time varying LDPC-CC such as described in Non-Patent Document 5 through. Non-Patent Document 7 and Non-Patent Document 14.

Also, a puncturing method according to this embodiment can be used for time-invariant LDPC-CCs and time varying LDPC-CCs described in embodiments and another embodiments of the present invention, and has an effect of suppressing degradation of received quality.

(Time-Invarianttime Varying LDPC-CCs Based on a Convolutional Code (of a Coding Rate of ½))

An overview of time-invariant/time varying LDPC-CCs based on a convolutional code is given below.

A systematic code with the coding rate of R=½ and generator matrix G=[1 G1(D)G0(D)] will be considered. At this time, G1 represents a feed-forward polynomial and G0 represents a feedback polynomial. If an information sequence polynomial representation is X(D), and a parity sequence polynomial representation is P(D), a parity check polynomial is represented as shown below.

$$G_1(D)X(D)+G_0(D)P(D)=0 \qquad \text{(Equation 119)}$$

Here, a parity check polynomial of Equation 120 satisfying Equation 119 will be considered.

$$(D^{a1}+D^{a2}+\dots+d^{ar}+1)X(D)+$$

$$(D^{b1}+d^{b2}+\dots+d^{bs}+1)P(D)=0 \qquad \text{(Equation 120)}$$

In Equation 120, ai (where i=1, 2, . . . , r) is a non-zero integer, and bj (where j=1, 2, . . . , s) is an integer of 1 or above. A code defined by a parity check matrix based on a parity check polynomial of Equation 120 is called a time-invariant LDPC-CC here.

Here, m different parity check polynomials based on Equation 120 are provided (where m is an integer of 2 or above). These parity check polynomials are represented as shown below.

$$A_i(D)X(D)+B_i(D)P(D)=0 \qquad \text{(Equation 121)}$$

At this time, i=0, 1, . . . , m−1. Then information and parity at point in time j are represented by $X_j$ and $P_j$, and $u_j(X_j, P_j)$. At this time, point in time j information and parity $X_j$ and $P_j$ satisfy a parity check polynomial of Equation 122.

$$A_k(D)X(D)+B_kI(D)P(D)=0(k=j \bmod m) \qquad \text{(Equation 122)}$$

Here, "j mod m" is a remainder after dividing j by m.

A code defined by a parity check matrix based on a parity check polynomial of Equation 122 is called a time varying LDPC-CC here. At this time, a time-invariant LDPC-CC defined by a parity check polynomial of Equation 121 and a time varying LDPC-CC defined by a parity check polynomial of Equation 122 have a characteristic of enabling parity easily to be found sequentially by means of a register and exclusive OR.

In decoding, parity check matrix H is created from Equation 121 in the case of a time-invariant LDPC-CC and Equation 122 in the case of a time varying LDPC-CC, and if vector $u=(u_0, u_1, \dots, u_i, \dots)$, the following relational equation holds true.

$$Hu=0 \qquad \text{(Equation 123)}$$

Then, based on the relational equation in Equation 123, BP decoding is performed and a data sequence is obtained.

(Specification or Proposal)

An example of content when a specification or proposal is created is shown below.

1. Use of LDPC-CC (Low-Density Parity-Check Convolutional Codes) that are error correction codes corresponding to a plurality of coding rates is proposed as an FEC (Forward Error Correction) Scheme. LDPC-CC are error correction code defined by a low-density parity parity check matrix, and constitute a code class having correction capability approaching the Shannon Limit, in the same way as a CTC (Convolutional Turbo Code) and LDPC-BC (Block Code) (see Non-Patent Document 12 and Non-Patent Document 15).

An LDPC-CC has the following advantages over a CTC.

(1) Interleaver is not necessary in encoder

Encoder can be configured using only shift registers and adders.

Information sequence length is not limited to interleaver length, enabling encoding of an information sequence of any length.

(2) Sum-product decoding allowing parallel processing can be used for decoding algorithm, enabling processing delay to be reduced compared with CTC decoding requiring serial processing.

Also, there are the following advantages compared with an LDPC-BC standardized by IEEE802.11n or the like.

(3) Information sequence length is not limited to parity check matrix block length, enabling encoding of an information sequence of any length.

(4) Encoding can be implemented using computation scale proportional to memory length (constraint length), making the configuration of an encoder simpler (memory length<information sequence length) than with LDPC-BC requiring computation scale proportional to information sequence length.

(5) Decoding processing delay can be reduced by applying decoding algorithm using LDPC-CC-specific parity check matrix structure.

2. 2-1. FEC Encoding

Figure 46:
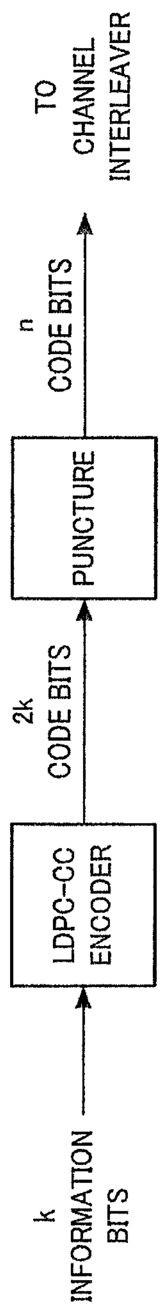
FIG. 46 shows an FEC encoder.

FIG. 46 is a block diagram of an error correction encoding method (FEC scheme). The error correction encoding method comprises an LDPC-CC encoder and a puncturer. The length of payload data to be encoded is k bits, and the length of codeword data obtained after encoding is n bits.

2-2. LDPC-CC Encoding

Figure 47:
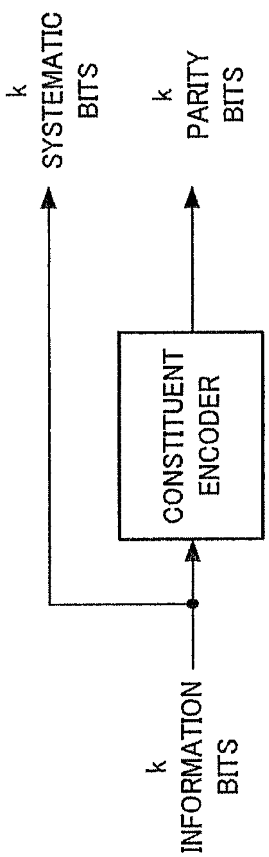
FIG. 47 shows a structure of an LDPC convolutional encoder.

Payload data is encoded by the LDPC-CC encoder. FIG. 47 shows the configuration of the LDPC-CC encoder. The LDPC-CC encoder outputs k systematic bits and k parity bits for k-bit payload data. Coding rate R of the LDPC-CC encoder is 12.

The LDPC convolutional encoding process is as shown below.

(1) Input comprising k information bits is divided into two. One is output as k systematic bits, and one is input to a constituent encoder.

(2) The constituent encoder performs encoding processing on the k information bits, and outputs k parity bits. The LDPC-CC encoder outputs code bits two at a time in the following order: {d1,p1}, {d2,p2}, {d3,p3}, {dk,pk}.

The LDPC-CC is defined by a parity parity check matrix provided by Equation 124.

$$H=\begin{bmatrix}
h_d^{(0)}(0) & h_p^{(0)}(0) & 0 & 0 & \dots & & & \dots & 0 & 0 \\
h_d^{(1)}(1) & h_p^{(1)}(1) & h_d^{(0)}(1) & h_p^{(0)}1 & \dots & & & & \vdots & \vdots \\
\vdots & \vdots & \vdots & \vdots & \ddots & & & & & \\
h_d^{(M)}(M) & h_p^{(M)}(M) & h_d^{(M-1)}(M) & h_p^{(M-1)}(M) & \dots & & & & & \\
0 & 0 & h_d^{(M)}(M+1) & h_p^{(M)}(M+1) & \dots & & & & \vdots & \vdots \\
\vdots & \vdots & & & \ddots & \ddots & & \ddots & 0 & 0 \\
0 & 0 & \dots & & \dots & 0 & h_d^{(M)}(k) & h_p^{(M)}(k) \ \dots & h_d^{(0)}(k) & h_p^{(0)}(k)
\end{bmatrix} \qquad \text{(Equation 124)}$$

Parity check matrix H is a k×2k matrix. Each column of parity check matrix H correspond to systematic bits (d1, . . . , dk) and parity bits (p1, . . . , pk) in the order d1, p1, d2, p2, . . . dt, pt, . . . , dk, pk. M is the LDPC-CC memory length.

Each row of parity check matrix H represents a parity check polynomial. Here, $h_d^{(i)}(t)$ (where i=0, . . . , M) represents a weight (1 or 0) of a systematic bit in the t'th parity check polynomial, and $h_p^{(i)}(t)$ (where i=0, . . . , M) represents a weight (1 or 0) of a parity bit in the t'th parity check polynomial. In parity check matrix H, all elements other than $h_d^{(i)}(t)$ and $h_p^{(i)}(t)$ are 0. As shown in Equation 1, LDPC-CC parity check matrix H is a matrix in which elements are 1 only in diagonal terms of the matrix and neighboring elements.

Check equations used by an FEC scheme are shown in Equation 125 and Equation 126, $$h_d^{(M)}(t)h_p^{(M)}(t)h_d^{(M-1)}(t)h_p^{(M-1)}(t)\ \ldots\ h_d^{(1)}(t)h_p^{(1)}(t)h_d^{(0)}(t)h_p^{(0)}(t) = \qquad \text{(Equation 125)}$$

00000000000000000000000000000000000000000000000000000000000000000000000000
00000000000000000000000000000000000000000000000000000000000010000100000000
00000000000000000000000000000000000000000000000000000000000000000000000000
00000000000000000000000000000000000000000000000000000000000000000000000000
00000000000000000000000000000000000000000000000000000000000000000000000000
00000000000000000000000000010000000000000000000000000000000000000000000000
00000000000000000000000001000000000000000000000000000000000000000000000000
00000010000000000000000010000000000000000000000000000000000000000000000000
00000000000010000000000000000000000000000000000000000000000000000000000000
00000000000000000000000000001100000000000000000000000000000000000000000000
00000000000000000100000000000000000000000000000000000000000000000000000000
00000000000000000000000000000000000000000000000000000000000000000000000000
00000000000000000000000010

(When $t$ is an even number)

(Equation 126)

01000000000000000000000000000000000000000000000000000000000000000000000000
00000000000000000000000000000000000000000000000000000000000000000000000000
00000000000000000001000000000000000000000000000000000000000000000000000000
00000000000001000000000000000000100000000000000100000000000000000000000000
00000000000000000000000000000000000000000000000000000000000000000000000000
00000000000000000000000000000100000000000000000000000000000000000000000000
00000000000000000000000000000000000000000000000000000000000000000000000000
00000000000000000000000000100000000000000000000000000000000000000000000000
00000000000010000000000000000000000000000000000000000000000000000000000000
00000000000000000000000000001100000000000000000000000000000000000000000000
00000000000000000000000000000000000000000000000000000000000000000000000000
00000000000000000000000000000000000000000000000000000000000000000000000000
000000000000000100000000000

(When $t$ is an odd number)

where n=0, 1, 2, . . . .

Polynomial representations of Equation 125 and Equation 126 are as follows.

$$(D^{262}+D^{132}+1+D^{-74}+D^{-158})X(D)+(D^{260}+D^{162}+D^{123}+D^{89}+1)P(D)=0 \qquad \text{(Equation 127)}$$

$$(D^{245}+D^{208}+D^{41}+1+D^{-158})X(D)+(D^{335}+D^{190}+D^{198}+D^{120}+1)P(D)=0 \qquad \text{(Equation 128)}$$

Here, X(D) represents systematic bits (d1, dk), and P(D) represents Parity Bits (p1, pk).

An LDPC-CC encoder of this proposal is a time varying LDPC-CC encoder with a period of 2 and memory length of 421 that uses two polynomials, a polynomial of Equation 125 and a polynomial of Equation 126, switched at each point in time.

The LDPC-CC encoder has any configuration that performs the computation in Equation 129.

$$d_t = u_t \qquad \text{(Equation 129)}$$

$$p_t = \sum_{i=0}^{M} h_d^{(i)}(t)u_{t-i} + \sum_{i=1}^{M} h_p^{(i)}(t)p_{t-i}$$

The initial state of the LDPC-CC encoder is an all-zero state. That is to say, the initial state is as represented by Equation 130 below.

$$\begin{matrix} d_t = 0 \\ p_t = 0 \end{matrix}\ t \le 0 \qquad \text{(Equation 130)}$$

An LDPC-CC supports encoding of Information Bits of arbitrary length k with the same encoder configuration. Also, an LDPC-CC supports a plurality of memory lengths.

3. Encoding Termination

In order to uniquely set the state of an LDPC-CC encoder at the time of encoding termination, termination is necessary. Termination is performed by means of zero-tailing.

Zero-tailing is implemented by performing LDPC-CC Encoding of tail-bits comprising 0 bits equivalent in number to memory length M. When termination is being performed, tail bits are a bit sequence known on the receiving side and therefore are not transmitted included in systematic bits, and only M parity bits obtained when tail bits were encoded are transmitted.

4. Puncturing

Puncturing is processing that punctures (discards) a number of systematic bits and/or parity bits from LDPC-CC encoder output in order to obtain a code of a coding rate higher than ½ with a single encoder configuration. Coding rates supported by puncturing are shown in Table 1. Coding rates that should be supported are ½, ⅓, and ¾, while coding rates of ⅘ and ⅚ are optional.

TABLE 1

| | |
|---|---|
| The following code rates shall be supported: | ½, ⅔, ¾ |
| The following code rates are optional: | ⅘, ⅚ |

Table 2 shows puncturing patterns used with the coding rates in Table 1. In the puncturing pattern column, d and p represent systematic bits and parity bits respectively, and when a value in a pattern is 0, that bit is punctured. LPunc represents the length of a puncturing pattern.

Regular rotated puncturing is used for puncturing. Systematic bits and parity bits are delimited at Lpunc-bit intervals, and puncturing is performed in a regular manner in accordance with a puncturing pattern shown in Table 2. In the case of coding rates of 34, 45, and 56, systematic bits are also punctured, and the resulting code is a non-systematic code.

TABLE 2

| Code Rate | Puncturing Pattern | $L_{PUNC}$ |
|---|---|---|
| | Mandatory Rates | |
| ½ | d: 1<br>p: 1 | 1 |
| ⅔ | d: 11<br>p: 01 | 2 |
| ¾ | d: 111010<br>p: 100111 | 6 |
| | Optional Rates | |
| ⅘ | d: 100001011111<br>p: 111011110100 | 12 |
| ⅚ | d: 10101<br>p: 10101 | 5 |

5. The use of an LDPC-CC as an FEC scheme has been proposed above. An LDPC-CC encoder configuration, polynomials, and puncturing patterns have been shown, and the ability to use these as an FEC scheme has been shown.

6. 6-1. Example of LDPC-CC Encoder

LDPC-CC encoding can be implemented by any encoder that implements Equation 129. The configuration shown in FIG. 48 is shown in Non-Patent Document 12 as an example of an LDPC-CC encoder.

Figure 48:
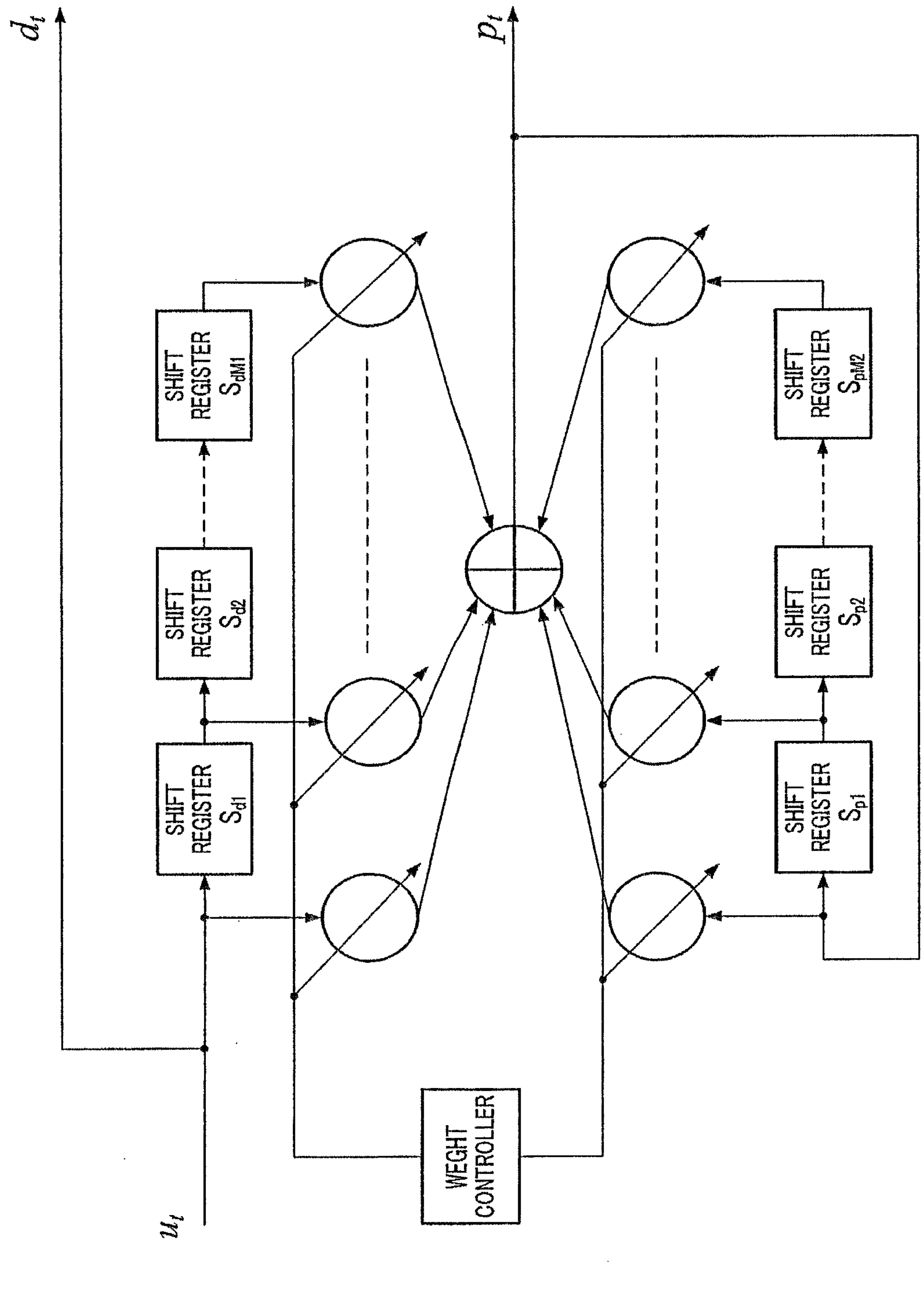
FIG. 48 shows a structure of an LDPC-CC encoder.

As shown in FIG. 48, an LDPC-CC encoder comprises M1 shift registers storing $u_t$, M2 shift registers storing $p_t$, a weight controller that outputs weights in accordance with the order of $h_d^{(i)}(t)$ and $h_p^{(i)}(t)$ of each column of parity check matrix H, and a modulo 2 adder.

Through the employment of this kind of configuration, the LDPC-CC encoder performs encoding processing of an LDPC-CC in accordance with Equation 125. As shown in FIG. 48, an LDPC-CC encoder can be configured by means of shift registers, an adder, and a weight controller alone.

Another Embodiment 8

In this embodiment, a method will be described whereby the method of creating a time varying LDPC-CC of a coding rate of ½ described in Embodiment 7 is extended, and a time varying LDPC-CC of a coding rate greater than a coding rate of ½ is created. Below, a method of creating a time varying LDPC-CC of a coding rate of 34 or suchlike will be described as an example.

Data X1, data X2, data X3, and parity P of point in time 2i are represented by $X_{1,2i}$, $X_{2,2i}$, $X_{3,2i}$, and $P_{2i}$ respectively, and data X1, data X2, data X3, and parity P of point in time 2i+1 are represented by $X_{1,2i+1}$, $X_{2,2i+1}$, $X_{3,2i+1}$, and $P_{2i+1}$ respectively (where i is an integer). Here, a polynomial of data X1 is designated X1(D), a polynomial of data X2 is designated X2(D), a polynomial of data X3 is designated X3(D), and a polynomial of parity P is designated P(D), and the parity check polynomial below is considered.

$$(D^{a1}+\dots+D^{ar}+1)X1(D)+(D^{b1}+\dots+D^{bs}+1)X2(D)+(D^{c1}+\dots+D^{cv}+1)X3(D)+(D^{e1}+\dots+D^{ew}+1)P(D)=0 \quad \text{(Equation 131)}$$

In Equation 131, it is assumed that a1, a2, . . . , ar are integers other than 0 (where a1≠a2≠ . . . ≠ar). Also, it is assumed that b1, b2, . . . , bs are integers other than 0 (where b1≠b2≠ . . . ≠bs). Furthermore, it is assumed that c1, c2, . . . , cv are integers other than 0 (where c1≠c2≠ . . . ≠cv). Moreover, it is assumed that e1, e2, . . . , ew are integers of 1 or above (where e1≠e2≠ . . . ≠ew). Then P(D) of point in time 2i is found using the relational equation in Equation 131. At this time, P(D) can be found sequentially.

Next, Equation 132 is considered as a parity check polynomial.

$$(D^{A1}+\dots+D^{AR}+1)X1(D)+(D^{B1}+\dots+D^{BS}+1)X2(D)+(D^{C1}+\dots+D^{CV}+1)X3(D)+(D^{E1}+\dots+D^{EW}+1)P(D)=0 \quad \text{(Equation 132)}$$

In Equation 132, it is assumed that A1, A2, . . . , AR are integers other than 0 (where A1≠A2≠ . . . ≠AR). Also, it is assumed that B1, B2, . . . BS are integers other than 0 (where B1≠B2≠ . . . ≠BS). Furthermore, it is assumed that C1, C2, . . . , CV are integers other than 0 (where C1≠C2≠ . . . ≠CV). Moreover, it is assumed that E1, E2, . . . EW are integers of 1 or above (where E1≠E2≠ . . . ≠EW). Then P(D) of point in time 2i+1 is found using the relational equation in Equation 132. At this time, P(D) can be found sequentially.

Creating an LDPC-CC of a time varying period of 2 as described above provides an advantage of enabling an optimal puncturing pattern to be selected easily when a method of periodically selecting puncture bits is employed, in the same way as in Embodiment 7.

If the time varying period is within 10, it is easy to employ a method of performing puncturing periodically and find an optimal puncturing pattern.

Next, an LDPC-CC for which the time varying period is m (where m is an integer ≥2) will be considered. In the case of a time varying period of m, m different check equations represented by Equation 131 are provided, and those m check equations are designated "check equation #1, check equation #2, . . . , check equation #m."

Then data X1, data X2, data X3, and parity P of point in time mi+1 are represented by $X_{1,mi+1}$, $X_{2,mi+1}$, $X_{3,mi+1}$, and $P_{mi+1}$ respectively, data X1, data X2, data X3, and parity P of point in time mi+2 are represented by $X_{1,mi+2}$, $X_{2,mi+2}$, $X_{3,mi+2}$, and $P_{mi+2}$ respectively, and data X1, data X2, data X3, and parity P of point in time mi+m are represented by $X_{1,mi+m}$, $X_{3,mi+m}$, and $P_{mi+m}$ respectively (where i is an integer).

Consider an LDPC-CC of a time varying period of m for which parity $P_{mi+1}$ of point in time mi+1 is found using "check equation #1," parity $P_{mi+2}$ of point in time mi+2 is found using "check equation #2," and parity $P_{mi+m}$ of point in time mi+m is found using "check equation #m" at this time. This kind of LDPC-CC code provides an advantage of enabling parity to be found sequentially, in addition to being a code offering good received quality.

In the above description, a time varying LDPC-CC based on Equation 131 and Equation 132 has been described, but an LDPC-CC of a time varying period of 2 or time varying period of m can also be formed using Equation 133 instead of Equation 131, or using Equation 134 instead of Equation 132.

$$(D^{a1}+\ldots+D^{ar})X1(D)+(D^{b1}+\ldots+D^{bs})X2(D)+(D^{c1}+\ldots+D^{cv})X3(D)+(D^{e1}+\ldots+D^{ew}+1)P(D)=0 \quad \text{(Equation 133)}$$

$$(D^{A1}+\ldots+D^{AR})X1(D)+(D^{B1}+\ldots+D^{BS})X2(D)+(D^{C1}+\ldots+D^{CV})X3(D)+(D^{E1}+\ldots+D^{EW}+1)P(D)=0 \quad \text{(Equation 134)}$$

The coding rate is not limited to 34, and an LDPC-CC code of a coding rate of n/n+1 can also be created in a similar way. For example, in the case of a time varying period of 2, data X1, data. X2, data X3, . . . , data Xn, and parity P of point in time 2i are represented by $X_{1,2i}$, $X_{2,2i}$, $X_{3,2i}$, . . . , $X_{n,2i}$, and $P_{2i}$ respectively, and data X1, data X2, data X3, . . . , data Xn, and parity P of point in time 2i+1 are represented by $X_{1,2i+1}$, $X_{2,2i+1}$, $X_{3,2i+1}$, . . . , $X_{n,2i+1}$, and $P_{2i+1}$ respectively (where i is an integer). Here, a polynomial of data X1 is designated X1 (D), a polynomial of data X2 is designated X2(D), a polynomial of data X3 is designated. X3(D), . . . , a polynomial of data Xn is designated Xn(D), and a polynomial of parity P is designated P(D), and the parity check polynomial below is considered.

$$(D^{a1,1}+\ldots+D^{a1,r1}+1)X1(D)+(D^{a2,1}+\ldots+D^{a2,r2}+1)X2(D)+\ldots+(D^{an,1}+\ldots+D^{an,rn}+1)Xn(D)+(D^{e1}+\ldots+D^{ew}+1)P(D)=0 \quad \text{(Equation 135)}$$

In Equation 135, it is assumed that $a_{1,1}$, $a_{1,2}$, . . . , $a_{1,r1}$ are integers other than 0 (where $a_{1,1}\neq a_{1,2}\neq \ldots \neq a_{1,r1}$). Also, it is assumed that $a_{2,1}$, $a_{2,2}$, . . . , $a_{2,r2}$ are integers other than 0 (where $a_{2,1}\neq a_{2,2}\neq \ldots \neq a_{2,r2}$). The same applies to X3(D) through Xn−1(D). Furthermore, it is assumed that $a_{n,1}$, $a_{n,2}$, . . . , an,rn are integers other than 0 (where $a_{n,1}\neq a_{n,2}\neq \ldots \neq a_{n,rn}$). Moreover, it is assumed that e1, e2, . . . , ew are integers of 1 or above (where e1≠e2≠ . . . ≠ew). Then P(D) of point in time 2i is found using the relational equation in Equation 135. At this time, P(D) can be found sequentially.

Next, Equation 136 is considered as a parity check polynomial.

$$(D^{A1,1}+\ldots+D^{A1,R1}+1)X1(D)+(D^{A2,1}+\ldots+D^{A2,R2}+1)X2(D)+\ldots+(D^{An,1}+\ldots+D^{An,Rn}+1)Xn(D)+(D^{E1}+\ldots+D^{EW}+1)P(D)=0 \quad \text{(Equation 136)}$$

In Equation 136, it is assumed that $A_{1,1}$, $A_{1,2}$, . . . , $A_{1,R1}$ are integers other than 0 (where $A_{1,1}\neq A_{1,2}\neq \ldots \neq A_{1,R1}$). Also, it is assumed that $A_{2,1}$, $A_{2,2}$, . . . , $A_{2,R}{}^{2}$ are integers other than 0 (where $A_{2,1}\neq A_{2,2}\neq \ldots \neq A_{2,R2}$). The same applies to X3(D) through Xn−1(D). Furthermore, it is assumed that $A_{n,1}$, $A_{n,2}$, . . . , $A_{n,Rn}$ are integers other than 0 (where $A_{n,1}\neq A_{n,2}\neq \ldots \neq A_{n,Rn}$). Moreover, it is assumed that E1, E2, . . . , EW are integers of 1 or above (where E1≠E2≠ . . . ≠Ew). Then P(D) of point in time 2i+1 is found using the relational equation in Equation 136. At this time, P(D) can be found sequentially.

Creating an LDPC-CC of a time varying period of 2 as described above provides an advantage of enabling an optimal puncturing pattern to be selected easily when a method of periodically selecting puncture bits are is employed, in the same way as in Embodiment 7.

If the time varying period is within 10, it is easy to employ a method of performing puncturing periodically and find an optimal puncturing pattern.

Next, an LDPC-CC for which the time varying period is m (where m is an integer ≥2) will be considered.

In the case of a time varying period of m, m different check equations represented by Equation 135 are provided, and those m check equations are designated "check equation #1, check equation #2, . . . , check equation #m."

Then data X1, data X2, data X3, . . . , data Xn, and parity P of point in time mi+1 are represented by $X_{1,mi+1}$, $X_{2,mi+1}$, $X_{3,mi+1}$, . . . , $X_{n,mi+1}$, and $P_{mi+2}$ respectively, data X1, data X2, data X3, . . . , data Xn, and parity P of point in time mi+2 are represented by $X_{1,mi+2}$, $X_{2,mi+2}$, $X_{3,mi+2}$, . . . , $X_{n,mi+2}$, and $P_{mi+2}$ respectively, and data X1, data X2, data X3, data Xn, and parity P of point in time mi+m are represented by $X_{1,mi+m}$, $X_{2,mi+m}$, $X_{3,mi+m}$, . . . , $X_{n,mi+m}$, and $P_{mi+m}$ respectively (where i is an integer).

Consider an LDPC-CC of a time varying period of m for which parity $P_{mi+1}$ of point in time mi+1 is found using "check equation #1," parity $P_{mi+2}$ of point in time mi+2 is found using "check equation #2," and parity $P_{mi+m}$ of point in time mi+m is found using "check equation #m" at this time. This kind of LDPC-CC code provides an advantage of enabling parity to be found sequentially, in addition to being a code offering good received quality.

In the above description, a time varying LDPC-CC based on Equation 135 and Equation 136 has been described, but an LDPC-CC of a time varying period of 2 or a time varying period of m can also be formed using Equation 137 instead of Equation 135, or using Equation 138 instead of Equation 136.

$$(D^{a1,1}+\ldots+D^{a1,r1})X1(D)+(D^{a2,1}+\ldots+D^{a2,r2}+1)X2(D)+\ldots+(D^{an,1}+\ldots+D^{an,rn}+1)Xn(D)+(D^{e1}+\ldots+D^{ew}+1)P(D)=0 \quad \text{(Equation 137)}$$

$$(D^{A1,1}+\ldots+D^{A1,R1})X1(D)+(D^{A2,1}+\ldots+D^{A2,R2})X2(D)+\ldots+(D^{An,1}+\ldots+D^{An,Rn})Xn(D)+(D^{E1}+\ldots+D^{EW}+1)P(D)=0 \quad \text{(Equation 138)}$$

Another Embodiment 9

The reason why received quality degrades when a time varying LDPC-CC based on Equation 68 and Equation 69 described in Embodiment 7 is punctured will be described from the viewpoint of conditions for producing a parity check polynomial (hereinafter abbreviated to "polynomial") whereby bits corresponding to maximum orders of a plurality of parity check polynomials are not punctured at the same time.

Figure 49:
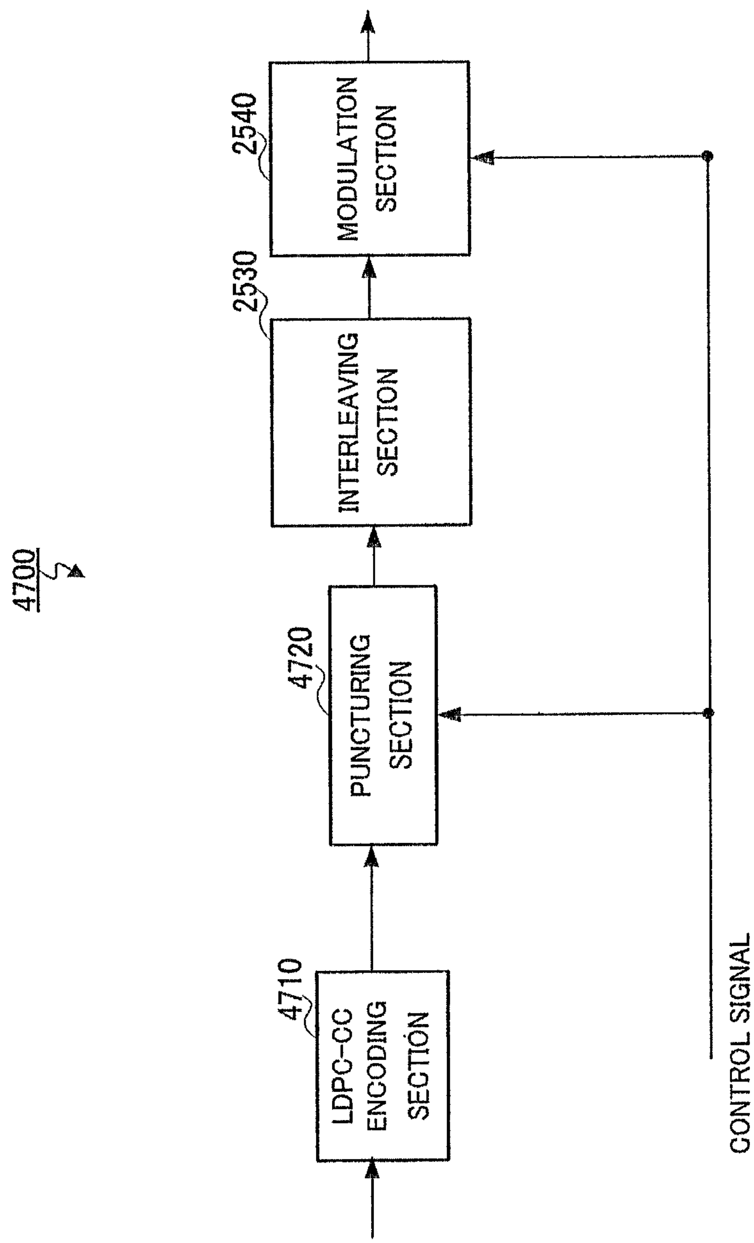
FIG. 49 is a block diagram showing another main configuration of a transmitting apparatus according to another Embodiment 9.

FIG. 49 is a block diagram showing a main configuration of a transmitting apparatus according to this embodiment. In the description of this embodiment, configuration parts identical to those in FIG. 39 are assigned the same reference codes as in FIG. 39, and descriptions thereof are omitted. As compared with transmitting apparatus 3700 in FIG. 39, transmitting apparatus 4700 in FIG. 49 is equipped with LDPC-CC encoding section 4710 and puncturing section 4720 instead of LDPC-CC encoding section 2510 and puncturing section 3710.

LDPC-CC encoding section 4710 generates parity bits for input information bits in accordance with parity check matrix H described later herein. LDPC-CC encoding section 4710 outputs codeword bits comprising information bits and parity bits to puncturing section 4720.

Puncturing section 4720 punctures codeword bits. The puncturing pattern will be described later herein.

Next, a case in which a parity check matrix used by LDPC-CC encoding section 4710 is configured by means of polynomials of Equation 139 and Equation 140 will be described as an example.

$$(D^{16}+D^{10}+D^{6}+1)X(D)+(D^{17}+D^{8}+D^{4}+1)P(D)=0 \quad \text{(Equation 139)}$$

$$(D^{17}+D^{8}+D^{4}+1)X(D)+(D^{19}+D^{12}+D^{5}+1)P(D)=0 \quad \text{(Equation 140)}$$

Parameters of a parity check matrix in which above polynomials (139) and (140) are repeated alternately are shown in Table 3.

TABLE 3

| | |
|---|---|
| Time varying period of T of check matrix | T = 2 |
| Maximum order α1 of information bit of polynomial (139) | α1 = 16 |
| Maximum order α2 of information bit of polynomial (140) | α2 = 17 |
| Maximum order β1 of parity bit of Polynomial (139) | β1 = 17 |
| Maximum order β2 of parity bit of Polynomial (140) | β2 = 19 |
| Maximum order γ of LDPC-CC = Max(α1, α2, β1, β2) | γ = 19 |
| Second order A1 of information bits of polynomial (139) | A1 = 10 |
| Second order A2 of information bits of polynomial (140) | A2 = 8 |
| Second order B1 of parity bit of polynomial (139) | B1 = 8 |
| Second order B2 of parity bit of polynomial (140) | B2 = 12 |
| Pre-puncturing coding rate R | R = ½ |

Figure 50:
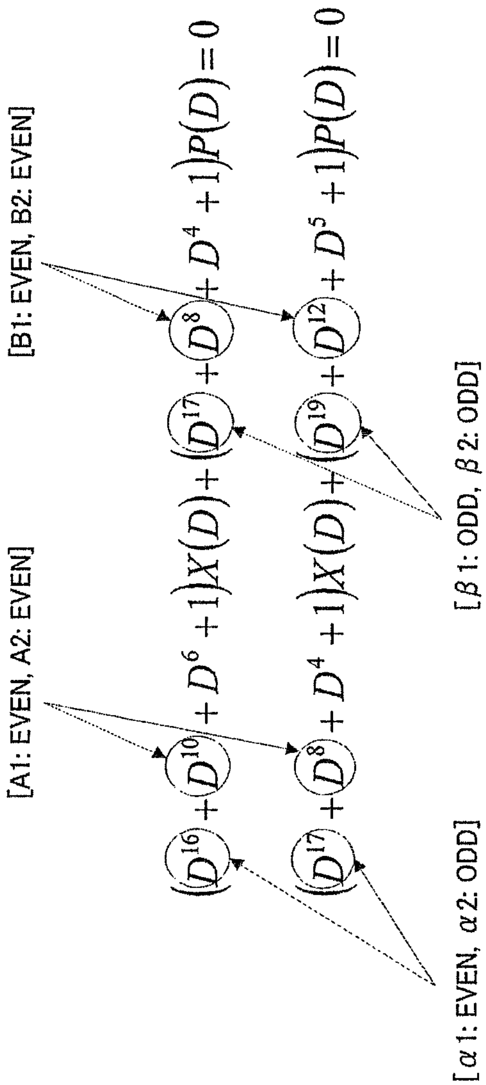
FIG. 50 shows the relationship between the maximum orders and second orders of two polynomials.

FIG. 50 shows the relationship between maximum orders α1, α2, β1, β2 and second orders A1, A2, B1, B2 of two polynomials.

As shown in FIG. 50, maximum orders α1 and α2 of information bits of the two polynomials are an even/odd pair. Below, these are represented as [α1: even, α2: odd]. Also, second orders A1 and A2 of information bits, maximum orders β1 and β2 of parity bits, and second orders B1 and B2 of parity bits comprise even/even or odd/odd pairs. Below, these are represented as [A1: even, A2: even], [β1: odd, β2: odd], and [B1: even, B2: even].

Figure 51:
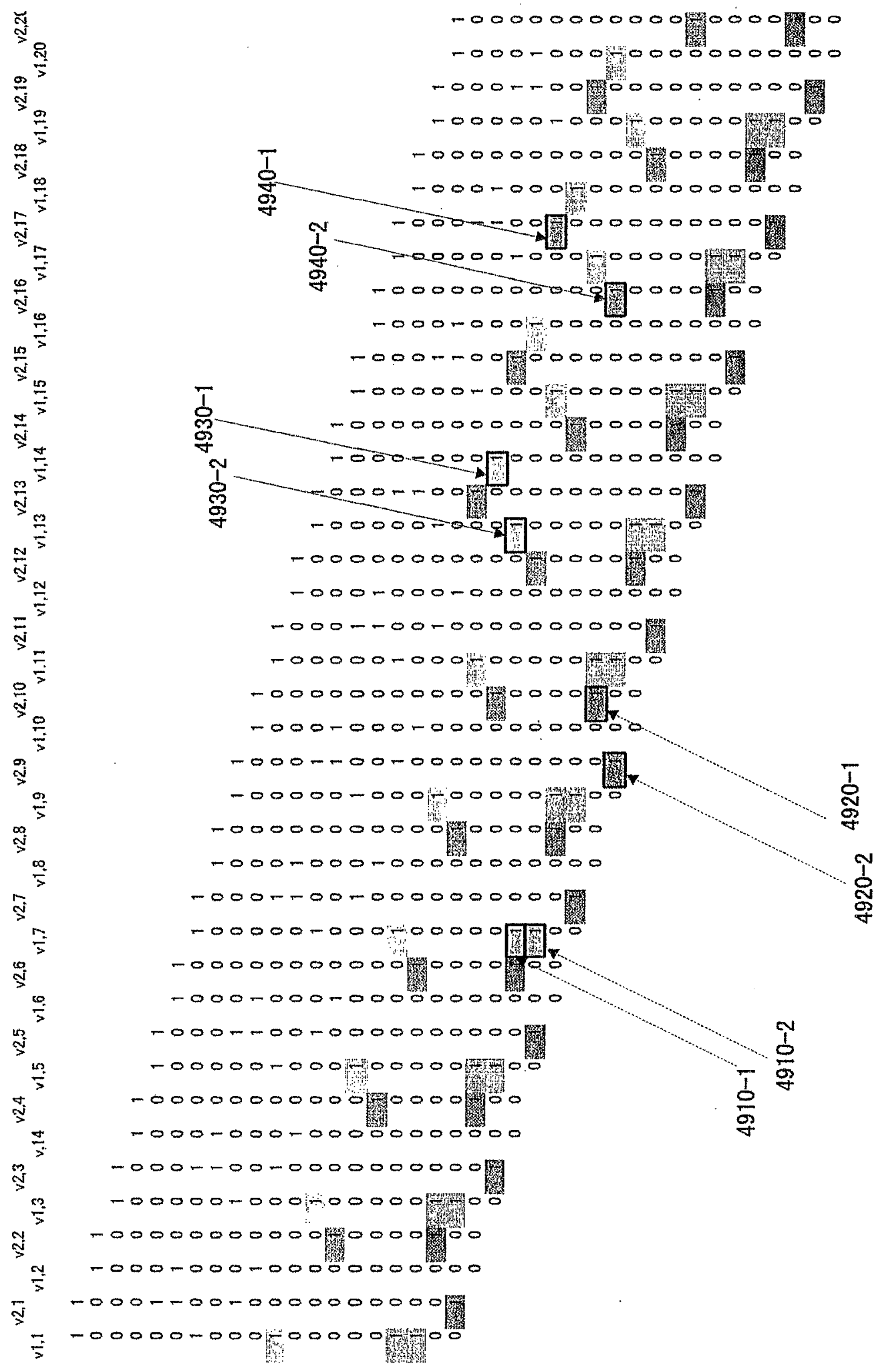
FIG. 51 is a drawing for explaining the relationship between the maximum orders and second orders of two polynomials.

The relationships of these will be described using the parity check matrix in FIG. 51. FIG. 51 shows a parity check matrix of a time varying period of 2 configured using polynomials (139) and (140). In FIG. 51, positions 4910-1 and 4910-2 indicate positions of bits corresponding to maximum orders α1 and α2 of information bits of the two polynomials; positions 4920-1 and 4920-2 indicate positions of bits corresponding to maximum orders β1 and β2 of parity bits of the two polynomials; positions 4930-1 and 4930-2 indicate positions of bits corresponding to second orders A1 and A2 of information bits of the two polynomials; and positions 4940-1 and 4940-2 indicate positions of bits corresponding to second orders B1 and B2 of parity bits of the two polynomials. In FIG. 51, elements in shaded parts are all 1.

As can be seen from positions 4910-1 and 4910-2 in FIG. 51, when certain orders of the two polynomials are an even/odd pair (for example, [α1: even, α2: odd]), those orders appear in the same column of the parity check matrix. Also, as can be seen from positions 4920-1 and 4920-2, 4930-1 and 4930-2, and 4940-1 and 4940-2 in FIG. 51, when certain orders of the two polynomials are an even/even pair (for example, [A1: even, A2: even], [β1: odd, β2: odd], [B1: even, B2: even]), those orders appear in different columns of the parity check matrix.

When maximum orders α1 and α2 of information bits are an even/odd pair ([α1: even, α2: odd]) as in the case of polynomials (139) and (140), bits corresponding to the maximum orders appear in the same column. For instance, in the example shown in FIG. 51, bits corresponding to maximum orders α1 and α2 of information bits are represented in information bit $v_{1,1}$, $v_{1,3}$, $v_{1,5}$, $V_{1,6}$, . . . columns. Consequently, when these bits are punctured, bits corresponding to the maximum orders of the two polynomials are also punctured, and the polynomial constraint length is shortened, resulting in a decrease in error correction capability.

A method of preventing such a decrease in error correction capability due to all bits corresponding to the maximum orders of the two polynomials being punctured is to use an LDPC-CC having polynomials such that the maximum orders of the two polynomials are both even or are both odd. That is to say, provision is made for use of polynomials such that maximum orders α1 and α2 of information bits are either [α1: even, α2: even] or [α1: odd, α2: odd], and maximum orders β1 and β2 of parity bits are either [β1: even, β2: even] or [β1: odd, β2: odd].

In other words, a characteristic of this embodiment is the use of an LDPC-CC having polynomials that satisfy Equation 141-1 for maximum orders α1 and α2 of information bits while also satisfying Equation 141-2 for maximum orders β1 and β2 of parity bits.

$$\alpha1\%2=\alpha2\%2 \quad \text{(Equation 140-1)}$$

$$\beta1\%2=\beta2\%2 \quad \text{(Equation 140-2)}$$

However, if maximum orders α1 and α2 of information bits have the same value, or if maximum orders β1 and β2 of parity bits have the same value, bits corresponding to the maximum orders are punctured whatever kind of pattern is used. Therefore, it is necessary for these maximum orders to have different values and to form an even pair or an odd pair.

That is to say, [α1: even, α2: even, α1≠α2] or [α1: odd, α2: odd, α1≠α2] is used for maximum orders α1 and α2 of information bits, and similarly, [β1: even, β2: even, β1≠β2] or [β1: odd, β2: odd, β1≠β2] is used for maximum orders β1 and β2 of parity bits.

Equations 141-1 and 141-2 show maximum order conditions for an LDPC-CC for which time varying period T=2, that is, an LDPC-CC comprising two kinds of polynomial, but the time varying period is not limited to 2, and time varying period T may also be 3 or above. If time varying period T is 3 or above, an LDPC-CC should be used that has polynomials that satisfy Equation 142-1 for maximum orders α1, α2, . . . , αt, . . . , αT of information bits, while also satisfying Equation 142-2 for maximum orders β1, β2, . . . , βt, . . . , βT of parity bits.

$$\alpha1\%T=\alpha2\%T=\ldots=\alpha t\%T=\ldots=\alpha T\%T(\alpha1\neq\alpha2\neq\ldots\neq\alpha t\neq\ldots\neq\alpha T) \quad \text{(Equation 142-1)}$$

$$\beta1\%T=\beta2\%T=\ldots=\beta t\%T=\ldots=\beta T\%T(\beta1\neq\beta2\neq\ldots\neq\beta t\neq\ldots\neq\beta T) \quad \text{(Equation 142-2)}$$

Next, to return to a case in which the time varying period is 2, a case will be described in which maximum orders [α1, α2] and [β1, β2] of two polynomials satisfy one or both of Equations 141-1 and 141-2.

Below, a case will be described as example in which Equation 141-1 is not satisfied and only Equation 141-2 is satisfied, using polynomials (139) and (140). In this case, bits corresponding to information bit related maximum orders α1 and α2 of the two polynomials appear in the same column, as indicated at positions 4910-1 and 4910-2 in FIG. 51. Consequently, depending on the puncturing pattern, there is a possibility of bits corresponding to maximum orders α1 and α2 of the two polynomials being punctured, the range in which belief is propagated being reduced, and error correction capability decreasing.

When bits corresponding to maximum orders α1 and α2 are punctured, the range in which belief is propagated depends on second orders A1 and A2. Thus, it is necessary to ensure that bits corresponding to second orders A1 and A2 are not punctured. That is to say, in this embodiment an LDPC-CC is used that has polynomials such that, when maximum orders α1 and α2 of information bits are an evenodd combination ([α1: even, α2: odd] or [α1: odd, α2: even]), second orders A1 and A2 of information bits are an eveneven pair [A 1: even, A2: even, A1≠A2] or an oddodd pair [A1: odd, A2: odd, A1≠A2].

Similarly, an LDPC-CC is used that has polynomials such that, when maximum orders β1 and β2 of parity bits are an evenodd combination ([β1: even, β2: odd] or [β1: odd, β2: even]), second orders B1 and B2 of parity bits are an eveneven pair [B1: even, B2: even, B1≠B2] or an oddodd pair [B1: odd, B2: odd, B1≠B2].

For example, LDPC-CC encoding section 4710 can provide an LDPC-CC whose error correction capability is high even when puncturing is applied by performing LDPC-CC encoding using the polynomials shown in Equation 143 and Equation 144.

$$(D^{529}+D^{468}+D^{239}+D^{229}+1)X(D)+$$

$$(D^{529}+D^{482}+D^{62}+D^{48}+1)P(D)=0 \quad \text{(Equation 143)}$$

$$D^{516}+D^{384}+D^{182}+D^{167}+1)X(D)+$$

$$(D^{555}+D^{539}+D^{523}+D^{9}+1)P(D)=0 \quad \text{(Equation 144)}$$

With Equation 143 and Equation 144, maximum orders α1 and α2 of information bits are even and odd, while second orders A1 and A2 of information bits are both even. As a result, maximum orders α1 and α2 of information bits of the two polynomials appear in the same column, but second orders A1 and A2 of information bits do not appear in the same column, and therefore belief propagation can be secured within a range dependent on second orders A1 and A2 of information bits. By this means, a decrease in error correction capability can be avoided.

With Equation 143 and Equation 144, maximum orders β1 and β2 of parity bits are both odd, and therefore belief propagation can be secured within a range dependent on maximum orders β1 and β2 of parity bits.

With Equation 68 and Equation 69 described in Embodiment 7, maximum orders α1 and α2 of information bits are an eveneven combination, and α1 and α2 are different ([α1: even, α2: even, α1≠α2]), and therefore bits corresponding to maximum orders α1 and α2 of information bits do not appear in the same column due to puncturing.

Also, with Equation 68 and Equation 69, maximum orders β1 and β2 of parity bits are an evenodd combination [β1: even, β2: odd] and second orders B1 and B2 of parity bits are an oddodd pair [B1: odd, B2: odd, B1≠B2], and therefore maximum orders β1 and β2 of parity bits of the two polynomials appear in the same column but second orders B1 and B2 of parity bits do not appear in the same column, so that belief propagation can be secured within a range dependent on second orders B1 and B2 of parity bits.

By this means, an LDPC-CC of a time varying period of 2 defined by Equation 68 and Equation 69 can avoid a decrease in error correction capability even when puncturing is applied.

Below, an LDPC-CC of a time varying period of 2 is considered that uses Equation 145 and Equation 146 instead of Equation 68 and Equation 69.

$$(D^{a1}+\ldots+D^{ar})X(D)+(D^{e1}+\ldots+D^{ew})P(D)=0 \quad \text{(Equation 145)}$$

$$(D^{A1}+\ldots+D^{AR})X(D)+(D^{E1}+\ldots+D^{EW})P(D)=0 \quad \text{(Equation 146)}$$

In Equation 145, it is assumed that a1, a2, . . . , ar are integers (where a1≠a2≠ . . . ≠ar). Also, it is assumed that e1, e2, . . . , ew are integers (where e1≠e2≠ . . . ≠ew).

In Equation 146, it is assumed that A1, A2, . . . , AR are integers (where A1≠A2≠ . . . ≠AR). Also, it is assumed that E1, E2, . . . , EW are integers (where E1≠E2≠ . . . ≠EW).

In this case, if there are three or more even numbers among orders a1, a2, . . . , ar of information bits of Equation 145, orders appear in the same column in the parity check matrix, and a loop 6 occurs. If there is a short loop such as a loop 6 (a loop with a length of 6, also called "Girth 6"), received quality degrades. Therefore, it is desirable for three or more even numbers not to be included in a1, a2, . . . , ar.

Similarly, if there are three or more odd numbers among orders a1, a2, . . . , ar of information bits of Equation 145, orders appear in the same column in the parity check matrix, and a loop 6 occurs. Therefore, it is desirable for three or more odd numbers not to be included in a1, a2, . . . , ar.

Furthermore, considering the row weights also described in Embodiment 7 above, it is desirable for the condition r≤4 to be satisfied.

It is similarly desirable for three or more even numbers or three or more odd numbers not to be included in orders e1 and e2, . . . , ew of parity bits of Equation 145, and for the condition w≤4 to be satisfied.

It is similarly desirable for three or more even numbers or three or more odd numbers not to be included in orders A1, A2, . . . , AR of information bits of Equation 146, and for the condition R≤4 to be satisfied.

It is similarly desirable for three or more even numbers or three or more odd numbers not to be included in orders E1 and E2, . . . , EW of information bits of Equation 146, and for the condition W≤4 to be satisfied.

A still better LDPC-CC of a time varying period of 2 can be designed if settings are made as described below.

That is to say, "Provision is made for three or more even numbers or three or more odd numbers not to be included in orders a1, a2, . . . , ar of information bits of Equation 145, and for the condition r≤4 to be satisfied;

and provision is made for three or more even numbers or three or more odd numbers not to be included in orders e1 and e2, . . . , ew of parity bits of Equation 145, and for the condition w≤4 to be satisfied;

and provision is made for three or more even numbers or three or more odd numbers not to be included in orders A1, A2, . . . , AR of information bits of Equation 146, and for the condition R≤4 to be satisfied;

and provision is made for three or more even numbers or three or more odd numbers not to be included in orders E1 and E2, . . . , EW of parity bits of Equation 146, and for the condition W≤4 to be satisfied."

An LDPC-CC of a time varying period of 2 and a coding rate of ½ using Equation 145 and Equation 146 has been described above. Below, an LDPC-CC of a time varying period of 2 and a coding rate of ⅓ using Equations 147-1 through 147-4 is considered.

$$(D^{a1}+\ldots+D^{am})X(D)+(D^{b1}+\ldots+D^{bm})P(D)+(D^{c1}+\ldots+D^{cq})P_n(D)=0 \quad \text{(Equation 147-1)}$$

$$(D^{A1}+\ldots+D^{AN})X(D)+(D^{B1}+\ldots+D^{BM})P(D)+(D^{C1}+\ldots+D^{CQ})P_n(D)=0 \quad \text{(Equation 147-2)}$$

$$(D^{\alpha 1}+\ldots+D^{\alpha\omega})X(D)+(D^{\beta 1}+\ldots+D^{\beta\xi})P(D)+(D^{\gamma 1}+\ldots+D^{\gamma\lambda})P_n(D)=0 \quad \text{(Equation 147-3)}$$

$$(D^{E1}+\ldots+D^{E\Omega})X(D)+(D^{F1}+\ldots+D^{FL})P(D)+(D^{G1}+\ldots+D^{GA})P_n(D)=0 \quad \text{(Equation 147-4)}$$

in Equation 147-1, it is assumed that a1, a2, . . . , an are integers (where a1≠a2≠ . . . ≠an). Also, it is assumed that b1, b2, . . . , bm are integers (where b1≠b2≠ . . . ≠bm). Furthermore, it is assumed that c1, c2, . . . , eq are integers (where c1≠c2≠ . . . ≠cq).

In Equation 147-2, it is assumed that A1, A2, . . . , AN are integers (where A1≠A2≠ . . . ≠AN). Also, it is assumed that B1, B2, . . . , BM are integers (where B1≠B2≠ . . . ≠BM). Furthermore, it is assumed that C1, C2, . . . , CQ are integers (where C1≠C2≠ . . . ≠CQ). Then P(D) and Pn(D) of point in time 2i are found using the relational equations of Equation 147-1 and Equation 147-2.

In Equation 147-3, it is assumed that α1, α2, . . . , αω are integers (where α1≠α2≠ . . . ≠αω). Also, it is assumed that β1, β2, . . . , βξ are integers (where β1≠β2≠ . . . ≠βξ). Furthermore, it is assumed that γ1, γ2, . . . , γλ) are integers (where γ1≠γ2≠ . . . ≠γλ).

In Equation 147-4, it is assumed that E1, E2, . . . , EΩ are integers (where E1≠E2≠ . . . ≠EΩ). Also, it is assumed that F1, F2, . . . , FZ are integers (where F1≠F2≠ . . . ≠FZ). Furthermore, it is assumed that G1, G2, . . . , GA are integers (where G1≠G2≠ . . . ≠GA). Then P(D) and Pn(D) of point in time 2i+1 are found using the relational equations of Equation 147-3 and Equation 147-4.

In the case of a coding rate of ⅓, also, as in the case of a coding rate of ½, for orders a1, a2, . . . , an of Equation 147-1, also, it is desirable for three or more even numbers or three or more odd numbers not to be included and for the condition n≤4 to be satisfied; for b1, b2, . . . , bm, also, it is desirable for three or more even numbers or three or more odd numbers not to be included and for the condition m≤4 to be satisfied; and for c1, c2, . . . , cq, also, it is desirable for three or more even numbers or three or more odd numbers not to be included and for the condition q≤4 to be satisfied.

Similarly, for orders A1, A2, . . . , AN of Equation 147-2, also, it is desirable for three or more even numbers or three or more odd numbers not to be included and for the condition N<4 to be satisfied; for B1, B2, . . . , BM, also, it is desirable for three or more even numbers or three or more odd numbers not to be included and for the condition M≤4 to be satisfied; and for C1, C2, . . . , CQ, also, it is desirable for three or more even numbers or three or more odd numbers not to be included and for the condition Q≤4 to be satisfied.

Similarly, for orders α1, α2, . . . , αω of Equation 147-3, also, it is desirable for three or more even numbers or three or more odd numbers not to be included and for the condition ω≤4 to be satisfied; for β1, β2, . . . , βξ, also, it is desirable for three or more even numbers or three or more odd numbers not to be included and for the condition ξ≤4 to be satisfied; and for γ1, γ2, . . . , γλ, also, it is desirable for three or more even numbers or three or more odd numbers not to be included and for the condition λ≤4 to be satisfied.

Similarly, for orders E1, E2, . . . , EΩ of Equation 147-4, also, it is desirable for three or more even numbers or three or more odd numbers not to be included and for the condition Ω≤4 to be satisfied; for F1, F2, . . . , FZ, also, it is desirable for three or more even numbers or three or more odd numbers not to be included and for the condition Z≤4 to be satisfied; and for G1, G2, . . . , GA, also, it is desirable for three or more even numbers or three or more odd numbers not to be included and for the condition Λ≤4 to be satisfied.

A still better LDPC-CC of a time varying period of 2 and a coding rate of ⅓ can be designed if settings are made as described below.

That is to say, "For orders a1, a2, . . . , an of Equation 147-1, also, provision is made for three or more even numbers or three or more odd numbers not to be included and for the condition n≤4 to be satisfied; and for b1, b2, . . . , bm, also, provision is made for three or more even numbers or three or more odd numbers not to be included and for the condition m≤4 to be satisfied; and for c1, c2, . . . , cq, also, provision is made for three or more even numbers or three or more odd numbers not to be included and for the condition q≤4 to be satisfied; and similarly, for orders A1, A2, . . . , AN of Equation 147-2, also, provision is made for three or more even numbers or three or more odd numbers not to be included and for the condition N≤4 to be satisfied; and for B1, B2, . . . , BM, also, provision is made for three or more even numbers or three or more odd numbers not to be included and for the condition M≤4 to be satisfied; and for C1, C2, . . . , CQ, also, provision is made for three or more even numbers or three or more odd numbers not to be included and for the condition Q≤4 to be satisfied; and similarly, for orders α1, α2, . . . , αω of Equation 147-3, also, provision is made for three or more even numbers or three or more odd numbers not to be included and for the condition ω≤4 to be satisfied; and for β1, β2, . . . , βξ, also, provision is made for three or more even numbers or three or more odd numbers not to be included and for the condition ξ≤4 to be satisfied; and for γ1, γ2, . . . , γλ, also, provision is made for three or more even numbers or three or more odd numbers not to be included and for the condition λ≤4 to be satisfied; and similarly, for orders E1, E2, . . . , EΩ of Equation 147-4, also, provision is made for three or more even numbers or three or more odd numbers not to be included and for the condition Ω≤4 to be satisfied; and for F1, F2, . . . , FZ, also, provision is made for three or more even numbers or three or more odd numbers not to be included and for the condition Z≤4 to be satisfied; and for G1, G2, . . . , GA, also, provision is made for three or more even numbers or three or more odd numbers not to be included and for the condition Λ≤4 to be satisfied.

Furthermore, an LDPC-CC of a time varying period of 2 and a coding rate of n/n+1 using Equation 148-1 and Equation 148-2 will be considered.

$$(D^{a1,1}+\ldots+D^{a1,r1})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 148-1)}$$

$$(D^{A1,1}+\ldots+D^{A1,R1})X1(D)+(D^{A2,1}+\ldots+D^{A2,R2})X2(D)+\ldots+(D^{An,1}+\ldots+D^{An,Rn})Xn(D)+(D^{E1}+\ldots+D^{EW})P(D)=0 \quad \text{(Equation 148-2)}$$

In Equation 148-1, it is assumed that $a_{1,1}, a_{1,2}, \ldots, a_{1,r1}$ are integers (where $a_{1,1}\neq a_{1,2}\neq \ldots \neq a_{1,r1}$). Also, it is assumed that $a_{2,1}, a_{2,2}, \ldots, a_{2,r2}$ are integers (where $a_{2,1}\neq a_{2,2}\neq \ldots \neq a_{2,r2}$). Furthermore, it is assumed that $a_{i,1}, a_{i,2}, \ldots, a_{i,ri}$ (where i=3, . . . , n−1) are integers (where $a_{i,1}\neq a_{i,2}\neq \ldots \neq a_{i,ri}$). Moreover, it is assumed that $a_{n,1}, a_{n,2}, \ldots, a_{n,rn}$ are integers (where $a_{n,1}\neq a_{n,2}\neq \ldots \neq a_{n,rn}$). Also, it is assumed that e1, e2, . . . , ew are integers (where e1≠e2≠ . . . ≠ew). Then it is assumed that P(D) of point in time 2i is found using the relational equation in Equation 148-1 for example.

In Equation 148-2, it is assumed that $A_{1,1}, A_{1,2}, \ldots, A_{1,R1}$ are integers (where $A_{1,1}\neq A_{1,2}\neq \ldots, \neq A_{1,R1}$). Also, it is assumed that $A_{2,1}, A_{2,2}, \ldots, A_{2,R2}$ are integers (where $A_{2,1} \neq A_{2,2} \neq \ldots \neq A_{2,R2}$). Furthermore, it is assumed that $A_{i,1}$, $A_{i,2}$, . . . , $A_{i,Ri}$ (where i=3, n−1) are integers (where $A_{i,1} \neq A_{i,2} \neq \ldots \neq A_{i,Ri}$). Moreover, it is assumed that $A_{n,1}$, $A_{n,2}$, . . . , $A_{n,Rn}$ are integers (where $A_{n,1} \neq A_{n,2} \neq \ldots \neq A_{n,Rn}$). Also, it is assumed that E1, E2, . . . , EW are integers (where E1≠E2≠ . . . ≠EW). Then it is assumed that P(D) of point in time 2i+1 is found using the relational equation in Equation 148-2 for example.

In the case of a coding rate of n/n+1, also, as in the case of coding rates of ½ and ⅓, a parity check matrix should be used that is defined based on first parity check polynomial (148-1) whereby, in an LDPC-CC parity check polynomial of a time varying period of 2 represented by Equation 148-1, three or more even numbers or odd numbers are not included in [$a_{1,1}$, $a_{1,2}$, . . . , $a_{1,r1}$] and the condition r1≤4 is satisfied, or three or more even numbers or odd numbers are not included in [$a_{i,1}$, $a_{i,2}$, . . . , $a_{i,ri}$] (where i=2, 3, . . . , n−1) and the condition ri≤4 is satisfied, or three or more even numbers or odd numbers are not included in [$a_{n,1}$, $a_{n,2}$, . . . , $a_{n,rn}$] and the condition rn≤4 is satisfied, or three or more even numbers or odd numbers are not included in [e1, e2, . . . , ew] and the condition w≤4 is satisfied; and second parity check polynomial (148-2) whereby, in a convolutional code parity check polynomial represented by Equation 148-2, three or more even numbers or odd numbers are not included in [$A_{1,1}$, $A_{1,2}$, . . . , $A_{1,R1}$] and the condition R1≤4 is satisfied, or three or more even numbers or odd numbers are not included in [$A_{i,1}$, $A_{i,2}$, . . . , $A_{i,Ri}$] (where i=2, 3, . . . , n−1) and the condition Ri≤4 is satisfied, or three or more even numbers or odd numbers are not included in [$A_{n,1}$, $A_{n,2}$, . . . , $A_{n,Rn}$] and the condition Rn≤4 is satisfied, or three or more even numbers or odd numbers are not included in [E1, E2, . . . , EW] and the condition W≤4 is satisfied.

An LDPC-CC of a time varying period of 2 and a coding rate of n/n+1 with still better characteristics can be obtained by complying with the following condition: "An LDPC-CC of a time varying period of 2 is designed using a parity check matrix based on first parity check polynomial (148-1) satisfying [Condition #1] below and second parity check polynomial (148-2) satisfying [Condition #2] below in LDPC-CC parity check polynomials of a time varying period of 2 appearing in the form of Equation 148-1 and Equation 148-2."

[Condition #1]

In Equation 148-1, three or more even numbers or odd numbers are not included in [$a_{1,1}$, $a_{1,2}$, . . . , $a_{1,r1}$] and the condition r1≤4 is satisfied;

and three or more even numbers or odd numbers are not included in [$a_{i,1}$, $a_{i,2}$, . . . , $a_{i,ri}$] (where i=2, 3, . . . , n−1) and the condition ri≤4 is satisfied;

and three or more even numbers or odd numbers are not included in [$a_{n,1}$, $a_{n,2}$, . . . , $a_{n,rn}$] and the condition rn≤4 is satisfied;

and three or more even numbers or odd numbers are not included in [e1, e2, . . . , ew] and the condition w≤4 is satisfied.

[Condition #2]

Three or more even numbers or odd numbers are not included in [$A_{1,1}$, $A_{1,2}$, . . . , $A_{1,R1}$] and the condition R1≤4 is satisfied;

and three or more even numbers or odd numbers are not included in [$A_{i,1}$, $A_{i,2}$, . . . , $A_{i,Ri}$] (where i=2, 3, . . . , n−1) and the condition Ri≤4 is satisfied;

and three or more even numbers or odd numbers are not included in [$A_{1,1}$, $A_{n,2}$, . . . , $A_{n,Rn}$] and the condition Rn≤4 is satisfied;

and three or more even numbers or odd numbers are not included in [E1, E2, . . . , EW] and the condition W≤4 is satisfied.

In the discussion of a loop 6 above, a condition has been that the number of each term is 4 or below. This is because if the number were 5 or above, three or more even numbers or three or more odd numbers would necessarily be present. An important theorem regarding a loop 6 will be described in detail in another Embodiment 14.

Table 4 shows a list of Ak and Bk codes in a parity check polynomial of a time varying period of 2 and a coding rate of ½ based on Equation 122.

Table 4 shows an example of an LDPC-CC of a time varying period of 2 and a coding rate of ½ that provides good reception performance in case where the maximum constraint length is 600 or below.

TABLE 4

| Code | Coefficients in Equation 122 |
|---|---|
| LDPC-CC of time varying period of 2, and codin rate of ½ | $(A_0(D), B_0(D), A_1(D), B_1(D))$ =<br>$(D^{43}+D^{16}+D^{11}+D^{8}+1, D^{535}+D^{517}+D^{492}+D^{374}+1, D^{37}+D^{31}+D^{25}+D^{9}+1, D^{577}+D^{505}+D^{475}+D^{173}+1)$,<br>$(D^{30}+D^{21}+D^{16}+D^{14}+1, D^{581}+D^{410}+D^{340}+D^{166}+1, D^{49}+D^{33}+D^{29}+D^{9}+1, D^{563}+D^{518}+D^{410}+D^{56}+1)$,<br>$(D^{37}+D^{33}+D^{27}+D^{13}+1, D^{548}+D^{361}+D^{276}+D^{38}+1, D^{40}+D^{32}+D^{8}+D^{4}+1, D^{559}+D^{544}+D^{393}+D^{100}+1)$,<br>$(D^{46}+D^{41}+D^{30}+D^{18}+1, D^{528}+D^{417}+D^{373}+D^{204}+1, D^{37}+D^{31}+D^{29}+D^{13}+1, D^{567}+D^{498}+D^{487}+D^{5}+1)$,<br>$(D^{47}+D^{29}+D^{19}+D^{14}+1, D^{563}+D^{539}+D^{535}+D^{161}+1, D^{37}+D^{35}+D^{32}+D^{28}+1, D^{547}+D^{496}+D^{442}+D^{106}+1)$,<br>$(D^{33}+D^{26}+D^{23}+D^{17}+1, D^{553}+D^{475}+D^{473}+D^{231}+1, D^{46}+D^{40}+D^{25}+D^{8}+1, D^{595}+D^{551}+D^{534}+D^{306}+1)$,<br>$(D^{47}+D^{37}+D^{33}+D^{14}+1, D^{517}+D^{361}+D^{345}+D^{243}+1, D^{37}+D^{31}+D^{22}+D^{10}+1, D^{541}+D^{520}+D^{459}+D^{190}+1)$,<br>$(D^{38}+D^{25}+D^{7}+D^{5}+1, D^{565}+D^{549}+D^{353}+D^{113}+1, D^{39}+D^{36}+D^{25}+D^{20}+1, D^{542}+D^{500}+D^{441}+D^{330}+1)$,<br>$(D^{48}+D^{33}+D^{23}+D^{11}+1, D^{509}+D^{416}+D^{400}+D^{102}+1, D^{49}+D^{46}+D^{26}+D^{20}+1, D^{501}+D^{447}+D^{381}+D^{371}+1)$,<br>$(D^{41}+D^{38}+D^{37}+D^{26}+1, D^{574}+D^{447}+D^{332}+D^{312}+1, D^{39}+D^{33}+D^{16}+D^{3}+1, D^{588}+D^{542}+D^{247}+D^{149}+1)$,<br>$(D^{516}+D^{384}+D^{182}+D^{167}+1, D^{555}+D^{539}+D^{523}+D^{9}+1, D^{529}+D^{468}+D^{239}+D^{229}+1, D^{529}+D^{482}+D^{62}+D^{48}+1)$,<br>$(D^{591}+D^{504}+D^{363}+D^{336}+1, D^{315}+D^{281}+D^{209}+D^{101}+1, D^{520}+D^{511}+D^{372}+D^{213}+1, D^{599}+D^{393}+D^{87}+D^{58}+1)$,<br>$(D^{562}+D^{540}+D^{529}+D^{157}+1, D^{548}+D^{496}+D^{483}+D^{318}+1, D^{526}+D^{400}+D^{349}+D^{83}+1, D^{571}+D^{361}+D^{284}+D^{148}+1)$,<br>$(D^{519}+D^{481}+D^{313}+D^{227}+1, D^{562}+D^{392}+D^{464}+D^{287}+1, D^{579}+D^{389}+D^{214}+D^{195}+1, D^{416}+D^{281}+D^{278}+D^{153}+1)$,<br>$(D^{592}+D^{468}+D^{357}+D^{181}+1, D^{574}+D^{441}+D^{418}+D^{27}+1, D^{591}+D^{583}+D^{497}+D^{115}+1, D^{563}+D^{163}+D^{120}+D^{16}+1)$,<br>$(D^{537}+D^{465}+D^{293}+D^{270}+1, D^{585}+D^{511}+D^{507}+D^{101}+1, D^{525}+D^{345}+D^{97}+D^{56}+1, D^{593}+D^{509}+D^{472}+D^{217}+1)$,<br>$(D^{523}+D^{441}+D^{427}+D^{64}+1, D^{566}+D^{510}+D^{254}+D^{133}+1, D^{585}+D^{548}+D^{450}+D^{439}+1, D^{428}+D^{366}+D^{273}+D^{259}+1)$,<br>$(D^{563}+D^{511}+D^{414}+D^{26}+1, D^{578}+D^{428}+D^{311}+D^{127}+1, D^{522}+D^{509}+D^{457}+D^{437}+1, D^{580}+D^{407}+D^{390}+D^{321}+1)$,<br>$(D^{595}+D^{137}+D^{65}+D^{1}+1, D^{530}+D^{402}+D^{287}+D^{178}+1, D^{591}+D^{431}+D^{407}+D^{318}+1, D^{559}+D^{519}+D^{421}+D^{59}+1)$,<br>$(D^{589}+D^{432}+D^{274}+D^{50}+1, D^{577}+D^{533}+D^{353}+D^{145}+1, D^{468}+D^{291}+D^{128}+D^{79}+1, D^{582}+D^{460}+D^{423}+D^{350}+1)$,<br>$(D^{24}+D^{13}+D^{11}+1, D^{559}+D^{299}+D^{51}+1, D^{38}+D^{33}+D^{15}+1, D^{461}+D^{326}+D^{69}+1)$,<br>$(D^{43}+D^{19}+D^{12}+1, D^{537}+D^{293}+D^{155}+1, D^{48}+D^{7}+D^{1}+1, D^{377}+D^{283}+D^{8}+1)$, |

TABLE 4-continued

| Code | Coefficients in Equation 122 |
|---|---|
| | $(D^{30}+D^{23}+D^{6}+1, D^{390}+D^{127}+D^{59}+1, D^{39}+D^{36}+D^{23}+1, D^{357}+D^{331}+D^{38}+1)$, |
| | $(D^{20}+D^{6}+D^{1}+1, D^{409}+D^{374}+D^{180}+1, D^{45}+D^{11}+D^{10}+1, D^{365}+D^{357}+D^{114}+1)$, |
| | $(D^{43}+D^{14}+D^{13}+1, D^{334}+D^{304}+D^{146}+1, D^{49}+D^{13}+D^{4}+1, D^{598}+D^{489}+D^{432}+1)$, |
| | $(D^{48}+D^{47}+D^{33}+1, D^{334}+D^{330}+D^{151}+1, D^{35}+D^{16}+D^{15}+1, D^{586}+D^{372}+D^{93}+1)$, |
| | $(D^{38}+D^{34}+D^{31}+1, D^{332}+D^{277}+D^{186}+1, D^{45}+D^{40}+D^{18}+1, D^{594}+D^{132}+D^{123}+1)$, |
| | $(D^{47}+D^{21}+D^{16}+1, D^{221}+D^{96}+D^{67}+1, D^{43}+D^{14}+D^{1}+1, D^{557}+D^{406}+D^{79}+1)$, |
| | $(D^{43}+D^{42}+D^{34}+1, D^{354}+D^{333}+D^{236}+1, D^{46}+D^{13}+D^{5}+1, D^{286}+D^{35}+D^{29}+1)$, |
| | $(D^{47}+D^{36}+D^{34}+1, D^{566}+D^{421}+D^{254}+1, D^{30}+D^{17}+D^{9}+1, D^{477}+D^{104}+D^{69}+1)$, |
| | $(D^{524}+D^{220}+D^{83}+1, D^{439}+D^{346}+D^{228}+1, D^{541}+D^{440}+D^{427}+1, D^{463}+D^{446}+D^{166}+1)$, |
| | $(D^{559}+D^{299}+D^{294}+1, D^{544}+D^{271}+D^{236}+1, D^{536}+D^{417}+D^{354}+1, D^{461}+D^{252}+D^{31}+1)$, |
| | $(D^{496}+D^{416}+D^{145}+1, D^{384}+D^{147}+D^{84}+1, D^{599}+D^{481}+D^{200}+1, D^{461}+D^{209}+D^{153}+1)$, |
| | $(D^{483}+D^{363}+D^{237}+1, D^{566}+D^{539}+D^{501}+1, D^{462}+D^{421}+D^{185}+1, D^{447}+D^{347}+D^{210}+1)$, |
| | $(D^{305}+D^{261}+D^{83}+1, D^{515}+D^{404}+D^{395}+1, D^{477}+D^{179}+D^{22}+1, D^{562}+D^{465}+D^{342}+1)$, |
| | $(D^{485}+D^{434}+D^{350}+1, D^{222}+D^{217}+D^{129}+1, D^{491}+D^{382}+D^{349}+1, D^{331}+D^{89}+D^{26}+1)$, |
| | $(D^{536}+D^{288}+D^{233}+1, D^{466}+D^{425}+D^{149}+1, D^{407}+D^{365}+D^{357}+1, D^{255}+D^{120}+D^{110}+1)$, |
| | $(D^{501}+D^{272}+D^{259}+1, D^{516}+D^{421}+D^{18}+1, D^{566}+D^{351}+D^{246}+1, D^{521}+D^{498}+D^{258}+1)$, |
| | $(D^{586}+D^{326}+D^{127}+1, D^{484}+D^{243}+D^{43}+1, D^{597}+D^{510}+D^{493}+1, D^{574}+D^{445}+D^{181}+1)$, |
| | $(D^{451}+D^{309}+D^{77}+1, D^{519}+D^{492}+D^{132}+1, D^{447}+D^{229}+D^{104}+1, D^{520}+D^{71}+D^{37}+1)$, |

With an LDPC-CC of a time varying period of 2 and a coding rate of ½, one important condition for an LDPC-CC that provides good received quality is that a column weight should be 10 or below in all columns of a parity check matrix.

Another Embodiment 10

In Embodiment 7, Embodiment 8, another Embodiment 5, another Embodiment 6, and another Embodiment 8, cases in which the time varying period of a time varying LDPC-CC is short, for example, between 2 and 10, have been described. Here, an LDPC-CC is described for which the time varying period is lengthened by applying an LDPC-CC of a time varying period of 2. A case in which the coding rate is ½ is described below as an example. Since a case in which the coding rate is ½ has been described in Embodiment 7, the following description is presented as a comparison with Embodiment 7.

In Embodiment 7, LDPC-CCs with a time varying period between 2 and 10 or so were described. When parity check polynomials are generated randomly, although a code with good characteristics can easily be found in the case of an LDPC-CC of a time varying period of 2, it is difficult to find a code with good characteristics in the case of an LDPC-CC with a long time varying period. This is because, when parity check polynomials are generated randomly it is difficult to identify a combination of parity check polynomials capable of providing an LDPC-CC with good characteristics since the necessary number of parity check polynomials increases in proportion to the length of the time varying period.

Thus, a method will be considered whereby an LDPC-CC of a time varying period of 2 is applied and an LDPC-CC with a long time varying period is generated.

As explained in Embodiment 7, when the coding rate is ½, if a polynomial representation of an information sequence (data) is X(D), and a parity sequence polynomial representation is P(D), a parity check polynomial is represented as shown in Equation 64.

In Equation 64, it is assumed that a1, a2, . . . , an are integers other than 0 (where a1≠a2≠ . . . ≠an). Also, it is assumed that b1, b2, . . . , bm are integers of 1 or above (where b1≠b2≠ . . . ≠bm). Here, in order to make it possible to perform encoding easily, it is assumed that terms $D^0X(D)$ and $D^0P(D)$ (where $D^0=1$) are present. Therefore, P(D) is represented as shown in Equation 65.

As can be seen from Equation 65, since $D^0=1$ is present and terms of past parity, that is, b1, b2, . . . , bm, are integers of 1 or above, parity P can be found sequentially.

Next, a parity check polynomial of a coding rate of ½ different from Equation 64 is represented as shown in Equation 66.

In Equation 66, it is assumed that A1, A2, . . . , AN are integers other than 0 (where A1≠A2≠ . . . ≠AN). Also, it is assumed that B1, B2, . . . , BM are integers of 1 or above (where B1≠B2≠ . . . ≠BM). Here, in order to make it possible to perform encoding easily, it is assumed that terms $D^0X(D)$ and $D^0P(D)$ (where $D^0=1$) are present. At this time, P(D) is represented as shown in Equation 67.

Below, data X and parity P of point in time 2i are represented by $X_{2i}$ and $P_{2i}$ respectively, and data X and parity P of point in time 2i+1 are represented by $X_{2i+1}$ and $P_{2i+1}$ respectively (where i is an integer).

In the case of an LDPC-CC of a time varying period of 2, parity P2i of point in time 2i is calculated using Equation 65 and parity P2i+1 of point in time 2i+1 is calculated using Equation 67.

Here, an LDPC-CC of a time varying period of 2Z (where Z is an integer of 2 or above) will be considered. At this time, a parity check polynomial of Equation 65 and Z different parity check polynomials based on Equation 67, that is, (Z+1) different parity check polynomials, are provided. The Z different parity check polynomials based on Equation 67 are designated "check equation #0," "check equation #1," . . . , "check equation #Z−1."

Then parity of point in time j is found according to Case 1) or Case 2) below.

Case 1) When j mod 2 (remainder after dividing j by 2)=0

Parity of point in time j is found using Equation 65.

Case 2) When j mod 2 (remainder after dividing j by 2)=1

If the quotient when j is divided by 2 is designated k, and k=gZ+i (where g is an integer, and i=0, 1, . . . , Z−1), parity of point in time j is found using "check equation #i."

In this way, an LDPC-CC of a time varying period of 2Z can be generated by means of (Z+1) different parity check polynomials. That is to say, a time varying LDPC-CC is formed by (Z+1) different parity check polynomials, a number smaller than a time varying period of 2Z. Although the use of Equation 64 and Equation 65 has been described above, the forms of parity check polynomials are not limited to these.

Also, a case in which the coding rate is ½ has been described as an example, but this is not a limitation, and if the time varying period is other than 2, as described in another Embodiment 5, another Embodiment 6, another Embodiment 8, and so forth, an LDPC-CC of a time varying period of 2 can also be applied and an LDPC-CC of a long time varying period generated in the same way as in the case of a time varying period of 2. That is to say, Z different parity check polynomials "check equation #0," "check equation #1," . . . , "check equation #Z-1," and check polynomial "polynomial #A" different from these "check equation #0," "check equation #1," . . . , "check equation #Z-1," are provided, without limitations on the coding rate.

Then parity of point in time j is found according to Case 1) or Case 2) below.

Case 1) When j mod 2 (remainder after dividing j by 2)=0

Parity of point in time j is found using "polynomial #A."

Case 2) When j mod 2 (remainder after dividing j by 2)=1

If the quotient when j is divided by 2 is designated k, and k=gZ+i (where g is an integer, and i=0, 1, . . . , Z−1), parity of point in time j is found using "check equation #i."

As described above, with a coding rate other than 12, also, a time varying LDPC-CC can be formed by means of fewer than parity check polynomials of a time varying period of 2Z.

A time varying LDPC-CC can also be formed using fewer than parity check polynomials of a time varying period of 2Z by means of a method other than the above. For example, provision may also be made for a different parity check polynomials to be provided, and a time-variant-period-β (where (β>α) LDPC-CC to be formed using a number of parity check polynomials from among the α parity check polynomials a plurality of times. However, when j mod 2=0 as in Case 1), there is a particular advantage of a parity check polynomial with good characteristics being easy to find if the same "polynomial #A" is always used to find parity of point in time j.

Another Embodiment 11

Here, a search creation method will be described for an LDPC-CC having confidentiality, applying an LDPC-CC described in another Embodiment 10. A case in which the coding rate is ½ is described below as an example.

For example, a different parity check polynomials based on Equation 64 are provided. Then β (where α≥β) parity check polynomials are extracted from the α parity check polynomials, and a time-variant-period-γ (where γ≥β) LDPC-CC is created.

At this time, parity of point in time j satisfying the condition j mod γ=i is found using the same parity check polynomial. For example, if β polynomials are represented by "polynomial #1," "polynomial #2," . . . "polynomial #β," and "polynomial #k" (where k=1, 2, . . . , β) is used at least once with any of i=0, 1, . . . , γ−1, since γ≥β all β parity check polynomials are used with i=0, 1, . . . , γ−1.

At this time, there are a plurality of methods of selecting β different polynomials and methods of setting time varying period γ. Thus, it is difficult to correct errors unless the method of selecting β different polynomials and method of setting time varying period γ decided on the transmitting side are known on the receiving side.

Thus, confidential communication is proposed below whereby a transmitting apparatus includes a configuration that enables the above-described parity check polynomial selection method and time varying period to be changed, and a receiving apparatus takes the configuration of the encoder of the above transmitting apparatus as an encryption key.

Figure 52:
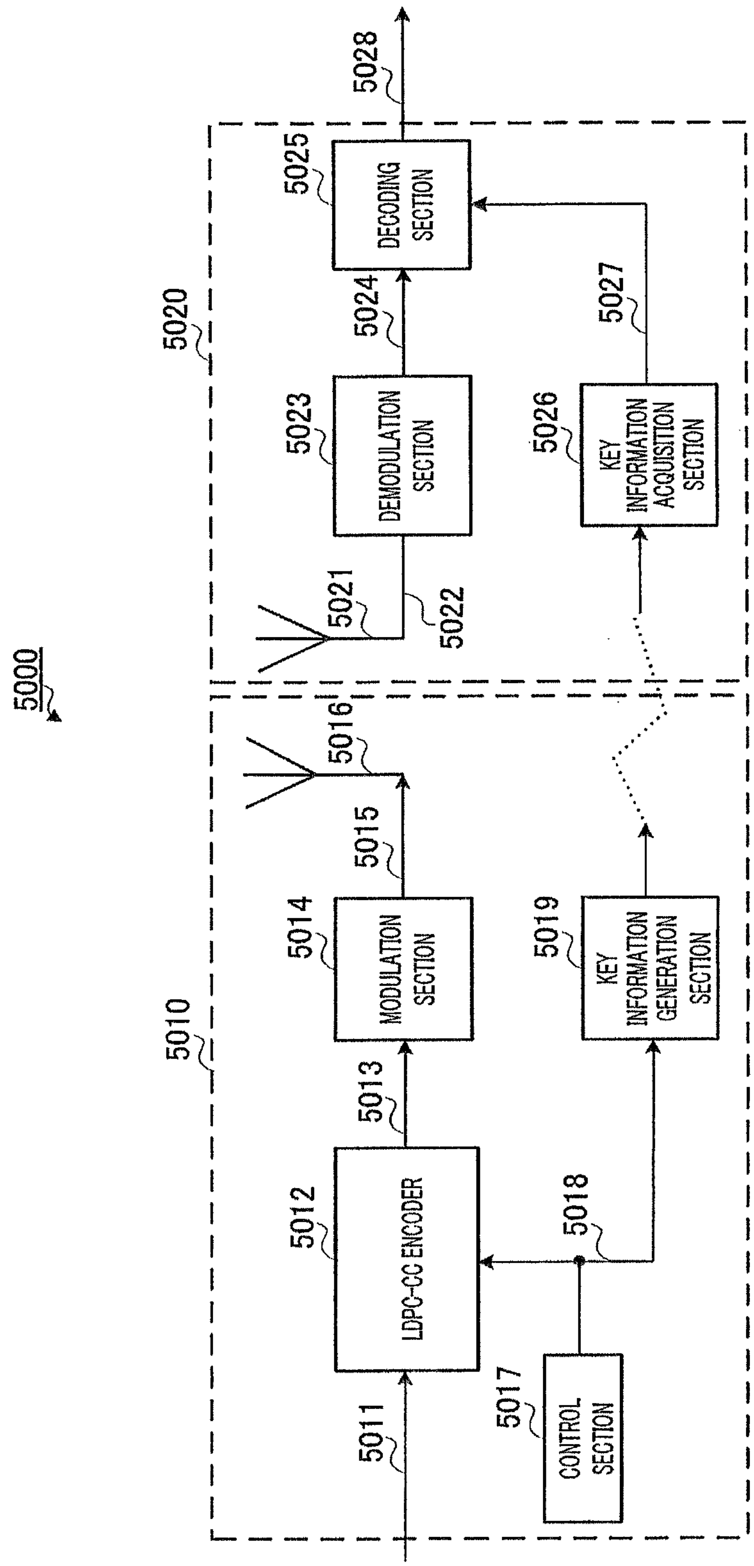
FIG. 52 shows an example of a wireless communication system according to another Embodiment 11.

FIG. 52 shows an example of a confidential communication system using the above-described method. A wireless communication system is described below as an example, but a confidential communication system is not limited to a wireless communication system.

Wireless communication system 5000 in FIG. 52 is equipped with transmitting apparatus 5010 and receiving apparatus 5020.

Transmitting apparatus 5010 is equipped with LDPC-CC encoder 5012, modulation section 5014, antenna 5016, control section 5017, and key information generation section 5019.

Control section 5017 selects p parity check polynomials. Parity check polynomials configure a parity check matrix used by LDPC-CC encoder 5012. Control section 5017 outputs encoding method related information including information on the selected β parity check polynomials to LDPC-CC encoder 5012.

For example, control section 5017 stores α different parity check polynomials based on Equation 64, and extracts (selects) β (where α≥β) parity check polynomials from the α parity check polynomials. Control section 5017 outputs information on the extracted (selected) β parity check polynomials to LDPC-CC encoder 5012 as encoding method related information 5018. Encoding method related information 5018 is shown below. For example, the α parity check polynomials are first numbered beforehand. Then provision is made for the numbers assigned to the α parity check polynomials to be known beforehand by both transmitting apparatus 5010 and receiving apparatus 5020. The numbers assigned to the extracted (selected) β parity check polynomials are used as encoding method related information 5018.

Control section 5017 also sets time varying period γ, and outputs information relating to a parity check polynomial used at point in time i from among the selected β parity check polynomials to LDPC-CC encoder 5012.

LDPC-CC encoder 5012 has information 5011, and encoding method related information 5018 output from control section 5017, as input, and performs LDPC-CC encoding in accordance with the encoding method specified by information 5018.

Specifically, LDPC-CC encoder 5012 finds parity of point in time j satisfying the condition j mod γ=i using the same parity check polynomial. For example, the β parity check polynomials to be represented by "polynomial #1," "polynomial #2," . . . "polynomial #β," and "polynomial #k" (where k=1, 2, . . . , β) is used at least once with any of i=0, 1, . . . , γ−1. Thus, since γ≥β, all β parity check polynomials are used with i=0, 1, . . . , γ−1. LDPC-CC encoder 5012 outputs post-encoding data 5013 to modulation section 5014.

Modulation section 5014 has post-encoding data 5013 as input, executes modulation, band limiting, frequency conversion, amplification, and suchlike processing, and outputs obtained modulation signal 5015 to antenna 5016.

Antenna 5016 emits modulation signal 5015 as a radio wave.

Key information generation section 5019 has information 5018 relating to the encoding method in LDPC-CC encoder 5012 as input, generates key information with this information 5018 as a key, and reports the generated key information to receiving apparatus 5020 using a communication means of some kind. When numbering of a parity check polynomials is executed beforehand, for example, as described above, numbers assigned to extracted (selected) β parity check polynomials may also be used as keys. That is to say, key information generation section 5019 reports information relating to parity check polynomials used by LDPC-CC encoder 5012 to receiving apparatus 5020.

Receiving apparatus 5020 is equipped with antenna 5021, demodulation section 5023, decoding section 5025, and key information acquisition section 5026.

Key information acquisition section 5026 has key information transmitted from transmitting apparatus 5010 as input, and reproduces encoding method related information. For example, if numbers of parity check polynomials used by LDPC-CC encoder 5012 of transmitting apparatus 5010 are taken as keys, key information acquisition section 5026 reproduces the parity check polynomial numbers, and outputs encoding information 5027 including the obtained numbers to decoding section 5025.

Demodulation section 5023 has received signal 5022 received by antenna 5021 as input, executes amplification, frequency conversion, quadrature demodulation, detection, and suchlike processing, and outputs log likelihood ratio 5024.

Decoding section 5025 has encoding information 5027 as input and creates a parity check matrix based on the encoding method, and also has log likelihood ratio 5024 as input, executes decoding processing based on the parity check matrix, and outputs estimation information 5028.

As described above, according to this embodiment transmitting apparatus 5010 is equipped with control section 5017 that selects parity check polynomials configuring a parity check matrix used by LDPC-CC encoder 5012 and outputs encoding method related information including information on the selected parity check polynomials to LDPC-CC encoder 5012, LDPC-CC encoder 5012 that performs encoding using the parity check polynomials selected by control section 5017, and key information generation section 5019 that reports encoding method related information including the parity check polynomials selected by control section 5017 to receiving apparatus 5020, and receiving apparatus 5020 performs decoding using parity check matrix H based on the encoding method related information reported from transmitting apparatus 5010.

In this way, it is possible to implement confidential communication in which a method of selecting β different parity check polynomials and a time varying period γ setting method decided on the transmitting side are used as keys.

A case has been described in which transmitting apparatus 5010 in FIG. 52 generates an encryption key, that is, information for specifying parity check matrix H, but this embodiment is not limited to this, and provision may also be made for receiving apparatus 5020 to set an encryption key and report this to transmitting apparatus 5010. An example of a wireless communication system configuration in this case is shown in FIG. 53.

Figure 53:
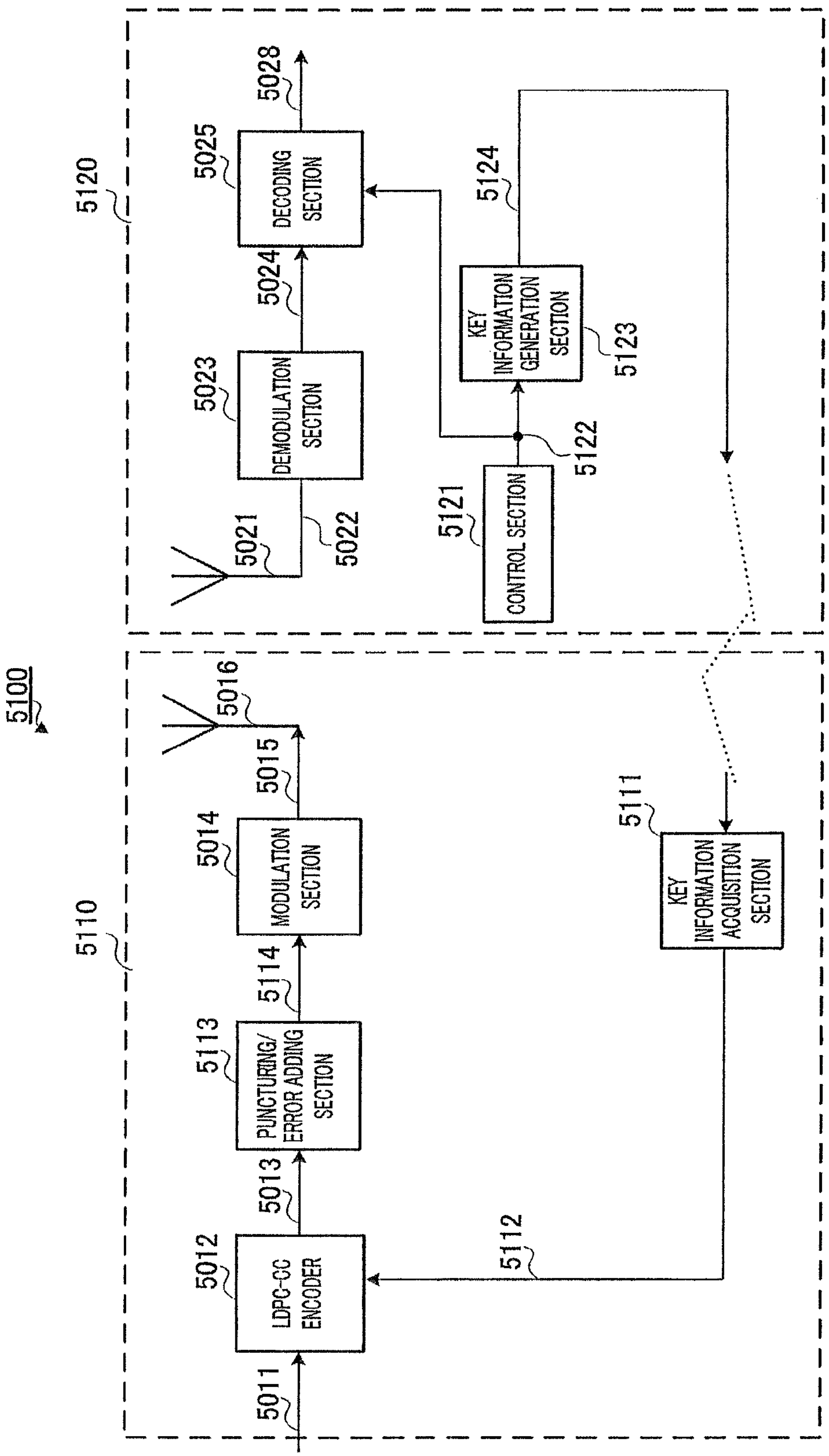
FIG. 53 shows another example of a wireless communication system according to another Embodiment 11.

Wireless communication system 5100 in FIG. 53 includes transmitting apparatus 5110 and receiving apparatus 5120. Configuration parts in FIG. 53 identical to those in FIG. 52 are assigned the same reference codes as in FIG. 52, and descriptions thereof are omitted here.

Receiving apparatus 5120 includes demodulation section 5023, decoding section 5025, control section 5121, and key information generation section 5123.

In a similar way to control section 5017, control section 5121 generates encoding method related information 5122 and outputs generated encoding method related information 5122 to decoding section 5025.

In a similar way to key information generation section 5019, key information generation section 5123 has encoding method related information 5122 as input, generates key information with this information 5122 as a key, and reports the generated key information to transmitting apparatus 5110 using a communication means of some kind.

Transmitting apparatus 5110 includes LDPC-CC encoder 5012, puncturingerror adding section 5113, modulation section 5014, and key information acquisition section 5111.

Key information acquisition section 5111 has key information reported from receiving apparatus 5120 as input, reproduces encoding method related information 5112, and outputs information 5112 to LDPC-CC encoder 5012.

LDPC-CC encoder 5012 performs encoding based on encoding method related information 5112.

When an LDPC-CC is a systematic code, if the communication state is good, such as when the radio reception electric field intensity is high, for example, data (information) X can be obtained by any kind of receiving apparatus by extracting only a part corresponding to data (information) X without error correction (decoding) being performed on the receiving side. That is to say, it may be possible to receive another person's information without permission. To avoid this, provision may be made for puncturingerror adding section 5113 to be provided in transmitting apparatus 5110 as shown in FIG. 53, and for puncturingerror adding section 5113 to perform processing such as puncturing data (information) X or replacing sone data with intentionally erroneous data. Providing puncturingerror adding section 5113 in this way makes it difficult for a receiving apparatus to obtain data (information) X unless it has a correct decoding function.

In the above description, a case has been described in which a different parity check polynomials based on Equation 64 are provided, but this embodiment is not limited to the use of Equation 64, and another parity check polynomial may be used.

(Time-invariant/time varying LDPC-CCs based on a convolutional code (of a coding rate of (n−1)/n) (where n is a natural number)) An overview of time-invariant/time varying LDDC-CCs based on a convolutional code is given below.

A parity check polynomial represented as shown in Equation 149 will be considered, with polynomial representations of coding rate of R=(n−1)/n information $X_1, X_2, \ldots, X_{n-1}$ as $X_1(D), X_2(D), \ldots, X_{n-1}(D)$, and polynomial representation of parity P as P(D).

$$(D^{\alpha 1,1}+D^{+1,2}+\ldots+D^{\alpha 1,r1})X_1(D)+(D^{\alpha 2,1}+D^{+2,2}+\ldots+D^{\alpha 2,r2}+1)X_2(D)+\ldots+(D^{\alpha n-1,1}+d^{\alpha n-1,2}+\ldots+D^{\alpha n-1,rn-1}+1)X_{n-1}(D)+(D^{b1}+D^{b2}+\ldots+D^{bs}+1)P(D)=0 \quad \text{(Equation 149)}$$

In Equation 149, at this time $a_{p,p}$ (where p=1, 2, . . . , n−1 and q=1, 2, . . . , rp) is, for example, a natural number, and satisfies the condition $a_{p,1} \neq a_{p,2} \neq \ldots \neq a_{p,rp}$. Also, $b_q$ (where q=1, 2, . . . , s) is a natural number, and satisfies the condition $b_1 \neq b_2 \neq \ldots \neq b_s$. A code defined by a parity check matrix based on a parity check polynomial of Equation 149 at this time is called a time-invariant LDPC-CC here.

Here, m different parity check polynomials based on Equation 149 are provided (where m is an integer of 2 or above). These parity check polynomials are represented as shown below.

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Equation 150)}$$

Here, i=0, 1, . . . , m−1.

Then information $X_1, X_2, \ldots, X_{n-1}$ at point in time j is represented as $X_{i,j}, X_{2,j}, \ldots, X_{n-1,j}$, parity P at point in time j is represented as $P_j$, and $u_j(X_{1,j}, X_{2,j}, \ldots, X_{n-1,j}, P_j)^T$. At this time, point in time j information $X_{1,j}, X_{2,j}, \ldots, X_{n-1,j}$, and parity $P_j$ satisfy a parity check polynomial of Equation 151.

$$A_{X1,k}(D)X_1(D)+A_{X2,k}(D)X_2(D)+ \ldots +$$

$$A_{Xn-1,k}(D)X_{n-1}(D)+B_k(D)P(D)=0 (k=j \bmod m) \quad \text{(Equation 151)}$$

Here, "j mod m" is a remainder after dividing j by m.

A code defined by a parity check matrix based on a parity check polynomial of Equation 151 is called a time varying LDPC-CC here. At this time, a time-invariant LDPC-CC defined by a parity check polynomial of Equation 149 and a time varying LDPC-CC defined by a parity check polynomial of Equation 151 have a characteristic of enabling parity easily to be found sequentially by means of a register and exclusive OR.

Figure 54:
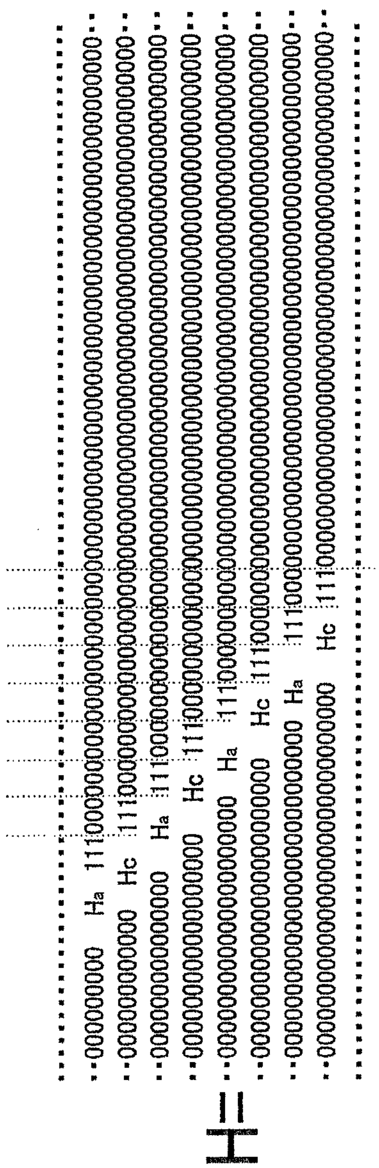
FIG. 54 shows an example of the configuration of LDPC-CC parity check matrix H of a coding rate of ⅔ and a time varying period of 2.

For example, the configuration of parity check matrix H of an LDPC-CC of a time varying period of 2 based on Equation 149 through Equation 151 with a coding rate of ⅔ is shown in FIG. 54. Two different check polynomials of a time varying period of 2 based on Equation 151 are designed "check equation #1" and "check equation #2." In FIG. 54, (Ha,111) is a part corresponding to "check equation #1," and (Hc,111) is a part corresponding to "check equation #2." Below, (Ha,111) and (Hc,111) are defined as sub-matrices.

Thus, LDPC-CC parity check matrix H of a time varying period of 2 of this proposal can be defined by a first sub-matrix representing a "check equation #1" parity check polynomial, and a second sub-matrix representing a "check equation #2" parity check polynomial. Specifically, in parity check matrix H, a first sub-matrix and second sub-matrix are arranged alternately in the row direction. When the coding rate is ⅔, a configuration is used in which a sub-matrix is shifted three columns to the right between an i'th row and i+1'th row, as shown in FIG. 54.

In the case of a time varying LDPC-CC of a time varying period of 2, an i'th row sub-matrix and an i+1'th row sub-matrix are different sub-matrices. That is to say, either sub-matrix (Ha,111) or sub-matrix (Hc,111) is a first sub-matrix, and the other is a second sub-matrix. If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true. This point is as explained in Embodiment 1 (see Equation 3).

Next, an LDPC-CC for which the time varying period is m is considered in the case of a coding rate of ⅔. In the same way as when the time varying period is 2, m parity check polynomials represented by Equation 149 are provided. Then "check equation #1" represented by Equation 149 is provided. "Check equation #2" through "check equation #m" represented by Equation 149 are provided in a similar way. Data X and parity P of point in time mi+1 are represented by $X_{mi+1}$ and $P_{mi+1}$ respectively, data X and parity P of point in time mi+2 are represented by $X_{mi+2}$ and $P_{mi+2}$ respectively, . . . , and data X and parity P of point in time mi+m are represented by $X_{mi+m}$ and $P_{mi+m}$ respectively (where i is an integer).

Consider an LDPC-CC for which parity Pmi+1 of point in time mi+1 is found using "check equation #1," parity Pmi+2 of point in time mi+2 is found using "check equation #2," . . . , and parity Pmi+m of point in time mi+m is found using "check equation #m." An LDPC-CC of this kind provides the following advantages:

An encoder can be configured easily, and parity can be found sequentially.

Termination bit reduction and received quality improvement in puncturing upon termination can be expected.

Figure 55A:
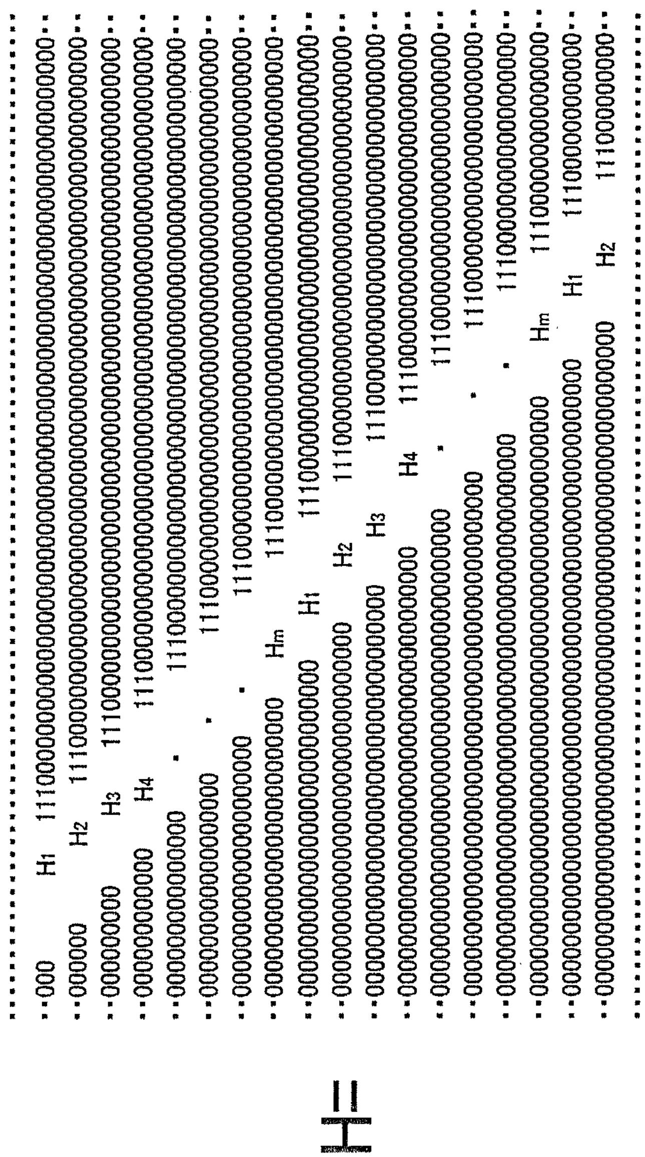
FIG. 55A shows an example of the configuration of an LDPC-CC parity check matrix of a coding rate of ⅔ and a time varying period of m.

FIG. 55A shows the configuration of an above-described an LDPC-CC parity check matrix of a coding rate of ⅔ and a time varying period of m. In FIG. 55A, ($H_1$,111) is a part corresponding to "check equation #1," ($H_2$,111) is a part corresponding to "check equation #2," . . . , and ($H_m$,111) is a part corresponding to "check equation #m."

Below, ($H_1$, 111) is defined as a first sub-matrix, ($H_2$, 111) is defined as a second sub-matrix, . . . , and ($H_m$,111) is defined as an m'th sub-matrix.

Thus, LDPC-CC parity check matrix H of a time varying period of m of this proposal can be defined by a first sub-matrix representing a "check equation #1" parity check polynomial, a second sub-matrix representing a "check equation #2" parity check polynomial, . . . , and an m'th sub-matrix representing a "check equation #m" parity check polynomial. Specifically, in parity check matrix H, a first sub-matrix through m'th sub-matrix are arranged periodically in the row direction (see FIG. 55A). When the coding rate is ⅔, a configuration is used in which a sub-matrix is shifted three columns to the right between an i'th row and i+1'th row (see FIG. 55A).

If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true. This point is as explained in Embodiment 1 (see Equation 3).

In the above description, a case of a coding rate of ⅔ has been described as an example of a time-invariant/time varying LDPC-CC based on a convolutional code of a coding rate of (n−1)/n, but a time-invariant/time varying LDPC-CC parity check matrix of a convolutional code of a coding rate of (n−1)/n can be created by thinking in a similar way.

Figure 55B:
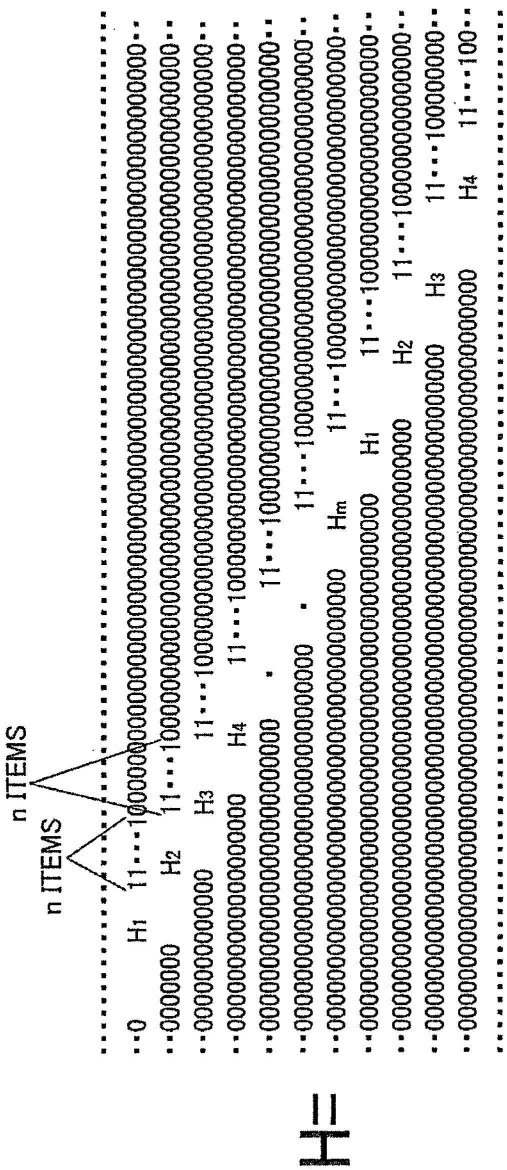
FIG. 55B shows an example of the configuration of an LDPC-CC parity check matrix of a coding rate of $(n-1)/n$ and a time varying period of m.

That is to say, whereas, in the case of a coding rate of ⅔, in FIG. 55A ($H_1$, 111) is a part (first sub-matrix) corresponding to "check equation #1," ($H_2$,111) is a part (second sub-matrix) corresponding to "check equation #2," . . . , and ($H_1$,111) is a part (m'th sub-matrix) corresponding to "check equation #m," in the case of a coding rate of (n−1)/n the situation is as shown in FIG. 55B. That is to say, a part (first sub-matrix) corresponding to "check equation #1" is represented by ($H_1$, 11 . . . 1), and a part (k'th sub-matrix) corresponding to "check equation #k" (where k=2, 3, . . . , m) is represented by ($H_k$, 11 . . . 1). At this time, the number of "1"s of parts excluding $H_k$ in the k'th sub-matrix is n. Also, in parity check matrix H, a configuration is used in which a sub-matrix is shifted n columns to the right between an i'th row and i+1'th row (see FIG. 55B).

If transmission vector u is represented as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, the relationship Hu=0 holds true. This point is as explained in Embodiment 1 (see Equation 3).

Table 5 shows a list of Ak and Bk codes in a parity check polynomial of a time varying period of 2 and a coding rate of ½ based on Equation 122. Table 5 shows an example of LDPC-CCs of a time varying period of 2 and coding rates of ⅔, ¾ and ⅚ that provide good reception performance in case where the maximum constraint length is 600 or below.

TABLE 5

| Code | Coefficients in Equation 151 |
|---|---|
| LDPC-CC of time varying period of 2 and coding rate ⅔ | $(A_{X1,0}(D), A_{X2,0}(D), B_0(D), A_{X1,1}(D), A_{X2,1}(D), B_1(D)) =$ $(D^{490} + D^{269} + D^{33} + 1, D^{260} + D^{198} + D^{10} + 1, D^{548} + D^{267} + D^{223} + 1,$ $D^{558} + D^{215} + D^{124} + 1, D^{591} + D^{154} + D^{7} + 1, D^{594} + D^{425} + D^{137} + 1)$ |

TABLE 5-continued

| Code | Coefficients in Equation 151 |
|---|---|
| LDPC-CC of time varying period of 2 and coding rate ¾ | $(A_{X1,0}(D), A_{X2,0}(D), A_{X3,0}(D), B_0(D), A_{X1,1}(D), A_{X2,1}(D), A_{X3,1}(D), B_1(D)) =$ $(D^{392}+D^{205}+D^{197}+1, D^{335}+D^{248}+D^{91}+1, D^{568}+D^{471}+D^{126}+1, D^{587}+D^{499}+D^{160}+1, D^{406}+D^{302}+D^{64}+1,$ $D^{508}+D^{431}+D^{125}+1, D^{595}+D^{582}+D^{262}+1, D^{464}+D^{451}+D^{321}+1),$ $(D^{545}+D^{542}+D^{185}+1, D^{437}+D^{353}+D^{86}+1, D^{433}+D^{307}+D^{156}+1, D^{441}+D^{421}+D^{240}+1, D^{429}+D^{272}+D^{251}+1,$ $D^{592}+D^{451}+D^{421}+1, D^{557}+D^{385}+D^{290}+1, D^{421}+D^{297}+D^{2}+1)$ |
| LDPC-CC of time varying period of 2 and coding rate ⅚ | $(A_{X1,0}(D), A_{X2,0}(D), A_{X3,0}(D), A_{X4,0}(D), A_{X5,0}(D), B_0(D), A_{X1,1}(D), A_{X2,1}(D), A_{X3,1}(D), A_{X4,1}(D), A_{X5,1}(D), B_1(D)) =$ $(D^{273}+D^{98}+D^{20}+1, D^{184}+D^{100}+D^{48}+1, D^{592}+D^{207}+D^{23}+1, D^{276}+D^{115}+D^{37}+1, D^{395}+D^{336}+D^{282}+1,$ $D^{271}+D^{145}+D^{51}+1, D^{534}+D^{258}+D^{67}+1, D^{318}+D^{276}+D^{47}+1, D^{495}+D^{410}+D^{403}+1, D^{404}+D^{185}+D^{103}+1,$ $D^{458}+D^{423}+D^{154}+1, D^{377}+D^{315}+D^{262}+1),$ $(D^{263}+D^{254}+D^{207}+1, D^{193}+D^{79}+D^{70}+1, D^{167}+D^{114}+D^{89}+1, D^{306}+D^{113}+D^{105}+1, D^{235}+D^{164}+D^{5}+1,$ $D^{257}+D^{186}+D^{53}+1, D^{558}+D^{267}+D^{189}+1, D^{337}+D^{295}+D^{138}+1, D^{550}+D^{209}+D^{91}+1, D^{469}+D^{257}+D^{130}+1,$ $D^{505}+D^{405}+D^{210}+1, D^{516}+D^{459}+D^{81}+1),$ |

Another Embodiment 12

Here, the relationship between parity check polynomials and parity check matrix H will be described. Below, the case of a time varying period of 2 is described as an example.

Figure 56B:
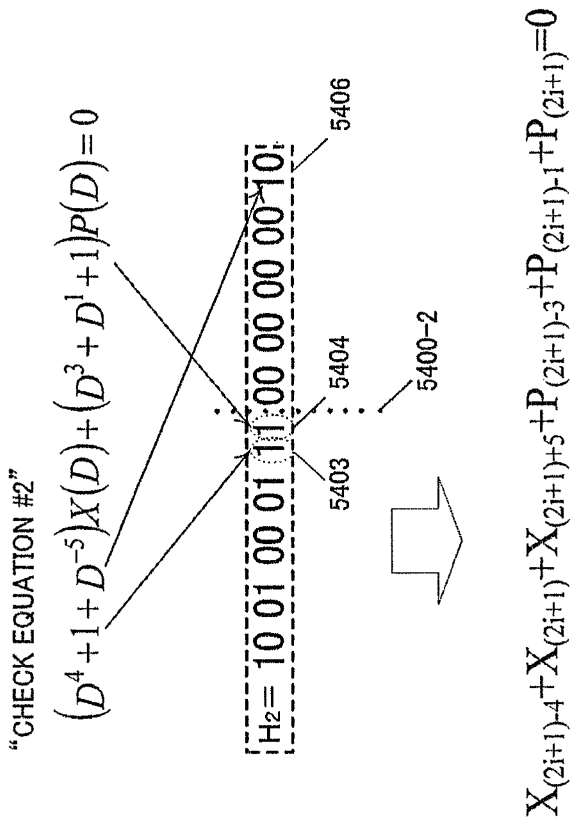
FIG. 56A and FIG. 56B show examples of a first sub-matrix and second sub-matrix according to another Embodiment 12.
Figure 56A:
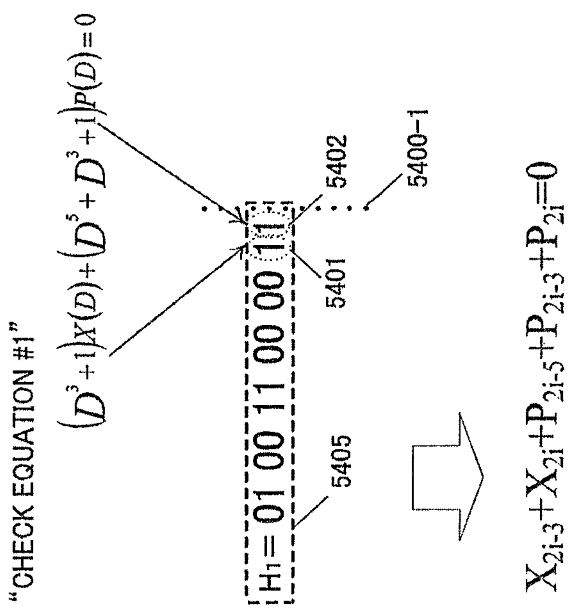

FIG. 56A shows a "check equation #1" parity check polynomial used when finding parity of point in time 2i, and corresponding first sub-matrix $H_1$ (5405). In first sub-matrix $H_1$ (5405) shown in FIG. 56A, dotted line 5400-1 indicates a boundary between point in time 2i and point in time 2i+1 in parity check matrix H. Also, element 5401, the second element from dotted line 5400-1, corresponds to a "1" relating to data (information) of a parity check polynomial, and element 5402, the element immediately to the left of dotted line 5400-1, corresponds to a "1" relating to parity check polynomial parity.

FIG. 56B shows a parity check polynomial of "check equation #2" used when finding parity of point in time 2i, and corresponding second sub-matrix $H_2$ (5406). In second sub-matrix $H_2$ (5406) shown in FIG. 56B, dotted line 5400-2 indicates a boundary between point in time 2i+1 and point in time 2i+2 in parity check matrix H. Also, element 5403, the second element from dotted line 500-2, corresponds to a "1" relating to data (information) of a parity check polynomial, and element 5404, the element immediately to the left of dotted line 500-2, corresponds to a "1" relating to parity check polynomial parity.

Figure 57:
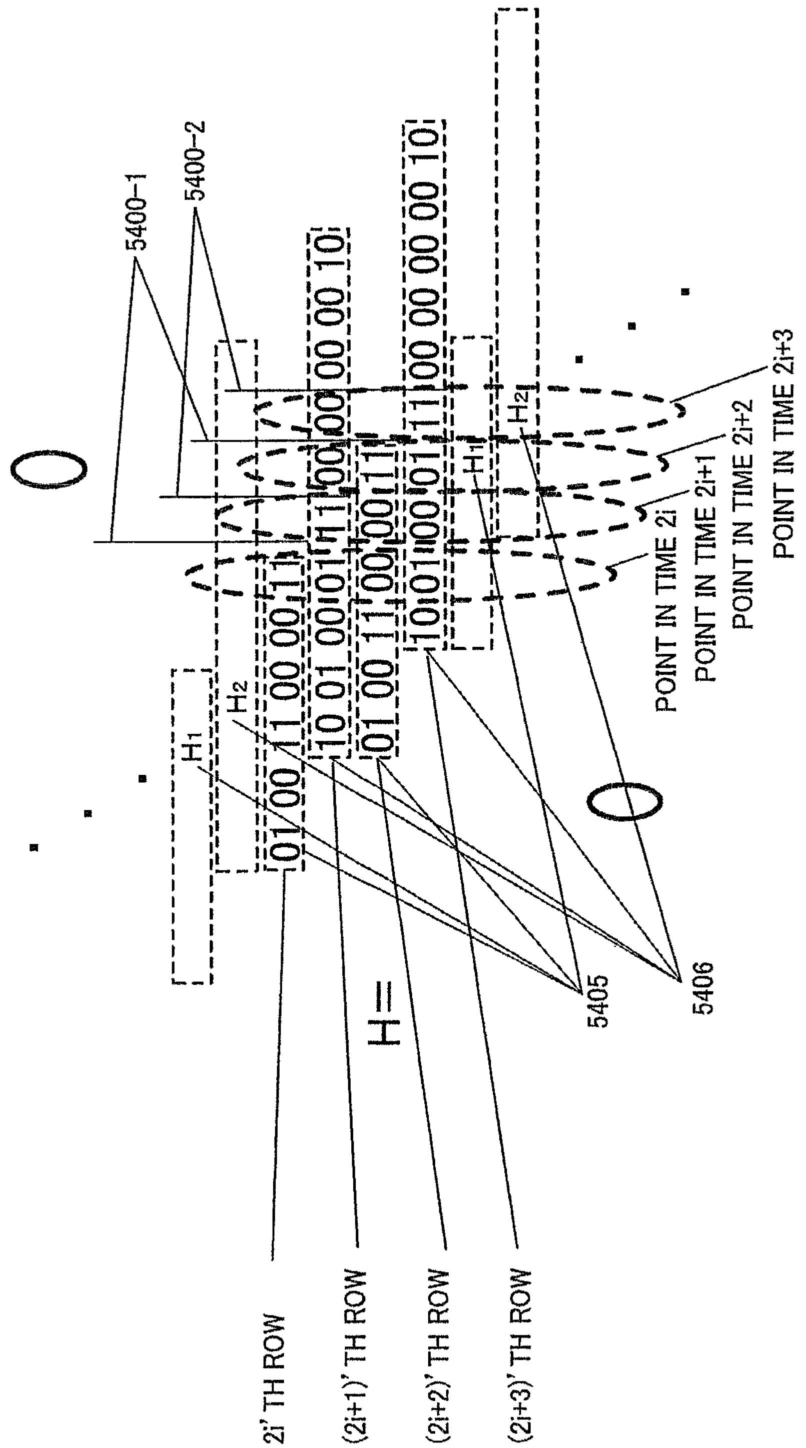
FIG. 57 shows a configuration example of LDPC-CC parity check matrix H of a coding rate of ½ and a time varying period of 2 comprising a first sub-matrix and second sub-matrix.

FIG. 57 shows LDPC-CC parity check matrix H of a coding rate of ½ and a time varying period of 2 configured by means of first sub-matrix $H_1$ shown in FIG. 56A and second sub-matrix $H_2$ shown in FIG. 56B. As can be seen from FIG. 57, in the case of a coding rate of ½, a configuration is used whereby boundary 5400-1 between point in time 2i and point in time 2i+1 of first sub-matrix $H_1$ and boundary 5400-2 between point in time 2i+1 and point in time 2i+2 of second sub-matrix $H_2$ are shifted two columns to the right between the 2i'th row and the (2i+1)'th row. Also, a configuration is used whereby boundary 5400-2 between point in time 2i+1 and point in time 2i+2 of second sub-matrix $H_2$ and dotted line corresponding to a boundary between point in time 2i and point in time 2i+1 of first sub-matrix $H_1$ (boundary between point in time 2i+2 and point in time 2i+3) 5400-1 are shifted two columns to the right between the (2i+1)'th row and the (2i+2)'th row.

The above-described relationship between parity check polynomials and parity check matrix H is also similar for an LDPC-CC of a time varying period of 2 or time varying period of m parity check matrix described in the above embodiments and another embodiments.

Transmission sequence u is represented as $u=(X_0, P_0, X_1, P_1, \ldots, X_i, P_i, \ldots)^T$, where $X_i$ is information and $P_i$ is parity. Transmission sequence u is a systematic code. In this case, first sub-matrix $H_1$ in FIG. 56A satisfies the condition $X_{2i-3}+X_{2i}+P_{2i-5}+P_{2i-3}+P_{2i}-0$. Similarly, second sub-matrix $H_2$ in FIG. 56B satisfies the condition $X_{(2i+1)-4}+X_{(2i+1)}+X_{(2i+1)+5}+P_{(2i+1)-3}+P_{(2i+1)-1}+P_{(2i+1)}=0$.

In the above description, the relationship between parity check polynomials and parity check matrix H has been described taking the case of a coding rate of ½ and time varying period of 2 as an example, but the relationship between parity check polynomials and parity check matrix H is not limited to a coding rate and time varying period. Below, a case in which the coding rate is ⅔ and the time varying period is 2 is described.

Figures 58A, 58B:
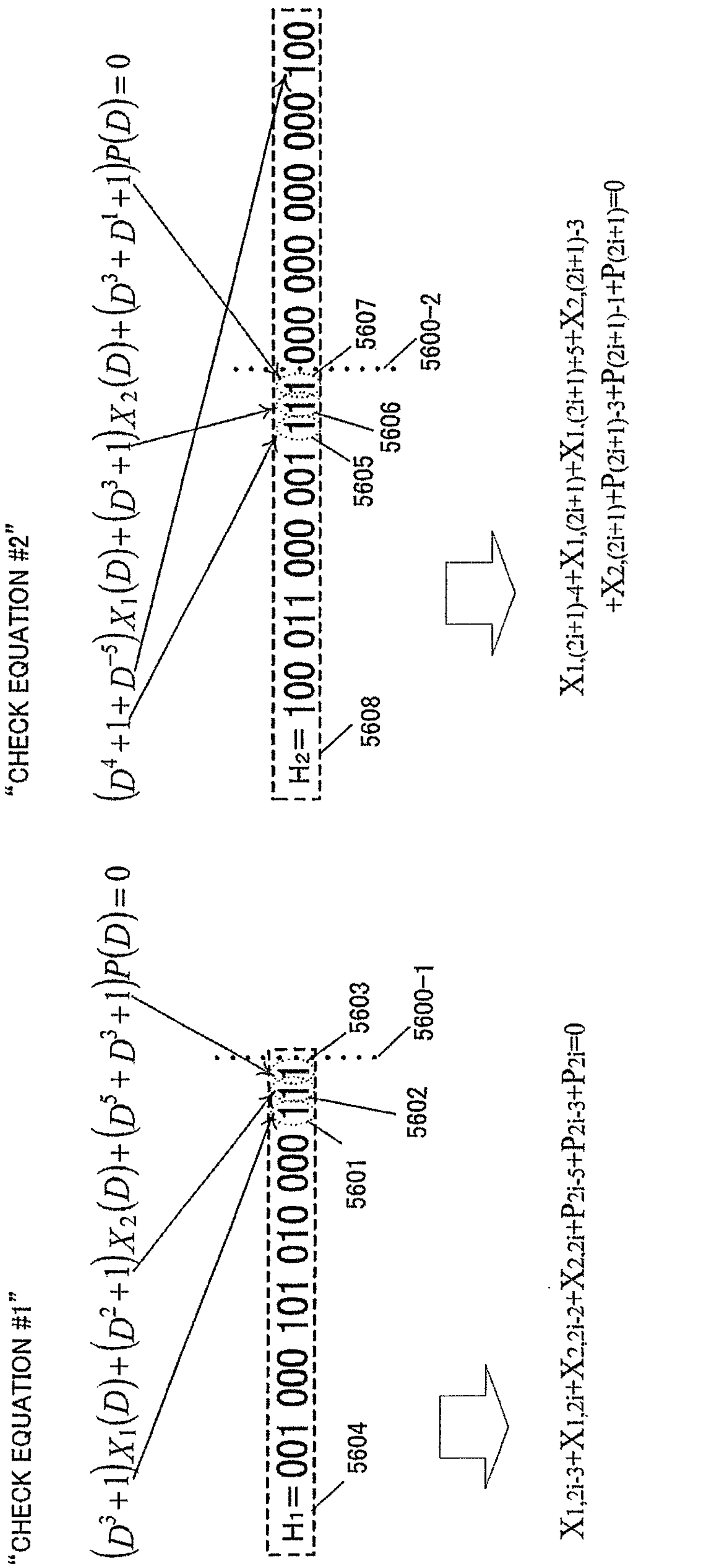
FIG. 58A and FIG. 58B show examples of a first sub-matrix and second sub-matrix according to another Embodiment 12.

FIG. 58A shows a "check equation #1" parity check polynomial used when finding parity of point in time 2i, and corresponding first sub-matrix $H_1$ (5604). In first sub-matrix $H_1$ (5604) shown in FIG. 58A, dotted line 5600-1 indicates a boundary between point in time 2i and point in time 2i+1 in parity check matrix H. Also, dement 5601, the third element from dotted line 5600-1, corresponds to a "1" relating to X1(D), element 5602, the second element from dotted line 5600-1, corresponds to a "1" relating to X2(D), and element 5603, the element immediately to the left of dotted line 5600-1, corresponds to a "1" relating to P(D) parity.

FIG. 58B shows a parity check polynomial of "check equation #2" used when finding parity of point in time 2i+1, and corresponding second sub-matrix $H_2$ (5608). In second sub-matrix $H_2$ (5608) shown in FIG. 58B, dotted line 5600-2 indicates a boundary between point in time 2i+1 and point in time 2i+2 in parity check matrix H. Also, element 5605, the third element from dotted line 5600-2, corresponds to a "1" relating to X1(D), element 5606, the second element from dotted line 5600-2, corresponds to a "1" relating to X2(D), and element 5607, the element immediately to the left of dotted line 5600-2, corresponds to a "1" relating to P(D) parity.

Figure 59:
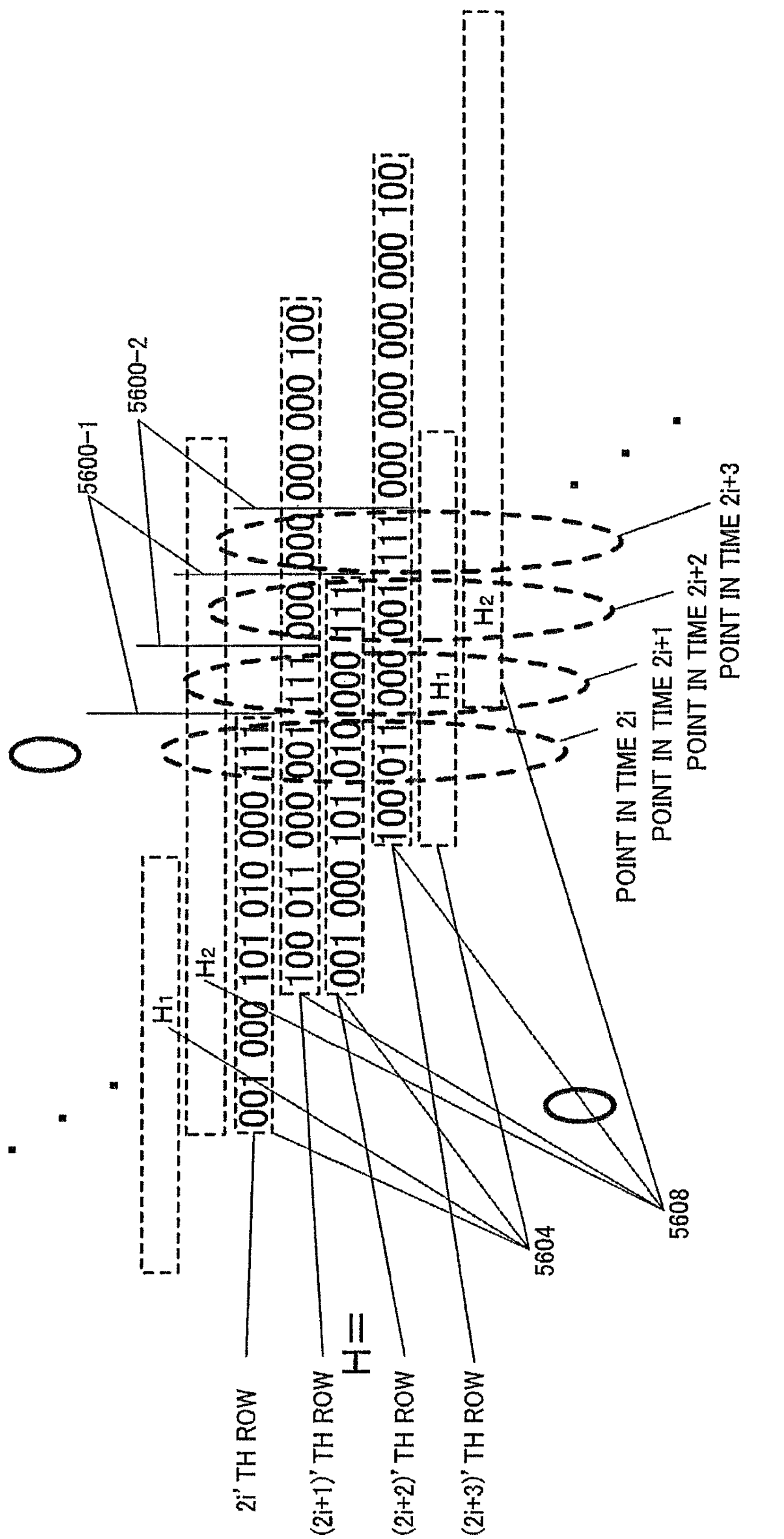
FIG. 59 shows a configuration example of LDPC-CC parity check matrix H of a coding rate of ⅔ and a time varying period of 2 comprising a first sub-matrix and second sub-matrix.

FIG. 59 shows LDPC-CC parity check matrix H of a coding rate of ⅔ and a time varying period of 2 configured by means of first sub-matrix $H_1$ shown in FIG. 58A and second sub-matrix $H_2$ shown in FIG. 58B. As can be seen from FIG. 59, in the case of a coding rate of ⅔, a configuration is used whereby boundary 5600-1 between point in time 2i and point in time 2i+1 of first sub-matrix $H_1$ and boundary 5600-2 between point in time 2i+1 and point in time 2i+2 of second sub-matrix $H_2$ are shifted three columns to the right between the 2i'th row and the (2i+1)'th row. Also, a configuration is used whereby boundary 5600-2 between point in time 2i+1 and point in time 2i+2 of second sub-matrix $H_2$ and dotted line corresponding to a boundary between point in time 2i and point in time 2i+1 of first sub-matrix $H_1$ (boundary between point in time 2i+2 and point in time 2i+3) 5600-1 are shifted three columns to the right between the (2i+1)'th row and the (2i+2)'th row.

The above-described relationship between parity check polynomials and parity check matrix H is also similar for an LDPC-CC parity check matrix of a time varying period of 2 or a time varying period of m described in the above embodiments and another embodiments.

Transmission sequence u is represented as $u=(X_{1,0}, X_{2,0}, P_0, X_{1,1}, X_{2,1}, P_1, \ldots, X_{1,i}, X_{2,i}, P_i, \ldots)^T$, where $X_{1,1}$, $X_{2,1}$ are information and $P_i$ is parity. Transmission sequence u is a systematic code. In this case, first sub-matrix $H_1$ in FIG. 58A satisfies the condition $X_{1,2i-3}+X_{1,2i}+X_{2,2i-2}+X_{2,2i}+P_{2i-5} P_{2i-3}+P_{2i}=0$. Similarly, second sub-matrix $H_2$ in FIG. 58B satisfies the condition $X_{1,(2i+1)-4}+X_{1,(2i+1)}+X_{1,(2i+1)+5}+X_{2,(2i+1)-3}+W_{2,(2i+1)}+P_{(2i+1)-3}+P_{(2i+1)-1}+P_{(2i+1)}=0$.

As described above, although the relationship between parity check polynomials and parity check matrix H has been described taking the cases of coding rates of 12 and 23 as examples, the relationship between parity check polynomials and parity check matrix H holds true in a similar way irrespective of the coding rate. In particular, details regarding an LDPC-CC (convolutional code) parity check matrix H are given in Non-Patent Document 17 and Non-Patent Document 18.

Another Embodiment 13

Here, differences between Embodiment 7, Embodiment 8, another Embodiment 5, another Embodiment 6, and another Embodiment 8, and Non-Patent Document 16, are described.

Non-Patent Document 16 describes a method of designing an LDPC-CC of a time varying period of 4 from an LDPC-BC (Low-Density Parity-Check Block Code) in the case of a coding rate of ½.

A brief description of the LDPC-CC design method of Non-Patent Document 16 is given below using accompanying drawings.

FIG. 60A, FIG. 60B, and FIG. 60C are drawings provided to explain the design method described in Non-Patent Document 16. Using FIG. 16, a method of designing an LDPC-CC of a time varying period of 4 from an LDPC-BC of a coding rate of ½ will be described. In Non-Patent Document 16, an LDPC-CC parity check matrix is generated by means of Step 1) through Step 3) shown below.

Step 1)

An LDPC-BC serving as an LDPC-CC base is set. According to Non-Patent Document 16, an m-row×2m-column LDPC-BC is necessary in order to create an LDPC-CC of a coding rate of ½ and a time varying period of m.

Parity check matrix 5801 in FIG. 60A is an example of a parity check matrix of an LDPC-BC serving as a base of an LDPC-CC of a time varying period of 4. As explained above, in the case of a time varying period of 4, a 4-row×8-column LDPC-BC parity check matrix is used as a base parity check matrix.

Step 2)

Then predetermined processing is executed on parity check matrix 5801, and parity check matrix 5802 is created (see FIG. 60B). Since the actual processing is described in Non-Patent Document 16, a description thereof is omitted here.

Step 3)

Then "11"s are added to parity check matrix 5802 and parity check matrix 5803 is created, as shown in FIG. 60C.

In this way an LDPC-CC parity check matrix of a time varying period of 4 is created from a 4-row×8-column LDPC-BC by means of Step 1) through Step 3) in Non-Patent Document 16.

A parity check polynomial corresponding to parity check matrix 5803 obtained in this way is represented by Equation 152.

$$(D^{a1}+\ldots+D^{ap}+1)X(D)+(D^{b1}+\ldots+D^{bq}+1)P(D)=0 \quad \text{(Equation 152)}$$

In Equation 152, it is assumed that a1, a2, . . . , ap are integers of 1 or above (where a1≠a2≠ . . . ≠ap), and b1, b2, . . . , bq are integers of 1 or above (where b1≠b2≠ . . . ≠bq).

As can be seen from FIG. 60C, with an LDPC-CC of a time varying period of 4 there are four different parity check polynomials based on Equation 152. Therefore, when designing an LDPC-CC of a time varying period of 4, since a 4-row×8-column LDPC-BC parity check matrix is used as a base and "11"s are added as shown in FIG. 60C in Step 3), this means that ai≤4 (where i=1, 2, . . . , p) and bj≤4 (where j=1, 2, . . . , q) in all four different parity check polynomials configuring the base LDPC-BC parity check matrix.

That is to say, when designing an LDPC-CC of a time varying period of 4 in accordance with Non-Patent Document 16, the maximum constraint length is 4+1=5.

Similarly, when designing an LDPC-CC of a time varying period of m by means of the design method of Non-Patent Document 16, ai≤m (where i=1, 2, . . . , p) and bj≤m (where j=1, 2, . . . , q) in Equation 152 in all m different parity check polynomials configuring the base LDPC-BC parity check matrix.

That is to say, when designing an LDPC-CC of a time varying period of m in accordance with Non-Patent Document 16, since an m-row×2m-column LDPC-BC parity check matrix is used as a base and "11"s are added in Step 3), the maximum constraint length is m+1.

Similarly, when designing an LDPC-CC of a time varying period of 2 by means of the design method of Non-Patent Document 16, ai≤2 (where i=1, 2, . . . , p) and bj≤2 (where j=1, 2, . . . , q) in all different parity check polynomials configuring the base LDPC-BC parity check matrix.

That is to say, when designing an LDPC-CC of a time varying period of 2 in accordance with Non-Patent Document 16, the maximum constraint length is 2+1=3. Thus, when designing an LDPC-CC of a time varying period of m by means of the design method of Non-Patent Document 16, the maximum constraint length is m+1. Therefore, when designing an LDPC-CC with a long constraint length, for example, a constraint length of 100 or above (100, . . . , 500, . . . , 1000, . . . , 2000, . . . , 10000, . . . , 20000, . . . ), in order to improve received quality (error correction capability), if the LDPC-CC is designed in accordance with Non-Patent Document 16, a time varying period having a value of the same order as the constraint length is necessary.

As explained in above-described Embodiment 7 and so forth, if the time varying period is too large, it is difficult to perform puncturing periodically, and it may be necessary to perform puncturing randomly, for example, with a resulting possibility of degradation of received quality. Thus, if a time varying LDPC-CC is designed using the design method of Non-Patent Document 16, it may be difficult to achieve the application of puncturing and support for a plurality of coding rates at the same time as an improvement in received quality (error correction capability).

If an LDPC-CC of a time varying period of between 2 and or so enabling application of puncturing described in Embodiment 7 were to be designed using the design method of Non-Patent Document 16, with a time varying period of 2 the maximum constraint length would be 3 (=2+1), and the conditions $ai \le 2$ (where i=1, 2, . . . , p) and $bj \le 2$ (where j=1, 2, . . . , q) would apply in Equation 152. Similarly, with a time varying period of 10 the maximum constraint length would be 11 (=10+1), that is to say, the conditions $ai \le 10$ (where i=1, 2, . . . , p) and $bj \le 10$ (where j=1, 2, . . . , q) would apply in Equation 152.

Thus, when using the design method disclosed in Non-Patent Document 16, with a shorter time varying period the maximum constraint length also becomes proportionally shorter. Generally, with an LDPC-CC, as the constraint length increases the range in which belief is propagated is also extended, and consequently reception performance is improved. However, according to Non-Patent Document 16, the constraint length is shortened at the same time as the time varying period is shortened, making it difficult to obtain good received quality (error correction capability).

That is to say, according to Non-Patent Document 16, if the parity check polynomial constraint length is increased in order to obtain good received quality, the time varying period also increases at the same time, making it difficult to perform puncturing periodically. Also, according to Non-Patent Document 16, if the time varying period is shortened the constraint length is also shortened, making it difficult to obtain good received quality.

However, by adding the following requirements for an LDPC-CC, as described in Embodiment 7 and so forth, support for a plurality of coding rates by means of puncturing and an improvement in received quality can both be achieved.

[Requirements]

A time varying period between 2 and 10 or so is to be set.

With a time varying period of m, the constraint length is to be made m+2 or above. In other words, when using m different parity check polynomials based on Equation 152, for all of the m parity check polynomials the condition $A_{max} \ge m+1$ is to hold true between maximum value $A_{max}$ of ai (where i=1, 2, . . . , p), and the condition $B_{max} \ge m+1$ is to hold true between maximum value $B_{max}$ of bi (where i=1, 2, . . . , q). In order to obtain good received quality, it is desirable for either $A_{max}$ or $B_{max}$ to be made 100 or above.

A row weight of between 7 and 12 is to be set.

On the other hand, if an LDPC-CC of a time varying period of 2 enabling a puncturing pattern to be found most easily is designed by means of the design method of Non-Patent Document 16, the maximum constraint length is 3, and the conditions $ai \le 2$ (where i=1, 2, . . . , p) and $bj \le 2$ (where j=1, 2, . . . , q) hold true in two different Equations 152. Therefore, if an LDPC-CC of a time varying period of 2 is designed using the design method of Non-Patent Document 16, the row weight is a maximum of 6.

Therefore, of the requirements for an LDPC-CC of a time varying period of 2 for achieving both an improvement in received quality and support for a plurality of coding rates by means of puncturing described in Embodiment 7, the requirement "A row weight of between 7 and 12 is to be set" is a distinctive requirement of the invention of the present application.

Another Embodiment 14

Here, a loop 6 of a time-invariant LDPC-CC and an LDPC-CC of a time varying period of 2 will be described in detail.

(1) First, a description will be given relating to a time-invariant LDPC-CC of a coding rate of n/n+1.

A polynomial of data (information) X1 is designated X1(D), a polynomial of data (information) X2 is designated X2(D), a polynomial of data (information) X3 is designated X3(D), . . . , a polynomial of data (information) Xn is designated Xn(D), and a polynomial of parity P is designated P(D), and the parity check polynomial below is considered.

$$(D^{a1,1}+\ldots+D^{a1,r1})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 153)}$$

In Equation 153, it is assumed that $a_{1,1}, a_{1,2}, \ldots, a_{1,r1}$ are integers (where $a_{1,1} \ne z_{1,2} \ne \ldots \ne a_{1,r1}$). Also, it is assumed that $a_{2,1}, a_{2,2}, \ldots, a_{2,r2}$ are integers (where $a_{2,1} \ne a_{2,2} \ne \ldots \ne a_{2,r2}$). Furthermore, it is assumed that $a_{i,1}, a_{i,2}, \ldots, a_{i,ri}$ (where i=3, . . . , n−1) are integers (where $a_{i,1} \ne a_{i,2} \ne \ldots \ne a_{i,ri}$). Moreover, it is assumed that $a_{n,1}, a_{n,2}, \ldots, a_{n,rn}$ are integers (where $a_{n,1} \ne a_{n,2} \ne \ldots \ne a_{n,rn}$). Also, it is assumed that $e_1, e_2, \ldots e_w$ are integers (where $e_1 \ne e_2 \ne \ldots \ne e_w$).

[Theorem 1]

In a time-invariant LDPC-CC based on a parity check polynomial of Equation 153, when three or more terms are present in any of X1(D), X2(D), X3(D), . . . , Xn(D), and P(D), at least one loop 6 is present.

Example

With regard to X1(D), consider a case in which terms $(D^5+D^3+1)$ X1(D) are present in a parity check polynomial. In this case, a sub-matrix generated by extracting only a part relating to X1(D) is represented as shown in FIG. 61, and a loop 6 is present as indicated by dotted line 5901.

[Proof]

If it can be proved for X1(D) that at least one loop 6 is present when three or more terms are present, it can be proved that the same also holds true for X2(D), X3(D), . . . , Xn(D), and P(D), by considering them as being replaced by X1(D). Therefore, X1(D) will be focused on.

For Equation 153, in a parity check matrix H in which two terms are present in X1(D), a sub-matrix generated by extracting only a part relating to X1(D) is represented as shown in FIG. 62, and a loop is not present.

Next, consider Equation 154 in which three terms are present in X1(D) with respect to Equation 153.

$$(D^{a1,1}+D^{a1,2}+D^{a1,3})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 154)}$$

At this time, generality is not lost even if $a_{1,1}>a_{1,2}>a_{1,3}$. Thus, Equation 154 is represented as shown below, $$(D^{a1,3+\alpha+\beta}+D^{a1,3+\beta}+D^{a1,3})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 155)}$$

where α and β are natural numbers.

At this time, consider X1(D) related terms, that is, $(D^{a1,3+\alpha+\beta}D^{a1,3+\beta}+D^{a1,3})$ X1(D), in Equation 155. In parity check matrix H, a sub-matrix generated by extracting only a part relating to X1(D) is represented as shown in FIG. 63. Therefore, a loop 6 formed by elements 6101 necessarily occurs irrespective of the values of α and β.

If four or more terms relating to X1(D) are present, and three of the four or more terms are selected, a loop 6 is formed by the three selected elements (see FIG. 63). Thus, a loop 6 is present if four or more terms relating to X1(D) are present.

Therefore, a loop 6 is present if three or more terms relating to X1(D) are present in a parity check polynomial. A similar proof can also be carried out for X2(D), X3(D), . . . , Xn(D), and P(D). Thus, Theorem 1 has been proved. (End of proof)

(2) Next, a description will be given to an important matter relating to an LDPC-CC of a time varying period of 2.

In an LDPC-CC of a time varying period of 2, a polynomial of data (information) X1 is designated X1(D), a polynomial of data (information) X2 is designated X2(D), a polynomial of data (information) X3 is designated X3(D), . . . , a polynomial of data (information) Xn is designated Xn(D), and a polynomial of parity P is designated P(D). Then a parity check polynomial of Equation 156 is considered as "check equation #1."

$$(D^{a1,1}+\ldots+D^{a1,r1})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 156)}$$

In Equation 156, it is assumed that $a_{1,1}, a_{1,2}, \ldots, a_{1,r1}$ are integers (where $a_{1,1}\neq a_{1,2}\neq \ldots \neq a_{1,r1}$). Also, it is assumed that $a_{2,1}, a_{2,2}, \ldots, a_{2,r2}$ are integers (where $a_{2,1}\neq a_{2,2}\neq \ldots \neq a_{2,r2}$). Furthermore, it is assumed that $a_{i,1}, a_{i,2}, \ldots, a_{i,ri}$ (where i=3, . . . , n−1) are integers (where $a_{i,1}\neq a_{i,2}\neq \ldots \neq a_{i,ri}$). Moreover, it is assumed that $a_{n,1}, a_{n,2}, \ldots, a_{n,rn}$ are integers (where $a_{n,1}\neq a_{n,2}\neq \ldots \neq a_{n,rn}$). Also, it is assumed that $e_1, e_2, \ldots, e_w$ are integers (where $e_1\neq e_2\neq \ldots \neq e_w$).

Then a parity check polynomial of Equation 157 is considered as "check equation #2."

$$(D^{b1,1}+\ldots+D^{b1,s1})X1(D)+(D^{b2,1}+\ldots+D^{b2,s2})X2(D)+\ldots+(D^{bn,1}+\ldots+D^{bn,sn})Xn(D)+(D^{f1}+\ldots+D^{fv})P(D)=0 \quad \text{(Equation 157)}$$

In Equation 157, it is assumed that $b_{1,1}, b_{1,2}, \ldots, b_{1,s1}$ are integers (where $b_{1,1}\neq b_{1,2}\neq \ldots \neq b_{1,s1}$). Also, it is assumed that $b_{2,1}, b_{2,2}, \ldots, b_{2,s2}$ are integers (where $b_{2,1}\neq b_{2,2}\neq \ldots \neq b_{2,s2}$). Furthermore, it is assumed that $b_{i,1}, b_{i,2}, \ldots, b_{i,si}$ (where i=3, . . . , n−1) are integers (where $b_{i,1}\neq b_{i,2}\neq \ldots \neq b_{i,si}$). Moreover, it is assumed that $b_{n,1}, b_{n,2}, \ldots, b_{n,sn}$ are integers (where $b_{n,1}\neq b_{n,2}\neq \ldots \neq b_{n,sn}$). Also, it is assumed that $f_1, f_2, \ldots, f_v$ are integers (where $f_1\neq f_2\neq \ldots \neq f_v$).

Then an LDPC-CC of a time varying period of 2 provided by "check equation #1" and "check equation #2" is considered.

[Theorem 2]

With an LDPC-CC of a time varying period of 2 based on a parity check polynomial of Equation 156 and parity check polynomial of Equation 157, at least one loop 6 is present when the following condition is satisfied in a parity check polynomial of Equation 156: "y is present such that $(a_{y,i}, a_{y,j}, a_{y,k})$ are all odd numbers or all even numbers (where i≠j≠k), or z is present such that $(e_i, e_j, e_k)$ are all odd numbers or all even numbers or $(b_{z,i}, b_{z,j}, b_{z,k})$ are all odd numbers or all even numbers (where i≠j≠k), or $(f_i, f_j, f_k)$ are all odd numbers or all even numbers."

Example

With regard to X1(D) of "check equation #1", consider a case in which terms $(D^6+D^2+1)$ X1(D) are present in a parity check polynomial. In this case, a sub-matrix generated by extracting only a part relating to X1(D) in parity check matrix H is represented as shown in FIG. 64, and a loop 6 is present as indicated by dotted line 6203.

[Proof]

If it can be proved for X1(D) that a loop 6 is present when $(a_{1,i}, a_{1,j}, a_{1,k})$ are all odd numbers or all even numbers (where i≠j≠k), it can be proved that the same also holds true for X2(D), X3(D), . . . , Xn(D), and P(D), by considering them as being replaced by X1(D). Therefore, X1(D) will be focused on.

Also, by proving in a similar way that this holds true in a parity check polynomial of Equation 156, that is, "check equation #1," it can be proved that this also holds true in a parity check polynomial of Equation 157, that is, "check equation #2." Therefore, a parity check polynomial of Equation 156, that is, "check equation #1," will be taken into account.

When two even numbers or two odd numbers are present in $a_{1,i}$ (where i=1, 2, . . . , r1) in terms relating to X1(D) of Equation 156, a sub-matrix generated by extracting only a part relating to X1(D) is as shown in FIG. 65. In FIG. 65, sub-matrix 6301 is a sub-matrix corresponding to X1(D) of "check equation #1," and sub-matrix 6302 is a sub-matrix corresponding to X1(D) of "check equation #2." As can be seen from sub-matrix 6301 in FIG. 65, a loop does not occur with only the presence of two even numbers or two odd numbers in $a_{1,i}$ (where i=1, 2, . . . , r1) of a parity check polynomial of Equation 156 ("check equation #1").

Next, if Equation 158 is considered when three terms are present for X1(D) with respect to Equation 156 and $(a_{1,i}, a_{1,j}, a_{1,k})$ are all odd numbers or all even numbers, this can be represented as Equation 159. Generality is not lost even if $a_{1,1}>a_{1,2}>a_{1,3}$.

$$(D^{a1,1}+D^{a1,2}+D^{a1,3})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 158)}$$

$$(D^{a1,3+2p+2q}+D^{a1,3+2q}+D^{a1,3})X1(D)+(D^{a2,1}+\ldots+D^{a2,r2})X2(D)+\ldots+(D^{an,1}+\ldots+D^{an,rn})Xn(D)+(D^{e1}+\ldots+D^{ew})P(D)=0 \quad \text{(Equation 159)}$$

Here, p and q are natural numbers.

At this time, consider X1(D) related terms, that is, $(D^{a1,3+2p+2q}+D^{a1,3+2q}+D^{a1,3})$ X1(D), in Equation 159. In parity check matrix H, a sub-matrix generated by extracting only a part relating to X1(D) is represented as shown in FIG. 66. In the case of a time varying period of 2, sub-matrix 6401 in FIG. 66 entirely comprises "check equation #1" of Equation 159, and therefore the state is similar to that in FIG. 63 described in the proof of Theorem 1.

Therefore, a loop 6 is formed by elements 6101 as shown in FIG. 66 with "check equation #1" only, irrespective of the values of p and q.

When four or more terms relating to X1(D) are present, if three of the four or more terms are selected and $(a_{1,i}, a_{1,j}, a_{1,k})$ are all odd numbers or all even numbers in the three selected terms, a loop 6 is formed by elements 6101 as shown in FIG. 66.

From the above, a loop 6 is present if, for X1(D), $(a_{1,i}, a_{1,j}, a_{1,k})$ are all odd numbers or all even numbers (where i≠j≠k). The same can also be said for X2(D), X3(D), . . . , Xn(D), and P(D).

The same can be said for "check equation #2" as for "check equation #1," and therefore Theorem 2 has been proved. (End of Proof)

[Theorem 3]

With an LDPC-CC of a time varying period of 2 based on a parity check polynomial of Equation 156 and parity check polynomial of Equation 157, at least one loop 6 is present when five or more terms are present in any of X1(D), X2(D), X3(D), . . . , Xn(D), and P(D) of a parity check polynomial of Equation 156, or when five or more terms are present in any of X1(D), X2(D), X3(D), . . . , Xn(D), and P(D) of a parity check polynomial of Equation 157.

[Proof]

When five or more terms are present in any of X1(D), X2(D), X3(D), . . . , Xn(D), and P(D), Theorem 2 is necessarily satisfied. Therefore, Theorem 3 has been proved. (End of proof)

The importance of another Embodiment 9 is clear from the above.

Another Embodiment 15

First, an LDPC-CC of a time varying period of 4 with good characteristics will be described. A case in which the coding rate is ½ is described below as an example.

Consider Equations 160-1 through 160-4 as parity check polynomials of an LDPC-CC for which the time varying period is 4. At this time, X(D) is polynomial representation of data (information) and P(D) is a parity polynomial representation. Here, in Equations 160-1 through 160-4, parity check polynomials have been assumed in which there are four terms in X(D) and P(D) respectively, the reason being that four or more terms are desirable from the standpoint of obtaining good received quality.

$$(D^{a1}+D^{a2}+D^{a3}+D^{a4})X(D)+(D^{b1}+D^{b2}+D^{b3}+D^{b4})P(D)=0 \quad \text{(Equation 160-1)}$$

$$(D^{A1}+D^{A2}+D^{A3}+D^{A4})X(D)+(D^{B1}+D^{B2}+D^{B3}+D^{B4})P(D)=0 \quad \text{(Equation 160-2)}$$

$$(D^{\alpha1}+D^{\alpha2}+D^{\alpha3}+D^{\alpha4})X(D)+(D^{\beta1}+D^{\beta2}+D^{\beta3}+D^{\beta4})P(D)=0 \quad \text{(Equation 160-3)}$$

$$(D^{E1}+D^{E2}+D^{E3}+D^{E4})X(D)+(D^{F1}+D^{F2}+D^{F3}+D^{F4})P(D)=0 \quad \text{(Equation 160-4)}$$

In Equation 160-1, it is assumed that a1, a2, a3, and a4 are integers (where $a1 \neq a2 \neq a3 \neq a4$). Also, it is assumed that b1, b2, b3, and b4 are integers (where $b1 \neq b2 \neq b3 \neq b4$). A parity check polynomial of Equation 160-1 is called "check equation #1," and a sub-matrix based on a parity check polynomial of Equation 160-1 is designated first sub-matrix H1.

In Equation 160-2, it is assumed that A1, A2, A3, and A4 are integers (where $A1 \neq A2 \neq A3 \neq A4$). Also, it is assumed that B1, B2, B3, and B4 are integers (where $B1 \neq B2 \neq B3 \neq B4$). A parity check polynomial of Equation 160-2 is called "check equation #2," and a sub-matrix based on a parity check polynomial of Equation 160-2 is designated second sub-matrix H2.

In Equation 160-3, it is assumed that α1, α2, α3, and α4 are integers (where $\alpha1 \neq \alpha2 \neq \alpha3 \neq \alpha4$). Also, it is assumed that β1, β2, β3, and β4 are integers (where $\beta1 \neq \beta2 \neq \beta3 \neq \beta4$). A parity check polynomial of Equation 160-3 is called "check equation #3," and a sub-matrix based on a parity check polynomial of Equation 160-3 is designated third sub-matrix $H_3$.

In Equation 160-4, it is assumed that E1, E2, E3, and E4 are integers (where $E1 \neq E2 \neq E3 \neq E4$). Also, it is assumed that F1, F2, F3, and F4 are integers (where $F1 \neq F2 \neq F3 \neq F4$). A parity check polynomial of Equation 160-4 is called "check equation #4," and a sub-matrix based on a parity check polynomial of Equation 160-4 is designated fourth sub-matrix $H_4$.

Next, an LDPC-CC of a time varying period of 4 is considered that generates a parity check matrix such as shown in FIG. 19 from first sub-matrix $H_1$, second sub-matrix $H_2$, third sub-matrix $H_3$, and fourth sub-matrix $H_4$.

At this time, if a remainder after dividing the values of combinations of orders X(D) and P(D) (a1, a2, a3, a4), (b1, b2, b3, b4), (A1, A2, A3, A4), (B1, B2, B3, B4), (α1, α2, α3, α4), (β1, β2, β3, β4), (E1, E2, E3, E4), (F1, F2, F3, F4) in Equations 160-1 through 160-4 by 4 is designated k, provision is made for one each of remainders 0, 1, 2, and 3 to be included in four coefficient sets represented as shown above (for example, (a1, a2, a3, a4)), and to hold true for all above four coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2, 3 are included in the four coefficient sets as remainders (k). Similarly, if orders (b1, b2, b3, b4) of "check equation #1" P(D) are set as (b1, b2, b3, b4)=(4, 3, 2, 1), remainders k after dividing orders (b1, b2, b3, b4) by 4 are (0, 3, 2, 1), and one each of 0, 1, 2, 3 are included in the four coefficient sets as remainder (k). It is assumed that the above "remainder" related condition (hereinafter also referred to as "remainder rule") also holds true for the four coefficient sets of X(D) and P(D) of the other parity check polynomials ("check equation #2," "check equation #3," and "check equation #4").

By this means, the column weight of parity check matrix H configured from Equations 160-1 through 160-4 becomes 4 for all columns, and a regular LDPC code can be formed. Here, a regular LDPC code is an LDPC code that is defined by a parity check matrix for which each column weight is fixed, and is characterized by the fact that its characteristics are stable and an error floor is unlikely to occur. In particular, since the characteristics are good when the column weight is 4, an LDPC-CC offering good reception performance can be obtained by generating an LDPC-CC as described above.

Table 6 shows examples of LDPC-CCs (LDPC-CCs #1 through #3) of a time varying period of 4 and a coding rate of ½ for which the above "remainder" related condition (remainder rule) holds true. In Table 6, LDPC-CCs of a time varying period of 4 are defined by four parity check polynomials: "check polynomial #1," "check polynomial #2," "check polynomial #3," and "check polynomial #4."

TABLE 6

| Code | Parity Check Polynomials |
|---|---|
| LDPC-CC #1 of time varying period of 4 and coding rate ½ | "Check polynomial #1": $(D^{458}+D^{435}+D^{341}+1)X(D)+(D^{598}+D^{373}+D^{67}+1)P(D)=0$<br>"Check polynomial #2": $(D^{287}+D^{213}+D^{130}+1)X(D)+(D^{545}+D^{542}+D^{103}+1)P(D)=0$<br>"Check polynomial #3": $(D^{557}+D^{495}+D^{326}+1)X(D)+(D^{561}+D^{502}+D^{351}+1)P(D)=0$<br>"Check polynomial #4": $(D^{426}+D^{329}+D^{99}+1)X(D)+(D^{321}+D^{55}+D^{42}+1)P(D)=0$ |
| LDPC-CC #2 of time varying period of 4 and coding rate ½ | "Check polynomial #1": $(D^{503}+D^{454}+D^{49}+1)X(D)+(D^{569}+D^{467}+D^{402}+1)P(D)=0$<br>"Check polynomial #2": $(D^{518}+D^{473}+D^{203}+1)X(D)+(D^{598}+D^{499}+D^{145}+1)P(D)=0$<br>"Check polynomial #3": $(D^{403}+D^{397}+D^{62}+1)X(D)+(D^{294}+D^{267}+D^{69}+1)P(D)=0$<br>"Check polynomial #4": $(D^{483}+D^{385}+D^{94}+1)X(D)+(D^{426}+D^{415}+D^{413}+1)P(D)=0$ |

TABLE 6-continued

| Code | Parity Check Polynomials |
|---|---|
| LDPC-CC #3 of time varying period of 4 and coding rate ½ | "Check polynomial #1": $(D^{454}+D^{447}+D^{17}+1)X(D)+(D^{494}+D^{237}+D^{7}+1)P(D)=0$ "Check polynomial #2": $(D^{583}+D^{545}+D^{506}+1)X(D)+(D^{325}+D^{71}+D^{66}+1)P(D)=0$ "Check polynomial #3": $(D^{430}+D^{425}+D^{407}+1)X(D)+(D^{582}+D^{47}+D^{45}+1)P(D)=0$ "Check polynomial #4": $(D^{434}+D^{353}+D^{127}+1)X(D)+(D^{345}+D^{207}+D^{38}+1)P(D)=0$ |

In the above description, a case in which the coding rate is ½ has been described as an example, but a regular LDPC code is also formed and good received quality can be obtained when the coding rate is (n−1)/n if the above "remainder" related condition (remainder rule) holds true for four coefficient sets in information X1(D), X2(D), . . . , Xn−1(D).

In the case of a time varying period of 2, also, it has been confirmed that a code with good characteristics can be found if the above "remainder" related condition (remainder rule) is applied. An LDPC-CC of a time varying period of 2 with good characteristics is described below. A case in which the coding rate is ½ is described below as an example.

Consider Equations 160-1 and 160-2 as parity check polynomials of an LDPC-CC for which the time varying period is 2. At this time, X(D) is polynomial representation of data (information) and P(D) is polynomial representation of parity. Here, in Equations 161-1 and 161-2, parity check polynomials have been assumed in which there are four terms in X(D) and P(D) respectively, the reason being that four or more terms are desirable from the standpoint of obtaining good received quality.

$$(D^{a1}+D^{a2}+D^{a3}+D^{a4})X(D)+(D^{b1}+D^{b2}+D^{b3}+D^{b4})P(D)=0 \quad \text{(Equation 161-1)}$$

$$(D^{A1}+D^{A2}+D^{A3}+D^{A4})X(D)+(D^{B1}+D^{B2}+D^{B3}+D^{B4})P(D)=0 \quad \text{(Equation 161-2)}$$

In Equation 161-1, it is assumed that a1, a2, a3, and a4 are integers (where a1≠a2≠a3≠a4). Also, it is assumed that b1, b2, b3, and b4 are integers (where b1≠b2≠b3≠b4). A parity check polynomial of Equation 161-1 is called "check equation #1," and a sub-matrix based on a parity check polynomial of Equation 161-1 is designated first sub-matrix $H_1$.

In Equation 161-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of Equation 161-2 is called "check equation #2," and a sub-matrix based on a parity check polynomial of Equation 160-2 is designated second sub-matrix $H_2$.

Next, an LDPC-CC of a time varying period of 2 generated from first sub-matrix $H_1$ and second sub-matrix $H_2$ is considered.

At this time, if a remainder after dividing the values of combinations of orders of X(D) and P(D) (a1, a2, a3, a4), (b1, b2, b3, b4), (A1, A2, A3, A4), (B1, B2, B3, B4), in Equations 161-1 and 161-2 by 4 is designated k, provision is made for one each of remainders 0, 1, 2, and 3 to be included in four coefficient sets represented as shown above (for example, (a1, a2, a3, a4)), and to hold true for all above four coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2, 3 are included in the four coefficient sets as remainder (k). Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2, 3 are included in the four coefficient sets as remainder (k). It is assumed that the above "remainder" related condition (remainder rule) also holds true for the four coefficient sets of X(D) and P(D) of "check equation #2."

By this means, the column weight of parity check matrix H configured from Equations 161-1 and 161-2 becomes 4 for all columns, and a regular LDPC code can be formed. Here, a regular LDPC code is an LDPC code that is defined by a parity check matrix for which each column weight is fixed, and is characterized by the fact that its characteristics are stable and an error floor is unlikely to occur. In particular, since the characteristics are good when the column weight is 8, an LDPC-CC enabling reception performance to be further improved can be obtained by generating an LDPC-CC as described above.

Table 7 shows examples of LDPC-CCs (LDPC-CCs #1 and #2) of a time varying period of 2 and a coding rate of ½ for which the above "remainder" related condition (remainder rule) holds true. In Table 7, LDPC-CCs of a time varying period of 2 are defined by two parity check polynomials: "check polynomial #1" and "check polynomial #2."

TABLE 7

| Code | Parity Check Polynomials |
|---|---|
| LDPC-CC #1 of time varying period of 2 and coding rate ½ | "Check polynomial #1": $(D^{551}+D^{465}+D^{98}+1)X(D)+(D^{407}+D^{386}+D^{373}+1)P(D)=0$ "Check polynomial #2": $(D^{443}+D^{433}+D^{54}+1)X(D)+(D^{559}+D^{557}+D^{546}+1)P(D)=0$ |
| LDPC-CC #2 of time varying period of 2 and coding rate ½ | "Check polynomial #1": $(D^{265}+D^{190}+D^{99}+1)X(D)+(D^{295}+D^{246}+D^{69}+1)P(D)=0$ "Check polynomial #2": $(D^{275}+D^{226}+D^{213}+1)X(D)+(D^{298}+D^{147}+D^{45}+1)P(D)=0$ |

In the above description (LDPC-CCs of a time varying period of 2), a case in which the coding rate is ½ has been described as an example, but a regular LDPC code is also formed and good received quality can be obtained when the coding rate is (n−1)/n if the above "remainder" related condition (remainder rule) holds true for four coefficient sets in information X1(D), X2(D), . . . , Xn−1 (D).

In the case of a time varying period of 3, also, it has been confirmed that a code with good characteristics can be found if the "remainder" related condition below is applied. LDPC-CC of a time varying period of 3 with good characteristics is described below. A case in which the coding rate is ½ is described below as an example.

Consider Equations 162-1 through 162-3 as parity check polynomials of an LDPC-CC for which the time varying period is 3. At this time, X(D) is polynomial representation of data (information) and P(D) is a parity polynomial representation. Here, in Equations 162-1 through 162-3, parity check polynomials are assumed such that there are three terms in X(D) and P(D) respectively.

$$(D^{a1}+D^{a2}+D^{a3})X(D)+(D^{b1}+D^{b2}+D^{b3})P(D)=0 \quad \text{(Equation 162-1)}$$

$$(D^{A1}+D^{A2}+D^{A3})X(D)+(D^{B1}+D^{B2}+D^{B3})P(D)=0 \quad \text{(Equation 162-2)}$$

$$(D^{\alpha1}+D^{\alpha2}+D^{\alpha3})X(D)+(D^{\beta1}+D^{\beta2}+D^{\beta3})P(D)=0 \quad \text{(Equation 162-3)}$$

In Equation 162-1, it is assumed that a1, a2, and a3 are integers (where a1≠a2≠a3). Also, it is assumed that b1, b2 and b3 are integers (where b1≠b2≠b3). A parity check polynomial of Equation 162-1 is called "check equation #1," and a sub-matrix based on a parity check polynomial of Equation 162-1 is designated first sub-matrix $H_1$.

In Equation 162-2, it is assumed that A1, A2 and A3 are integers (where A1≠A2≠A3). Also, it is assumed that B1, B2 and B3 are integers (where B1≠B2≠B3). A parity check polynomial of Equation 162-2 is called "check equation #2," and a sub-matrix based on a parity check polynomial of Equation 162-2 is designated second sub-matrix $H_2$.

In Equation 162-3, it is assumed that α1, α2 and α3 are integers (where α1≠α2≠α3). Also, it is assumed that β1, β2 and β3 are integers (where β1≠β2≠β3). A parity check polynomial of Equation 162-3 is called "check equation #3," and a sub-matrix based on a parity check polynomial of Equation 162-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if a remainder after dividing the values of combinations of orders of X(D) and P(D) (a1, a2, a3), (b1, b2, b3), (A1, A2, A3), (B1, B2, B3), (α1, α2, α3), (β1, β2, β3) in Equations 162-1 through 162-3 by 3 is designated k, provision is made for one each of remainders 0, 1, and 2 to be included in three coefficient sets represented as shown above (for example, (a1, a2, a3)), and to hold true for all above three coefficient sets.

For example, if orders (a1, a2, a3) of X(D) of "check equation #1" are set as (a1, a2, a3)=(6, 5, 4), remainders k after dividing orders (a1, a2, a3) by 3 are (0, 2, 1), and one each of 0, 1, are included in the three coefficient sets as remainder (k). Similarly, if orders (b1, b2, b3) of P(D) of "check equation #1" are set as (b1, b2, b3)=(3, 2, 1), remainders k after dividing orders (b1, b2, b3) by 3 are (0, 2, 1), and one each of 0, 1, 2 are included in the three coefficient sets as remainder (k). It is assumed that the above "remainder" related condition (remainder rule) also holds true for the three coefficient sets of X(D) and P(D) of "check equation #2" and "check equation #3."

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained. This is because, when considered in column units, positions at which a "1" is present are arranged so as to propagate belief accurately, as described above.

The above belief propagation will be described below using accompanying drawings. FIG. 67A shows parity check polynomials and a parity check matrix H configuration of LDPC-CC of a time varying period of 3.

"Check equation #1" illustrates a case in which (a1, a2, a3)=(2, 1, 0) and (b1, b2, b3)=(2, 1, 0) in a parity check polynomial of Equation 162-1, and remainders after dividing the coefficients by 3 are as follows: (a1%3, a2%3, a3%3)=(2, 1, 0), (b1%3, b2%3, b3%3)=(2, 1, 0), where "Z %3" represents a remainder after dividing Z by 3.

"Check equation #2" illustrates a case in which (A1, A2, A3)=(5, 1, 0) and (B1, B2, B3)=(5, 1, 0) in a parity check polynomial of Equation 162-2, and remainders after dividing the coefficients by 3 are as follows: (A1%3, A2%3, A3%3)=(2, 1, 0), (B1%3, B2%3, B3%3)=(2, 1, 0).

"Check equation #3" illustrates a case in which (α1, α2, α3)=(4, 2, 0) and (β1, β2, β3)=(4, 2, 0) in a parity check polynomial of Equation 162-3, and remainders after dividing the coefficients by 3 are as follows: (α1%3, α2%3, α3%3)=(1, 2, 0), (β1%3, β2%3, β3%3)=(1, 2, 0).

Therefore, the example of LDPC-CC of a time varying period of 3 shown in FIG. 67A satisfies the above-described "remainder" related condition (remainder rule), that is, a condition whereby (a1%3, a2%3, a3%3), (b1%3, b2%3, b3%3), (A1%3, A2%3, A3%3), (B1%3, B2%3, B3%3), (α1%3, α2%3, α3%3), (β1%3, β2%3, β3%3) are any of the following: (0, 1, 2), (0, 2, 1), (1, 0, 2), (1, 2, 0), (2, 0, 1), (2, 1, 0).

Returning to FIG. 67A again, belief propagation will now be explained. Through column computation of column 6506 in BP decoding, for a "1" of area 6501 of "check equation #1," belief is propagated from a "1" of area 6504 of "check equation #2" and a "1" of area 6505 of "check equation #3." As described above, a "1" of area 6501 of "check equation #1" is a coefficient for which a remainder after division by 3 is 0 (a3%3=0 (a3=0) or b3%3=0 (b3=0)). Also, a "1" of area 6504 of "check equation #2" is a coefficient for which a remainder after division by 3 is 1 (A2%3=1 (A2=1) or B2%3=1 (B2=1)). Furthermore, a "1" of area 6505 of "check equation #3" is a coefficient for which a remainder after division by 3 is 2 (α2%3=2 (α2=2) or β2%3=2 (β2=2)).

Thus, for a "1" of area 6501 for which a remainder is 0 in a coefficient of "check equation #1," in column computation of column 6506 in BP decoding, belief is propagated from a "1" of area 6504 for which a remainder is 1 in a coefficient of "check equation #2" and a "1" of area 6505 for which a remainder is 2 in a coefficient of "check equation #3."

Similarly, for a "1" of area 6502 for which a remainder is 1 in a coefficient of "check equation #1," in column computation of column 6509 in BP decoding, belief is propagated from a "1" of area 6507 for which a remainder is 2 in a coefficient of "check equation #2" and a "1" of area 6508 for which a remainder is 0 in a coefficient of "check equation #3."

Similarly, for a "1" of area 6503 for which a remainder is 2 in a coefficient of "check equation #1," in column computation of column 6512 in BP decoding, belief is propagated from a "1" of area 6510 for which a remainder is 0 in a coefficient "check equation #2" and a "1" of area 6511 for which a remainder is 1 in a coefficient "check equation #3."

A supplementary explanation of belief propagation will now be given using FIG. 67B. FIG. 67B shows the belief propagation relationship of terms relating to X(D) of "check equation #1" through "check equation #3" in FIG. 67A. "Check equation #1" through "check equation #3" in FIG. 67A illustrate cases in which (a1, a2, a3)=(2, 1, 0), (A1, A2, A3)=(5, 1, 0), and (α1, α2, α3)=(4, 2, 0), in terms relating to X(D) of Equations 162-1 through 162-3.

In FIG. 67B, terms (a3, A3, α3) inside squares indicate coefficients for which a remainder after division by 3 is 0, terms (a2, A2, α2) inside circles indicate coefficients for which a remainder after division by 3 is 1, and terms (a1, A1, α1) inside diamond-shaped boxes indicate coefficients for which a remainder after division by 3 is 2.

As can be seen from FIG. 67B, for a1 of "check equation #1," belief is propagated from A3 of "check equation #2" and α1 of "check equation #3" for which remainders after division by 3 differ; for a2 of "check equation #1," belief is propagated from A1 of "check equation #2" and α3 of "check equation #3" for which remainders after division by 3 differ; and for a3 of "check equation #1," belief is propagated from A2 of "check equation #2" and α2 of "check equation #3" for which remainders after division by 3 differ. While FIG. 67B shows the belief propagation relationship of terms relating to X(D) of "check equation #1" through "check equation #3," the same can be said for terms relating to P(D).

Thus, for "check equation #1," belief is propagated from coefficients for which remainders after division by 3 are 0, 1, and 2 among coefficients of "check equation #2." That is to say, for "check equation #1," belief is propagated from coefficients for which remainders after division by 3 are all different among coefficients of "check equation #2." Therefore, reliabilities with low correlation are all propagated to "check equation #1."

Similarly, for "check equation #2," belief is propagated from coefficients for which remainders after division by 3 are 0, 1, and 2 among coefficients of "check equation #1." That is to say, for "check equation #2," belief is propagated from coefficients for which remainders after division by 3 are all different among coefficients of "check equation #1." Also, for "check equation #2," belief is propagated from coefficients for which remainders after division by 3 are 0, 1, and 2 among coefficients of "check equation #3." That is to say, for "check equation #2," belief is propagated from coefficients for which remainders after division by 3 are all different among coefficients of "check equation #3."

Similarly, for "check equation #3," belief is propagated from coefficients for which remainders after division by 3 are 0, 1, and 2 among coefficients of "check equation #1." That is to say, for "check equation #3," belief is propagated from coefficients for which remainders after division by 3 are all different among coefficients of "check equation #1." Also, for "check equation #3," belief is propagated from coefficients for which remainders after division by 3 are 0, 1, and 2 among coefficients of "check equation #2." That is to say, for "check equation #3," belief is propagated from coefficients for which remainders after division by 3 are all different among coefficients of "check equation #2."

By providing for the orders of parity check polynomials of Equations 162-1 through 162-3 to satisfy the above-described "remainder" related condition (remainder rule) in this way, belief is necessarily propagated in all column computations, and therefore belief propagation can be performed efficiently in all check equations, and error correction capability can be further increased.

A case in which the coding rate is ½ has been described above for LDPC-CC of a time varying period of 3, but the coding rate is not limited to 12. A regular LDPC code is also formed and good received quality can be obtained when the coding rate is (n−1)/n (where n is an integer of 2 or above) if the above "remainder" related condition (remainder rule) holds true for three coefficient sets in information X1(D), X2(D), . . . , Xn−1(D).

A case in which the coding rate is (n−1)/n (where n is an integer of 2 or above) is described below.

Consider Equations 163-1 through 163-3 as parity check polynomials of an LDPC-CC for which the time varying period is 3. At this time, X1(D), X2(D), . . . , Xn−1(D) are polynomial representations of data (information) X1, X2, . . . , Xn−1, and P(D) is polynomial representation of parity. Here, in Equations 163-1 through 163-3, parity check polynomials are assumed such that there are three terms in X1(D), X2(D), . . . , Xn−1(D), and P(D) respectively.

$$(D^{a1,1}+D^{a1,2}+D^{a1,3})X_1(D)+(D^{a2,1}+D^{a2,2}+D^{a2,3})X_2(D)+\dots+(D^{an-1,1}+D^{an-1,2}+D^{an-1,3})X_{n-1}(D)+(D^{b1}+D^{b2}+D^{b3})P(D)=0 \quad \text{(Equation 163-1)}$$

$$(D^{A1,1}+D^{A1,2}+D^{A1,3})X_1(D)+(D^{A2,1}+D^{A2,2}+D^{A2,3})X_2(D)+\dots+(D^{An-1,1}+D^{An-1,2}+D^{An-1,3})X_{n-1}(D)+(D^{B1}+D^{B2}+D^{B3})P(D)=0 \quad \text{(Equation 163-2)}$$

$$(D^{\alpha1,1}+D^{\alpha1,2}+D^{\alpha1,3})X_1(D)+(D^{\alpha2,1}+D^{\alpha2,2}+D^{\alpha2,3})X_2(D)+\dots+(D^{\alpha n-1,1}+D^{\alpha n-1,2}+D^{\alpha n-1,3})X_{n-1}(D)+(D^{\beta1}+D^{\beta2}+D^{\beta3})P(D)=0 \quad \text{(Equation 163-3)}$$

In Equation 163-1, it is assumed that $a_{i,1}$, $a_{i,2}$, and $a_{i,3}$ (i=1,2, . . . , n−1) are integers (where $a_{i,1}\neq a_{i,2}\neq a_{i,3}$). Also, it is assumed that b1, b2 and b3 are integers (where b1≠b2≠b3). A parity check polynomial of Equation 163-1 is called "check equation #1," and a sub-matrix based on a parity check polynomial of Equation 163-1 is designated first sub-matrix $H_1$.

In Equation 163-2, it is assumed that $A_{i,1}$, $A_{i,2}$, and $A_{i,3}$ (i=1, 2, . . . , n−1) are integers (where $A_{i,1}\neq A_{i,2}\neq A_{i,3}$). Also, it is assumed that B1, B2 and B3 are integers (where B1≠B2≠B3). A parity check polynomial of Equation 163-2 is called "check equation #2," and a sub-matrix based on a parity check polynomial of Equation 163-2 is designated second sub-matrix $H_2$.

In Equation 163-3, it is assumed that $\alpha_{i,1}$, $\alpha_{i,2}$, and $\alpha_{i,3}$ (i=1, 2, . . . , n−1) are integers (where $\alpha_{i,1}\neq\alpha_{i,2}\neq\alpha_{i,3}$). Also, it is assumed that β1, β2 and β3 are integers (where β1≠β2≠β3). A parity check polynomial of Equation 163-3 is called "check equation #3," and a sub-matrix based on a parity check polynomial of Equation 163-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if a remainder after dividing the values of combinations of orders X1(D), X2(D), . . . , Xn−1(D), and P(D) $(a_{1,1}, a_{1,2}, a_{1,3})$, $(a_{2,1}, a_{2,2}, a_{2,3})$, . . . , $(a_{n-1,1}, a_{n-1,2}, a_{n-1,3})$, (b1, b2, b3), $(A_{1,1}, A_{1,2}, A_{1,3})$, $(A_{2,1}, A_{2,2}, A_{2,3})$, . . . , $(A_{n-1,1}, A_{n-1,2}, A_{n-1,3})$, (B1, B2, B3), $(\alpha_{1,1}, \alpha_{1,2}, \alpha_{1,3})$, $(\alpha_{2,1}, \alpha_{2,2}, \alpha_{2,3})$, . . . , $(\alpha_{n-1,1}, \alpha_{n-1,2}, \alpha_{n-1,3})$, (β1, β2, β3) in Equations 163-1 through 163-3 by 3 is designated k, provision is made for one each of remainders 0, 1, and 2 to be included in three coefficient sets represented as shown above (for example, $(a_{1,1}, a_{1,2}, a_{1,3})$), and to hold true for all above three coefficient sets.

That is to say, provision is made for $(a_{1,1}\%3, a_{1,2}\%3, a_{1,3}\%3)$, $(a_{2,1}\%3, a_{2,2}\%3, a_{2,3}\%3)$, . . . , $(a_{n-1,1}\%3, a_{n-1,2}\%3, a_{n-1,3}\%3)$, (b1%3, b2%3, b3%3), $(A_{1,1}\%3, A_{1,2}\%3, A_{1,3}\%3)$, $(A_{2,1}\%3, A_{2,2}\%3, A_{2,3}\%3)$, . . . , $(A_{n-1,1}\%3, A_{n-1,2}\%3, A_{n-1,3}\%3)$, (B1%3, B2%3, B3%3), $(\alpha_{1,1}\%3, \alpha_{1,2}\%3, \alpha_{1,3}\%3)$, $(\alpha_{2,1}\%3, \alpha_{2,2}\%3, (\alpha_{2,3}\%3)$, . . . , $(\alpha_{n-1,1}\%3, \alpha_{n-1,2}\%3, \alpha_{n-1,3}\%3)$, (β1%3, β2%3, (β3%3) to be any of the following: (0, 1, 2), (0, 2, 1), (1, 0, 2), (1, 2, 0), (2, 0, 1), (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained in the same way as in the case of a coding rate of 12.

Table 8 shows examples of LDPC-CCs (LDPC-CCs #1, #2, #3, #4, and #5) of a time varying period of 3 and a coding rate of 12 for which the above "remainder" related condition (remainder rule) holds true. In Table 8, LDPC-CCs of a time varying period of 3 are defined by three parity check polynomials: "check (polynomial) equation #1," "check (polynomial) equation #2," and "check (polynomial) equation #3."

TABLE 8

| Code | Parity Check Polynomials |
|---|---|
| LDPC-CC #1 of time varying period of 3 and coding rate ½ | "Check polynomial #1": $(D^{428}+D^{325}+1)X(D)+(D^{538}+D^{332}+1)P(D)=0$<br>"Check polynomial #2": $(D^{538}+D^{380}+1)X(D)+(D^{449}+D^{1}+1)P(D)=0$<br>"Check polynomial #3": $(D^{583}+D^{170}+1)X(D)+(D^{364}+D^{242}+1)P(D)=0$ |
| LDPC-CC #2 of time varying period of 3 and coding rate ½ | "Check polynomial #1": $(D^{562}+D^{71}+1)X(D)+(D^{325}+D^{155}+1)P(D)=0$<br>"Check polynomial #2": $(D^{215}+D^{106}+1)X(D)+(D^{566}+D^{142}+1)P(D)=0$<br>"Check polynomial #3": $(D^{590}+D^{559}+1)X(D)+(D^{127}+D^{110}+1)P(D)=0$ |
| LDPC-CC #3 of time varying period of 3 and coding rate ½ | "Check polynomial #1": $(D^{112}+D^{53}+1)X(D)+(D^{110}+D^{88}+1)P(D)=0$<br>"Check polynomial #2": $(D^{103}+D^{47}+1)X(D)+(D^{85}+D^{83}+1)P(D)=0$<br>"Check polynomial #3": $(D^{148}+D^{89}+1)X(D)+(D^{146}+D^{49}+1)P(D)=0$ |
| LDPC-CC #4 of time varying period of 3 and coding rate ½ | "Check polynomial #1": $(D^{350}+D^{322}+1)X(D)+(D^{448}+D^{338}+1)P(D)=0$<br>"Check polynomial #2": $(D^{529}+D^{32}+1)X(D)+(D^{238}+D^{188}+1)P(D)=0$<br>"Check polynomial #3": $(D^{592}+D^{572}+1)X(D)+(D^{578}+D^{568}+1)P(D)=0$ |
| LDPC-CC #5 of time varying period of 3 and coding rate ½ | "Check polynomial #1": $(D^{410}+D^{82}+1)X(D)+(D^{835}+D^{47}+1)P(D)=0$<br>"Check polynomial #2": $(D^{875}+D^{796}+1)X(D)+(D^{962}+D^{871}+1)P(D)=0$<br>"Check polynomial #3": $(D^{605}+D^{547}+1)X(D)+(D^{950}+D^{439}+1)P(D)=0$ |

It has been confirmed that, as in the case of a time varying period of 3, a code with good characteristics can be found if the "remainder" related condition (remainder rule) below is applied to an LDPC-CC for which the time varying period is a multiple of 3 (for example, 6, 9, 12, . . . ). An LDPC-CC of a multiple of a time varying period of 3 with good characteristics is described below. The case of an LDPC-CC of a coding rate of ½ and a time varying period of −6 is described below as an example.

Consider Equations 164-1 through 164-6 as parity check polynomials of an LDPC-CC for which the time varying period is 6.

$$(D^{a1,1}+D^{a1,2}+D^{a1,3})X(D)+(D^{b1,1}+D^{b1,2}+D^{b1,3})P(D)=0 \quad \text{(Equation 164-1)}$$

$$(D^{a2,1}+D^{a2,2}+D^{a2,3})X(D)+(D^{b2,1}+D^{b2,2}+D^{b2,3})P(D)=0 \quad \text{(Equation 164-2)}$$

$$(D^{a3,1}+D^{a3,2}+D^{a3,3})X(D)+(D^{b3,1}+D^{b3,2}+D^{b3,3})P(D)=0 \quad \text{(Equation 164-3)}$$

$$(D^{a4,1}+D^{a4,2}+D^{a4,3})X(D)+(D^{b4,1}+D^{b4,2}+D^{b4,3})P(D)=0 \quad \text{(Equation 164-4)}$$

$$(D^{a5,1}+D^{a5,2}+D^{a5,3})X(D)+(D^{b5,1}+D^{b5,2}+D^{b5,3})P(D)=0 \quad \text{(Equation 164-5)}$$

$$(D^{a6,1}+D^{a6,2}+D^{a6,3})X(D)+(D^{b6,1}+D^{b6,2}+D^{b6,3})P(D)=0 \quad \text{(Equation 164-6)}$$

At this time, X(D) is polynomial representation of data (information) and P(D) is a parity polynomial representation. With an LDPC-CC of a time varying period of 6, if i %6=k (where k=0, 1, 2, 3, 4, 5) is assumed for parity Pi and information Xi of time i, a parity check polynomial of Equation 164-(k+1) holds true. For example, if i=1, i %6=1 (k=1), and therefore Equation 165 holds true.

$$(D^{a2,1}+D^{a2,2}+D^{a2,3})X_1+(D^{b2,1}+D^{b2,2}+D^{b2,3})P_1=0 \quad \text{(Equation 165)}$$

Here, in Equations 164-1 through 164-6, parity check polynomials are assumed such that there are three terms in X(D) and P(D) respectively.

In Equation 164-1, it is assumed that a1,1, a1,2, a1,3 are integers (where a1,1≠a1,2≠a1,3). Also, it is assumed that b1,1, b1,2, and b1,3 are integers (where b1,1≠b1,2≠b1,3). A parity check polynomial of Equation 164-1 is called "check equation #1," and a sub-matrix based on a parity check polynomial of Equation 164-1 is designated first sub-matrix $H_1$.

In Equation 164-2, it is assumed that a2,1, a2,2, and a2,3 are integers (where a2,1≠a2,2≠a2,3). Also, it is assumed that b2,1, b2,2, b2,3 are integers (where b2,1≠b2,2≠b2,3). A parity check polynomial of Equation 164-2 is called "check equation #2," and a sub-matrix based on a parity check polynomial of Equation 164-2 is designated second sub-matrix $H_2$.

In Equation 164-3, it is assumed that a3,1, a3,2, and a3,3 are integers (where a3,1≠a3,2≠a3,3). Also, it is assumed that b3,1, b3,2, and b3,3 are integers (where b3,1≠b3,2≠b3,3). A parity check polynomial of Equation 164-3 is called "check equation #3," and a sub-matrix based on a parity check polynomial of Equation 164-3 is designated third sub-matrix $H_3$.

In Equation 164-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of Equation 164-4 is called "check equation #4," and a sub-matrix based on a parity check polynomial of Equation 164-4 is designated fourth sub-matrix $H_4$.

In Equation 164-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of Equation 164-5 is called "check equation #5," and a sub-matrix based on a parity check polynomial of Equation 164-5 is designated fifth sub-matrix $H_5$.

In Equation 164-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of Equation 164-6 is called "check equation #6," and a sub-matrix based on a parity check polynomial of Equation 164-6 is designated sixth sub-matrix $H_6$.

Next, an LDPC-CC of a time varying period of 6 is considered that is generated from first sub-matrix $H_1$, second sub-matrix $H_2$, third sub-matrix $H_3$, fourth sub-matrix $H_4$, fifth sub-matrix $H_5$, and sixth sub-matrix $H_6$.

At this time, if a remainder after dividing the values of combinations of orders of X(D) and P(D) (a1,1,a1,2,a1,3), (b1,1,b1,2,b1,3), (a2,1,a2,2,a2,3), (b2,1,b2,2,b2,3), (a3,1,a3,2,a3,3), (b3,1,b3,2,b3,3), (a4,1,a4,2,a4,3), (b4,1,b4,2,b4,3), (a5,1,a5,2,a5,3), (b5,1,b5,2,b5,3), (a6,1,a6,2,a6,3), (b6,1,b6,2,b 6,3) in Equations 164-1 through 164-6 by 3 is designated k, provision is made for one each of remainders 0, 1, and 2 to be included in three coefficient sets represented as shown above (for example, (a1,1,a1,2,a1,3)), and to hold true for all above three coefficient sets. That is to say, provision is made for (a1,1%3,a1,2%3,a1,3%3), (b1,1%3,b1,2%3,b1,3%3), (a2,1%3,a2,2% 3,a2,3%3), (b2,1%3, b2,2%3, b2,3%3), (a3, 1%3, a3,2%3, a3,3%3), (b3, 1%3, b3,2%3, b3,3%3), (a4,1% 3, a4,2%3, a4,3% 3), (b4,1% 3, b4,2%3, b4,3%3), (a5,1%3, a5,2% 3, a5,3% 3), (b5,1%3, b5,2%3, b5,3% 3), (a6,1% 3, a6,2%3, a6,3%3), (b6,1%3, b6,2%3, b6,3%3) to be any of the following: (0,1,2), (0,2,1), (1,0,2), (1,2,0), (2,0,1), (2,1,0).

By generating an LDPC-CC in this way, if an edge is present when a Tanner graph is drawn for "check equation #1," belief in "check equation #2 or check equation #5" and belief in "check equation #3 or check equation #6" are propagated accurately. Also, if an edge is present when a Tanner graph is drawn for "check equation #2," belief in "check equation #1 or check equation #4" and belief in "check equation #3 or check equation #6" are propagated accurately; if an edge is present when a Tanner graph is drawn for "check equation #3", belief in "check equation #1 or check equation #4" and belief in "check equation #2 or check equation #5" are propagated accurately; if an edge is present when a Tanner graph is drawn for "check equation #4," belief in "check equation #2 or check equation #5" and belief in "check equation #3 or check equation #6" are propagated accurately; if an edge is present when a Tanner graph is drawn for "check equation #5," belief in "check equation #1 or check equation #4" and belief in "check equation #3 or check equation #6" are, propagated accurately; and if an edge is present when a Tanner graph is drawn for "check equation #6," belief in "check equation #1 or check equation #4" and belief in "check equation #2 or check equation #5" are propagated accurately. Consequently, an LDPC-CC of a time varying period of 6 can maintain better error correction capability in the same way as when the time varying period is 3.

In this regard, belief propagation will be described using FIG. 67C. FIG. 67C shows the belief propagation relationship of terms relating to X(D) of "check equation #1" through "check equation #6." In FIG. 67C, a square indicates a coefficient for which a remainder after division by 3 in ax,y (where x=1, 2, 3, 4, 5, 6, and y=1, 2, 3) is 0; a circle indicates a coefficient for which a remainder after division by 3 in ax,y (where x=1, 2, 3, 4, 5, 6, and y=1, 2, 3) is 1; and a diamond-shaped box indicates a coefficient for which a remainder after division by 3 in ax,y (where x=1, 2, 3, 4, 5, 6, and y=1, 2, 3) is 2. As can be seen from FIG. 67C, if an edge is present when a Tanner graph is drawn, for a1,1 of "check equation #1," belief is propagated from "check equation #2 or #5" and "check equation #3 or #6" for which remainders after division by 3 differ. Similarly, if an edge is present when a Tanner graph is drawn, for a1,2 of "check equation #1," belief is propagated from "check equation #2 or #5" and "check equation #3 or #6" for which remainders after division by 3 differ. Similarly, if an edge is present when a Tanner graph is drawn, for a1,3 of "check equation #1," belief is propagated from "check equation #2 or #5" and "check equation #3 or #6" for which remainders after division by 3 differ. While FIG. 67C shows the belief propagation relationship of terms relating to X(D) of "check equation #1" through "check equation #6," the same can be said for terms relating to P(D).

Thus, belief is propagated to each node in a "check equation #1" Tanner graph from coefficient nodes of other than "check equation #1." Therefore, reliabilities with low correlation are all propagated to "check equation #1," enabling an improvement in error correction capability to be expected.

In FIG. 67C, "check equation #1" has been focused upon, but a Tanner graph can be drawn in a similar way for "check equation #2" through "check equation #6," and belief is propagated to each node in a "check equation #K" Tanner graph from coefficient nodes of other than "check equation #K." Therefore, reliabilities with low correlation are all propagated to "check equation #K" (where K=2, 3, 4, 5, 6), enabling an improvement in error correction capability to be expected.

By providing for the orders of parity check polynomials of Equations 164-1 through 164-6 to satisfy the above-described "remainder" related condition (remainder rule) in this way, belief can be propagated efficiently in all check equations, and the possibility of being able to further improve error correction capability is increased.

A case in which the coding rate is ½ has been described above for an LDPC-CC of a time varying period of 6, but the coding rate is not limited to ½. The possibility of obtaining good received quality can be increased when the coding rate is (n−1)/n (where n is an integer of 2 or above) if the above "remainder" related condition (remainder rule) holds true for three coefficient sets in information X1(D), X2(D), . . . , Xn−1(D).

A case in which the coding rate is (n−1)/n (where n is an integer of 2 or above) is described below.

Consider Equations 166-1 through 166-6 as parity check polynomials of an LDPC-CC for which the time varying period is 6.

$$(D^{\alpha\#1,1,1}+D^{\alpha\#1,1,2}+D^{\alpha\#1,1,3})X_1(D)+(D^{\alpha\#1,2,1}+D^{\alpha\#1,2,2}+D^{\alpha\#1,2,3})X_2(D)+\dots+(D^{\alpha\#1,n-1,1}+D^{\alpha\#1,n-1,2}+D^{\alpha\#1,n-1,3})X_{n-1}(D)+(D^{\alpha\#1,1}+D^{\alpha\#1,2}+D^{\alpha\#1,3})P(D)=0 \quad \text{(Equation 166-1)}$$

$$(D^{\alpha\#2,1,1}+D^{\alpha\#2,1,2}+D^{\alpha\#2,1,3})X_1(D)+(D^{\alpha\#2,2,1}+D^{\alpha\#2,2,2}+D^{\alpha\#2,2,3})X_2(D)+\dots+(D^{\alpha\#2,n-1,1}+D^{\alpha\#2,n-1,2}+D^{\alpha\#2,n-1,3})X_{n-1}(D)+(D^{\alpha\#2,1}+D^{\alpha\#2,2}+D^{\alpha\#2,3})P(D)=0 \quad \text{(Equation 166-2)}$$

$$(D^{\alpha\#3,1,1}+D^{\alpha\#3,1,2}+D^{\alpha\#3,1,3})X_1(D)+(D^{\alpha\#3,2,1}+D^{\alpha\#3,2,2}+D^{\alpha\#3,2,3})X_2(D)+\dots+(D^{\alpha\#3,n-1,1}+D^{\alpha\#3,n-1,2}+D^{\alpha\#3,n-1,3})X_{n-1}(D)+(D^{\alpha\#3,1}+D^{\alpha\#3,2}+D^{\alpha\#3,3})P(D)=0 \quad \text{(Equation 166-3)}$$

$$(D^{\alpha\#4,1,1}+D^{\alpha\#4,1,2}+D^{\alpha\#4,1,3})X_1(D)+(D^{\alpha\#4,2,1}+D^{\alpha\#4,2,2}+D^{\alpha\#4,2,3})X_2(D)+\dots+(D^{\alpha\#4,n-1,1}+D^{\alpha\#4,n-1,2}+D^{\alpha\#4,n-1,3})X_{n-1}(D)+(D^{\alpha\#4,1}+D^{\alpha\#4,2}+D^{\alpha\#4,3})P(D)=0 \quad \text{(Equation 166-4)}$$

$$(D^{\alpha\#5,1,1}+D^{\alpha\#5,1,2}+D^{\alpha\#5,1,3})X_1(D)+(D^{\alpha\#5,2,1}+D^{\alpha\#5,2,2}+D^{\alpha\#5,2,3})X_2(D)+\dots+(D^{\alpha\#5,n-1,1}+D^{\alpha\#5,n-1,2}+D^{\alpha\#5,n-1,3})X_{n-1}(D)+(D^{\alpha\#5,1}+D^{\alpha\#5,2}+D^{\alpha\#5,3})P(D)=0 \quad \text{(Equation 166-5)}$$

$$(D^{\alpha\#6,1,1}+D^{\alpha\#6,1,2}+D^{\alpha\#6,1,3})X_1(D)+(D^{\alpha\#6,2,1}+D^{\alpha\#6,2,2}+D^{\alpha\#6,2,3})X_2(D)+\dots+(D^{\alpha\#6,n-1,1}+D^{\alpha\#6,n-1,2}+D^{\alpha\#6,n-1,3})X_{n-1}(D)+(D^{\alpha\#6,1}+D^{\alpha\#6,2}+D^{\alpha\#6,3})P(D)=0 \quad \text{(Equation 166-6)}$$

At this time, X1(D), X2(D), . . . , Xn−1(D) are polynomial representations of data (information) X1, X2, . . . , Xn−1, and P(D) is polynomial representation of parity. Here, in Equations 166-1 through 166-6, parity check polynomials are assumed such that there are three terms in X1(D), X2(D), . . . , Xn−1(D), and P(D) respectively. Thinking in the same way as in the case of the above coding rate of ½, and in the case of a time varying period of 3, the possibility of being able to obtain higher error correction capability is increased if the condition below (<Condition #1>) is satisfied in an LDPC-CC of a time varying period of 6 and a coding rate of (n−1)/n (where n is an integer of 2 or above) represented by parity check polynomials of Equations 166-1 through 166-6.

In an LDPC-CC of a time varying period of 6 and a coding rate of (n−1)/n (where n is an integer of 2 or above), parity and information of time i are represented by Pi and $X_{i,1}$, $X_{i,2}$, . . . , $X_{i,n-1}$ respectively. If i %6=k (where k=0, 1, 2, 3, 4, 5) is assumed at this time, a parity check polynomial of Equation 166-(k+1) holds true. For example, if i=8, i %6=2 (k=2), and therefore Equation 167 holds true.

$$(D^{\alpha\#3,1,1}+D^{\alpha\#3,1,2}+D^{\alpha\#3,1,3})X_{8,1}+(D^{\alpha\#3,2,1}+D^{\alpha\#3,2,2}+D^{\alpha\#3,2,3})X_{8,2}+\ldots+(D^{\alpha\#3,n-1,1}+D^{\alpha\#3,n-1,2}+D^{\alpha\#3,n-1,3})X_{8,n-1}+(D^{\alpha\#3,1}+D^{\alpha\#3,2}+D^{\alpha\#3,3})P_{8}0 \quad \text{(Equation 167)}$$

<Condition #1>

In Equations 166-1 through 166-6, combinations of orders of X1(D), X2(D), . . . , Xn−1(D), and P(D) satisfy the following condition. ($a_{\#1,1,1}$%3, $a_{\#1,1,2}$%3, $a_{\#1,1,3}$%3), ($a_{\#1,2,1}$%3, $a_{\#1,2,2}$%3, $a_{\#1,2,3}$%3), . . . , ($a_{\#1,k,1}$%3, $a_{\#1,k,2}$%3, $a_{\#1,k,3}$%3), . . . , ($a_{\#1,n-1,1}$%3, $a_{\#1,n-1,2}$%3, $a_{\#1,n-1,3}$%3), ($b_{\#1,1}$%3, $b_{\#1,2}$%3, $b_{\#1,3}$%3) are any of (0, 1, 2), (0, 2, 1), (1, 0, 2), (1, 2, 0), (2, 0, 1), or (2, 1, 0) (where k=1, 2, 3, . . . , n−1), and ($a_{\#2,1,1}$%3, $a_{\#2,1,2}$%3, $a_{\#2,1,3}$%3), ($a_{\#2,2,1}$%3, $a_{\#2,2,2}$%3, $a_{\#2,2,3}$%3), . . . , ($a_{\#2,k,1}$%3, $a_{\#2,k,2}$%3, $a_{\#2,k,3}$%3), . . . , ($a_{\#2,n-1,1}$%3, $a_{\#2,n-1,2}$%3, $a_{\#2,n-1,3}$%3), ($b_{\#2,1}$%3, $b_{\#2,2}$%3, $b_{\#2,3}$%3) are any of (0, 1, 2), (0, 2, 1), (1, 0, 2), (1, 2, 0), (2, 0, 1), or (2, 1, 0) (where k=1, 2, 3, . . . , n−1), and ($a_{\#3,1,1}$%3, $a_{\#3,1,2}$%3, $a_{\#3,1,3}$%3), ($a_{\#3,2,1}$%3, $a_{\#3,2,2}$%3, $a_{\#3,2,3}$%3), . . . , ($a_{\#3,k,1}$%3, $a_{\#3,k,2}$%3, $a_{\#3,k,3}$%3), . . . , ($a_{\#3,n-1,1}$%3, $a_{\#3,n-1,2}$%3, $a_{\#3,n-1,3}$%3), ($b_{\#3,1}$%3, $b_{\#3,2}$%3, $b_{\#3,3}$%3) are any of (0, 1, 2), (0, 2, 1), (1, 0, 2), (1, 2, 0), (2, 0, 1), or (2, 1, 0) (where k=1, 2, 3, . . . , n−1), and ($a_{\#4,1}$%3, $a_{\#4,1,2}$%3, $a_{\#4,1,3}$%3), ($a_{\#4,2,1}$%3, $a_{\#4,2,2}$%3, $a_{\#4,2,3}$%3), . . . , ($a_{\#4,k,1}$%3, $a_{\#4,k,2}$%3, $a_{\#4,k,3}$%3), . . . , ($a_{\#4,n-1,1}$%3, $a_{\#4,n-1,2}$%3, $a_{\#4,n-1,3}$%3), ($b_{\#4,1}$%3, $b_{\#4,2}$%3, $b_{\#4,3}$%3) are any of (0, 1, 2), (0, 2, 1), (1, 0, 2), (1, 2, 0), (2, 0, 1), or (2, 1, 0) (where k=1, 2, 3, . . . , n−1), and ($a_{\#5,1,1}$%3, $a_{\#5,1,2}$%3, $a_{\#5,1,3}$%3), ($a_{\#5,2,1}$%3, $a_{\#5,2,2}$%3, $a_{\#5,2,3}$%3), . . . , ($a_{\#5,k,1}$%3, $a_{\#5,k,2}$%3, $a_{\#5,k,3}$%3), . . . , ($a_{\#5,n-1,1}$%3, $a_{\#5,n-1,2}$%3, $a_{\#5,n-1,3}$%3), ($b_{\#5,1}$%3, $b_{\#5,2}$%3, $b_{\#5,3}$%3) are any of (0, 1, 2), (0, 2, 1), (1, 0, 2), (1, 2, 0), (2, 0, 1), or (2, 1, 0) (where k=1, 2, 3, . . . , n−1), and ($a_{\#6,1,1}$%3, $a_{\#6,1,2}$%3, $a_{\#6,1,3}$%3), ($a_{\#6,2,1}$%3, $a_{\#6,2,2}$%3, $a_{\#6,2,3}$%3), ($a_{\#6,k,1}$%3, $a_{\#6,k,2}$%3, $a_{\#6,k,3}$%3), . . . , ($a_{\#6,n-1,1}$%3, $a_{\#6,n-1,2}$%3, $a_{\#6,n-1,3}$%3), ($b_{\#6,1}$%3, $b_{\#6,2}$%3, $b_{\#6,3}$%3) are any of (0, 1, 2), (0, 2, 1), (1, 0, 2), (1, 2, 0), (2, 0, 1), or (2, 1, 0) (where k=1, 2, 3, . . . , n−1).

In the above description, a code having high error correction capability has been described for an LDPC-CC of a time varying period of 6, but a code having high error correction capability can also be generated when an LDPC-CC of a time varying period of 3g (where g=1, 2, 3, 4, . . . ) (that is, an LDPC-CC for which the time varying period is a multiple of 3) is created in the same way as with the design method for an LDPC-CC of a time varying period of −3 or −6. A configuration method for this code is described in detail below.

Consider Equations 168-1 through 168-3g as parity check polynomials of an LDPC-CC for which the time varying period is 3g (where g=1, 2, 3, 4, . . . ) and the coding rate is (n−1)/n (where n is an integer of 2 or above).

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\ldots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 168-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\ldots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 168-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\ldots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Equation 168-3)}$$

$$\vdots$$

$$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\ldots+(D^{a\#k,n-1,1}+D^{a\#k,n-1,2}+D^{a\#k,n-1,3})X_{n-1}(D)+(D^{b\#k,1}+D^{b\#k,2}+D^{b\#k,3})P(D)=0 \quad \text{(Equation 168-(3g-2))}$$

$$\vdots$$

$$(D^{a\#3g-2,1,1}+D^{a\#3g-2,1,2}+D^{a\#3g-2,1,3})X_1(D)+(D^{a\#3g-2,2,1}+D^{a\#3g-2,2,2}+D^{a\#3g-2,2,3})X_2(D)+\ldots+(D^{a\#3g-2,n-1,1}+D^{a\#3g-2,n-1,2}+D^{a\#3g-2,n-1,3})X_{n-1}(D)(D^{a\#3g-2,1}+D^{a\#3g-2,2}+D^{a\#3g-2,3})P(D)=0$$

$$(D^{a\#3g-1,1,1}+D^{a\#3g-1,1,2}+D^{a\#3g-1,1,3})X_1(D)+(D^{a\#3g-1,2,1}+D^{a\#3g-1,2,2}+D^{a\#3g-1,2,3})X_2(D)+\ldots+(D^{a\#3g-1,n-1,1}+D^{a\#3g-1,n-1,2}+D^{a\#3g-1,n-1,3})X_{n-1}(D)(D^{b\#3g-1,1}+D^{b\#3g-1,2}+D^{b\#3g-1,3})P(D)=0 \quad \text{(Equation 168-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\ldots+(D^{a\#3g,n-1,1}+D^{a\#3g,n-1,2}+D^{a\#3g,n-1,3})X_{n-1}(D)(D^{b\#3g,1}+D^{b\#3g,2}+D^{b\#3g,3})P(D)=0 \quad \text{(Equation 168-3g)}$$

At this time, X1 (D), X2(D), . . . , Xn−1 (D) are polynomial representations of data (information) X1, X2, . . . , Xn−1, and P(D) is polynomial representation of parity. Here, in Equations 168-1 through 168-3g, parity check polynomials are assumed such that there are three terms in X1(D), X2(D), . . . , Xn−1(D), and P(D) respectively.

In the case of an LDPC-CC of a time varying period of 3 and an LDPC-CC of a time varying period of 6, the possibility of being able to obtain higher error correction capability is increased if the condition below (<Condition #2>) is satisfied in an LDPC-CC of a time varying period of 3g and a coding rate of (n−1)/n (where n is an integer of 2 or above) represented by parity check polynomials of Equations 168-1 through 168-3g.

In an LDPC-CC of a time varying period of 3g and a coding rate of (n−1)/n (where n is an integer of 2 or above), parity and information of time i are represented by $P_i$ and $X_{i,1}$, $X_{i,2}$, . . . , $X_{i,n-1}$ respectively. If i %3g=k (where k=0, 1, 2, . . . , 3g−1) is assumed at this time, a parity check polynomial of Equation 168-(k+1) holds true. For example, if i=2, (k=2), and therefore Equation 169 holds true.

$$(D^{\alpha\#3,1,1}+D^{\alpha\#3,1,2}+D^{\alpha\#3,1,3})X_{2,1}+(D^{\alpha\#3,2,1}+D^{\alpha\#3,2,2}+D^{\alpha\#3,2,3})X_{2,2}+\ldots+(D^{\alpha\#3,n-1,1}+D^{\alpha\#3,n-1,2}+D^{\alpha\#3,n-1,3})X_{2,n-1}+(D^{\alpha\#3,1}+D^{\alpha\#3,2}+D^{\alpha\#3,3})P_2=0 \quad \text{(Equation 169)}$$

In Equations 168-1 through 168-3g, it is assumed that $a_{\#k,p,1}$, $a_{\#k,p,2}$, and $a_{\#k,p,3}$ are integers (where $a_{\#k,p,1} \neq a_{\#k,p,2} \neq a_{\#k,p,3}$) (where k=1, 2, 3, . . . , 3g, and p=1, 2, 3, . . . , n−1). Also, it is assumed that $b_{\#k,1}$, $b_{\#k,2}$, and $b_{\#k,3}$ are integers (where $b_{\#k,1} \neq b_{\#k,2} \neq b_{\#k,3}$). A parity check polynomial of Equation 168-k (where k=1, 2, 3, . . . , 3g) is called "check equation #k," and a sub-matrix based on a parity check polynomial of Equation 168-k is designated k'th sub-matrix $H_k$. Next, an LDPC-CC of a time varying period of 3g is considered that is generated from first sub-matrix $H_1$, second sub-matrix $H_2$, third sub-matrix $H_3$, . . . , and 3g'th sub-matrix $H_{3g}$.

<Condition #2>

In Equations 168-1 through 168-3g, combinations of orders of X1(D), X2(D), . . . , Xn−1(D), and P(D) satisfy the following condition. ($a_{\#1,1,1}$%3, $a_{\#1,1,2}$%3, $a_{\#1,1,3}$%3), ($a_{\#1,2,1}$%3, $a_{\#1,2,2}$%3, $a_{\#1,2,3}$%3), . . . , ($a_{\#1,p,1}$%3, $a_{\#1,p,2}$%3, $a_{\#1,p,3}$%3), . . . , ($a_{\#1,n-1,}$%3, $a_{\#1,n-1,2}$%3, $a_{\#1,n-1,3}$%3), ($b_{\#1,1}$%3, $b_{\#1,2}$%3, $b_{\#1,3}$%3) are any of (0, 1, 2), (0, 2, 1), (1, 0, 2), (1, 2, 0), (2, 0, 1), or (2, 1, 0) (where p=1, 2, 3, . . . , n−1)

and ($a_{\#2,1,1}$%3, $a_{\#2,1,2}$%3, $a_{\#2,1,3}$%3), ($a_{\#2,2,1}$%3, $a_{\#2,2,2}$%3, $a_{\#2,2,3}$%3), . . . , ($a_{\#2,p,1}$%3, $a_{\#2,p,2}$%3, $a_{\#2,p,3}$%3), . . . , ($a_{\#2,n-1,1}$%3, $a_{\#2,n-1,2}$%3, $a_{\#2,n-1,3}$%3), ($b_{\#2,1}$%−3, $b_{\#2,2}$%3, $b_{\#2,3}$%3) are any of (0, 1, 2), (0, 2, 1), (1, 0, 2), (1, 2, 0), (2, 0, 1), or (2, 1, 0) (where p=1, 2, 3, . . . , n−1)

and ($a_{\#3,1,1}$%3, $a_{\#3,1,2}$%3, $a_{\#3,1,3}$%3), ($a_{\#3,2,1}$%3, $a_{\#3,2,2}$%3, $a_{\#3,2,3}$%3), . . . , ($a_{\#3,p,1}$%3, $a_{\#3,p,2}$%3, $a_{\#3,p,3}$%3), . . . , , ($a_{\#3,n-1}$,1%3, $a_{\#3,n-1}$,2%3, $a_{\#3,n-1}$,3%3), ($b_{\#3,1}$%3, $b_{\#3,2}$%3, $b_{\#3,3}$%3) are any of (0, 1, 2), (0, 2, 1), (1, 0, 2), (1, 2, 0), (2, 0, 1), or (2, 1, 0) (where p=1, 2, 3, . . . , n−1)

and

⋮ and ($a_{\#k,1,1}$%3, $a_{\#k,1,2}$%3, $a_{\#k,1,3}$%3), ($a_{\#k,2,1}$%3, $a_{\#k,2,2}$%3, $a_{\#k,2,3}$%3), . . . , , ($a_{\#k,p,1}$%3, $a_{\#k,p,3}$%3), . . . , ($a_{\#k,n-1,1}$%3, $a_{\#k,n-1,2}$%3, $a_{\#k,n-1,3}$%3), ($b_{\#k,1}$%3, $b_{\#k,2}$%3, $b_{\#k,3}$%3) are any of (0, 1, 2), (0, 2, 1), (1, 0, 2), (1, 2, 0), (2, 0, 1), or (2, 1, 0) (where p=1, 2, 3, . . . , n−1)(where, k=1, 2, 3, . . . , 3g)

and

⋮ and ($a_{\#3g-2,1,1}$%3, $a_{\#3g-2,1,2}$%3, $a_{\#3g-2,1,3}$%3), ($a_{\#3g-2,2,1}$%3, $a_{\#3g-2,2,2}$%3, $a_{\#3g-2,2,3}$%3), . . . , ($a_{\#3g-2,p,1}$%3, $a_{\#3g-2,p,2}$%3, $a_{\#3g-2,p,3}$%3), . . . , ($a_{\#3g-2,n-1,1}$%3, $a_{\#3g-2,n-1,2}$%3, $a_{\#3g-2,n-1,3}$%3), ($b_{\#3g-2,1}$%3, $b_{\#3g-2,2}$%3, $b_{\#3g-2,3}$%3) are any of (0, 1, 2), (0, 2, 1), (1, 0, 2), (1, 2, 0), (2, 0, 1), or (2, 1, 0) (where p=1, 2, 3, . . . , n−1)

and ($a_{\#3g-1,1,1}$%3, $a_{\#3g-1,1,2}$%3, $a_{\#3g-1,1,3}$%3), ($a_{\#3g-1,2,1}$%3, $a_{\#3g-1,2,2}$%3, $a_{\#3g-1,2,3}$%3), . . . , ($a_{\#3g-1,p,1}$%3, $a_{\#3g\ 1,p,2}$%3, $a_{\#3g-1,p,3}$%3), . . . , ($a_{\#3g-1,n-1,1}$%3, $a_{\#3g-1,n-1,2}$%3, $a_{\#3g-1,n-1,3}$%3), ($b_{\#3g-1,1}$%3, $b_{\#3g-1,2}$%3, $b_{\#3g-1,3}$%3) are any of (0, 1, 2), (0, 2, 1), (1, 0, 2), (1, 2, 0), (2, 0, 1), or (2, 1, 0) (where p=1, 2, 3, . . . , n−1)

and ($a_{\#3g,1,1}$%3, $a_{\#3g,1,2}$%3, $a_{\#3g,1,3}$%3), ($a_{\#3g,2,1}$%3, $a_{\#3g,2,2}$%3, $a_{\#3g,2,3}$%3), . . . , ($a_{\#3g,p,}$ %3, $a_{\#3g,p,2}$%3, $a_{\#3g4,3}$ %3), . . . , $a_{\#3g,n-1,2}$%3, $a_{\#3g,n-1,3}$%3), ($b_{\#3g,1}$%3, $b_{\#3g,2}$%3, $b_{\#3g,3}$%3) are any of (0, 1, 2), (0, 2, 1), (1, 0, 2), (1, 2, 0), (2, 0, 1), or (2, 1, 0) (where p=1, 2, 3, . . . , n−1)

As also stated elsewhere than in this embodiment, taking ease of performing encoding into consideration, it is desirable for one "0" to be present among the three items ($b_{\#k,1}$%3, $b_{\#k,2}$%3, $b_{\#k,3}$%3) (where k=1, 2, . . . , 3g) in Equations 168-1 through 168-3g.

Also, in order to provide relevancy between parity bits and data bits of the same point in time, and to facilitate a search for a code having high correction capability, it is desirable for:

one "0" to be present among the three items ($a_{\#k,1,1}$%3, $a_{\#k,1,2}$%3, $a_{\#k,1,3}$%3);

one "0" to be present among the three items ($a_{\#k,2,1}$%3, $a_{\#k,2,2}$%3, $a_{\#k,2,3}$%3);

⋮ one "0" to be present among the three items ($a_{\#k,p,1}$%3, $a_{\#k,p,2}$%3, $a_{\#k,p,3}$%3);

⋮ and one "0" to be present among the three items ($a_{\#k,n-1,1}$%3, $a_{\#k,n-1,2}$%3, $a_{\#k,\ n-1,3}$%3), (where k=1, 2, . . . , 3g).

Next, an LDPC-CC of a time varying period of 3g (where g=2, 3, 4, 5, . . . ) that takes ease of encoding into account is considered. At this time, if the coding rate is (n−1)/n (where n is an integer of 2 or above), LDPC-CC parity check polynomials can be represented as shown below.

$$\begin{aligned}(D^{a\#1,1,1}+D^{a\#1,1,2}+D^{a\#1,1,3})X_1(D)+\\(D^{a\#1,2,1}+D^{a\#1,2,2}+D^{a\#1,2,3})X_2(D)+\ldots+\\(D^{a\#1,n-1,1}+D^{a\#1,n-1,2}+D^{a\#1,n-1,3})X_{n-1}(D)+\\(D^{b\#1,1}+D^{b\#1,2}+D^{b\#1,3})P(D)=0\end{aligned} \quad \text{(Equation 170-1)}$$

$$\begin{aligned}(D^{a\#2,1,1}+D^{a\#2,1,2}+D^{a\#2,1,3})X_1(D)+\\(D^{a\#2,2,1}+D^{a\#2,2,2}+D^{a\#2,2,3})X_2(D)+\ldots+\\(D^{a\#2,n-1,1}+D^{a\#2,n-1,2}+D^{a\#2,n-1,3})X_{n-1}(D)+\\(D^{b\#2,1}+D^{b\#2,2}+D^{b\#2,3})P(D)=0\end{aligned} \quad \text{(Equation 170-2)}$$

$$\begin{aligned}(D^{a\#3,1,1}+D^{a\#3,1,2}+D^{a\#3,1,3})X_1(D)+\\(D^{a\#3,2,1}+D^{a\#3,2,2}+D^{a\#3,2,3})X_2(D)+\ldots+\\(D^{a\#3,n-1,1}+D^{a\#3,n-1,2}+D^{a\#3,n-1,3})X_{n-1}(D)+\\(D^{b\#3,1}+D^{b\#3,2}+1)P(D)=0\end{aligned} \quad \text{(Equation 170-3)}$$

$$\vdots$$

$$\begin{aligned}(D^{a\#k,1,1}+D^{a\#k,1,2}+D^{a\#k,1,3})X_1(D)+\\(D^{a\#k,2,1}+D^{a\#k,2,2}+D^{a\#k,2,3})X_2(D)+\ldots+\\(D^{a\#k,n-1,1}+D^{a\#k,n-1,2}+D^{a\#k,n-1,3})X_{n-1}(D)+\\(D^{b\#k,1}+D^{b\#k,2}+1)P(D)=0\end{aligned} \quad \text{(Equation 170-k)}$$

$$\vdots$$

$$\begin{aligned}(D^{a\#3g-2,1,1}+D^{a\#3g-2,1,2}+D^{a\#3g-2,1,3})X_1(D)+\\(D^{a\#3g-2,2,1}+D^{a\#3g-2,2,2}+D^{a\#3g-2,2,3})X_2(D)+\\\ldots+\\(D^{a\#3g-2,n-1,1}+D^{a\#3g-2,n-1,2}+D^{a\#3g-2,n-1,3})\\X_{n-1}(D)(D^{b\#3g-2,1}+D^{b\#3g-2,2}+1)P(D)=0\end{aligned} \quad \text{(Equation 170-(3g-2))}$$

$$\begin{aligned}(D^{a\#3g-1,1,1}+D^{a\#3g-1,1,2}+D^{a\#3g-1,1,3})X_1(D)+\\(D^{a\#3g-1,2,1}+D^{a\#3g-1,2,2}+D^{a\#3g-1,2,3})X_2(D)+\\\ldots+\\(D^{a\#3g-1,n-1,1}+D^{a\#3g-1,n-1,2}+D^{a\#3g-1,n-1,3})\\X_{n-1}(D)(D^{b\#3g-1,1}+D^{b\#3g-1,2}+1)P(D)=0\end{aligned} \quad \text{(Equation 170-(3g-1))}$$

$$\begin{aligned}(D^{a\#3g,1,1}+D^{a\#3g,1,2}+D^{a\#3g,1,3})X_1(D)+\\(D^{a\#3g,2,1}+D^{a\#3g,2,2}+D^{a\#3g,2,3})X_2(D)+\\\ldots+(D^{a\#3g,n-1,1}+D^{a\#3g,n-1,2}+D^{a\#3g,n-1,3})\\X_{n-1}(D)(D^{b\#3g,1}+D^{b\#3g,2}+1)P(D)=0\end{aligned} \quad \text{(Equation 170-3g)}$$

At this time, X1(D), X2(D), . . . , Xn−1(D) are polynomial representations of data (information) X1, X2, . . . , Xn−1, and P(D) is polynomial representation of parity. Here, in Equations 170-1 through 170-3g, parity check polynomials are assumed such that there are three terms in X1(D), X2(D), . . . , Xn−1(D), and P(D) respectively. In an LDPC-CC of a time varying period of 3g and a coding rate of (n−1)/n (where n is an integer of 2 or above), parity and information of time i are represented by Pi and $X_{i,2}$, $X_{i,2}$, . . . , $X_{i,n-1}$ respectively. If i %3g=k (where k=0, 1, 2, . . . , 3g−1) is assumed at this time, a parity check polynomial of Equation 170-(k+1) holds true. For example, if i=2, i %3=2 (k=2), and therefore Equation 171 holds true.

$$(D^{\alpha\#3,1,1}+D^{\alpha\#3,1,2}+D^{\alpha\#3,1,3})X_{2,1}+(D^{\alpha\#3,2,1}+D^{\alpha\#3,2,2}+D^{\alpha\#3,2,3})X_{2,2}+\dots+(D^{\alpha\#3,n-1,1}+D^{\alpha\#3,n-1,2}+D^{\alpha\#3,n-1,3})X_{2,n-1}+(D^{\alpha\#3,1}+D^{\alpha\#3,2}+1)P_2=0 \qquad \text{(Equation 171)}$$

If <Condition #3> and <Condition #4> are satisfied at this time, the possibility of being able to create a code having higher error correction capability is increased.

<Condition #3>

In Equations 170-1 through 170-3g, combinations of orders of X1(D), X2(D), . . . , Xn−1(D), and P(D) satisfy the following condition. $(a_{\#1,1,1}\%3, a_{\#1,1,2}\%3, a_{\#1,1,3}\%3)$, $(a_{\#1,2,1}\%3, a_{\#1,2,2}\%3, a_{\#1,2,3}\%3)$, . . . , $a_{\#1,p,2}\%3, a_{\#1,p,3}\%3)$, . . . , $a_{\#1,n-1,2}\%3, a_{\#1,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1)

and $(a_{\#2,1,1}\%3, a_{\#2,1,2}\%3, a_{\#2,1,3}\%3)$, $(a_{\#2,2,1}\%3, a_{\#2,2,2}\%3, a_{\#2,2,3}\%3)$, . . . , $(a_{\#24,1}\%3, a_{\#2,p,2}\%3, a_{\#2,p,3}\%3)$, . . . , $(a_{\#2,n-1,1}\%3, a_{\#2,n-1,2}\%3, a_{\#2,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1)

and $(a_{\#3,1,1}\%3, a_{\#3,1,2}\%3, a_{\#3,1,3}\%3)$, $(a_{\#3,2,1}\%3, a_{\#3,2,2}\%3, a_{\#3,2,3}\%3)$, . . . , $(a_{\#3,p,1}\%3, a_{\#3,p,2}\%3, a_{\#3,p,3}\%3)$, . . . , $(a_{\#3,n-1,1}\%3, a_{\#3,n-1,2}\%3, a_{\#3,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1)

⋮ and $(a_{\#k,1,1}\%3, a_{\#k,1,2}\%3, a_{\#k,1,3}\%3)$, $(a_{\#k,2,1}\%3, a_{\#k,2,2}\%3, a_{\#k,2,3}\%3)$, . . . , $(a_{\#k,p,1}\%3, a_{\#k,p,2}\%3, a_{\#k,p,3}\%3)$, . . . , $(a_{\#l,n-1,1}\%3, a_{\#k,n-1,2}\%3, a_{\#k,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1) (where, k=1, 2, 3, . . . , 3g)

and

⋮ and $(a_{\#3g-2,1,1}\%3, a_{\#3g-2,1,2}\%3, a_{\#3g-2,1,3}\%3)$ $(a_{\#3g-2,2,1}\%3, a_{\#3g-2,2,2}\%3, a_{\#3g-2,2,3}\%3)$, . . . , $(a_{\#3g-2,p,1}\%3, a_{\#3g-2,p,2}\%3, a_{\#3g-2,p,3}\%3)$, . . . , $(a_{\#3g-2,n-1,1}\%3, a_{\#3g-2,n-1,2}\%3, a_{\#3g-2,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1)

and $(a_{\#3g,1,1,1}\%3, a_{\#3g-1,1,2}\%3, a_{\#3g-1,1,3}\%3)$, $(a_{\#3g-1,2,1}\%3, a_{\#3g-1,2,2}\%3, a_{\#3g-1,2,3}\%3)$, . . . , $(a_{\#3g-1,p,1}\%3, a_{\#3g-1,p,2}\%3, a_{\#3g-1,p,3}\%3)$, . . . , $(a_{\#3g-1,n-1,1}\%3, a_{\#3g-1,n-1,2}\%3, a_{\#3g-1,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1)

and $(a_{\#3g,1,1}\%3, a_{\#3g,1,2}\%3, a_{\#3g,1,3}\%3)$, $(a_{\#3g,2,1}\%3, a_{\#3g,2,2}\%3, a_{\#3g,2,3}\%3)$, . . . , $(a_{\#3g,p,1}\%3, a_{\#3g,p,2}\%3, a_{\#3g,p,3}\%3)$, $(a_{\#3g,n-1,1}\%3, a_{\#3g,n-1,2}\%3, a_{\#3g,n-1,3}\%3)$ are any of (0, 1, 2), (0, 2, 1), (1, 0, 2), (1, 2, 0), (2, 0, 1), or (2, 1, 0) (where p=1, 2, 3, . . . , n−1)

In Equations 170-1 through 170-3g, combinations of orders P(D) satisfy the following condition.

$(b_{\#1,1}\%3, b_{\#1,2}\%3)$, $(b_{\#2,1}\%3, b_{\#2,2}\%3)$, $(b_{\#3,1}\%3, b_{\#3,2}\%3)$, . . . , $(b_{\#k,1}\%3, b_{\#k,2}\%3)$, $(b_{\#3g-2,1}\%3, b_{\#3g-2,2}\%3)$, $(b_{\#3g-1,1}\%3, b_{\#3g-1,2}\%3)$, $(b_{\#3g,1}\%3, b_{\#3g,2}\%3)$ are any of (1, 2), or (2, 1) (where k=1, 2, 3, . . . , 3g)

<Condition #3> has a similar relationship with respect to Equations 170-1 through 170-3g as <Condition #2> has with respect to Equations 168-1 through 168-3g. If the condition below (<Condition #4>) is added for Equations 170-1 through 170-3g in addition to <Condition #3>, the possibility of being able to create an LDPC-CC having higher error correction capability is increased.

<Condition #4>

The following condition is satisfied for orders of P(D) of Equations 170-1 through 170-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: $(b_{\#1,1}\%3g, b_{\#1,2}\%3g)$, $(b_{\#2,1}\%3g, b_{\#2,2}\%3g)$, $(b_{\#3,1}\%3g, b_{\#3,2}\%3g)$, . . . , $(b_{\#k,1}\%3g, b_{\#k,2}\%3g)$, . . . , $(b_{\#3g-2,1}\%3g, b_{\#3g-2,2}\%3g)$, $(b_{\#3g-1,1}\%3g, b_{\#3g-1,2}\%3g)$, $(b_{\#3g,1}\%3g, b_{\#3g,2}\%3g)$.

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is (n−1)/n (where n is an integer of 2 or above) that has parity check polynomials of Equations 170-1 through 170-3g, if a code is created in which <Condition #4> is applied in addition to <Condition #3> it is possible to provide randomness while maintaining regularity for positions at which "1"s are present in a parity check matrix, and therefore the possibility of obtaining good error correction capability is increased.

Next, an LDPC-CC of a time varying period of −3g (where g=2, 3, 4, 5, . . . ) is considered that enables encoding to be performed easily and provides relevancy to parity bits and data bits of the same point in time. At this time, if the coding rate is (n−1)/n (where n is an integer of 2 or above), LDPC-CC parity check polynomials can be represented as shown below.

$$(D^{a\#1,1,1}+D^{a\#1,1,2}+1)X_1(D)+(D^{a\#1,2,1}+D^{a\#1,2,2}+1)X_2(D)+\dots+(D^{a\#1,n-1,1}+D^{a\#1,n-1,2}+1)X_{n-1}(D)+(D^{b\#1,1}+D^{b\#1,2}+1)P(D)=0 \qquad \text{(Equation 172-1)}$$

$$(D^{a\#2,1,1}+D^{a\#2,1,2}+1)X_1(D)+(D^{a\#2,2,1}+D^{a\#2,2,2}+1)X_2(D)+\dots+(D^{a\#2,n-1,1}+D^{a\#2,n-1,2}+1)X_{n-1}(D)+(D^{b\#2,1}+D^{b\#2,2}+1)P(D)=0 \qquad \text{(Equation 172-2)}$$

$$(D^{a\#3,1,1}+D^{a\#3,1,2}+1)X_1(D)+(D^{a\#3,2,1}+D^{a\#3,2,2}+1)X_2(D)+\dots+(D^{a\#3,n-1,1}+D^{a\#3,n-1,2}+1)X_{n-1}(D)+(D^{b\#3,1}+D^{b\#3,2}+1)P(D)=0 \qquad \text{(Equation 172-3)}$$

-continued $$\vdots$$

$$(D^{a\#k,1,1}+D^{a\#k,1,2}+1)X_1(D)+(D^{a\#k,2,1}+D^{a\#k,2,2}+1)X_2(D)+\ldots+(D^{a\#k,n-1,1}+D^{a\#k,n-1,2}+1)X_{n-1}(D)+(D^{b\#k,1}+D^{b\#k,2}+1)P(D)=0 \quad \text{(Equation 172-k)}$$

$$\vdots$$

$$(D^{a\#3g-2,1,1}+D^{a\#3g-2,1,2}+1)X_1(D)+(D^{a\#3g-2,2,1}+D^{a\#3g-2,2,2}+1)X_2(D)+\ldots+(D^{a\#3g-2,n-1,1}+D^{a\#3g-2,n-1,2}+1)X_{n-1}(D)\ (D^{a\#3g-2,1}+D^{a\#3g-2,2}+1)P(D)=0 \quad \text{(Equation 172-(3g-2))}$$

$$(D^{a\#3g-1,1,1}+D^{a\#3g-1,1,2}+1)X_1(D)+(D^{a\#3g-1,2,1}+D^{a\#3g-1,2,2}+1)X_2(D)+\ldots+(D^{a\#3g-1,n-1,1}+D^{a\#3g-1,n-1,2}+1)X_{n-1}(D)\ (D^{a\#3g-1,1}+D^{a\#3g-1,2}+1)P(D)=0 \quad \text{(Equation 172-(3g-1))}$$

$$(D^{a\#3g,1,1}+D^{a\#3g,1,2}+1)X_1(D)+(D^{a\#3g,2,1}+D^{a\#3g,2,2}+1)X_2(D)+\ldots+(D^{a\#3g,n-1,1}+D^{a\#3g,n-1,2}+1)X_{n-1}(D)\ (D^{b\#3g,1}+D^{b\#3g,2}+1)P(D)=0 \quad \text{(Equation 172-3g)}$$

At this time, X1(D), X2(D), . . . , Xn−1(D) are polynomial representations of data (information) X1, X2, . . . , Xn−1, and P(D) is polynomial representation of parity. In Equations 172-1 through 172-3g, parity check polynomials are assumed such that there are three terms in X1(D), X2(D), . . . , Xn−1 (D), and P(D) respectively, and a $D^0$ term is present in X1(D), X2(D), . . . , Xn−1(D), and P(D), (where k=1, 2, 3, . . . , 3g).

In an LDPC-CC of a time varying period of 3g and a coding rate of (n−1)/n (where n is an integer of 2 or above), parity and information of time i are represented by Pi and $X_{i,1}$, $X_{i,2}$, . . . , $X_{i,n-1}$ respectively. If i %3g=k (where k=0, 1, 2, . . . 3g−1) is assumed at this time, a parity check polynomial of Equation 172-(k+1) holds true. For example, if i=2, i %3g=2 (k=2), and therefore Equation 173 holds true.

$$(D^{\alpha\#3,1,1}+D^{\alpha\#3,1,2}+1)X_{2,1}+(D^{\alpha\#3,2,1}+D^{\alpha\#3,2,2}+1)X_{2,2}+\ldots+(D^{\alpha\#3,n-1,1}+D^{\alpha\#3,n-1,2}+1)X_{2,n-1}+(D^{\alpha\#3,1}+D^{\alpha\#3,2}+1)P_2=0 \quad \text{(Equation 173)}$$

If <Condition #5> and <Condition #6> are satisfied at this time, the possibility of being able to create a code having higher error correction capability is increased.

<Condition #5>

In Equations 172-1 through 172-3g, combinations of orders of X1(D), X2(D), . . . , Xn−1(D), and P(D) satisfy the following condition.

($a_{\#1,1,1}$%3, $a_{\#1,1,2}$%3), ($a_{\#1,2,1}$%3, $a_{\#1,2,2}$%3), . . . , ($a_{\#14,1}$%3, $a_{\#1,p,2}$%3), . . . , ($a_{\#1,n-1,1}$%3, $a_{\#1,n—1,2}$%3) are any of (1, 2), (2, 1) (p=1, 2, 3, . . . , n−1)

and ($a_{\#2,1,1}$%3, $a_{\#2,1,2}$%3), ($a_{\#2,2,1}$%3, $a_{\#2,2,2}$%3), . . . , ($a_{\#2,p,1}$%3, $a_{\#2,p,2}$%3), . . . , ($a_{\#2,n-1,1}$%3, $a_{\#2,n-1,2}$%3) are any of (1, 2), or (2, 1) (where p=1, 2, 3, . . . , n−1)

and ($a_{\#3,1,1}$%3, $a_{\#3,1,2}$%3), ($a_{\#3,2,1}$%3, $a_{\#3,2,2}$%3), . . . , ($a_{\#3,p,1}$%3, $a_{\#3,p,2}$%3), . . . , ($a_{\#3,n-1,1}$%3, $a_{\#3,n-1,2}$%3) are any of (1, 2), or (2, 1) (where p=1, 2, 3, . . . , n−1)

and $$\vdots$$

and ($a_{\#k,1,1}$%3, $a_{ttk,1,2}$%3), ($a_{\#k,2,1}$%3, $a_{\#k,2,2}$%3), . . . , ($a_{\#k,p,1}$%3, $a_{\#1,4,2}$%3), . . . , ($a_{\#k,n-1,1}$%3, $a_{\#k,n-1,2}$%3) are any of (1, 2), or (2, 1) (where p=1, 2, 3, . . . , n−1) (where, k=1, 2, 3, . . . , 3g)

and $$\vdots$$

($a_{\#3g-2,1,1}$%3, $a_{\#3g-2,1,2}$%3), ($a_{\#3g-2,2,1}$%3, $a_{\#3g-2,2,2}$%3) . . . , ($a_{\#3g-2,p,1}$%3, $a_{\#3g-24,2}$%3), . . . , ($a_{\#3g-2,n-1,1}$%3, $a_{\#3g-2,n-1,2}$%3) are any of (1, 2), or (2, 1) (where p=1, 2, 3, . . . , n−1)

and ($a_{\#3g-1}$-1%3, $a_{\#3g-1,1,2}$%3), ($a_{\#3g-1,2,1}$%3, $a_{\#3g-1,2,2}$%3) . . . , ($a_{\#3g-1,p,1}$%3, $a_{\#3g-1,p,2}$%3), . . . , ($a_{\#3g-1,n-1,1}$%3, $a_{\#3g-1,n-1,2}$%3) are any of (1, 2), or (2, 1) (where p=1, 2, 3, . . . , n−1)

and ($a_{\#3g,1,1}$%3, $a_{\#3g,1,2}$%3), ($a_{\#3g,2,1}$%3, $a_{\#3g,2,2}$%3), . . . , ($a_{\#3g,p,1}$%3, $a_{\#3g,p,2}$%3), . . . , ($a_{\#3g,n-1,1}$%3, $a_{\#3g,n-1,2}$%3) are any of (1, 2), or (2, 1) (where p=1, 2, 3, . . . , n−1)

In Equations 172-1 through 172-3g, combinations of orders of P(D) satisfy the following condition. ($b_{\#1,1}$%3, $b_{\#1,2}$%3), ($b_{\#2,1}$%3, $b_{\#2,2}$%3), ($b_{\#3,1}$%3, $b_{\#3,2}$%3), ($b_{\#k,1}$%3, $b_{\#k,2}$%3), . . . , ($b_{\#3g-2,1}$%3, $b_{\#3g-2,2}$%3), ($b_{\#3g-1,1}$%3, $b_{\#3g-1,2}$%3), ($b_{\#3g,1}$%3, $b_{\#3g,2}$%3) are any of (1, 2), or (2, 1) (where k=1, 2, 3, . . . , 3g)

<Condition #5> has a similar relationship with respect to Equations 172-1 through 172-3g as <Condition #2> has with respect to Equations 168-1 through 168-3g. If the condition below (<Condition #6>) is added for Equations 172-1 through 172-3g in addition to <Condition #5>, the possibility of being able to create a code having high error correction capability is increased.

<Condition #6>

The following condition is satisfied for orders of X1(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,1,1}$%3g, $a_{\#}$1,1,2%3g), ($a_{\#2,1,1}$%3g, $a_{\#}$2,1,2%3g), ($a_{\#p,1,1}$%3g, $a_{\#p,1,2}$%3g), ($a_{\#3g,1,1}$%3g, $a_{\#3g,1,2}$%3g) (where p=1, 2, 3, . . . , 3g)

and

The following condition is satisfied for orders of X2(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,2,1}$%3g, $a_{\#1,2,2}$%3g), ($a_{\#2,2,1}$%3g, $a_{\#2,2,2}$%3), . . . , ($a_{\#p,2,1}$%3g, $a_{\#p,2,2}$%3g), ($a_{\#3g,2,1}$%3g, $a_{\#3g,2,2}$%3g) (where p=1, 2, 3, . . . , 3g)

and

The following condition is satisfied for orders of X3(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,3,1}$%3g, $a_{\#1,3,2}$%3g), ($a_{\#2,3,1}$%3g, $a_{\#2,3,2}$%3g), ($a_{\#p,3,1}$%3g, $a_{\#p,3,2}$%3g), . . . , ($a_{\#3g,3,1}$%3g, $a_{\#3g,3,2}$%3g) (where p=1, 2, 3, . . . , 3g)

and $$\vdots$$

and

The following condition is satisfied for orders of Xk(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,k,1}$%3g, $a_{n,k,2}$%3g), ($a_{\#2,k,1}$%3g, $a_{\#2,k,2}$%3g), ($a_{\#p,k,1}$%3g, $a_{\#p,k,2}$%3g), ($a_{\#3g,k,1}$%3g, $a_{\#3g,k,}$ 2%3g) (where p=1, 2, 3, . . . , 3g) (where k=1, 2, 3, . . . , n−1)

and

•

⋮ and

The following condition is satisfied for orders of Xn−1(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,n-1,1}$%3g, $a_{\#1,n-1,2}$%3g), ($a_{\#2,n-1,1}$%3g, $a_{\#2,n-1,2}$%3g), . . . , ($a_{\#pn-1,1}$%3g, $a_{\#pn-1,2}$%3g), ($a_{\#3g,n-1,1}$%3g, $a_{\#3g,n-1,2}$%3g) (where p=1, 2, 3, . . . , 3g)

and

The following condition is satisfied for orders of P(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($b_{\#1,1}$%3g, $b_{\#1,2}$%3g), ($b_{\#2,1}$%3g, $b_{\#2,2}$%3g), ($b_{\#3,1}$%3g, $b_{\#3,2}$%3g), . . . , ($b_{\#k,1}$%3g, $b_{\#k,2}$%3g, . . . , ($b_{\#3g-2,1}$%3g, $b_{\#3g-2,2}$%3g), ($b_{\#3g-1,1}$%3g, $b_{\#3g-1,2}$%3g), ($b_{\#3g,1}$%3g, $b_{\#3g,2}$%3g) (where k=1, 2, 3, . . . , n−1)

The possibility of obtaining good error correction capability is high if there is also randomness while regularity is maintained for positions at which “1”s are present in a parity check matrix. With an LDPC-CC for which the time varying period is 3g (where g=2, 3, 4, 5, . . . ) and the coding rate is (n−1)/n (where n is an integer of 2 or above) that has parity check polynomials of Equations 172-1 through 172-3g, if a code is created in which <Condition #6> is applied in addition to <Condition #5> it is possible to provide randomness while maintaining regularity for positions at which “1”s are present in a parity check matrix, and therefore the possibility of obtaining good error correction capability is increased.

The possibility of being able to create a code having higher error correction capability is also increased if a code is created using <Condition #6'> instead of <Condition #6>, that is, with <Condition #6'> added in addition to <Condition #5>.

<Condition #6'>

The following condition is satisfied for orders of X1(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#}$1,1,1%3g, $a_{\#1,1,2}$%3g), ($a_{\#2,1,1}$%3g, $a_{\#2,1,2}$%3g), . . . , ($a_{\#p,1,1}$%3g, $a_{\#p,1,2}$%3g), . . . , ($a_{\#3g,1}$,1%3g, $a_{\#3g,1}$,2%3g) (where p=1, 2, 3, . . . , 3g)

or

The following condition is satisfied for orders of X2(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,2,1}$%3g, $a_{\#1,2,2}$%3g), ($a_{\#2,2,1}$%3g, $a_{\#2,2,2}$%3g), ($a_{\#p,2,1}$%3g, $a_{\#p,2,2}$%3g), . . . , ($a_{\#3g,2,1}$%3g, $a_{\#3g,2,2}$%3g) (where p=1, 2, 3, . . . , 3g)

or

The following condition is satisfied for orders of X3(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,3,1}$%3g, $a_{\#1,3,2}$%3), ($a_{\#2,3,1}$%3g, $a_{\#2,3,2}$%3g), . . . , ($a_{\#p,3,1}$%3g, $a_{\#p,3,2}$%3g), . . . , ($a_{\#3g,3,1}$%3g, $a_{\#3g,3,2}$%3g) (where p=1, 2, 3, . . . , 3g)

or

⋮ or

The following condition is satisfied for orders of Xk(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,k,1}$%3g, $a_{\#1,k,2}$%3g), ($a_{\#2,k,1}$%3g, $a_{\#2,k,2}$%3g), . . . , ($a_{\#p,k,1}$%3g, $a_{\#p,k,2}$%3g), . . . , ($a_{\#3g,k,1}$%3g, $a_{\#3g,k,2}$%3g) (where p=1, 2, 3, . . . , 3g) (where k=1, 2, 3, . . . , n−1)

or

⋮ or

The following condition is satisfied for orders of Xn−1(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,n-1,1}$%3g, $a_{\#1,n-1,2}$%3g), ($a_{\#2,n-1,1}$%3g, $a_{\#2,n-1,2}$%3g), . . . , ($a_{\#p,n-1,1}$%3g, $a_{\#p,n-1,2}$%3g), ($a_{\#3g,n-1,1}$%3g, $a_{\#3g,n-1,2}$%3g) (where p=1, 2, 3, . . . , 3g)

or

The following condition is satisfied for orders of P(D) of Equations 172-1 through 172-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($b_{\#1,1}$%3g, $b_{\#1,2}$%3g), ($b_{\#2,1}$%3g, $b_{\#2,2}$%3g), ($b_{\#3,1}$%3g, $b_{\#3,2}$%3g), . . . , ($b_{\#k,1}$%3g, $b_{\#k,2}$%3g), . . . , ($b_{\#3g-2,1}$%3g, $b_{\#3g-2,2}$%3g), ($b_{\#3g-1,1}$%3g, $b_{\#3g-1,2}$%3g), ($b_{\#3g-1}\%_{3g}$, $b_{\#3g,2}$%3g) (where k=1, 2, 3, . . . , 3g)

The above description relates to an LDPC-CC of a time varying period of 3g and a coding rate of (n−1)/n (where n is an integer of 2 or above). Below, conditions are described for orders of an LDPC-CC of a time varying period of 3g and a coding rate of ½ (n=2).

Consider Equations 174-1 through 174-3g as parity check polynomials of an LDPC-CC for which the time varying period is 3g (where g=1, 2, 3, 4, . . . ) and the coding rate is ½ (n=2).

$$(D^{a\#1,1,1} + D^{a\#1,1,2} + D^{a\#1,1,3})X(D) + (D^{b\#1,1} + D^{b\#1,2} + D^{b\#1,3})P(D) = 0 \quad \text{(Equation 174-1)}$$

$$(D^{a\#2,1,1} + D^{a\#2,1,2} + D^{a\#2,1,3})X(D) + (D^{b\#2,1} + D^{b\#2,2} + D^{b\#2,3})P(D) = 0 \quad \text{(Equation 174-2)}$$

$$(D^{a\#3,1,1} + D^{a\#3,1,2} + D^{a\#3,1,3})X(D) + (D^{b\#3,1} + D^{b\#3,2} + D^{b\#3,3})P(D) = 0 \quad \text{(Equation 174-3)}$$

$$\vdots$$

$$(D^{a\#k,1,1} + D^{a\#k,1,2} + D^{a\#k,1,3})X(D) + (D^{b\#k,1} + D^{b\#k,2} + D^{b\#k,3})P(D) = 0 \quad \text{(Equation 174-k)}$$

$$\vdots$$

$$(D^{a\#3g-2,1,1} + D^{a\#3g-2,1,2} + D^{a\#3g-2,1,3})X(D) + (D^{b\#3g-2,1} + D^{b\#3g-2,2} + D^{b\#3g-2,3})P(D) = 0 \quad \text{(Equation 174-(3g-2))}$$

-continued $$(D^{a\#3g-1,1,1}+D^{a\#3g-1,1,2}+D^{a\#3g-1,1,3})X(D)+(D^{b\#3g-1,1}+D^{b\#g-1,2}+D^{b\#3g-1,3})P(D)=0 \quad \text{(Equation 174-(3g-1))}$$

$$(D^{a\#3g,1,1}+D^{a\#3g,1,2}+D^{a\#3g,1,3})X(D)+(D^{b\#3g,1}+D^{b\#3g,2}+D^{b\#3g,3})P(D)=0 \quad \text{(Equation 174-3g)}$$

At this time, X is polynomial representation of data (information) X and P(D) is polynomial representation of parity. Here, in Equations 174-1 through 174-3g, parity check polynomials are assumed such that there are three terms in X(D) and P(D) respectively.

Thinking in the same way as in the case of an LDPC-CC of a time varying period of 3 and an LDPC-CC of a time varying period of 6, the possibility of being able to obtain higher error correction capability is increased if the condition below (<Condition #2-1>) is satisfied in an LDPC-CC of a time varying period of 3g and a coding rate of ½ (n=2) represented by parity check polynomials of Equations 174-1 through 174-3g.

In an LDPC-CC of a time varying period of 3g and a coding rate of ½ (n=2), parity and information of time i are represented by Pi and $X_{i,1}$ respectively. If i %3g=k (where k=0, 1, 2, . . . , 3g−1) is assumed at this time, a parity check polynomial of Equation 174-(k+1) holds true. For example, if i=2, i %3g=2 (k=2), and therefore Equation 175 holds true.

$$(D^{\alpha\#3,1,1}+D^{\alpha\#3,1,2}+D^{\alpha\#3,1,3})X_{2,1}+(D^{\alpha\#3,1}+D^{\alpha\#3,2}+D^{\alpha\#3,3})P_2=0 \quad \text{(Equation 175)}$$

In Equation 174-1 through 174-3g, it is assumed that $a_{\#k,1,1}$, $a_{\#k,1,2}$, and $a_{\#k,1,3}$ are integers (where $a_{\#k,1,1}\neq a_{\#k,1,2}\neq a_{\#k,1,3}$). Also, it is assumed that $b_{\#k,1}$, $b_{\#k,2}$, and $b_{\#k,3}$ are integers (where $b_{\#k,1}\neq b_{\#k,2}\neq b_{\#k,3}$) A parity check polynomial of Equation 174-k (k=1, 2, 3, . . . , 3g) is called "check equation #k," and a sub-matrix based on a parity check polynomial of Equation 174-k is designated kth sub-matrix $H_k$. Next, an LDPC-CC of a time varying period of 3g is considered that is generated from first sub-matrix $H_1$, second sub-matrix $H_2$, third sub-matrix $H_3$, . . . , and 3g'th sub-matrix $H_{ag}$ <Condition #2-1>

In Equations 174-1 through 174-3g, combinations of orders of X(D) and P(D) satisfy the following condition.

($a_{\#1,1,1}$%3, $a_{\#1,1,2}$%3, $a_{\#1,1,3}$%3), ($b_{\#1,1}$%3, $b_{\#1,2}$%3, $b_{\#1,3}$%3) are any of (0, 1, 2), (0, 2, 1), (1, 0, 2), (1, 2, 0), (2, 0, 1), or (2, 1, 0)

and ($a_{\#2,1,1}$%3, $a_{\#2,1,2}$%3, $a_{\#2,1,3}$%3), ($b_{\#2,1}$%3, $b_{\#2,2}$%3, $b_{\#2,3}$%3) are any of (0, 1, 2), (0, 2, 1), (1, 0, 2), (1, 2, 0), (2, 0, 1), or (2, 1, 0)

and ($a_{\#3,1,1}$%3, $a_{\#3,1,2}$%3, $a_{\#3,1,3}$%3), ($b_{\#3,1}$%3, $b_{\#3,2}$%3, $b_{\#3,3}$%3) are any of (0, 1, 2), (0, 2, 1), (1, 0, 2), (1, 2, 0), (2, 0, 1), or (2, 1, 0)

and

⋮ and ($a_{\#k,1,1}$%3, $a_{\#k,1,2}$%3, $a_{\#k,1,3}$%3), ($b_{\#k,1}$%3, $b_{\#k,2}$%3, $b_{\#k,3}$%3) are any of (0, 1, 2), (0, 2, 1), (1, 0, 2), (1, 2, 0), (2, 0, 1), or (2, 1, 0) (where k=1, 2, 3, . . . , 3g), and

⋮ and ($a_{\#3g-2,1,1}$%3, $a_{\#3g-2,1,2}$%3, $a_{\#3g-2,1,3}$%3), ($b_{\#3g-2,1}$%3, $b_{\#3g-2,2}$%3, $b_{\#3g-2,3}$%3) are any of (0, 1, 2), (0, 2, 1), (1, 0, 2), (1, 2, 0), (2, 0, 1), or (2, 1, 0)

and ($a_{\#3g-1,1,1}$%3, $a_{\#3g-1,1,2}$%3, $a_{\#3g-1,1,3}$%3), ($b_{\#3g-1,1}$%3, $b_{\#3g-1,2}$%3, $b_{\#3g-1,3}$%3) are any of (0, 1, 2), (0, 2, 1), (1, 0, 2), (1, 2, 0), (2, 0, 1), or (2, 1, 0)

and ($a_{\#3g,1,1}$%3, $a_{\#3g,1,2}$%3, $a_{\#3g,1,3}$%3), ($b_{\#3g,1}$%3, $b_{\#3g,2}$%3, $b_{\#3g,3}$%3) are any of (0, 1, 2), (0, 2, 1), (1, 0, 2), (1, 2, 0), (2, 0, 1), or (2, 1, 0)

As also stated elsewhere than in this embodiment, taking ease of performing encoding into consideration, it is desirable for one "0" to be present among the three items ($b_{\#k,1}$(703, $b_{\#k,2}$%3, and $b_{\#k,3}$%3) (where k=1, 2, . . . , 3g) in Equations 174-1 through 174-3g.

Also, in order to provide relevancy between parity bits and data bits of the same point in time, and to facilitate a search for a code having high correction capability, it is desirable for one "0" to be present among the three items ($a_{\#k,1,1}$%3, $a_{\#k,1,2}$%3, and $a_{\#k,1,3}$%3);

Next, an LDPC-CC of a time varying period of 3g (where g=2, 3, 4, 5, . . . ) that takes ease of encoding into account is considered. At this time, if the coding rate is ½ (n=2), LDPC-CC parity check polynomials can be represented as shown below.

$$(D^{a\#1,1,1}+D^{a\#1,1,2}+D^{a\#1,1,3})X(D)+(D^{b\#1,1}+D^{b\#1,2}+1)P(D)=0 \quad \text{(Equation 176-1)}$$

$$(D^{a\#2,1,1}+D^{a\#2,1,2}+D^{a\#2,1,3})X(D)+(D^{b\#2,1}+D^{b\#2,2}+1)P(D)=0 \quad \text{(Equation 176-2)}$$

$$(D^{a\#3,1,1}+D^{a\#3,1,2}+D^{a\#3,1,3})X(D)+(D^{b\#3,1}+D^{b\#3,2}+1)P(D)=0 \quad \text{(Equation 176-3)}$$

$$\vdots$$

$$(D^{a\#k,1,1}+D^{a\#k,1,2}+D^{a\#k,1,3})X(D)+(D^{b\#k,1}+D^{b\#k,2}+1)P(D)=0 \quad \text{(Equation 176-k)}$$

$$\vdots$$

$$(D^{a\#3g-2,1,1}+D^{a\#3g-2,1,2}+D^{a\#3g-2,1,3})X(D)+(D^{b\#3g-2,1}+D^{b\#g-2,2}+1)P(D)=0 \quad \text{(Equation 176-(3g-2))}$$

$$(D^{a\#3g-1,1,1}+D^{a\#3g-1,1,2}+D^{a\#3g-1,1,3})X(D)+(D^{b\#3g-1,1}+D^{b\#g-1,2}+1)P(D)=0 \quad \text{(Equation 176-(3g-1))}$$

$$(D^{a\#3g,1,1}+D^{a\#3g,1,2}+D^{a\#3g,1,3})X(D)+(D^{b\#3g,1}+D^{b\#3g,2}+1)P(D)=0 \quad \text{(Equation 176-3g)}$$

At this time, X(D) is polynomial representation of data (information) X and P(D) is polynomial representation of parity. Here, in Equations 176-1 through 176-3g, parity check polynomials are assumed such that there are three terms in X(D) and P(D) respectively. In an LDPC-CC of a time varying period of 3g and a coding rate of ½ (n=2), parity and information of time are represented by Pi and $X_{i,1}$ respectively. If i %3g=k (where k=0, 1, 2, . . . , 3g−1) is assumed at this time, a parity check polynomial of Equation 176-(k+1) holds true. For example, if i=2, %3g=2 (k=2), and therefore Equation 177 holds true.

$$(D^{\alpha\#3,1,1}+D^{\alpha\#3,1,2}+D^{\alpha\#3,1,3})X_{2,1}+(D^{\alpha\#3,1}+D^{\alpha\#3,2}+1)P_2=0 \quad \text{(Equation 177)}$$

If <Condition #3-1> and <Condition #4-1> are satisfied at this time, the possibility of being able to create a code having higher error correction capability is increased.

<Condition #3-1>

In Equations 176-1 through 176-3g, combinations of orders of X(D) satisfy the following condition. ($a_{\#}1,1,1\%3$, $a_{\#1,1,2}\%3$, $a_{\#1,1,3}\%3$) are any of (0, 1, 2), (0, 2, 1), (1, 0, 2), (1, 2, 0), (2, 0, 1), or (2, 1, 0)

and ($a_{\#2,1,1}\%3$, $a_{\#2,1,2}\%3$, $a_{\#2,1,3}\%3$) are any of (0, 1, 2), (0, 2, 1), (1, 0, 2), (1, 2, 0), (2, 0, 1), or (2, 1,0)

and ($a_{\#3,1,1}\%3$, $a_{\#3,1,2}\%3$, $a_{\#3,1,3}\%3$) are any of (0, 1, 2), (0, 2, 1), (1, 0, 2), (1, 2, 0), (2, 0, 1), or (2, 1, 0)

and

⋮ and ($a_{\#k,1,1}\%3$, $a_{\#k,1,2}\%3$, $a_{\#k,1,3}\%3$) are any of (0, 1, 2), (0, 2, 1), (1, 0, 2), (1, 2, 0), (2, 0, 1), or (2, 1, 0) (where k=1, 2, 3, . . . , 3g), and

⋮ and ($a_{\#3g-2,1,1}\%3$, $a_{\#3g-2,1,2}\%3$, $a_{\#3g-2,1,3}\%3$) are any of (0, 1, 2), (0, 2, 1), (1, 0, 2), (1, 2, 0), (2, 0, 1), or (2, 1, 0)

and ($a_{\#3g-1,1,1}\%3$, $a_{\#3g-1,1,2}\%3$, $a_{\#3g-1,1,3}\%3$) are any of (0, 1, 2), (0, 2, 1), (1, 0, 2), (1, 2, 0), (2, 0, 1), or (2, 1,0)

and ($a_{\#3g,1,1}\%3$, $a_{\#3g,1,2}\%3$, $a_{\#3g,1,3}\%3$) are any of (0, 1, 2), (0, 2, 1), (1, 0, 2), (1, 2, 0), (2, 0, 1), or (2, 1, 0)

In Equations 176-1 through 176-3g, combinations of orders of P(D) satisfy the following condition. ($b_{\#1,1}\%3$, $b_{\#1,2}\%3$), ($b_{\#2,1}\%3$, $b_{\#2,2}\%3$), ($b_{\#3,1}\%3$, $b_{\#3,2}\%3$), . . . , ($b_{\#k,1}\%3$, $b_{\#k,2}\%3$), . . . , ($b_{\#3g-2,1}\%3$, $b_{\#3g-2,2}\%3$), ($b_{\#3g-1,1}\%3$, $b_{\#3g-1,2}\%3$), ($b_{\#3g,1}\%3$, $b_{\#3g,2}\%3$) are any of (1, 2), or (2, 1) (k=1, 2, 3, . . . , 3g)

<Condition #3-1> has a similar relationship with respect to Equations 176-1 through 176-3g as <Condition #2-1> has with respect to Equations 174-1 through 174-3g. If the condition below (<Condition #4-1>) is added for Equations 176-1 through 176-3g in addition to <Condition #3-1>, the possibility of being able to create an LDPC-CC having higher error correction capability is increased.

<Condition #4-1>

The following condition is satisfied for orders of P(D) of Equations 176-1 through 176-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($b_{\#1,1}\%3g$, $b_{\#1,2}\%3g$), ($b_{\#2,1}\%3g$, $b_{\#2,2}\%3g$), ($b_{\#3,1}\%3g$, $b_{\#3,2}\%3g$), . . . , ($b_{\#k,1}\%3g$, $b_{\#k,2}\%3g$), . . . , ($b_{\#3g-2,1}\%3g$, $b_{\#3g-2,2}\%3g$), ($b_{\#3g-1,1}\%3g$, $b_{\#3g-1,2}\%3g$), ($b_{\#3g,1}\%3g$, $3_{g,2}\%3$).

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is ½ (n=2) that has parity check polynomials of Equations 176-1 through 176-3g, if a code is created in which <Condition #4-1> is applied in addition to <Condition #3-1> it is possible to provide randomness while maintaining regularity for positions at which "1"s are present in a parity check matrix, and therefore the possibility of obtaining better error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is ½ (n=2), LDPC-CC parity check polynomials can be represented as shown below.

$$(D^{a\#1,1,1}+D^{a\#1,1,2}+1)X(D)+(D^{b\#1,1}+D^{b\#1,2}+1)P(D)=0 \quad \text{(Equation 178-1)}$$

$$(D^{a\#2,1,1}+D^{a\#2,1,2}+1)X(D)+(D^{b\#2,1}+D^{b\#2,2}+1)P(D)=0 \quad \text{(Equation 178-2)}$$

$$(D^{a\#3,1,1}+D^{a\#3,1,2}+1)X(D)+(D^{b\#3,1}+D^{b\#3,2}+1)P(D)=0 \quad \text{(Equation 178-3)}$$

$$\vdots$$

$$(D^{a\#k,1,1}+D^{a\#k,1,2}+1)X(D)+(D^{b\#k,1}+D^{b\#k,2}+1)P(D)=0 \quad \text{(Equation 178-k)}$$

$$\vdots$$

$$(D^{a\#3g-2,1,1}+D^{a\#3g-2,1,2}+1)X(D)+(D^{b\#3g-2,1}+D^{b\#g-2,2}+1)P(D)=0 \quad \text{(Equation 178-(3g-2))}$$

$$(D^{a\#3g-1,1,1}+D^{a\#3g-1,1,2}+1)X(D)+(D^{b\#3g-1,1}+D^{b\#g-1,2}+1)P(D)=0 \quad \text{(Equation 178-(3g-1))}$$

$$(D^{a\#3g,1,1}+D^{a\#3g,1,2}+1)X(D)+(D^{b\#3g,1}+D^{b\#3g,2}+1)P(D)=0 \quad \text{(Equation 178-3g)}$$

At this time, X(D) is polynomial representation of data (information) X and P(D) is polynomial representation of parity. In Equations 178-1 through 178-3g, parity check polynomials are assumed such that there are three terms in X(D) and P(D) respectively, and a $D^0$ term is present in X(D) and P(D), (where k=1, 2, 3, . . . , 3g).

In an LDPC-CC of a time varying period of 3g and a coding rate of ½ (n=2), parity and information of time i are represented by Pi and $X_{i,1}$ respectively. If i %3g=k (where k=0, 1, 2, . . . , 3g−1) is assumed at this time, a parity check polynomial of Equation 178-(k+1) holds true. For example, if i=2, i %3g=2 (k=2), and therefore Equation 179 holds true.

$$(D^{\alpha\#3,1,1}+D^{\alpha\#3,1,2}+D^{\alpha\#3,1,3})X_{2,1}+(D^{\alpha\#3,1}+D^{\alpha\#3,2}+1)P_2=0 \quad \text{(Equation 179)}$$

If <Condition #5-1> and <Condition #6-1> are satisfied at this time, the possibility of being able to create a code having higher error correction capability is increased.

<Condition #5-1>

In Equations 178-1 through 178-3g, combinations of orders of X(D) satisfy the following condition.

($a_{\#1,1,1}\%3$, $a_{\#1,1,2}\%3$) is (1, 2) or (2, 1), and ($a_{\#2,1,1}\%3$, $a_{\#2,1,2}\%3$) is (1, 2) or (2, 1), and ($a_{\#3,1,1}\%3$, $a_{\#3,1,2}\%3$) is (1, 2) or (2, 1), and

⋮

($a_{\#k,1,1}\%3$, $a_{\#k,1,2}\%3$) is (1, 2) or (2, 1) (where k=1, 2, 3, . . . , 3g), and

⋮

($a_{\#3g-2,1}\%3$, $a_{\#}3g-2,1,2\%3$) is (1, 2) or (2, 1), and $a_{\#3g-1,1,2}$%3, $a_{\#3g-2,1,2}$%3) is (1, 2) or (2, 1), and ($a_{\#3g,1,1}$%3, $a_{\#3g,1,2}$%3) is (1, 2) or (2, 1).

In Equations 178-1 through 178-3g, combinations of orders of P(D) satisfy the following condition. ($b_{\#1,1}$%3, $b_{\#1,2}$%3), ($b_{\#2,1}$%3, $b_{\#2,2}$%3), ($b_{\#3,1}$%3, $b_{\#3,2}$%3), . . . , ($b_{\#k,1}$%3, $b_{\#k,2}$%3), . . . , ($b_{\#3g-2,1}$%3, $b_{\#3g-2,2}$%3), ($b_{\#3g-1,1}$%3, $b_{\#3g-1,2}$%3), ($b_{\#3g,1}$%3, $b_{\#3g,2}$%3) are any of (1, 2), or (2, 1) (where k=1, 2, 3, . . . , 3g)

<Condition #5-1> has a similar relationship with respect to Equations 178-1 through 178-3g as <Condition #2-1> has with respect to Equations 174-1 through 174-3g. If the condition below (<Condition #6-1>) is added for Equations 178-1 through 178-3g in addition to <Condition #5-1>, the possibility of being able to create an LDPC-CC having higher error correction capability is increased.

<Condition #6-1>

The following condition is satisfied for orders of X(D) of Equations 178-1 through 178-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,1,1}$%3g, $a_{\#1,1,2}$%3), ($a_{\#2,1,1}$%3g, $a_{\#2,1,2}$%3g), . . . , ($a_{\#p,1,1}$%3g, $a_{\#p,1,2}$%3), . . . , ($a_{\#3g,1,1}$%3g, $a_{\#3g,1,2}$%3g)

and the following condition is satisfied for orders of P(D) of Equations 178-1 through 178-3g. All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($b_{\#1,1}$%3g, $b_{\#1,2}$%3g), ($b_{\#2,1}$%3g, $b_{\#2,2}$%3g), ($b_{\#3,1}$%3g, $b_{\#3,2}$%3g), . . . , ($b_{\#k,1}$%3g, $b_{\#k,2}$%3g), . . . , ($b_{\#3g-2,1}$%3g, $b_{\#3g-2,2}$%3), (b#3g−1,1%3g, $b_{\#3g-1,2}$%3g), ($b_{\#3g,1}$%3g, $b_{\#3g,2}$%3g) (where k=1, 2, 3, . . . 3g)

The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is ½ that has parity check polynomials of Equations 178-1 through 178-3g, if a code is created in which <Condition #6-1> is applied in addition to <Condition #5-1>, it is possible to provide randomness while maintaining regularity for positions at which "1"s are present in a parity check matrix, and therefore the possibility of obtaining better error correction capability is increased.

The possibility of being able to create a code having higher error correction capability is also increased if a code is created using <Condition #6'-1> instead of <Condition #6-1>, that is, with <Condition #6'-1> added in addition to <Condition #5-1>.

<Condition #6'-1>

The following condition is satisfied for orders of X(D) of Equations 178-1 through 178-3g:

All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($a_{\#1,1,1}$%3g, $a_{\#1,1,2}$%3g), ($a_{\#2,1,1}$%3g, $a_{\#2,1,2}$%3g), . . . , ($a_{\#p,1,1}$%3g, $a_{\#p,1,2}$%3g), . . . , ($a_{\#3g,1,1}$%3g, $a_{\#3g,1,2}$%3g), (where p=1, 2, 3, . . . , 3g);

Or the following condition is satisfied for orders of P(D) of Equations 178-1 through 178-3g:

All values other than multiples of 3 (that is, 0, 3, 6, . . . , 3g−3) from among integers from 0 to 3g−1 (0, 1, 2, 3, 4, . . . , 3g−2, 3g−1) are present in the following 6g values: ($b_{\#1,1}$%3g, $b_{\#1,2}$%3g), ($b_{\#2,1}$%3g, $b_{\#2,2}$%3g), ($b_{\#3,1}$%3g, $b_{\#3,2}$%3g), . . . , ($b_{\#k,1}$%3g, $b_{\#k,2}$%3g), . . . , ($b_{\#3g}$-2,1%3 $b_{\#3g-2,2}$%3), ($b_{\#3g-1,1}$%3g, $b_{\#3g-1,2}$%3g), ($b_{\#3g,1}$%3g, $b_{\#3g,2}$%3g), (where k=1, 2, 3, . . . , 3g).

Examples of LDPC-CCs of a coding rate of ½ and a time varying period of 6 having good error correction capability are shown in Table 9.

TABLE 9

| Code | Parity Check Polynomials |
|---|---|
| LDPC-CC #1 of time varying period of 6 and coding rate ½ | "Check polynomial #1": $(D^{328}+D^{317}+1)X(D)+(D^{589}+D^{434}+1)P(D)=0$ |
| | "Check polynomial #2": $(D^{596}+D^{553}+1)X(D)+(D^{586}+D^{461}+1)P(D)=0$ |
| | "Check polynomial #3": $(D^{550}+D^{143}+1)X(D)+(D^{470}+D^{448}+1)P(D)=0$ |
| | "Check polynomial #4": $(D^{470}+D^{223}+1)X(D)+(D^{256}+D^{41}+1)P(D)=0$ |
| | "Check polynomial #5": $(D^{89}+D^{40}+1)X(D)+(D^{316}+D^{71}+1)P(D)=0$ |
| | "Check polynomial #6": $(D^{320}+D^{190}+1)X(D)+(D^{575}+D^{136}+1)P(D)=0$ |
| LDPC-CC #2 of time varying period of 6 and coding rate ½ | "Check polynomial #1": $(D^{524}+D^{511}+1)X(D)+(D^{215}+D^{103}+1)P(D)=0$ |
| | "Check polynomial #2": $(D^{547}+D^{287}+1)X(D)+(D^{467}+D^{1}+1)P(D)=0$ |
| | "Check polynomial #3": $(D^{289}+D^{62}+1)X(D)+(D^{503}+D^{502}+1)P(D)=0$ |
| | "Check polynomial #4": $(D^{401}+D^{55}+1)X(D)+(D^{443}+D^{106}+1)P(D)=0$ |
| | "Check polynomial #5": $(D^{433}+D^{395}+1)X(D)+(D^{404}+D^{100}+1)P(D)=0$ |
| | "Check polynomial #6": $(D^{136}+D^{59}+1)X(D)+(D^{599}+D^{559}+1)P(D)=0$ |
| LDPC-CC #3 of time varying period of 6 and coding rate ½ | "Check polynomial #1": $(D^{253}+D^{44}+1)X(D)+(D^{473}+D^{256}+1)P(D)=0$ |
| | "Check polynomial #2": $(D^{595}+D^{143}+1)X(D)+(D^{598}+D^{95}+1)P(D)=0$ |
| | "Check polynomial #3": $(D^{97}+D^{11}+1)X(D)+(D^{592}+D^{491}+1)P(D)=0$ |
| | "Check polynomial #4": $(D^{50}+D^{10}+1)X(D)+(D^{368}+D^{112}+1)P(D)=0$ |
| | "Check polynomial #5": $(D^{286}+D^{221}+1)X(D)+(D^{517}+D^{359}+1)P(D)=0$ |
| | "Check polynomial #6": $(D^{407}+D^{322}+1)X(D)+(D^{283}+D^{257}+1)P(D)=0$ |

Another Embodiment 16

In Another Embodiment 9, an LDPC-CC of a time varying period of 2 providing good received quality was described. Here, an LDPC-CC of a time varying period of 2 providing good received quality to which another Embodiment 14 is additionally applied will be described. A case in which the coding rate is (n−1)/n (where n is an integer of 2 or above) is described below as an example.

Consider Equation 180-1 and Equation 180-2 as parity check polynomials of an LDPC-CC for which the time varying period is 2. At this time, X1(D), X2(D), . . . , Xn−1(D) are polynomial representations of data (information) X1, X2, . . . , Xn−1, and P(D) is polynomial representation of parity. Here, in Equation 180-1 and Equation 180-2, parity check polynomials are assumed such that there are three terms in X1(D), X2(D), . . . , Xn−1 (D), and P(D) respectively.

$$(D^{a1,1}+D^{a1,2}+D^{a1,3})X_1(D)+(D^{a2,1}+D^{a2,2}+D^{a2,3})X_2(D)+\dots+$$

$$(D^{an-1,1}+D^{an-1,2}+D^{an-1,3})X_{n-1}(D)+(D^{b1}+D^{b2}D^{b3})P(D)=0 \quad \text{(Equation 180-1)}$$

$$(D^{A1,1}+D^{A1,2}+D^{A1,3})X_1(D)+(D^{A2,1}+D^{A2,2}+D^{A2,3})X_2(D)+\ldots+(D^{An-1,1}+D^{An-1,2}+D^{An-1,3})X_{n-1}(D)+(D^{B1}+D^{B2}D^{B3})P(D)=0 \quad \text{(Equation 180-2)}$$

In Equation 180-1, it is assumed that $a_{i,1}$, $a_{i,2}$, and $a_{i,3}$ (i=1, 2, . . . , 11-1) are integers (where $a_{i,1}\neq a_{i,2}\neq a_{i,3}$). Also, it is assumed that b1, b2, and b3 are integers (where b1≠b2≠b3). A parity check polynomial of Equation 180-1 is called "check equation #1," and a sub-matrix based on a parity check polynomial of Equation 180-1 is designated second sub-matrix $H_1$.

In Equation 180-2, it is assumed that $A_{i,1}$, $A_{i,2}$, and $A_{i,3}$ (where i=1, 2, . . . , n−1) are integers (where $A_{i,1}\neq A_{i,2}\neq A_{1,3}$). Also, it is assumed that B1, B2, and B3 are integers (where B1≠B2≠B3). A parity check polynomial of Equation 180-2 is called "check equation #2," and a sub-matrix based on a parity check polynomial of Equation 180-2 is designated second sub-matrix $H_2$.

Next, an LDPC-CC of a time varying period of 2 generated from first sub-matrix $H_1$ and second sub-matrix $H_2$ is considered.

If the following conditions apply in Equation 180-1 and Equation 180-2, the conditions described in another Embodiment 14 are satisfied, and therefore a loop 6 never occurs, and a regular LDPC code is formed, enabling good error correction capability to be obtained:

"For X1(D) related coefficients ($a_{1,1}$, $a_{1,2}$, $a_{1,3}$) and coefficients ($A_{1,1}$, $A_{1,2}$, $A_{1,3}$), one of the following is satisfied:

Of ($a_{1,1}$, $a_{1,2}$, $a_{1,3}$), two are odd numbers and one is an even number, and of ($A_{1,1}$, $A_{1,2}$, $A_{1,3}$), two are odd numbers and one is an even number Of ($a_{1,1}$, $a_{1,2}$, $a_{1,3}$), one is an odd number and two are even numbers, and of ($A_{1,1}$, $A_{1,2}$, $A_{1,3}$), one is an odd number and two are even numbers"

and

"For Xi(D) (where i=2, 3, . . . , n−1) related coefficients ($a_{i,1}$, $a_{i,2}$, $a_{i,3}$) and coefficients ($A_{i,1}$, $A_{i,2}$, $A_{i,3}$), one of the following is satisfied:

Of ($a_{i,1}$, $a_{i,2}$, $a_{i,3}$), two are odd numbers and one is an even number, and of ($A_{i,1}$, $A_{i,2}$, $A_{i,3}$), two are odd numbers and one is an even number Of ($a_{i,1}$, $a_{i,2}$, $a_{i,3}$), one is an odd number and two are even numbers, and of ($A_{i,1}$, $A_{i,2}$, $A_{i,3}$), one is an odd number and two are even numbers"

and

"One of the following is satisfied:

Of ($b_1$, $b_2$, $b_3$), two are odd numbers and one is an even number, and of ($B_1$, $B_2$, $B_3$), two are odd numbers and one is an even number Of ($b_1$, $b_2$, $b_3$), one is an odd number and two are even numbers, and of ($B_1$, $B_2$, $B_3$), one is an odd number and two are even numbers."

Another Embodiment 17

In another Embodiment 15, an LDPC-CC of a time varying period of 3 providing good received quality was described. Here, a puncturing method suitable for the LDPC-CC of a time varying period of 3 described in another Embodiment 15 will be described. A case in which a code of a coding rate of ½ (a coding rate of 12) is made larger than a coding rate of ½ by means of puncturing will be described as an example.

Consider an LDPC-CC of a time varying period of 3 defined by Equations 162-1 through 162-3. At this time, generality is not lost even if a1>a2>a3, b1>b2>b3, A1>A2>A3, B1>B2>B3, α1>α2>α3, and β1>β2>β3. Thus, the following description is based on these relationships.

The maximum order of information X(D) of "check equation #1" of Equation 162-1 is a1, and the maximum order of parity P(D) is b1. The maximum order of information X(D) of "check equation #2" of Equation 162-2 is A1, and the maximum order of parity P(D) is B1. The maximum order of information X(D) of "check equation #3" of Equation 162-3 is α1, and the maximum order of parity P(D) is β1. Here, the following two conditions are given.

[Condition #1]

Consider an order that is the maximum value among maximum orders a1, A1, and α1 of data X(D) in "check equation #1," "check equation #2," and "check equation #3." For example, if a1 is the largest among these three maximum orders, a1 related bits are not punctured, that is, a1 related bits are transmitted, and puncture (non-transmitted) bits are selected from bits other than a1 bits. Similarly, if A1 is the largest among these three maximum orders, A1 related bits are not punctured, and puncture bits are selected from bits other than A1 bits. Likewise, if α1 is the largest among these three maximum orders, α1 related bits are not punctured, and puncture bits are selected from bits other than α1 bits.

[Condition #2]

Consider an order that is the maximum value among maximum orders b1, B1, and β1 of parity P(D) in "check equation #1," "check equation #2," and "check equation #3." For example, if b1 is the largest among these three maximum orders, b1 related bits are not punctured, that is, b1 related bits are transmitted, and puncture (non-transmitted) bits are selected from bits other than b1 bits. Similarly, if B1 is the largest among these three maximum orders, B1 related bits are not punctured, and puncture bits are selected from bits other than B1 bits. Likewise, if β1 is the largest among these three maximum orders, β1 related bits are not punctured, and puncture bits are selected from bits other than β1 bits.

Puncturing is performed on the LDPC-CC of a time varying period of 3 described in another Embodiment 15 so that either [Condition #1] or [Condition #2] above is satisfied. By this means, good error correction capability can be obtained even if puncturing is performed. Naturally, still better error correction capability can be obtained if [Condition #1] and [Condition #2] are both satisfied. A detailed description will be given below using accompanying drawings.

FIG. 68 shows a correspondence relationship of LDPC-CC parity check matrix H of a time varying period of 3, transmission sequence u, and parity patterns in accordance with above [Condition #1] and [Condition #2]. FIG. 68 shows a case in which configuration is performed by means of the same kind of parity check polynomials as in FIG. 67A as parity check polynomials of a time varying period of 3. Therefore, sub-matrices $H_1$, $H_2$, and $H_3$ in FIG. 68 are the same as sub-matrices $H_1$, $H_2$, and $H_3$ in FIG. 67A.

If transmission vector u is represented as $u=(X_1, P_1, X_2, P_2, \ldots, X_i, P_i, X_{i+1}, P_{i+1}, \ldots)^T$, the relationship Hu=0 holds true. Therefore, the relationship between a transmission sequence and parity check matrix is as shown in FIG. 68, as described in Embodiment 7 (see FIG. 18).

In the LDPC-CC of a time varying period of 3 in FIG. 68, of maximum orders (a1, A1, α1)=(2, 5, 4) of data X(D) in "check equation #1," "check equation #2," and "check equation #3," maximum order A1=5 having the maximum value will be considered.

In FIG. 68, "1"s in position 6601 indicate positions of bits corresponding to maximum order A1. "1"s in position 6601 are in positions of bits corresponding to maximum order A1, and therefore are important in obtaining high belief in column computation in BP decoding. This is because, when an LDPC-CC is considered as a convolutional code, bits corresponding to maximum order A1 relate to the maximum constraint length. Generally, with a convolutional code, the longer the constraint length, the higher is the belief that can be obtained. Thus, maximum order A1 is important in relating to the maximum constraint length. Therefore, if bits corresponding to maximum order A1 are punctured and bits corresponding to maximum order A1 are not transmitted, the maximum constraint length is shortened.

Thus, provision is made for "1"s in position 6601 in FIG. 68 to be retained, so that the maximum constraint length is not shortened by puncturing. That is to say, information bits Xi, Xi+3, Xi+6, Xi+9, . . . in FIG. 68 are not selected as puncture bits but are taken as transmission bits, while bits other than information bits Xi, Xi+3, Xi+6, Xi+9, . . . are punctured, and non-transmitted bits are selected from bits other than information bits Xi, Xi+3, Xi+6, Xi+9, . . . . By this means, good error correction capability can be obtained even if puncturing is performed.

Similarly, in the LDPC-CC of a time varying period of 3 in FIG. 68, of maximum orders (b1, B1, β1)=(2, 5, 4) of parity P(D) in "check equation #1," "check equation #2," and "check equation #3," maximum order B1=5 having the maximum value will be considered.

In FIG. 68, "1"s in position 6602 indicate positions of bits corresponding to maximum order B1. "1"s in position 6602 are bits corresponding to maximum order B1, and are important in relating to the maximum constraint length, as explained above.

Thus, provision is made for "1"s in position 6602 in FIG. 68 to be retained, so that the maximum constraint length is not shortened by puncturing. That is to say, parity Pi, Pi+3, Pi+6, Pi+9, . . . in FIG. 68 are not selected as puncture bits but are taken as transmission bits, while bits other than parity Pi, Pi+3, Pi+6, Pi+9, . . . are punctured, and non-transmitted bits are selected from bits other than information bits Pi, Pi+3, Pi+6, Pi+9, . . . . By this means, good error correction capability can be obtained even if puncturing is performed.

Thus, bits that are not punctured (bits that are transmitted) in information X are established in accordance with [Condition #1], and bits that are not punctured (bits that are transmitted) in parity P can be established separately in accordance with [Condition #2] independently of [Condition #1]. Still better error correction capability can be obtained by establishing bits that are not punctured (bits that are transmitted) for information X and parity P in accordance with both [Condition #1] and [Condition #1].

FIG. 69 shows a different correspondence relationship from that in FIG. 68. Parity check matrix H is different in FIG. 68 and FIG. 69. Parity check polynomials of a time varying period of 3 and sub-matrices $H_1$, $H_2$, and $H_3$ of FIG. 69 are shown in the drawing.

If transmission vector u is represented as $u(X_1, P_1, X_2, P_2, \ldots, X_i, P_i, X_{i+1}, P_{i+1}, \ldots)^T$, the relationship Hu=0 holds true. Therefore, the relationship between a transmission sequence and parity check matrix is as shown in FIG. 69, as described in Embodiment 7 (see FIG. 18).

In the LDPC-CC of a time varying period of 3 in FIG. 69, of the maximum orders (a1, A1, α1)=(2, 5, 4) of data X(D) in "check equation #1," "check equation #2," and "check equation #3," maximum order A1=5 having the maximum value will be considered.

In FIG. 69, "1"s in position 6701 indicate positions of bits corresponding to maximum order A1. "1"s in position 6701 are in positions of bits corresponding to maximum order A1, and therefore are important in obtaining high belief in column computation in BP decoding. This is because, when an LDPC-CC is considered as a convolutional code, bits corresponding to maximum order A1 relate to the maximum constraint length.

Thus, provision is made for "1"s in position 6701 in FIG. 69 to be retained, so that the maximum constraint length is not shortened by puncturing. That is to say, information Xi, Xi+3, Xi+6, Xi+9, . . . in FIG. 69 are not selected as puncture bits but are taken as transmission bits, while bits other than information Xi, Xi+3, Xi+6, Xi+9, . . . are punctured, and non-transmitted bits are selected from bits other than information Xi, Xi+3, Xi+6, Xi+9, . . . . By this means, good error correction capability can be obtained even if puncturing is performed.

Similarly, in the LDPC-CC of a time varying period of 3 in FIG. 69, of maximum orders (b1, B1, β1)=(5, 2, 7) of parity P(D) in "check equation #1," "check equation #2," and "check equation #3," maximum order β1=7 having the maximum value will be considered.

In FIG. 69, "1"s in position 6702 indicate positions of bits corresponding to maximum order β1. "1"s in position 6702 are in positions of bits corresponding to maximum order β1, and therefore are important in relating to the maximum constraint length as explained above.

Thus, provision is made for "1"s in position 6702 in FIG. 69 to be retained, so that the maximum constraint length is not shortened by puncturing. That is to say, parity Pi-1, Pi+2, Pi+5, Pi+8, . . . in FIG. 69 are not selected as puncture bits but are taken as transmission bits, while bits other than parity Pi−1, Pi+2, Pi+5, Pi+8, . . . are punctured, and non-transmitted bits are selected from bits other than parity Pi−1, Pi+2, Pi+5, Pi+8, . . . . By this means, good error correction capability can be obtained even if puncturing is performed.

Thus, bits that are not punctured (bits that are transmitted) in information X are established in accordance with [Condition #1], and bits that are not punctured (bits that are transmitted) in parity P can be established separately in accordance with [Condition #2] independently of [Condition #1]. Still better error correction capability can be obtained by establishing bits that are not punctured (bits that are transmitted) for information X and parity P in accordance with both [Condition #1] and [Condition #1].

A case in which the coding rate is ½ has been described above as an example, but the coding rate is not limited to ½, and puncturing can also be executed in a similar way when the coding rate is made larger than (n−1)/n from a code of a coding rate of (n−1)/n (where n is an integer of 2 or above) (a coding rate of (n−1)/n). This is outlined below.

Consider an LDPC-CC of a time varying period of 3 defined by Equations 163-1 through 163-3. At this time, generality is not lost even if $a_{i,1}>a_{i,2}>a_{i,3}$, b1>b2>b3, $A_{i,1}>A_{i,2}>A_{i,3}$, B1>B2>B3, $\alpha_{i,1}>\alpha_{i,2}>\alpha_{i,3}$, and β1>β2>β3 (i=1, 2, . . . , n−1). Thus, the following description is based on these relationships.

The maximum order information Xi(D) of "check equation #1" of Equation 163-1 is $a_{i,1}$, and the maximum order of parity P(D) is b1. The maximum order of information Xi(D) of "check equation #2" of Equation 163-2 is $A_{i,1}$, and the maximum order of parity P(D) is B1. The maximum order of information Xi(D) of "check equation #3" of Equation 162-3 is $\alpha_{i,1}$, and the maximum order of parity P(D) is β1. Here, the following two conditions are given.

[Condition #1]

Consider an order that is the maximum value among maximum orders $a_{i,1}$, $A_{i,1}$, and $\alpha_{i,1}$ of data Xi(D) in "check equation #1," "check equation #2," and "check equation #3." For example, if $\alpha_{i,1}$ is the largest among these three maximum orders, $\alpha_{i,1}$ related bits are not punctured, that is, $a_{i,1}$ related bits are transmitted, and puncture (non-transmitted) bits are selected from bits other than $a_{i,1}$ bits. Similarly, if $A_{i,1}$ is the largest among these three maximum orders, $A_{i,1}$ related bits are not punctured, and puncture bits are selected from bits other than $A_{i,1}$ bits. Likewise, if $\alpha_{i,1}$ is the largest among these three maximum orders, $\alpha_{i,1}$ related bits are not punctured, $\alpha_{i,1}$ related bits are transmitted and puncture (non-transmitted) bits are selected from bits other than $a_{i,1}$ bits.

[Condition #2]

Consider an order that is the maximum value among maximum orders b1, B1, and β1 of parity P(D) in "check equation #1," "check equation #2," and "check equation #3." For example, if b1 is the largest among these three maximum orders, b1 related bits are not punctured, that is, b1 related bits are transmitted, and puncture (non-transmitted) bits are selected from bits other than b1 bits. Similarly, if B1 is the largest among these three maximum orders, B1 related bits are not punctured, B1 related bits are transmitted and puncture (non-transmitted) bits are selected from bits other than B1 bits. Likewise, if β1 is the largest among these three maximum orders, β1 related bits are not punctured, β1 related bits are transmitted and puncture (non-transmitted) bits are selected from bits other than β1 bits.

Puncturing is performed on an LDPC-CC of a time varying period of 3 and a coding rate of (n−1)/n so that either [Condition #1] or [Condition #2] above is satisfied. By this means, good error correction capability can be obtained even if puncturing is performed. Naturally, still better error correction capability can be obtained if [Condition #1] and [Condition #2] are both satisfied. The setting method for preventing candidacy as puncture bits (non-transmitted bits) is as illustrated in FIG. 68 and FIG. 69.

In another Embodiment 14, a method was described for eliminating a loop 6 that inevitably occurs in an LDPC-CC of an time varying period of 2. A description of a case in which the method described in another Embodiment 14 is applied to another embodiment forms another Embodiment 15. The important point in this case is the "remainder" related condition (remainder rule). That is to say, if a remainder rule is set properly, the inevitably occurring loop 6 described in another Embodiment 14 can be eliminated. In the description of LDPC-CCs of time varying periods 3 and 4 in another Embodiment 15, a remainder rule is set on the premise of eliminating an inevitably occurring loop 6, and a remainder rule for obtaining good data received quality has been described in detail. Also, remainder rules for obtaining good data received quality for LDPC-CCs of time varying periods of 6 and 3g based on time varying periods of 2, 3, and 4 remainder rules have been described.

The present invention is not limited to the above-described embodiments, and various variations and modifications may be possible without departing from the scope of the present invention. For example, in the above embodiments a case has been described in which the present invention is implemented as a radio communication apparatus, but the present invention is not limited to this, and can also be applied in the case of implementation by means of power line communication.

It is also possible for this communication method to be implemented as software. For example, provision may be made for a program that executes the above-described communication method to be stored in ROM (Read Only Memory) beforehand, and for this program to be run by a CPU (Central Processing Unit).

Provision may also be made for a program that executes the above-described communication method to be stored in a computer-readable storage medium, for the program stored in the storage medium to be recorded in RAM (Random Access Memory) of a computer, and for the computer to be operated in accordance with that program.

It goes without saying that the present invention is not limited to radio communication, and is also useful in power line communication (PLC), visible light communication, and optical communication.

The disclosures of Japanese Patent Application No. 2007-256567, filed on Sep. 28, 2007, Japanese Patent Application No. 2007-340963, filed on Dec. 28, 2007, Japanese Patent Application No. 2008-000844, filed on Jan. 7, 2008, Japanese Patent Application No. 2008-000847, filed on Jan. 7, 2008, Japanese Patent Application No. 2008-015670, filed on Jan. 25, 2008, Japanese Patent Application No. 2008-045290, filed on Feb. 26, 2008, Japanese Patent Application No. 2008-061749, filed on Mar. 11, 2008, and Japanese Patent Application No. 2008-149478, filed on Jun. 6, 2008, including the specifications, drawings and abstracts, are incorporated herein by reference in their entirety. Industrial

APPLICABILITY

The present invention can be widely applied to communication systems that use an LDPC-CC.

The invention claimed is:

1. An encoding method comprising the steps of:

supplying three different types of parity check polynomials for creating a Low-Density Parity-Check Convolutional Code, the Low-Density Parity-Check Convolutional Code created by using a parity check matrix in which three check equations are arranged repeatedly;

selecting, by a processor, a parity check polynomial from among the three different types of parity check polynomials in accordance with a time-variant period of 3; and applying, by a processor, the selected parity check polynomial to input data to generate a low-density parity-Check convolutional code, wherein:

the three different types of parity check polynomials are respectively represented by following three Equations;

$$\sum_{j=1}^{n-1}[(D^{a\#1,j,1}+D^{a\#1,j,2}+D^{a\#1,j,3})X_j(D)]+(D^{b\#1,1}+D^{b\#1,2}+D^{b\#1,3})P(D)=0$$

$$\sum_{j=1}^{n-1}[(D^{a\#2,j,1}+D^{a\#2,j,2}+D^{a\#2,j,3})X_j(D)]+(D^{b\#2,1}+D^{b\#2,2}+D^{b\#2,3})P(D)=0$$

$$\sum_{j=1}^{n-1}[(D^{a\#3,j,1}+D^{a\#3,j,2}+D^{a\#3,j,3})X_j(D)]+(D^{b\#3,1}+D^{b\#3,2}+D^{b\#3,3})P(D)=0$$

wherein:

D is a delay operator;

$X_j(D)$ is a polynomial representation of an piece of information $X_j$ that is a target to be encoded where j is each integer of one or more, and n−1 or less (where n is an integer of 2 or more);

P(D) is a polynomial representation of a parity;

$a_{\#k,j,1}$, $a_{\#k,j,2}$ and $a_{\#k,j,3}$ are parameters, where k designates each of 1, 2 and 3, and j designates each integer of one or more, and n−1 or less, $a_{\#k,j,1}$, $a_{\#k,j,2}$ and $a_{\#k,j,3}$ are integers of zero or more (where $a_{\#k,j,1} \neq a_{\#k,j,2} \neq a_{\#k,j,3}$), $b_{\#k,1}$, $b_{\#k,2}$ and $b_{\#k,3}$ are parameters, where k designates each of 1, 2 and 3, $b_{\#k,1}$ and $b_{\#k,2}$ are natural numbers (where $b_{\#k,1} \neq b_{\#k,2}$), and at least one of $a_{\#k,j,3}$ and $b_{\#k,3}$ is equal to zero.

2. The encoding method according to claim 1, wherein the integer n is 2.

3. The encoding method according to claim 1, wherein the generating step generates the low-density parity-check convolutional code by using the input data shifted by a shift register.

4. An encoder structured to create a Low-Density Parity-Check Convolutional Code from a convolutional code, the encoder comprising a parity calculator that finds a parity sequence by the encoding scheme the encoding scheme comprising the steps of:

supplying three different types of parity check polynomials for creating a Low-Density Parity-Check Convolutional Code, the Low-Density Parity-Check Convolutional Code created by using a parity check matrix in which three check equations are arranged repeatedly;

selecting, by a processor, a parity check polynomial from among the three different types of parity check polynomials in accordance with a time-variant period of 3; and applying, by a processor, the selected parity check polynomial to input data to generate a low-density parity-Check convolutional code, wherein:

the three different types of parity check polynomials are respectively represented by following three Equations;

$$\sum_{j=1}^{n-1}[(D^{a\#1,j,1}+D^{a\#1,j,2}+D^{a\#1,j,3})X_j(D)]+(D^{b\#1,1}+D^{b\#1,2}+D^{b\#1,3})P(D)=0$$

$$\sum_{j=1}^{n-1}[(D^{a\#2,j,1}+D^{a\#2,j,2}+D^{a\#2,j,3})X_j(D)]+(D^{b\#2,1}+D^{b\#2,2}+D^{b\#2,3})P(D)=0$$

$$\sum_{j=1}^{n-1}[(D^{a\#3,j,1}+D^{a\#3,j,2}+D^{a\#3,j,3})X_j(D)]+(D^{b\#3,1}+D^{b\#3,2}+D^{b\#3,3})P(D)=0$$

wherein:

D is a delay operator;

$X_j(D)$ is a polynomial representation of an piece of information $X_j$ that is a target to be encoded where j is each integer of one or more, and n−1 or less (where n is an integer of 2 or more);

P(D) is a polynomial representation of a parity;

$a_{\#k,j,1}$, $a_{\#k,j,2}$ and $a_{\#k,j,3}$ are parameters, where k designates each of 1, 2 and 3, and j designates each integer of one or more, and n−1 or less, $a_{\#k,j,1}$, $a_{\#k,j,2}$ and $a_{\#k,j,3}$ are integers of zero or more (where $a_{\#k,j,1} \neq a_{\#k,j,2} \neq a_{\#k,j,3}$), $b_{\#k,1}$, $b_{\#k,2}$ and $b_{\#k,3}$ are parameters, where k designates each of 1,2 and 3, $b_{\#k,1}$ and $b_{\#k,2}$ are natural numbers (where $b_{\#k,1} \neq b_{\#k,2}$), and at least one of $a_{\#k,j,3}$ and $b_{\#k,3}$ is equal to zero.

5. The encoder according to claim 4, wherein the parity calculator is structured to find the parity sequence by using the input data shifted by shift register.

6. A decoder that decodes a Low-Density Parity-Check Convolutional Code using Belief Propagation, the decoder comprising:

a row processing calculator structured to perform row processing calculation using a parity check matrix corresponding to a parity check polynomial used by an encoder 4;

a column processing calculator structured to perform column processing calculation using the parity check matrix; and a determinator structured to estimate a code using calculation results of the row processing calculator and the column processing calculator, wherein an encoder structured to create a Low-Density Parity-Check Convolutional Code from a convolutional code, the encoder comprising a parity calculator that finds a parity sequence by the encoding scheme, the encoding scheme comprising the steps of:

supplying three different types of parity check polynomials for creating a Low-Density Parity-Check Convolutional Code, the Low-Density Parity-Check Convolutional Code created by using a parity check matrix in which three check equations are arranged repeatedly; and selecting, by a processor, a parity check polynomial from among the three different types of parity check polynomials in accordance with a time-variant period of 3; and applying, by a processor, the selected parity check polynomial to input data to generate a low-density parity-Check convolutional code, wherein:

the three different types of parity check polynomials are respectively represented by following three Equations;

$$\sum_{j=1}^{n-1}[(D^{a\#1,j,1}+D^{a\#1,j,2}+D^{a\#1,j,3})X_j(D)]+(D^{b\#1,1}+D^{b\#1,2}+D^{b\#1,3})P(D)=0$$

$$\sum_{j=1}^{n-1}[(D^{a\#2,j,1}+D^{a\#2,j,2}+D^{a\#2,j,3})X_j(D)]+(D^{b\#2,1}+D^{b\#2,2}+D^{b\#2,3})P(D)=0$$

$$\sum_{j=1}^{n-1}[(D^{a\#3,j,1}+D^{a\#3,j,2}+D^{a\#3,j,3})X_j(D)]+(D^{b\#3,1}+D^{b\#3,2}+D^{b\#3,3})P(D)=0$$

wherein:

D is a delay operator;

$X_j(D)$ is a polynomial representation of an piece of information $X_j$ that is a target to be encoded where j is each integer of one or more, and n−1 or less (where n is an integer of 2 or more);

P(D) is a polynomial representation of a parity;

$a_{\#k,j,1}$, $a_{\#k,j,2}$ and $a_{\#k,j,3}$ are parameters, where k designates each of 1, 2 and 3, and j designates each integer of one or more, and n−1 or less, $a_{\#k,j,1}$, $a_{\#k,j,2}$ and $a_{\#k,j,3}$ are integers of zero or more (where $a_{\#k,j,1} \neq a_{\#k,j,2} \neq a_{\#k,j,3}$), $b_{\#k,1}$, $b_{\#k,2}$ and $b_{\#k,3}$ are parameters, where k designates each of 1,2 and 3, $b_{\#k,1}$ and $b_{\#k,2}$ are natural numbers (where $b_{\#k,1} \neq b_{\#k,2}$), and at least one of $a_{\#k,j,3}$ and $b_{\#k,3}$ is equal to zero.

* * * * *